US010672997B2

(12) United States Patent
Margulies et al.

(10) Patent No.: US 10,672,997 B2
(45) Date of Patent: *Jun. 2, 2020

(54) ORGANIC ELECTROLUMINESCENT MATERIALS AND DEVICES

(71) Applicant: Universal Display Corporation, Ewing, NJ (US)

(72) Inventors: Eric A. Margulies, Ewing, NJ (US); Zhiqiang Ji, Hillsborough, NJ (US); Jui-Yi Tsai, Newtown, PA (US); Chun Lin, Yardley, PA (US); Alexey Borisovich Dyatkin, Ambler, PA (US); Mingjuan Su, Ewing, NJ (US); Bin Ma, Plainsboro, NJ (US); Michael S. Weaver, Princeton, NJ (US); Julia J. Brown, Yardley, PA (US); Lichang Zeng, Lawrenceville, NJ (US); Walter Yeager, Yardley, PA (US); Alan Deangelis, Pennington, NJ (US); Chuanjun Xia, Lawrenceville, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 127 days.

This patent is subject to a terminal disclaimer.

(21) Appl. No.: 15/619,217

(22) Filed: Jun. 9, 2017

(65) Prior Publication Data
US 2017/0365801 A1    Dec. 21, 2017

Related U.S. Application Data

(60) Provisional application No. 62/516,329, filed on Jun. 7, 2017, provisional application No. 62/352,119, filed (Continued)

(51) Int. Cl.
*H01L 51/00* (2006.01)
*C09K 11/06* (2006.01)
(Continued)

(52) U.S. Cl.
CPC ...... *H01L 51/0085* (2013.01); *C07F 15/0033* (2013.01); *C09K 11/06* (2013.01);
(Continued)

(58) Field of Classification Search
None
See application file for complete search history.

(56) References Cited

U.S. PATENT DOCUMENTS 4,769,292 A    9/1988  Tang et al.
5,061,569 A    10/1991 VanSlyke et al.
(Continued)

FOREIGN PATENT DOCUMENTS

EP    0650955    5/1995
EP    1725079    11/2006
(Continued)

OTHER PUBLICATIONS

Burke et al. "An efficient route to asymmetrically diconjugated tris(heteroleptic) complexes of Ru(II)" RSC Adv. 2016, 6, 40869-40877. (Year: 2016).*

(Continued)

*Primary Examiner* — Robert S Loewe
(74) *Attorney, Agent, or Firm* — Duane Morris LLP

(57) ABSTRACT

A compound is disclosed that has a metal coordination complex structure having at least two ligands coordinated to the metal; wherein the compound has a first substituent $R^1$ at one of the ligands' periphery; wherein a first distance is defined as the distance between the metal and one of the atoms in $R^1$ where that atom is the farthest away from the metal among the atoms in $R^1$; wherein the first distance is also longer than any other atom-to-metal distance between the metal and any other atoms in the compound; and wherein when a sphere having a radius r is defined whose center is at the metal and the radius r is the smallest radius that will (Continued)

allow the sphere to enclose all atoms in the compound that are not part of $R^1$, the first distance is longer than the radius r by at least 2.9 Å.

23 Claims, 8 Drawing Sheets

Related U.S. Application Data on Jun. 20, 2016, provisional application No. 62/352,139, filed on Jun. 20, 2016, provisional application No. 62/450,848, filed on Jan. 26, 2017, provisional application No. 62/479,795, filed on Mar. 31, 2017, provisional application No. 62/480,746, filed on Apr. 3, 2017.

(51) Int. Cl.
  *C07F 15/00* (2006.01)
  *H01L 51/52* (2006.01)
  *H01L 51/50* (2006.01)

(52) U.S. Cl.
  CPC ............. *C09K 2211/1007* (2013.01); *C09K 2211/1011* (2013.01); *C09K 2211/1022* (2013.01); *C09K 2211/1029* (2013.01); *C09K 2211/1033* (2013.01); *C09K 2211/1044* (2013.01); *C09K 2211/1088* (2013.01); *C09K 2211/1092* (2013.01); *C09K 2211/185* (2013.01); *H01L 51/5016* (2013.01); *H01L 51/5206* (2013.01); *H01L 51/5221* (2013.01)

(56) References Cited

U.S. PATENT DOCUMENTS

| | | | |
|---|---|---|---|
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,528,187 B1 | 3/2003 | Okada | |
| 6,687,266 B1 | 2/2004 | Ma et al. | |
| 6,835,469 B2 | 12/2004 | Kwong et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,442,797 B2 * | 10/2008 | Itoh .................... | C07D 213/06 313/504 |
| 7,445,855 B2 | 11/2008 | Mackenzie et al. | |
| 7,534,505 B2 | 5/2009 | Lin et al. | |
| 7,732,606 B2 * | 6/2010 | Ise ..................... | C07F 15/0086 257/E51.044 |
| 9,673,409 B2 * | 6/2017 | Li ....................... | C07F 15/0086 |
| 10,243,154 B2 * | 3/2019 | Che ................... | H01L 51/0087 |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0138657 A1 | 7/2003 | Li et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0137267 A1 | 7/2004 | Igarashi et al. | |
| 2004/0137268 A1 | 7/2004 | Igarashi et al. | |
| 2004/0174116 A1 | 9/2004 | Lu et al. | |
| 2005/0025993 A1 | 2/2005 | Thompson et al. | |
| 2005/0112407 A1 | 5/2005 | Ogasawara et al. | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0182992 A1* | 8/2006 | Nii .................... | C07C 251/24 428/690 |
| 2006/0202194 A1 | 9/2006 | Jeong et al. | |
| 2006/0240279 A1 | 10/2006 | Adamovich et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0190359 A1 | 8/2007 | Knowles et al. | |
| 2007/0278936 A1* | 12/2007 | Herron .............. | C09K 11/06 313/504 |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Pakash et al. | |
| 2009/0108737 A1 | 4/2009 | Kwong et al. | |
| 2009/0115316 A1 | 5/2009 | Zheng et al. | |
| 2009/0124805 A1* | 5/2009 | Alleyne .............. | C09K 11/06 546/4 |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2011/0049496 A1 | 3/2011 | Fukuzaki | |
| 2013/0082248 A1* | 4/2013 | Groarke ............. | C07F 15/0033 257/40 |
| 2013/0328018 A1 | 12/2013 | Xia et al. | |
| 2013/0328019 A1 | 12/2013 | Xia et al. | |
| 2014/0021449 A1* | 1/2014 | Xia ..................... | C07F 15/0033 257/40 |
| 2014/0197386 A1 | 7/2014 | Kim et al. | |
| 2014/0306206 A1 | 10/2014 | Watanabe et al. | |
| 2014/0378685 A1* | 12/2014 | Catinat .............. | C07F 15/0033 546/4 |
| 2015/0011764 A1* | 1/2015 | Catinat .............. | C07F 15/0033 546/4 |
| 2015/0060830 A1* | 3/2015 | Thompson ......... | H01L 51/0085 257/40 |
| 2015/0069334 A1 | 3/2015 | Xia et al. | |
| 2015/0207086 A1* | 7/2015 | Li ....................... | C07F 15/006 546/4 |
| 2015/0357586 A1* | 12/2015 | Horiuchi ............ | C09K 11/06 257/40 |
| 2015/0357587 A1* | 12/2015 | Kishino ............. | C09K 11/06 257/40 |
| 2015/0364701 A1* | 12/2015 | Horiuchi ............ | C07F 15/0033 315/291 |
| 2016/0111661 A1* | 4/2016 | Boudreault ........ | H01L 51/0085 257/40 |
| 2016/0118604 A1* | 4/2016 | Choi .................. | H01L 51/0085 257/40 |
| 2017/0229663 A1* | 8/2017 | Tsai .................... | C07F 15/0033 |
| 2017/0365799 A1* | 12/2017 | Ji ....................... | H01L 51/0085 |

(56) References Cited

U.S. PATENT DOCUMENTS

| | | | |
|---|---|---|---|
| 2017/0365800 A1* | 12/2017 | Tsai | C07F 15/0033 |
| 2017/0373259 A1* | 12/2017 | Su | H01L 51/0085 |
| 2018/0134954 A1* | 5/2018 | Tsai | C07F 15/0033 |

FOREIGN PATENT DOCUMENTS

| | | | | |
|---|---|---|---|---|
| EP | 2034538 | | 3/2009 | |
| JP | 200511610 | | 1/2005 | |
| JP | 2007123392 | | 5/2007 | |
| JP | 2007254297 | | 10/2007 | |
| JP | 2008074939 | | 4/2008 | |
| JP | 2010084003 A | * | 4/2010 | C09B 57/10 |
| JP | 2010120893 A | * | 6/2010 | C07D 471/04 |
| JP | 2015173199 | | 10/2015 | |
| WO | 01/39234 | | 5/2001 | |
| WO | 02/02714 | | 1/2002 | |
| WO | 02015654 | | 2/2002 | |
| WO | 03040257 | | 5/2003 | |
| WO | 03060956 | | 7/2003 | |
| WO | 2004093207 | | 10/2004 | |
| WO | 04107822 | | 12/2004 | |
| WO | 2005014551 | | 2/2005 | |
| WO | 2005019373 | | 3/2005 | |
| WO | 2005030900 | | 4/2005 | |
| WO | 2005089025 | | 9/2005 | |
| WO | 2005/097942 | | 10/2005 | |
| WO | 2005123873 | | 12/2005 | |
| WO | 2006009024 | | 1/2006 | |
| WO | 2006056418 | | 6/2006 | |
| WO | 2006072002 | | 7/2006 | |
| WO | 2006082742 | | 8/2006 | |
| WO | 2006098120 | | 9/2006 | |
| WO | 2006100298 | | 9/2006 | |
| WO | 2006103874 | | 10/2006 | |
| WO | 2006114966 | | 11/2006 | |
| WO | 2006132173 | | 12/2006 | |
| WO | 2007002683 | | 1/2007 | |
| WO | 2007004380 | | 1/2007 | |
| WO | 2007063754 | | 6/2007 | |
| WO | 2007063796 | | 6/2007 | |
| WO | 2008056746 | | 5/2008 | |
| WO | 2008101842 | | 8/2008 | |
| WO | 2008132085 | | 11/2008 | |
| WO | 2009000673 | | 12/2008 | |
| WO | 2009003898 | | 1/2009 | |
| WO | 2009008311 | | 1/2009 | |
| WO | 2009018009 | | 2/2009 | |
| WO | 2009021126 | | 2/2009 | |
| WO | 2009050290 | | 4/2009 | |
| WO | 2009062578 | | 5/2009 | |
| WO | 2009063833 | | 5/2009 | |
| WO | 2009066778 | | 5/2009 | |
| WO | 2009066779 | | 5/2009 | |
| WO | 2009086028 | | 7/2009 | |
| WO | 2009100991 | | 8/2009 | |
| WO | 2014/033050 | | 3/2014 | |
| WO | 2014/112450 | | 7/2014 | |
| WO | 2014/112657 | | 7/2014 | |

OTHER PUBLICATIONS

Williams et al. "Light-emitting iridium complexes with tridentate ligands" Dalton Trans., 2008, 2081-2099. (Year: 2008).*
Fleetham et al. "Efficient "Pure" Blue OLEDs Employing Tetradentate Pt Complexes with a Narrow Spectral Bandwidth" Adv. Mater. 2014, 26, 7116-7121. (Year: 2014).*
Stinner et al. "Synthesis and Spectroelectrochemistry of Ir(bpy)(phen)(phi)3+, a Tris(heteroleptic Metallointercalator" Inorg. Chem. 2001, 40, 5245-5250. (Year: 2001).*
Machine translation of JP-2010084003, translation generated Oct. 2019, 29 pages. (Year: 2019).*
Kim, Kwon-Hyeon et al., "Highly Efficient Organic Light-Emitting Diodes with Phosphorescent Emitters Having High Quantum Yield and Horizontal Orientation of Transition Dipole Moments", Adv. Mater. 2014, 26, pp. 3844-3847.
Kim, Kwon-Hyeon et al., "Design of Heteroleptic Ir Complexes with Horizontal Emitting Dipoles for Highly Efficient Organic Light-Emitting Diodes with an External Quantum Efficiency of 38%", Chem. Mater. 2016, 28, pp. 7505-7510.
Graf, A. et al., "Correlating the transition dipole moment orientation of phosphorescent emitter molecules OLEDs with basic material properties", J. Mater. Chem. C, 2014, 2, pp. 10298-10304.
Jurow, Matthew J. et al, "Understanding and predicting the orientation of heteroleptic phosphors in organic light-emitting materials", Nature Materials, vol. 15, Jan. 2016, pp. 85-91.
Kim, Kwon-Hyeon et al., "Phosphorescent dye-based supramolecules for high-efficiency organic light-emitting diodes", Nature Communications, 5:4769, Sep. 2014, pp. 1-8.
Plummer, Edward A. et al., "Electrophosphorescent Devices Based on Cationic Complexes: Control of Switch-on Voltage and Efficiency Through Modification of Charge Injection and Charge Transport", Adv. Funct. Mater. 2005, vol. 15, No. 2, Feb. 2005, pp. 281-289.
Edkins, Robert M. "The synthesis and photophysics of tris-heteroleptic cyclometalated iridium complexes", Dalton Transactions, vol. 40, No. 38, Oct. 2011, pp. 9672-9678.
European Search Report dated Oct. 26, 2017 for corresponding European Patent Application No. 17176695.9.
Adachi, Chihaya et al., "Organic Electroluminescent Device Having a Hole Conductor as an Emitting Layer," Appl. Phys. Lett., 55(15): 1489-1491 (1989).
Adachi, Chihaya et al., "Nearly 100% Internal Phosphorescence Efficiency in an Organic Light Emitting Device," J. Appl. Phys., 90(10): 5048-5051 (2001).
Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.
Baldo et al., Highly Efficient Phosphorescent Emission from Organic Electroluminescent Devices, Nature, vol. 395, 151-154, (1998).
Baldo et al., Very high-efficiency green organic light-emitting devices based on electrophosphorescence, Appl. Phys. Lett., vol. 75, No. 1, 4-6 (1999).
Gao, Zhiqiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 1: 15-20 (2000).
Hamada, Yuji et al., "High Luminance in Organic Electroluminescent Devices with Bis(10-hydroxybenzo[h]quinolinato) beryllium as an Emitter, " Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater, 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).

(56) References Cited

OTHER PUBLICATIONS

Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater, 6(9):677-679 (1994).
Kwong, Raymond C. et al., "High Operational Stability of Electrophosphorescent Devices," Appl. Phys. Lett., 81(1)162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18(21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylbory1)-2,2'-bithiophene and 5,5"-Bis(dimesitylbory1)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).

Sotoyama, Wataru et al., "Efficient Organic Light-Emitting Diodes with Phosphorescent Platinum Complexes Containing N^c^n-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2- α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Choi, Gyeongshin et al., "Hemilabile N-Xylyl-N'-methylperimidine Carbene Iridium Complexes as Catalysts for C—H Activation and Dehydrogenative Silylation: Dual Role of N-Xylyl Moiety for ortho-C—H Bond Activation and Reductive Bong Cleavage" J. Am. Chem. Soc. 2013, 135, 13149-13161.
Tordera, Daniel et al., "Stable Green Electroluminescence from an Iridium Tris-Heteroleptic Ionic Complex" Chem. Mater. 2012, 24, 1896-1903.
Baranoff, Etienne et al., "Acid-Induced Degradation of Phosphorescent Dopants for OLEDs and Its Application to the Synthesis of Tris-heteroleptic Iridium(III) Bis-cyclometalated Complexes" Inorg. Chem. 2012, 51, 215-224.
Lepeltier, Marc et al., "Tris-cyclometalated Iridium(III) Complexes with Three Different Ligands: a New Example with 2-(2,4-Difluorophenyl)pyridine-Based Complex" Helvetica Chimica Acta—vol. 97 (2014), 939-956.
Park, Gui Youn et al., "Iridium Complexes Containing Three Different Ligands as White OLED Dopants" Molecular Crystals and Liquid Crystals, vol. 462, pp. 179-188, 2007.
Felici, Marco et al., "Cationic Heteroleptic Cyclometalated Iridium(III) Complexes Containing Phenyl-Triazole and Triazole-Pyridine Clicked Ligands" Molecules 2010, 15, 2039-2059.
Jia-Ling Liao et al.: "Ir(III)-Based Phosphors with Bipyrazolate Ancillaries; Rational Design, Photophysics, and Applications in Organic Light-Emitting Diodes" Inorganic Chemistry, vol. 54, No. 22, Nov. 16, 2015 (Nov. 16, 2015), pp. 10811-10821.
European Search Report dated Oct. 26, 2017 for corresponding EP Application No. 17176668.6.
Burke, Christopher S. and Keyes, Tia E. An Efficient Route to Asymmetrically Diconjugated tris(heteroleptic) Complexes of Ru(II), RSC Advances, vol. 6, Jan. 1, 2013, pp. 40869-40877.
Xu, Xianbin et al., "Trifunctional IRIII ppy-type asymmetric phosphorescent emitters with ambiopolar features for highly efficient electroluminescent devices" Chem. Commun., 2014, 50, pp. 2473-2476.
Xu, Xianbin et al., "tris-Heteroleptic Cyclometalated Iridium(III) Complexes with Ambipolar or Electron Injection/Transport Features for Highly Efficient Electrophosphorescent Devices" Chem. Asian J. 2015, 10, pp. 252-262.
Extended European Search Report dated Apr. 11, 2018 for corresponding EP Application No. 17176681.9.

\* cited by examiner

ORGANIC ELECTROLUMINESCENT MATERIALS AND DEVICES

CROSS-REFERENCE TO RELATED APPLICATIONS

This application claims priority under 35 U.S.C. § 119(e)(1) from U.S. Provisional Application Ser. No. 62/352,119, filed Jun. 20, 2016, 62/516,329, filed Jun. 7, 2017, 62/352,139, filed Jun. 20, 2016, 62/450,848, filed Jan. 26, 2017, 62/479,795, filed Mar. 31, 2017, and 62/480,746, filed Apr. 3, 2017, the entire contents of which are incorporated herein by reference.

FIELD

The present disclosure relates to compounds for use as phosphorescent emitters, and devices, such as organic light emitting diodes, including the same. More specifically, this disclosure relates to organometallic complexes having large aspect ratio in one direction and their use in OLEDs to enhance the efficiency.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted Ir(ppy)$_3$, which has the following structure:

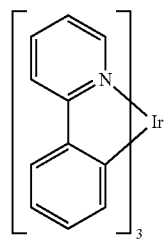

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule" and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an aspect of the present disclosure, a compound is disclosed that has a metal coordination complex structure having at least two ligands coordinated to the metal; wherein the compound has a first substituent $R^1$ at one of the ligands' periphery; wherein a first distance is defined as the distance between the metal and one of the atoms in $R^1$ where that atom is the farthest away from the metal among the atoms in $R^1$; wherein the first distance is also longer than any other atom-to-metal distance between the metal and any other atoms in the compound; and wherein when a sphere having a radius r is defined whose center is at the metal and the radius r is the smallest radius that will allow the sphere to enclose all atoms in the compound that are not part of $R^1$, the first distance is longer than the radius r by at least 2.9 Å.

According to another aspect, an OLED is disclosed that comprises: an anode; a cathode; and an organic layer, disposed between the anode and the cathode, comprising a compound having a metal coordination complex structure; wherein the compound is capable of functioning as an emitter in an organic light emitting device at room temperature; wherein the compound has at least two ligands coordinated to the metal; wherein the compound has a first substituent $R^1$ at one of the ligands' periphery; wherein a first distance is the distance between the metal and an atom in $R^1$ that is the farthest away from the metal; wherein the first distance is longer than any distance between the metal and any other atoms in the compound; and wherein when a sphere having a radius r is defined whose center is the metal and the radius r is the smallest radius that will allow the sphere to enclose all atoms in the compound that are not part of $R^1$, the first distance is longer than the radius r by at least 2.9 Å.

According to another aspect, an OLED is disclosed that comprises: an anode; a cathode; and an emissive layer, disposed between the anode and the cathode, comprising a phosphorescent emitting compound; wherein the phosphorescent emitting compound has an intrinsic emission spectrum with a full width at half maximum (FWHM) value of no more than 40 nm; wherein the OLED has an EQE of at least 25% measured at 0.1 mA/cm² at room temperature when a voltage is applied across the device.

According to another aspect, a consumer product comprising an OLED is disclosed wherein the OLED comprises: an anode; a cathode; and an organic layer, disposed between the anode and the cathode, comprising a compound having a metal coordination complex structure; wherein the compound is capable of functioning as an emitter in an organic light emitting device at room temperature; wherein the compound has at least two ligands coordinated to the metal; wherein the compound has a first substituent $R^1$ at one of the ligands' periphery; wherein a first distance is the distance between the metal and an atom in $R^1$ that is the farthest away from the metal; wherein the first distance is longer than any distance between the metal and any other atoms in the compound; and wherein when a sphere having a radius r is defined whose center is the metal and the radius r is the smallest radius that will allow the sphere to enclose all atoms in the compound that are not part of $R^1$, the first distance is longer than the radius r by at least 2.9 Å.

According to another aspect, a consumer product comprising an OLED is disclosed wherein the OLED comprises: an anode; a cathode; and an emissive layer, disposed between the anode and the cathode, comprising a phosphorescent emitting compound; wherein the phosphorescent emitting compound has an intrinsic emission spectrum with a FWHM value of no more than 40 nm and an EQE of at least 25% measured at 0.1 mA/cm² at room temperature when a voltage is applied across the device.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
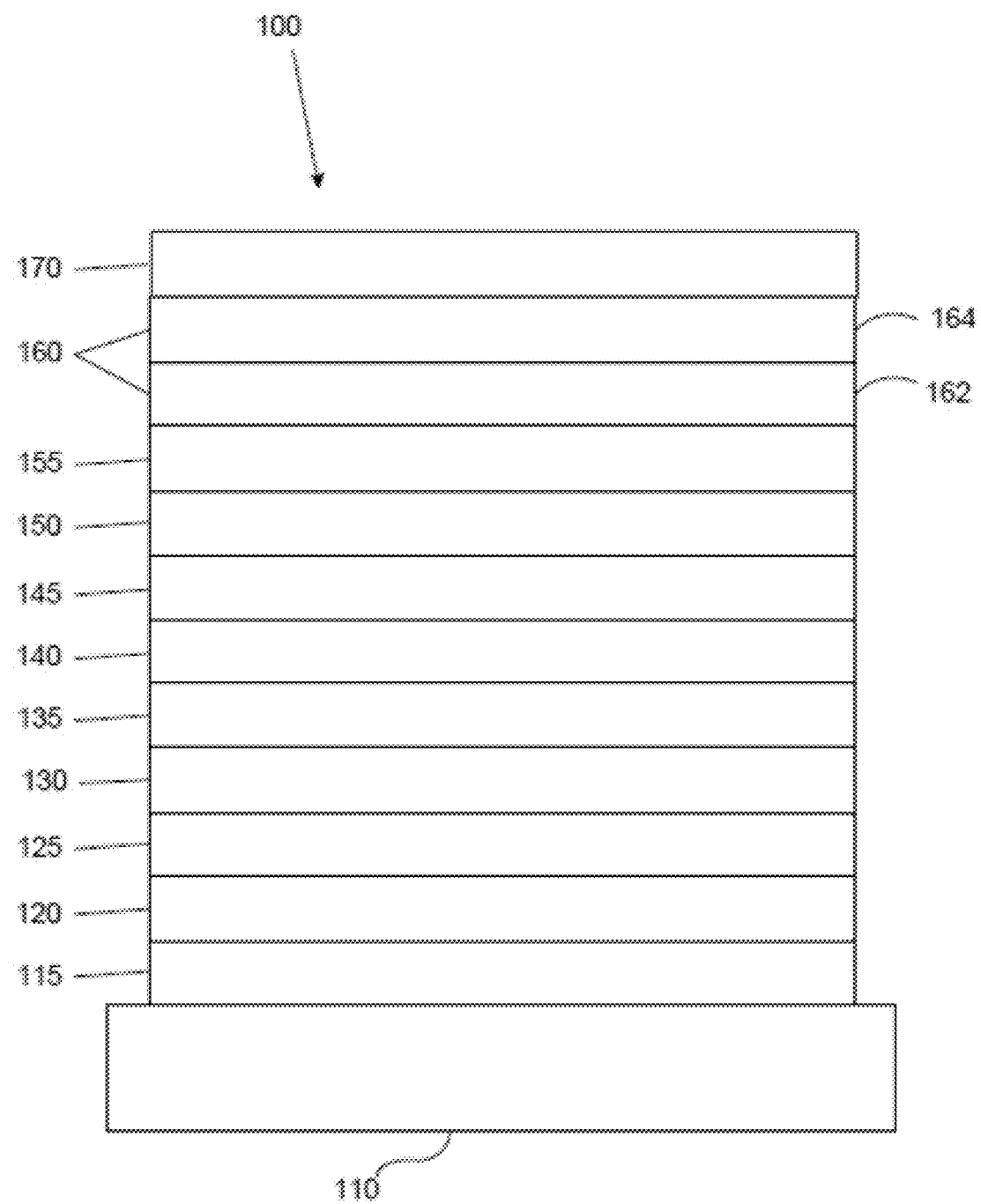
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
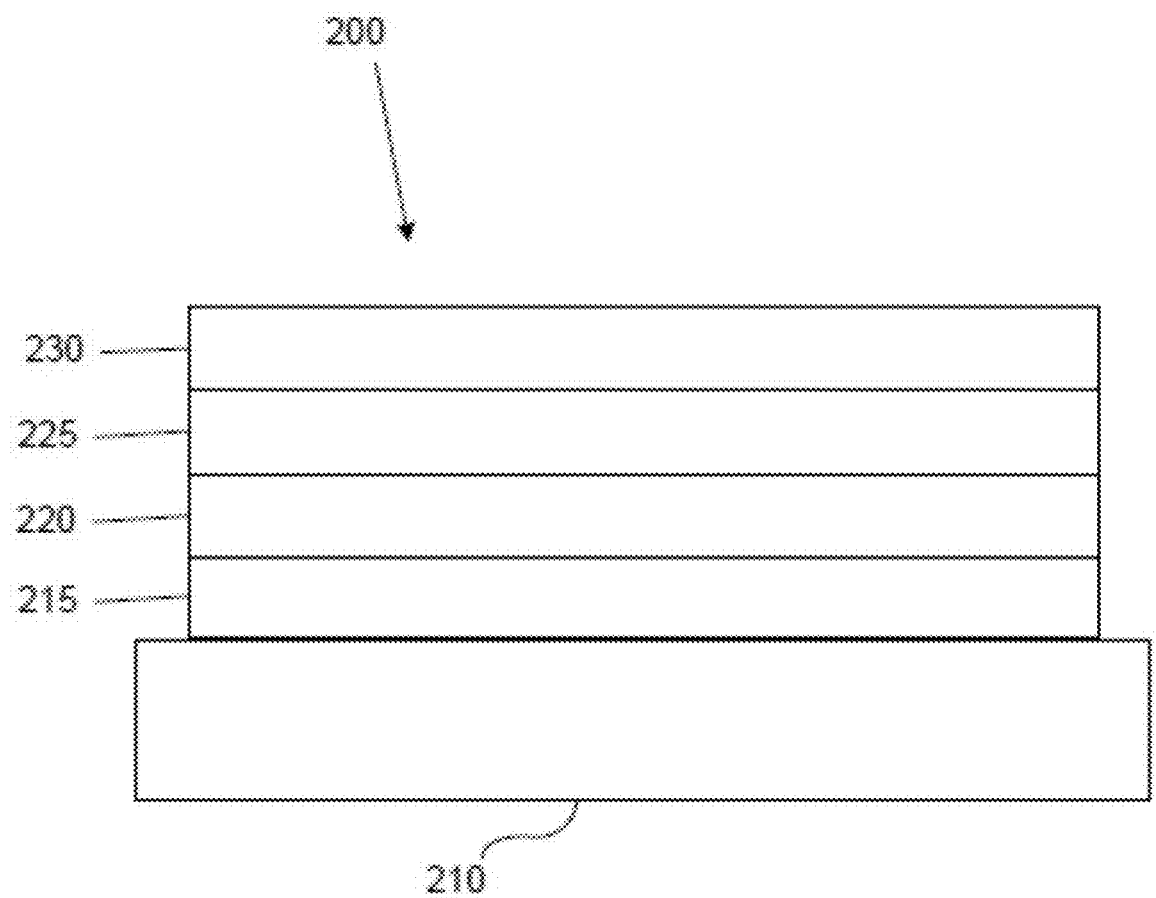
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The term "halo," "halogen," or "halide" as used herein includes fluorine, chlorine, bromine, and iodine.

The term "alkyl" as used herein contemplates both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" as used herein contemplates cyclic alkyl radicals. Preferred cycloalkyl groups are those containing 3 to 10 ring carbon atoms and includes cyclopropyl, cyclopentyl, cyclohexyl, adamantyl, and the like. Additionally, the cycloalkyl group may be optionally substituted.

The term "alkenyl" as used herein contemplates both straight and branched chain alkene radicals. Preferred alkenyl groups are those containing two to fifteen carbon atoms. Additionally, the alkenyl group may be optionally substituted.

The term "alkynyl" as used herein contemplates both straight and branched chain alkyne radicals. Preferred alkynyl groups are those containing two to fifteen carbon atoms. Additionally, the alkynyl group may be optionally substituted.

The terms "aralkyl" or "arylalkyl" as used herein are used interchangeably and contemplate an alkyl group that has as a substituent an aromatic group. Additionally, the aralkyl group may be optionally substituted.

The term "heterocyclic group" as used herein contemplates aromatic and non-aromatic cyclic radicals. Heteroaromatic cyclic radicals also means heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers, such as tetrahydrofuran, tetrahydropyran, and the like. Additionally, the heterocyclic group may be optionally substituted.

The term "aryl" or "aromatic group" as used herein contemplates single-ring groups and polycyclic ring systems. The polycyclic rings may have two or more rings in which two carbons are common to two adjoining rings (the rings are "fused") wherein at least one of the rings is aromatic, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" as used herein contemplates single-ring hetero-aromatic groups that may include from one to five heteroatoms. The term heteroaryl also includes polycyclic hetero-aromatic systems having two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

The alkyl, cycloalkyl, alkenyl, alkynyl, aralkyl, heterocyclic group, aryl, and heteroaryl may be unsubstituted or may be substituted with one or more substituents selected from the group consisting of deuterium, halogen, alkyl, cycloalkyl, heteroalkyl, arylalkyl, alkoxy, aryloxy, amino, cyclic amino, silyl, alkenyl, cycloalkenyl, heteroalkenyl, alkynyl, aryl, heteroaryl, acyl, carbonyl, carboxylic acid, ether, ester, nitrile, isonitrile, sulfanyl, sulfinyl, sulfonyl, phosphino, and combinations thereof.

As used herein, "substituted" indicates that a substituent other than H is bonded to the relevant position, such as carbon. Thus, for example, where $R^1$ is mono-substituted, then one $R^1$ must be other than H. Similarly, where $R^1$ is di-substituted, then two of $R^1$ must be other than H. Similarly, where $R^1$ is unsubstituted, $R^1$ is hydrogen for all available positions.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In the present disclosure, we describe a method for achieving emitter transition dipole alignment for improvement of OLED device performance. Increasing the horizontal alignment of the transition dipole moment vector responsible for photon emission within individual emitter leads to an increased outcoupling, and thus increased efficiency. Increasing molecular aspect ratio of the emitter, through increased linearity or planarity, allows for non-isotropic orientation of the emitter in the OLED EML. Correlation of the transition dipole moment with this linear long axis or plane allows for the emitter orientation to translate to transition dipole orientation and improved light outcoupling. These changes can improve light outcoupling and device efficiency by up to 50% versus a randomly oriented emitter.

Alignment of Emissive Transition Dipole Moment:

The method described herein improves OLED performance by maximizing light outcoupling through molecular alignment. Despite very high exciton conversion efficiencies and emission quantum yields achieved through phosphorescent OLED materials, device efficiency is ultimately limited by light extraction efficiency. Extraction of photons emitted from the emissive layer (EML) of an OLED stack depends greatly on the direction of the photon emission. Photons propagating normal to the device substrate have a high probability of extraction, whereas those photons propagating at a high angle with respect to the substrate's orthogonal direction stand a much greater chance of being lost and not be extracted due to internal reflection, waveguided modes and coupling to surface plasmon modes.

In an individual emitter compound, light emission occurs perpendicular to the triplet to ground state transition dipole moment (TDM). As such, increasing the number of emitter compound molecules whose TDM vector is horizontally aligned with respect to the OLED's substrate results in a higher light extraction efficiency, and thus higher device efficiency (external quantum efficiency—EQE). This horizontal orientation factor can be described statistically in an ensemble of emitter molecules by the ratio θ of the horizontal component of the TDM vector, $TDM_\parallel$, to the sum of the vertical component, $TDM\perp$, and the horizontal component. In other words: $\theta = TDM_\parallel/(TDM\perp + TDM_\parallel)$. The ratio θ will be hereinafter referred to as the horizontal dipole ratio ("HDR").

Figure 10:
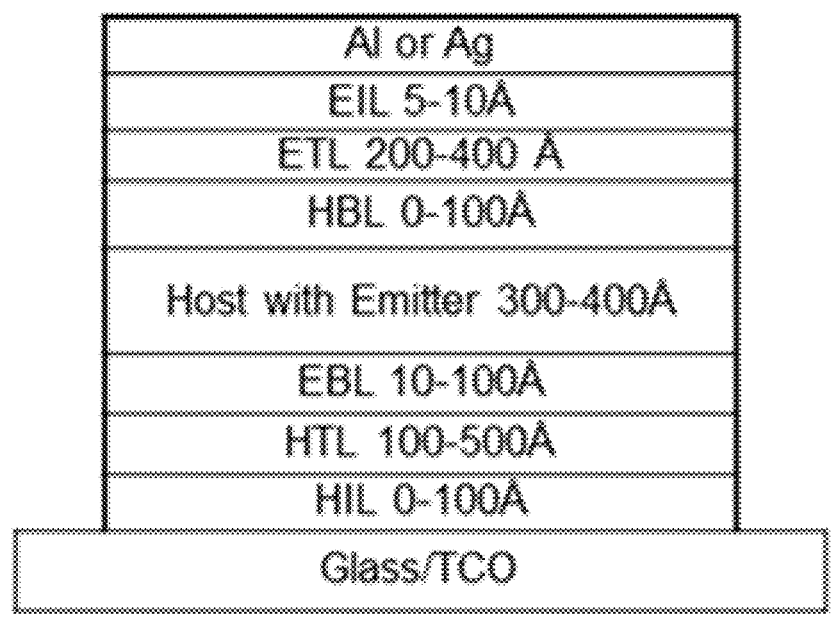
FIG. 10 shows an example bottom emission OLED device stack for determination of EQE in the absence of optical enhancement.

The horizontal dipole ratio θ may be measured by angle dependent photoluminescence measurements. By comparing the measured emission pattern of a photoexcited thin film sample, as a function of polarization, to the computationally modeled pattern, one can determine the TDM vector's orientation for a given sample. The horizontal dipole ratio θ has a very significant effect on resulting device efficiency. In a typical bottom emission device structure (as shown in FIG. 10) with no microcavity or other optical enhancement and material refractive indices 1.5-2.0, a randomly oriented emitter (θ=0.67) can achieve a maximum device EQE of roughly 28% assuming quantitative emission and charge recombination efficiency (achievable at very low current density <1 mA/cm$^2$). In the case of a perfectly horizontal emitter, with θ=1, EQE in excess of 40% is achievable in an OLED device with a PLQY of 100% and charge recombination efficiency of 100%.

In general, increased emission outcoupling depends on two primary factors: (1) triplet to ground state TDM vector alignment within an emitter compound molecule and (2) molecular alignment of the emitter within an EML structure. As such, it is necessary to control both factors in unison to effectively achieve alignment of the TDM vector to enhance the OLED performance. Furthermore, both factors may not be discrete, but a distribution of alignments. Near-degenerate emissive optical transitions may result in a distribution of differentially oriented TDM vectors that is described by Boltzmann statistics. Structurally, molecular alignment of the emitter in an amorphous EML medium results in a distribution of emitter alignments which may vary throughout the EML layer. As such, enhancement of device performance may be realized through both preferential emission from a single optical transition and strong alignment of this transition within a device EML.

Single TDM Vector Molecular Alignment:

In order to realize an aligned TDM vector within the device, preferential emitter alignment must be instilled into the host and emitter materials. This is achieved, primarily, through a high aspect ratio emitter molecule. It is found that high aspect ratio rod-like or disk-like structures may be preferentially oriented in a nominally amorphous film prepared by methods such as thermal vapor deposition, spin coating, ink jet printing, and organic vapor jet printing.

Figure 3:
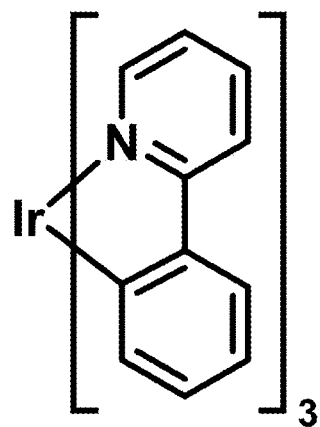
FIG. 3 shows an example of 2-phenylpyridine based Iridium phosphorescent emitter.

In emitters with a single preferential emissive transition, a rod-like structure can be chosen to optimize alignment with the TDM vector while still minimizing molecular weight. In emitters similar in structure to tris(2-phenylpyridine) iridiumn (Ir(ppy)$_3$, FIG. 3), this is achieved through creation of a long molecular axis extending though the iridium metal center. The directionality of the long molecular axis may depend on orientation of the TDM vector, as discussed below.

Figure 4:
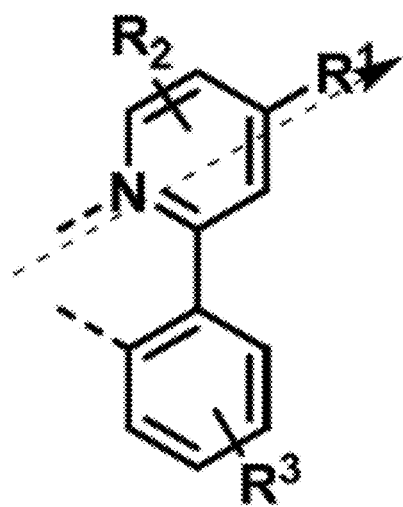
FIG. 4 shows an example of 4-substituted pyridine structure where the transition dipole moment vector (dashed line) is along the molecular long axis.

Referring to FIG. 4, in the case of emitters in which the TDM vector is roughly aligned with the iridium-nitrogen bond (depicted with dashed arrow), the molecular long axis may be created through an appropriate substitution at the pyridine 4-position ($R^1$ in FIG. 4). For example, aryl, heteroaryl, alkyl, or cycloalkyl substituents may be introduced at this position to facilitate the formation of a high aspect ratio rod-like structure in which the molecular long axis passes roughly through the iridium-nitrogen bond and through this substituent group. We aim to align the TDM vector axis with this high aspect ratio molecular long axis with an angle between these two axes preferably less than 30°, more preferably less than 10°. A preferred length of the substituent, $R^1$, ranges from 3 to 15 Å, more preferably from 4 to 9 Å. We predict that applying this molecular design with judicious choice of substituents can result in HDR of up to 0.85 and a resulting large EQE increase.

Figure 5:
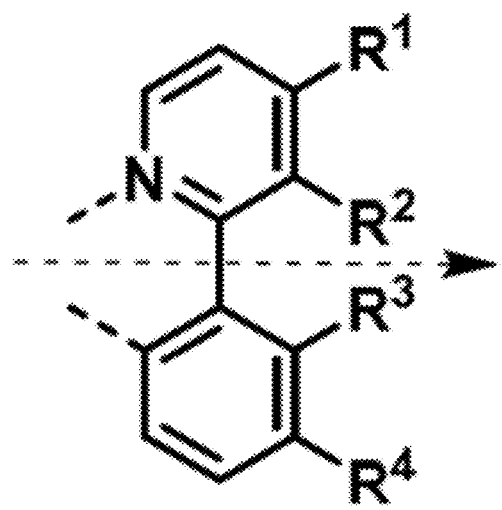
FIG. 5 shows an example of phenylpyridine based ligand where substitutions at $R^1$, $R^2$, $R^3$, and $R^4$ allows for long axis alignment with dashed TDM vector.

Similarly, a rod-like structure may be used in emitters containing a single preferential TDM vector roughly bisecting the bidentate emitting ligand (see FIG. 5, depicted in dashed line). In this case, elongation by aryl, heteroaryl, alkyl, or cycloalkyl substitution at the pyridine 3- and 4-position in conjunction with substitution at the phenyl 5- and 6-positions may be used to generate a molecular long axis roughly bisecting the bidentate emitting ligand. For example, alkyl substitution at the pyridine 4-position and fused heteroaryl substitution at the phenyl 5- and 6-positions results in net elongation in the TDM vector direction.

Similarly, twisted aryl substitution at the phenyl 6-position results in a more rod like elongation in this TDM vector axis. We aim to align the TDM vector axis with this high aspect ratio molecular long axis with an angle between these two axes preferably less than 300, more preferably less than 10°. The preferred length of the substituent, $R^1/R^2$ and $R^3/R^4$, ranges from 3 to 15 Å, more preferably from 4 to 9 Å. Because this substitution pattern may introduce a larger planar system to align with the EML surface, we predict further enhanced HDR of up to 0.9.

Ligand Energy Gap:

For homoleptic Iridium emitters, wherein all three bidentate ligands are identical, degeneracy of the three optical transitions leads to a randomization of the transition dipole orientation. As is the case with homoleptic emitters, heteroleptic emitters may also have emission distributed between degenerate or near-degenerate transitions. These transitions may be centered on different ligands and thus have largely orthogonal TDM vectors. This results in an overall scrambling of any emission alignment that may be afforded from molecular alignment.

We note that the very small energy gap between nearly identical phenylpyridine based ligands results in largely isotropic emission in Ir(ppy)$_3$-type emitters, even in strongly oriented rod-like structures. In these cases, Boltzmann statistics largely describe the probability of emission from near-degenerate transitions. As such, we find that the localization of the emissive transition is highly sensitive to the energy gap between the various transitions in question. In order to strongly localize emission and improve TDM alignment, the preferred energy gap between emission centered on the emissive ligand versus the ancillary ligand(s) is above 0.05 eV and more preferably 0.10 eV.

Furthermore, any preferential alignment induced by a long axis positioned along one of the ligands not primarily responsible for the emissive transition may result in a low horizontal dipole ratio, θ. This case, where the one of the aforementioned alignment motifs is applied on one of the emitter ancillary ligands, is to be avoided as this may result in HDR values below 0.67 (isotropic orientation).

Symmetry and Geometry of TDM Vectors:

In cases where large energy gaps may not be afforded by energetic tuning of emissive and ancillary ligand structures, as is the case with many high energy blue and green emitters, symmetry and molecular geometry may be used to produce highly aligned emission from multiple ligands. We note the largely orthogonal nature of the degenerate TDM vectors of Ir(ppy)$_3$ and the perfectly parallel nature of those in diketone ligated red emitters with symmetric emitting ligands. In the case of degenerate emission, these perpendicular and parallel relationships give rise to negation and enhancement, respectively, of any aligned emission due to molecular alignment in the EML.

Figure 6:
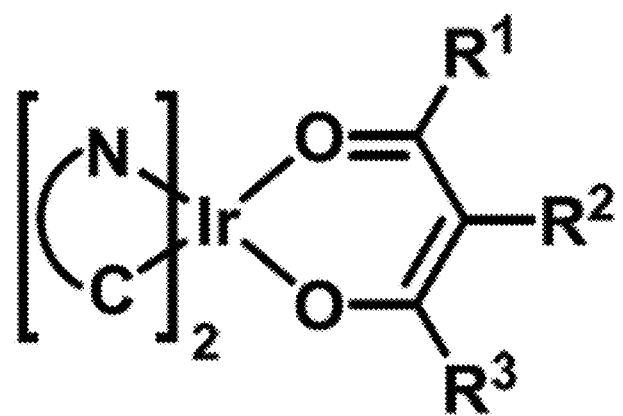
FIG. 6 shows diketone ligated structure wherein trans-nitrogen ligated C—N ligands introduce $C_2$ rotational symmetry.
Figure 7:
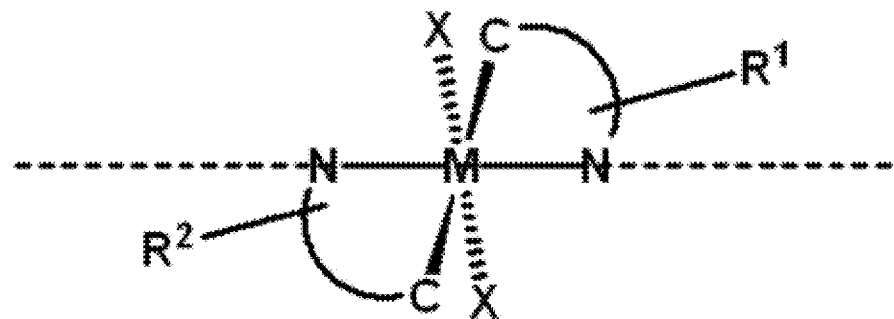
FIG. 7 shows a schematic illustration of trans-nitrogen axis and a preferred alignment of long axis and TDM vector with this axis.

In these diketone ligated Iridium emitters, a preferential trans-orientation of the Iridium-nitrogen bond results in a $C_2$ axis of symmetry in the structure. See FIG. 6. We propose using this $C_2$ axis to enhance alignment induced by elongation of the TDM vector axis. See FIG. 7. If the non-ketone ligand is designed to have both (1) TDM vector and (2) steric long axis aligned with the Ir—N bond, the $C_2$ symmetry enhances alignment due to the parallel TDM vectors on the two emissive ligands. This allows for very high HDR values in excess of 0.85.

Figure 8:
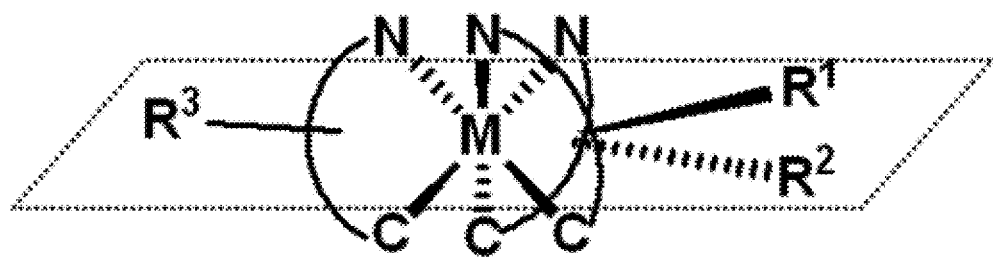
FIG. 8 shows a schematic illustration of $C_3$ or pseudo-$C_3$ symmetric structure and a preferred alignment of $R^1$, $R^2$, and $R^3$ molecular long axis as well as the TDM vector with this $C_3$ rotation plane.

Regarding tris substituted compounds, wherein the emission has an equal or near-equal probability of being centered on each of the three ligands, it is preferable to align both: (1) the TDM vector and (2) the long axis with the plane containing the compounds three-fold rotational symmetry. In these homoleptic fac compounds, this $C_3$ plane roughly bisects the angle between the two metal ligand bonds of each bidentate ligand. See FIG. 8. As such, the TDM vector of these complexes should be roughly bisecting this angle, preferably making less than a 20° angle between the $C_3$ plane and the TDM vector and more preferably less than 10°.

Figure 9:
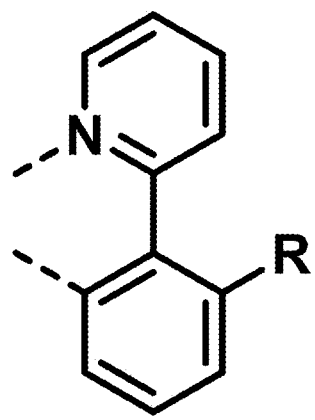
FIG. 9 shows one of the possible ligand substitution patterns to enable molecular long axis and TDM alignment with $C_3$ rotation plane of fac-tris-bidentate organometallic emitter.

The resulting planar or nearly-planar arrangement of the three TDM vectors can then contribute to efficiency gains if changes in the aspect ratio induce preferential horizontal alignment of this plane. Lengthening each ligand along this $C_3$ plane results in a very planar structure with a high aspect ratio. One such structure is shown in FIG. 9 where R is alkyl, cycloalkyl, aryl, or heteroaryl. Same R can also be at the similar position on the pyridine ring. The molecular aspect ratio is dictated by this radius between the metal center and the terminus of the R-group which is preferably longer than 4 Å and more preferably longer than 8 Å. Furthermore, it is preferable to have this vector between metal center and R-group terminus in the $C_3$ plane with an angle between the vector and plane less than 20° and more preferably less than 10°.

Emitters containing two identical emitting ligands or, more generally, two ligands primarily responsible for emission may be developed such that their long axes and TDM vectors are non-orthogonal. With respect to each ligand individually, the long axis and TDM vector may be collinear, as described above. When this long axis of one ligand is at a large angle (q) with respect to that of the second emitting ligand, enhancement of device efficiency may be observed. In this case, because the emitter molecular alignment can be described by a distribution of orientations in the amorphous EML, a bent shape where 90°<φ<180° results in a device efficiency enhancement by virtue of both TDM vectors being roughly aligned with the long axis formed between the two ligands. This is achieved where the TDM vector is preferably bisecting the bidentate ligand and also slightly out of the ligand plane. We propose using two degenerate or near-degenerate emissive ligands with this pseudo-symmetric orientation of TDM vectors to induce HDR values in excess of 0.7 and, more preferably, 0.8.

Host Induced Dopant Alignment:

Because the alignment of an emitter within the EML originates from the differential interaction of the emitter with the EML material and the depositing medium (vacuum, air, inert gas, solvent, etc.), it is expected that the interaction between the host and emitter materials has an effect on the resulting orientation of the emitter TDM vector. Just as electrostatic interactions drive high aspect ratio emitter molecules to lie flat in the EML structure, other strong host-emitter interactions may be used to drive alignment. These interactions may include pi-stacking, hydrogen bonding, use of functional groups with a strong interaction (including polar, non-polar, fluorinated, or alkyl groups which may interact between host/dopant or drive intercalation or segregation effects), donor-acceptor pi-interactions driven by interactions between electron rich and electron poor aromatic moieties.

Optimizing emitter-host interactions to induce dopant alignment may also depend strongly on planarity of the dopant and/or host molecules. Especially in the case where strong pi-stacking interactions lead to alignment, increased planarity of these molecules is expected to result in a stronger interaction and thus a higher degree of alignment. In this case, it is preferential to increase overall planarity of the dopant through judiciously introducing dihedral twisting of pi-planes to increase the number of co-aligned aromatic cycles in the molecule. It may also be desirable to increase the planarity of the host molecule through similar strategies as well as increasing conjugation length, increase charge transfer character in the host, and intra- and inter-molecular hydrogen bonding. These differences in host induced emitter alignment may be measured directly through photoluminescence techniques in emitter:host samples relative to emitter:mCP (where mCP is 1,3-Bis(N-carbazolyl)benzene, a disordered and non-orienting host).

To the extent that underlying layers of the device stack affect the alignment of the host or dopant material near the interface, it may also be preferred to introduce these aligning or templating motifs to the electron blocking layer (EBL) or other underlying layers.

According to an aspect of the present disclosure, a compound is disclosed that has a metal coordination complex structure and the compound is capable of functioning as an emitter in an OLED at room temperature. For the purposes of this description, room temperature refers to a temperature range of 20-25° C. The compound has at least two ligands coordinated to the metal; wherein the compound has a first substituent $R^1$ at one of the ligands' periphery; wherein a first distance is defined as the distance between the metal and one of the atoms in $R^1$ where that atom is the farthest away from the metal among the atoms in $R^1$; wherein the first distance is also longer than any other atom-to-metal distance between the metal and any other atoms in the compound; and wherein when a sphere having a radius r is defined whose center is at the metal and the radius r is the smallest radius that will allow the sphere to enclose all atoms in the compound that are not part of $R^1$, the first distance is longer than the radius r by at least 2.9 Å. 2.9 Å represents the diameter of a phenyl ring. It should be noted that the sphere as defined above does not exclude any of the atoms in $R^1$ from being enclosed in the sphere. As used herein, being enclosed in the sphere means that the atom is located at a distance that is less than or equal to the radius r from the metal.

In some embodiments of the compound, the first distance is longer than the radius r by at least 4.3 Å. In some embodiments of the compound, the first distance is longer than the radius r by at least 7.3 Å.

In some embodiments of the compound, the compound further has a second substituent $R^2$ at one of the ligands' periphery; wherein a second distance is defined as the distance between the metal and one of the atoms in $R^2$ where that atom is the farthest away from the metal among the atoms in $R^2$; and wherein when the radius r is the smallest radius that will allow the sphere to enclose all atoms in the compound that are not part of $R^1$ or $R^2$, the second distance is longer than r by at least 1.5 Å.

In some embodiments of the compound that has the second substituent $R^2$, $R^1$ and $R^2$ are on different ligands. In some embodiments of the compound, the second distance is longer than r by at least 2.9 Å. In some embodiments, the second distance is longer than r by at least 4.3 Å. In some embodiments, the second distance is longer than r by at least 7.3 Å. In some embodiments, the first and second distances are all longer than r by at least 4.3 Å. In some embodiments, the first and second distances are all longer than r by at least 7.3 Å.

In some embodiments of the compound that has the second substituent $R^2$, $R^1$ is attached to an aromatic ring having a first coordination atom, $R^2$ is attached to an aromatic ring having a second coordination atom; and wherein the first coordination atom is in a trans configuration to the second coordination atom relative to the metal.

In some embodiments of the compound, the compound further has a third substituent $R^3$ at one of the ligands' periphery; wherein a third distance is defined as the distance between the metal and one of the atoms in $R^3$ where that atom is the farthest away from the metal among the atoms in $R^3$; and wherein when the radius r is the smallest radius that will allow the sphere to enclose all atoms in the compound that are not part of $R^1$, $R^2$, or $R^3$, the third distance is longer than r by at least 1.5 Å.

In some embodiments of the compound that has the third substituent $R^3$, the substituents $R^1$, $R^2$, and $R^3$ are on different ligands. In some embodiments of the compound, the third distance is longer than r by at least 2.9 Å. In some embodiments, the third distance is longer than r by at least 4.3 Å. In some embodiments, the third distance is longer than r by at least 7.3 Å.

The following Table 1 lists the maximum linear length for various substituent groups defined along their long axis. This maximum linear length is defined as the distance between the two atoms that are the farthest apart along the long axis of the particular substituent group. The listed values can be used to estimate how much a given substituent at one of the ligands' periphery in a coordination complex would extend beyond the radius r of the sphere that would enclose all atoms in the coordination complex that are not part of that particular substituent. For example, in an embodiment of the coordination complex that only has the first substituent $R^1$, the difference between the first distance and the radius r can be estimated using the Table 1 depending on the particular chemical group involved in the first substituent $R^1$. If an embodiment of the coordination complex has additional substituents such as the second and third substituents $R^2$ and $R^3$ at the periphery of one or more of the ligands in the complex, the Table 1 can be used to estimate the difference between the second or the third distances and the radius r by considering the particular substituent groups involved in the substituents $R^2$ or $R^3$. The following Table 1 can be used to calculate the difference between two substituents. For example, if first substituent is phenyl, the second substituent is tolyl, then the second substituent is longer than first substituent by one C—C bond, which is 1.5 Å. In another example, if the second substituent is biphenyl, then the second substituent is longer than the first substituent by C—$C_6H_5$, which is 4.3 Å. Any two or more of the following fragments can be linked together, and its distance can be calculated by simply adding up these numbers plus the total length of the single C—C bond distance used to connect them.

TABLE 1

| The difference between two substituent | The difference in bond length between the two substituents. (Å) |
|---|---|
| C—C | 1.5 |
|  | 2.9 |
|  | 3.0 |
| 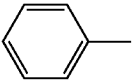 | 4.3 |
| 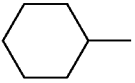 | 4.4 |
| 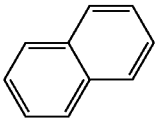 | 5.2 |
| 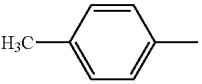 | 5.9 |
| 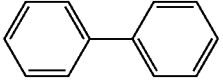 | 7.3 |
| 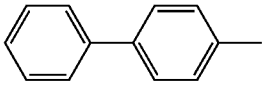 | 8.8 |

TABLE 1-continued

| The difference between two substituent | The difference in bond length between the two substituents. (Å) |
|---|---|
| [biphenyl diyl structure] | 10.3 |
| two C—C | 3.0 |
| [two phenyl + ] | 7.3 |
| [two phenyl + C—C] | 8.8 |
| [biphenyl + phenyl] | 13.1 |
| [biphenyl + biphenyl] | 17.6 |
| [biphenyl + biphenyl longer] | 19.1 |

In some embodiments of the compound that has the third substituent R³, the first, second, and third distances are all longer than r by at least 4.3 Å. In some embodiments, the first, second, and third distances are all longer than r by at least 7.3 Å. In some embodiments, the first, second, and third distances are each independently longer than r by at least one of the distances listed in the Table 1. In some further embodiments, the first, second, and third distances are all longer than r by at least one of the distances listed in the Table 1.

In some embodiments of the compound that has the third substituent R³, the compound has an octahedral coordination geometry with three bidentate ligands, wherein each of the three bidentate ligands having two coordination atoms and a midpoint defined between the two coordination atoms; wherein the three midpoints define a first plane; and wherein each atom in R¹, R², and R³ have a point-to-plane distance less than 5 Å relative to the first plane. A "point-to-plane" distance refers to the shortest distance between a plane and a point that is not in the plane.

In some embodiments of the compound having R³, any atom in R¹, R², and R³ has a point-to-plane distance less than 4 Å relative to the first plane. In some embodiments, any atom in R¹, R², and R³ has a point-to-plane distance less than r relative to the first plane.

In some embodiments of the compound, the compound has a transition dipole moment axis; and wherein an angle between the transition dipole moment axis and an axis along the first distance for R¹, is less than 40°. A "transition dipole moment axis" is an axis along the transition dipole moment. In some embodiments, the angle between the transition dipole moment axis and an axis along the first distance is less than 30°. In some embodiments, the angle between the transition dipole moment axis and an axis along the first distance is less than 20°. In some embodiments, the angle between the transition dipole moment axis and an axis along the first distance is less than 15°. In some embodiments, the angle between the transition dipole moment axis and an axis along the first distance is less than 10°. In some embodiments, the angle between the transition dipole moment axis and an axis along the first distance is less than 35°. In some embodiments, the angle between the transition dipole moment axis and an axis along the first distance is less than 25°. In some embodiments, the angle between the transition dipole moment axis and an axis along the first distance is less than 5°.

In some embodiments of the compound where the first distance for R¹ is significantly longer than the second distance for R² and the third distance for R³ or there is no R² or R³, the free energy difference between emission centered on the three different ligands is considered. In order to compare the free energy of the ligand having R¹, a first homoleptic metal complex formed of ligands that are same as the ligand having R¹ will have a triplet energy that is lower than the triplet energy of a second homoleptic metal complex that is formed of ligands that are any of the other ligands in the compound, by at least 0.02 eV. In other embodiments, the triplet energy of the first homoleptic metal complex is lower than the triplet energy of the second homoleptic metal complex by at least 0.05 eV. In other embodiments, the triplet energy of the first homoleptic metal complex is lower than the triplet energy of the second homoleptic metal complex by at least 0.1 eV. In other embodiments, the triplet energy of the first homoleptic metal complex is lower than the triplet energy of the second homoleptic metal complex by at least 0.15 eV.

In some embodiments of the compound, the substituents R¹, R², and R³ are each independently selected from the group consisting of:

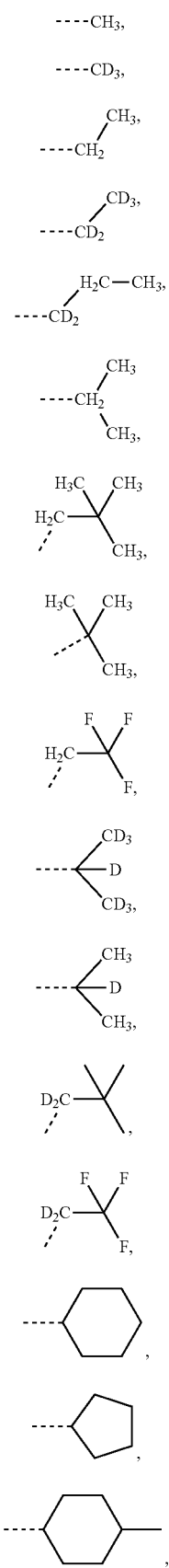

Substituent 1

Substituent 2

Substituent 3

Substituent 4

Substituent 5

Substituent 6

Substituent 7

Substituent 8

Substituent 9

Substituent 10

Substituent 11

Substituent 12

Substituent 13

Substituent 14

Substituent 15

Substituent 16

Subsituent 17

Subsituent 18
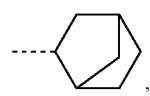

Subsituent 19
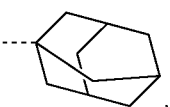

Subsituent 20
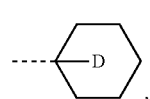

Subsituent 21
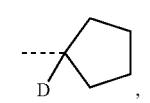

Subsituent 22
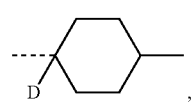

Subsituent 23

Subsituent 24
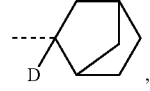

Subsituent 25
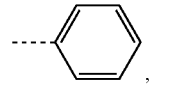

Subsituent 26
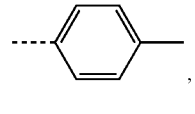

Subsituent 27
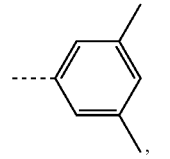

Subsituent 28
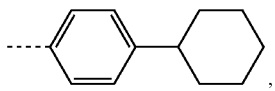

Subsituent 29
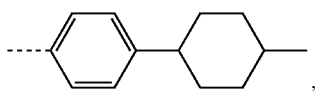

Subsituent 30
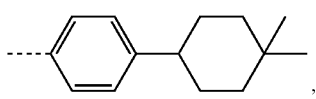

-continued
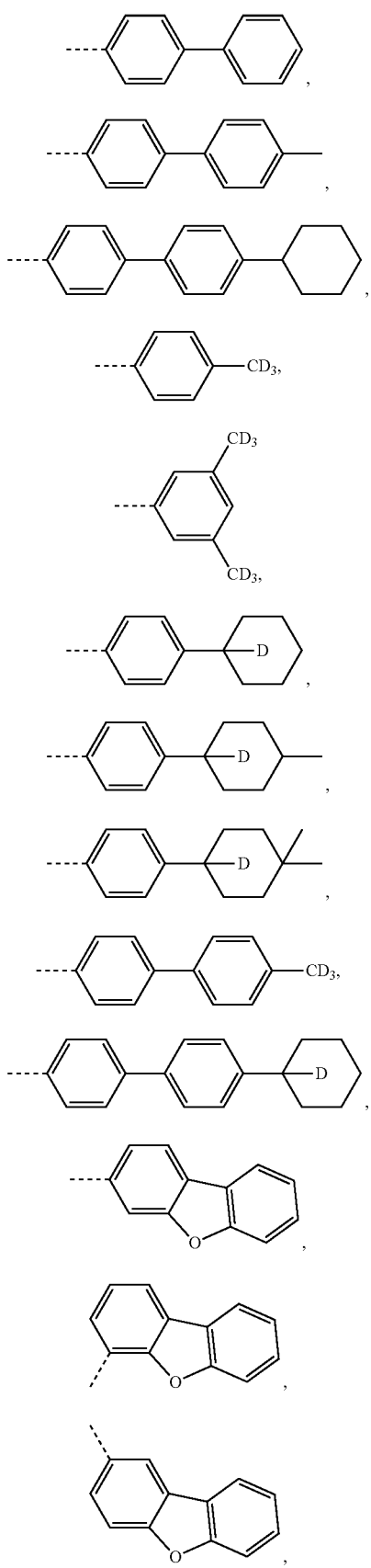
Substituent 31
Substituent 32
Substituent 33
Substituent 34
Substituent 35
Substituent 36
Substituent 37
Substituent 38
Substituent 39
Substituent 40
Substituent 41
Substituent 42
Substituent 43
-continued
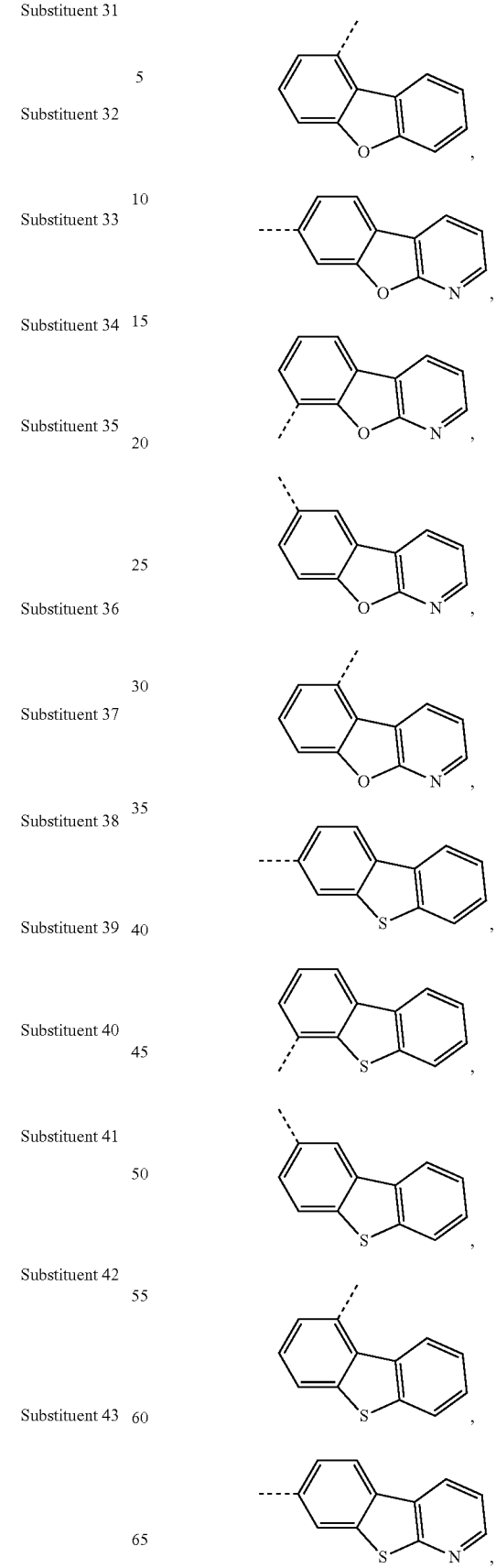
Substituent 44
Substituent 45
Substituent 46
Substituent 47
Substituent 48
Substituent 49
Substituent 50
Substituent 51
Substituent 52
Substituent 53

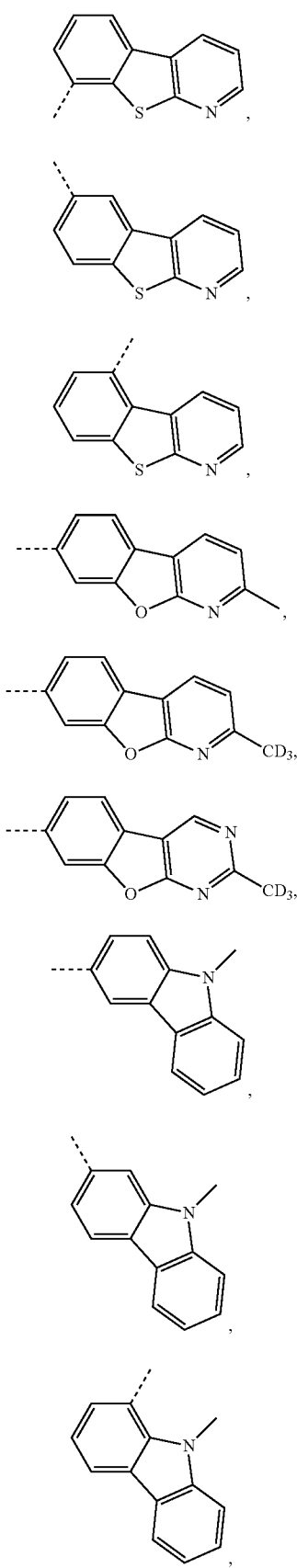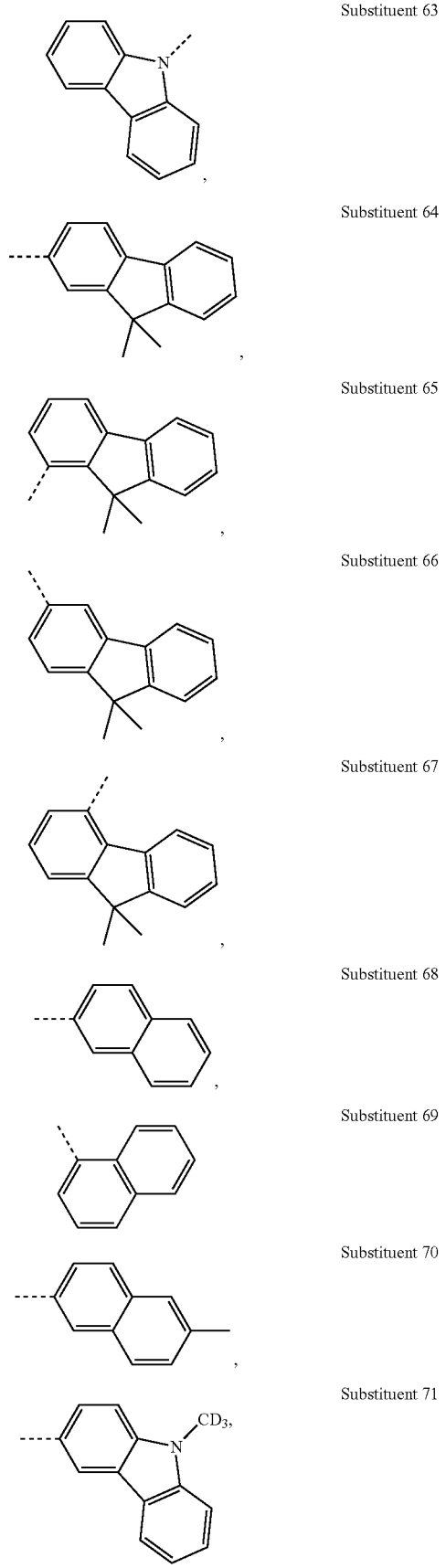

-continued
Substituent 72
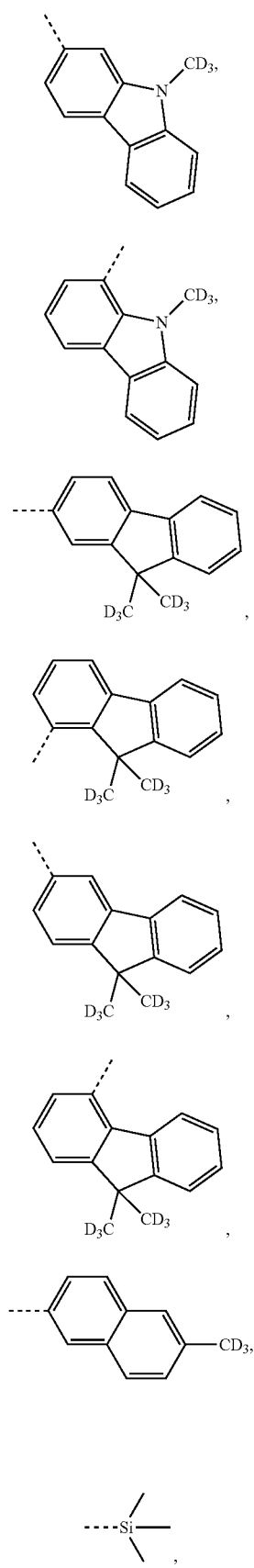
Substituent 73
Substituent 74
Substituent 75
Substituent 76
Substituent 77
Substituent 78
Substituent 79
-continued
Substituent 80
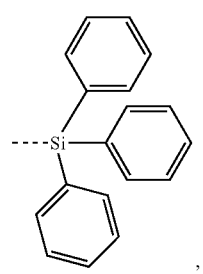
Substituent 81
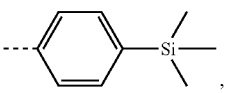
Substiitutent 82
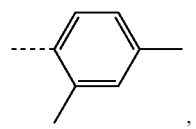
Substiitutent 83
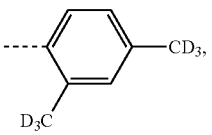
Substiitutent 84
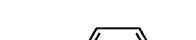
Substiitutent 85
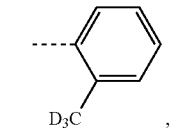
Substiitutent 86
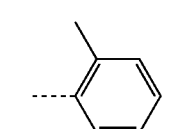
Substiitutent 87
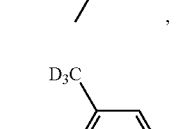
Substiitutent 88
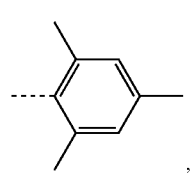

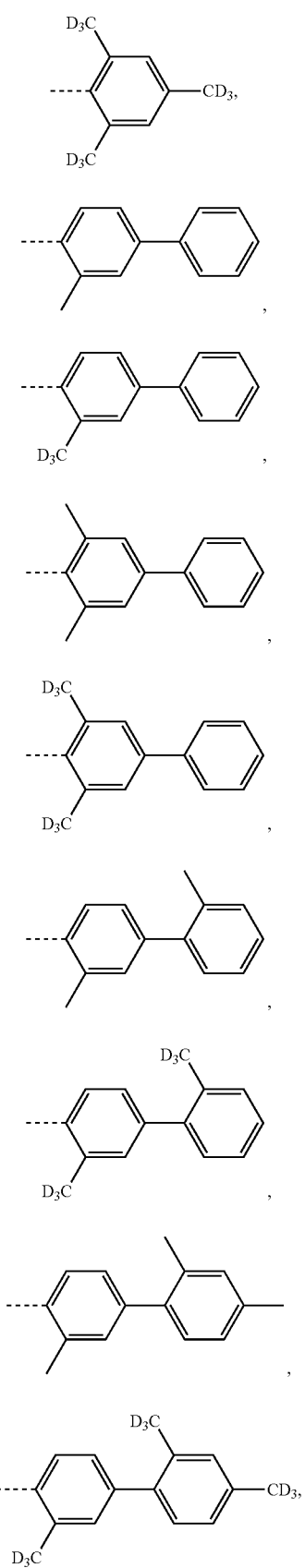
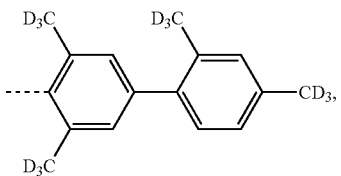
Substituent 98
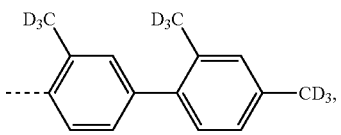
Substituent 99
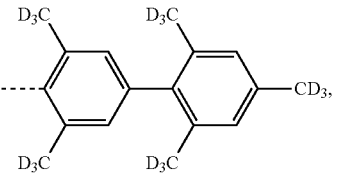
Substituent 100
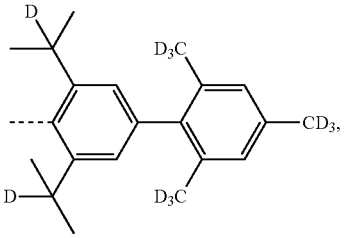
Substituent 101
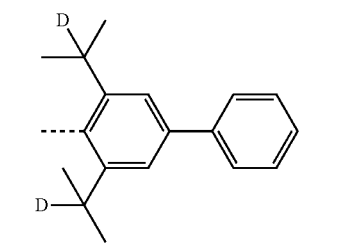
Substituent 102
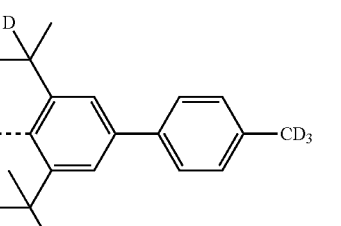
Substituent 103
and
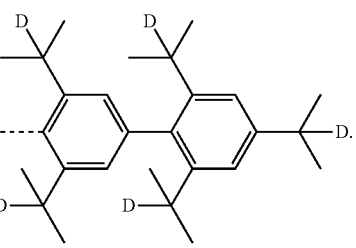
Substituent 104
In some embodiments of the compound, the compound is capable of functioning as a phosphorescent emitter, a fluorescent emitter, or a delayed fluorescent emitter in an organic light emitting device at room temperature.

In some embodiments of the compound, the compound is capable of emitting light from a triplet excited state to a ground singlet state at room temperature.

In some embodiments of the compound, the compound has a metal-carbon bond.

In some embodiments of the compound, the metal is selected from the group consisting of Ir, Rh, Re, Ru, Os, Pt, Pd, Au, Ag, and Cu. In some embodiments, the metal is Ir. In some embodiments, the metal is Pt.

In some embodiments of the compound, the compound has a neutral charge.

In some embodiments of the compound, each ligand in the compound is different from each other.

In some embodiments of the compound, the compound has an octahedral coordination geometry formed by three bidentate ligands, two tridentate ligands, one tetradentate and one bidentate ligands, or one hexadentate ligand.

In some embodiments of the compound, the compound has a tetrahedral coordination geometry formed by two bidentate ligands, or one tetradentate ligand.

In some embodiments of the compound, the compound comprises a first benzene ring coordinated to the metal; and wherein the first benzene ring is fused by a second aromatic ring. In some embodiments, the second aromatic ring is fused by a third aromatic ring. In some embodiments, the third aromatic ring is fused by a fourth aromatic ring.

In some embodiments of the compound, wherein the compound has the formula of $M(L^1)_x(L^2)_y(L^3)_z$;

wherein $L^1$, $L^2$, and $L^3$ can be the same or different;

wherein x is 1, 2, or 3;

wherein y is 0, 1, or 2;

wherein z is 0, 1, or 2;

wherein x+y+z is the oxidation state of the metal M;

wherein $L^1$, $L^2$, and $L^3$ are each independently selected from the group consisting of:

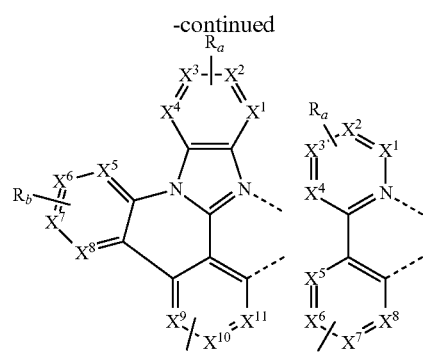
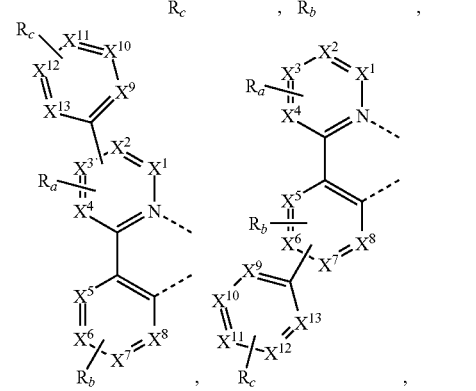
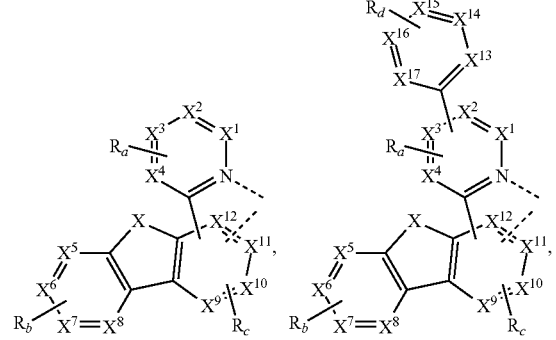
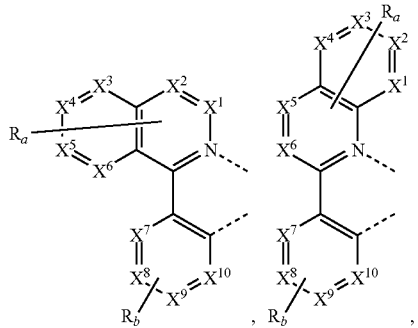
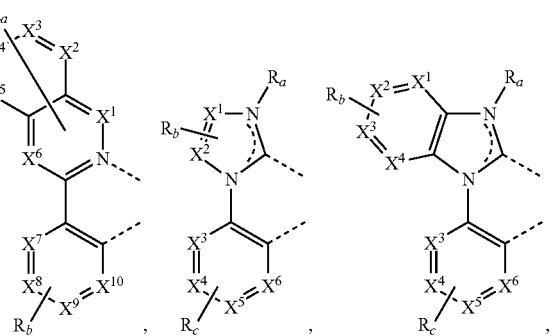
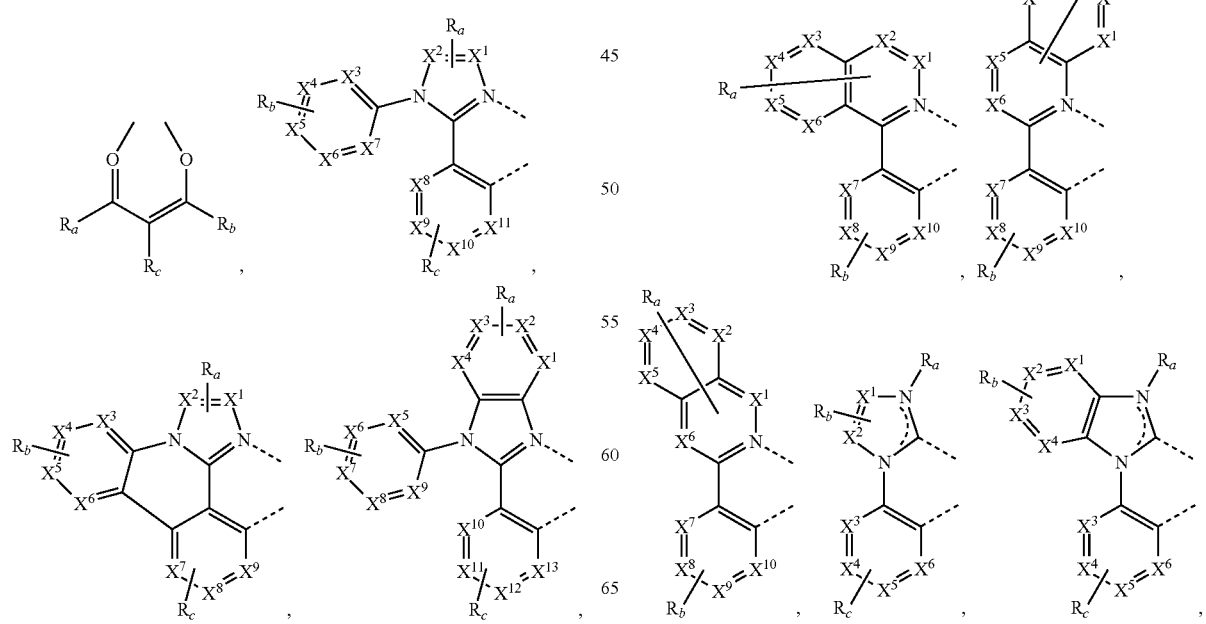

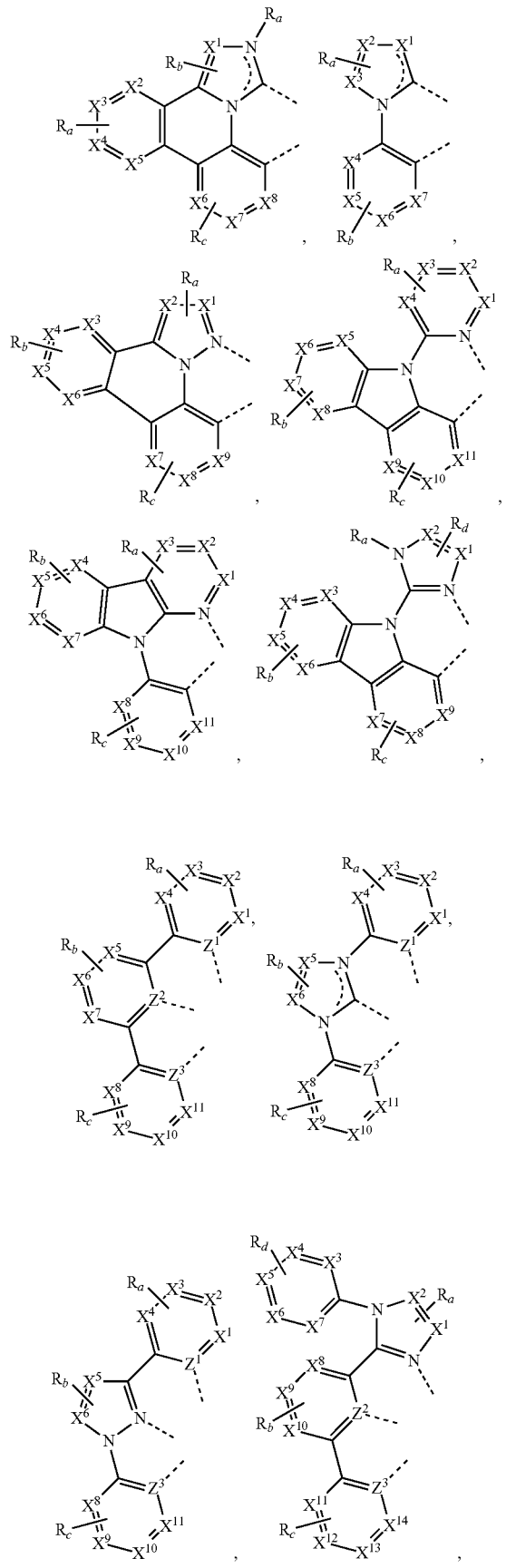
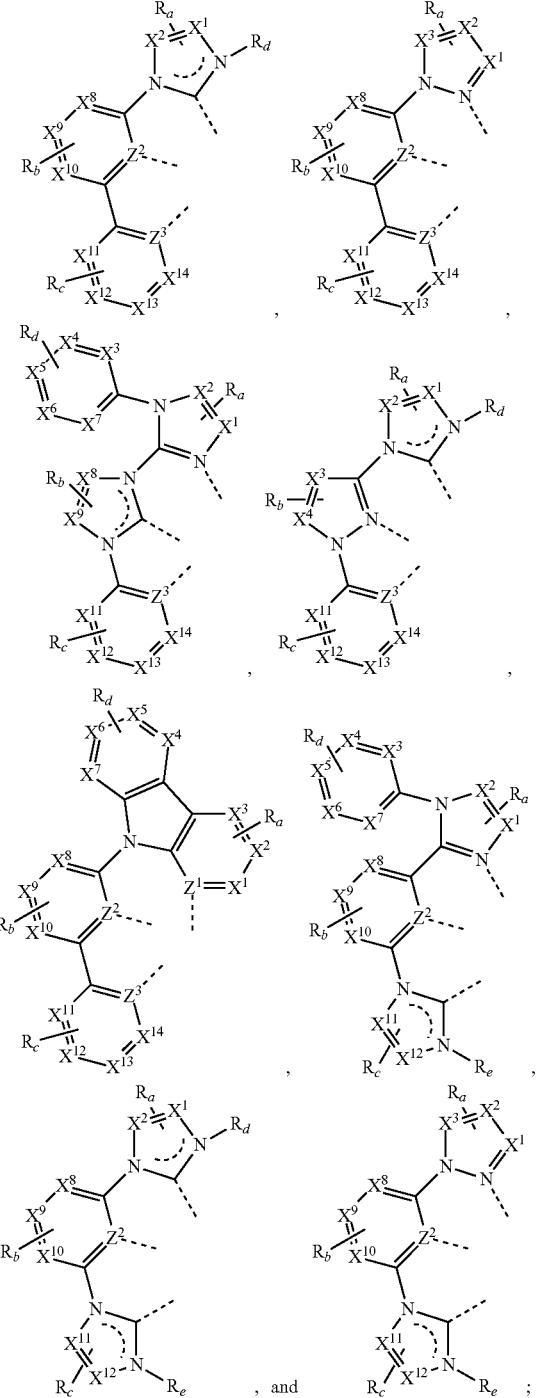

wherein each $X^1$ to $X^{17}$ are independently selected from the group consisting of carbon and nitrogen;

wherein $Z^1$, $Z^2$, and $Z^3$ are each independently a carbon or nitrogen;

wherein X is selected from the group consisting of BR', NR', PR', O, S, Se, C=O, S=O, SO$_2$, CR'R", SiR'R", and GeR'R";

wherein R' and R" are optionally fused or joined to form a ring;

wherein each $R_a$, $R_b$, $R_c$, and $R_d$ may represent from mono substitution to the possible maximum number of substitution, or no substitution;

wherein R', R'', $R_a$, $R_b$, $R_c$, $R_d$, $R_e$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and wherein any two $R_a$, $R_b$, $R_e$, and $R_d$ are optionally fused or joined to form a ring or form a multidentate ligand; and wherein at least one of the $R_a$, $R_b$, $R_e$, and $R_d$ includes $R^1$.

In some embodiments of the compound having the formula of $M(L^1)_x(L^2)_y(L^3)_z$, at least one pair of substituents $R_a$, $R_b$, $R_c$, and $R_d$ within the same ring are joined and fused into a ring.

In some embodiments of the compound having the formula of $M(L^1)_x(L^2)_y(L^3)_z$, at least one pair of substituents $R_a$, $R_b$, $R_c$, and $R_d$ between two nearby rings are joined and fused into a ring.

In some embodiments of the compound having the formula of $M(L^1)_x(L^2)_y(L^3)_z$, the compound has the formula of $Ir(L^1)_2(L^2)$.

In some embodiments of the compound having the formula of $Ir(L)_2(L^2)$, $L^1$ has the formula selected from the group consisting of:

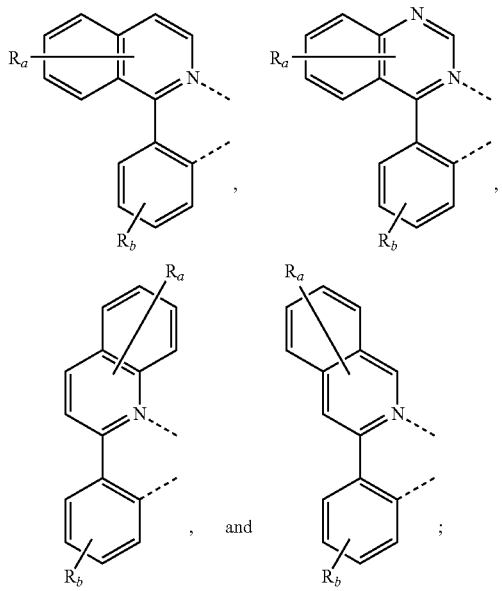

and wherein $L^2$ has the formula:

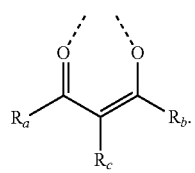

In some embodiments, $L^2$ has the formula:

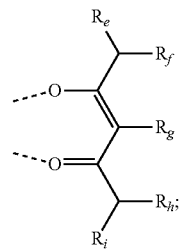

wherein $R_e$, $R_f$, $R_h$, and $R_i$ are independently selected from group consisting of alkyl, cycloalkyl, aryl, and heteroaryl;

wherein at least one of $R_e$, $R_f$, $R_h$, and $R_i$ has at least two carbon atoms; and wherein $R_g$ is selected from group consisting of hydrogen, deuterium, halogen, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acid, ester, nitrile, isonitrile, sulfanyl, sulfinyl, sulfonyl, phosphino, and combinations thereof.

In some embodiments of the compound having the formula of $M(L^1)_x(L^2)_y(L^3)_z$, the compound has the formula selected from the group consisting of $Ir(L^1)(L^2)(L^3)$, $Ir(L^1)_2(L^2)$, and $Ir(L^1)_3$;

wherein $L^1$, $L^2$, and $L^3$ are different and each independently selected from the group consisting of:

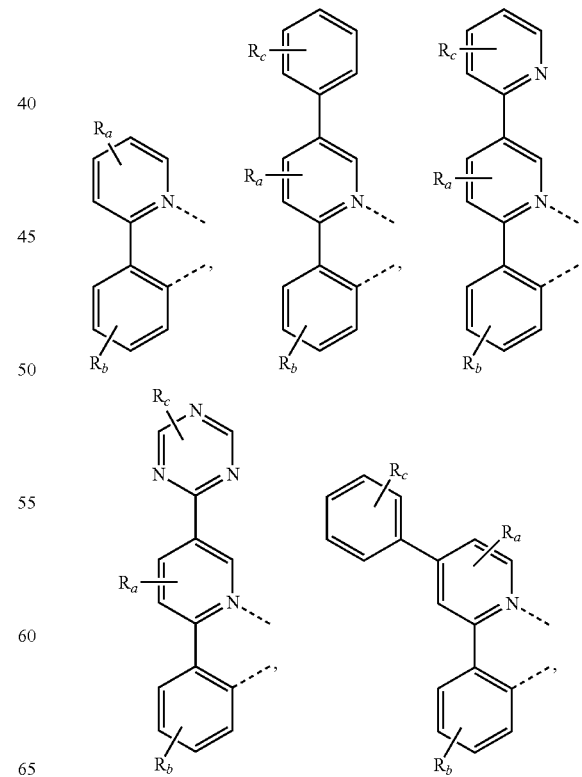

-continued
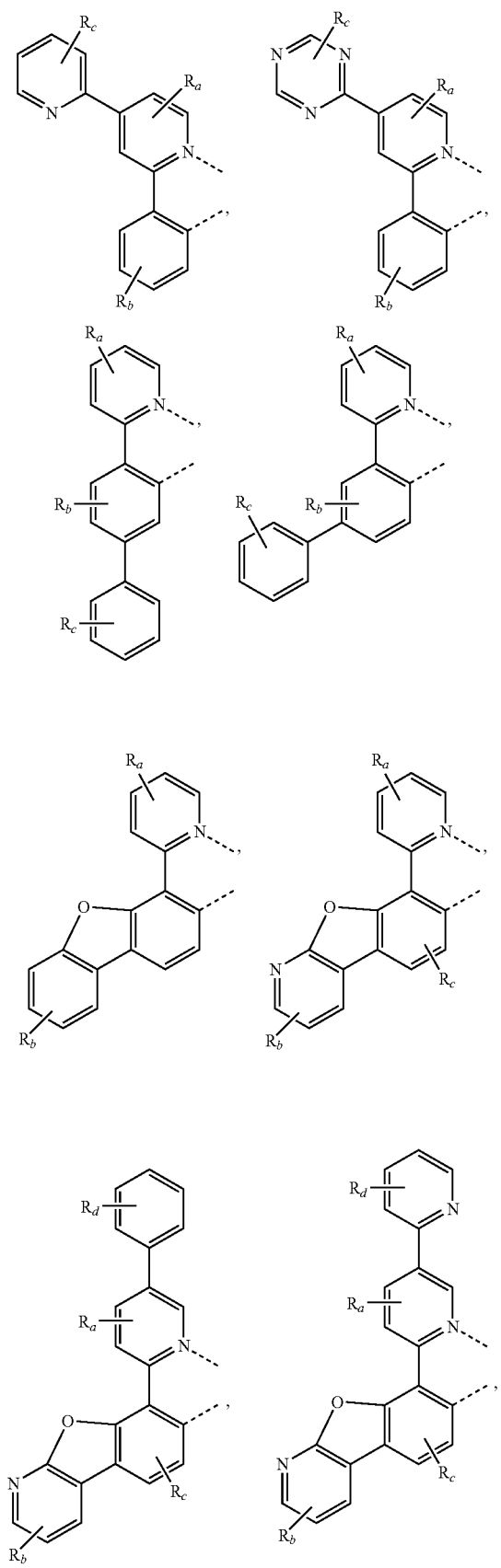
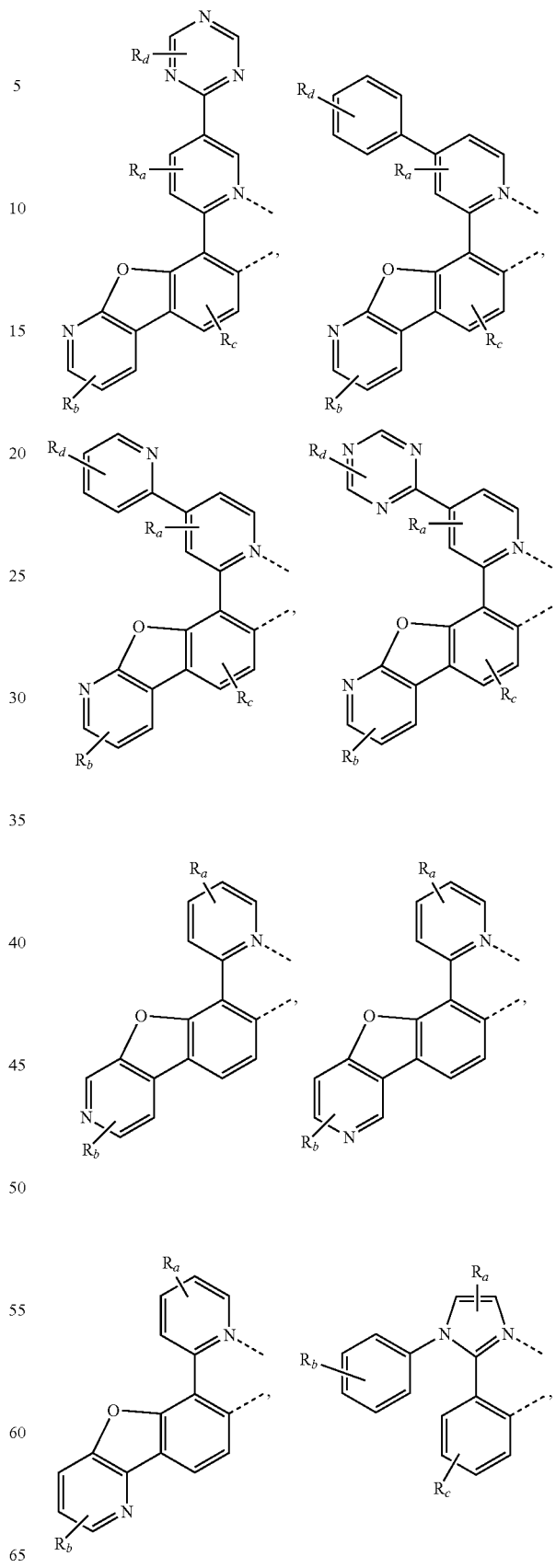

-continued

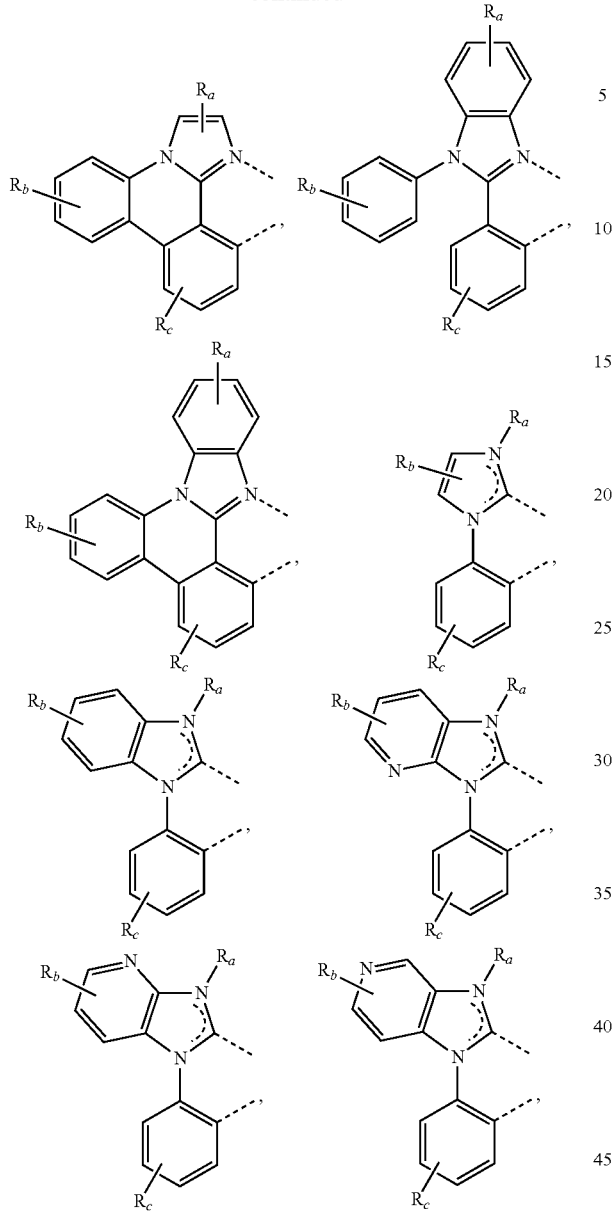

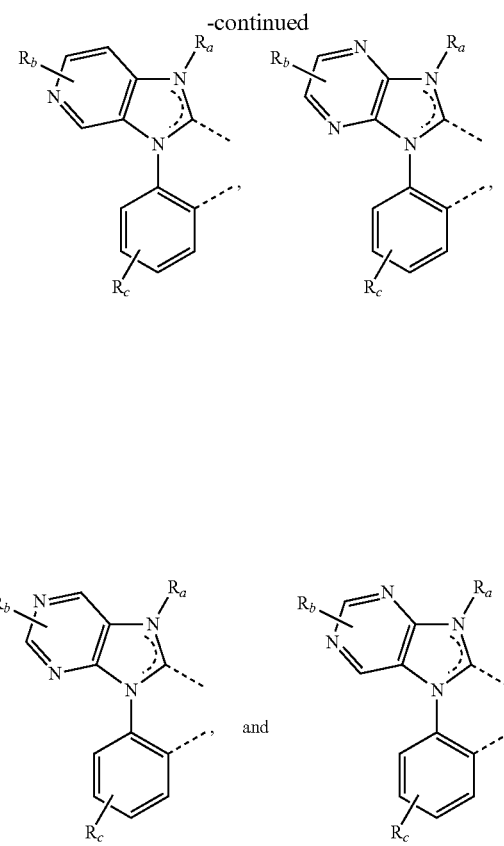

In some embodiments of the compound having the formula of $M(L^1)_x(L^2)_y(L^3)_z$, the compound has the formula of $Pt(L^1)_2$ or $Pt(L^1)(L^2)$. In some embodiments, $L^1$ is connected to the other $L^1$ or $L^2$ to form a tetradentate ligand.

In some embodiments of the compound having the formula of $M(L^1)_x(L^2)_y(L^3)_z$, the compound has the formula of $M(L)_2$ or $M(L^1)(L^2)$; wherein M is Ir, Rh, Re, Ru, or Os; and wherein $L^1$ and $L^2$ are each a different tridentate ligand.

In some embodiments of the compound, the compound is selected from the group consisting of:

Compound 1

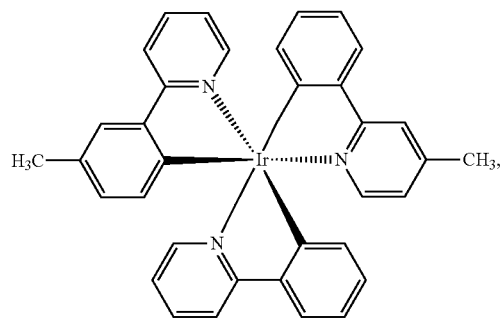

Compound 2

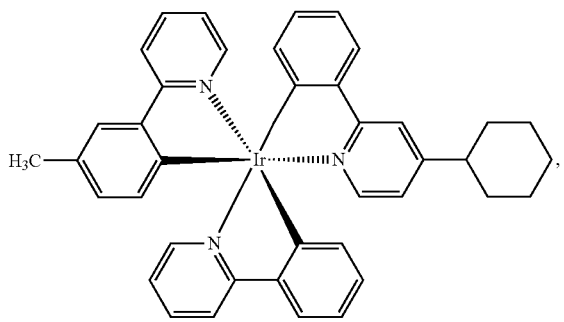

-continued
Compound 3
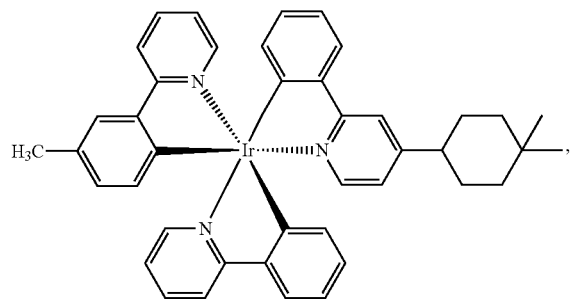
Compound 4
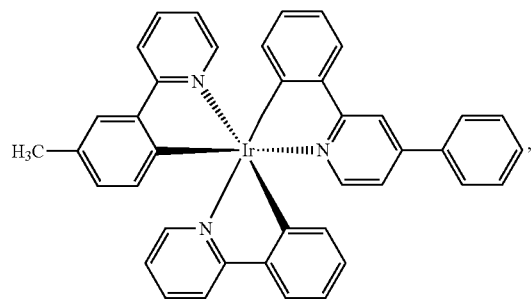
Compound 5
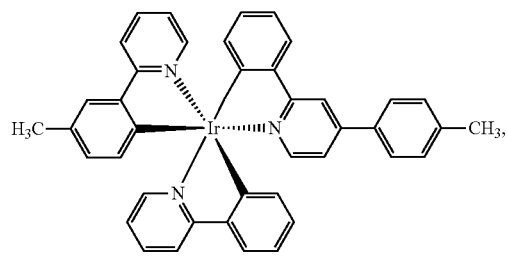
Compound 6
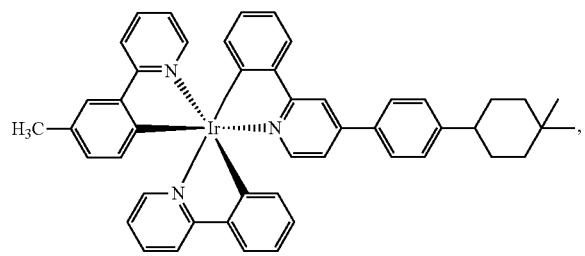
Compound 7
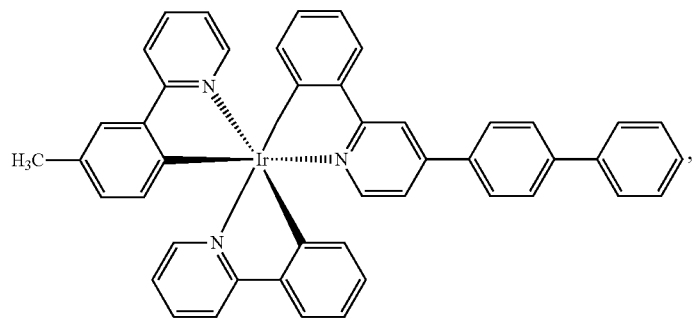
Compound 8
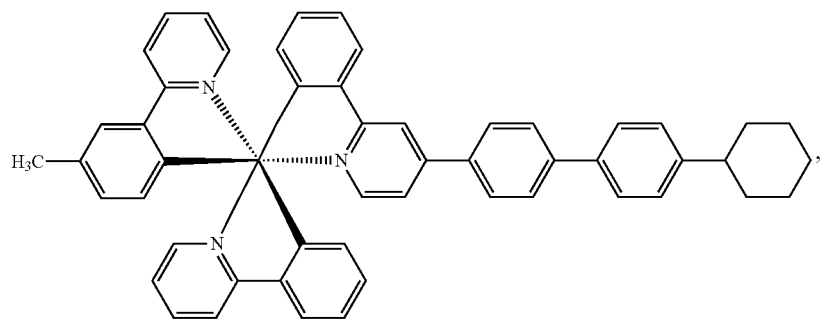
Compound 9
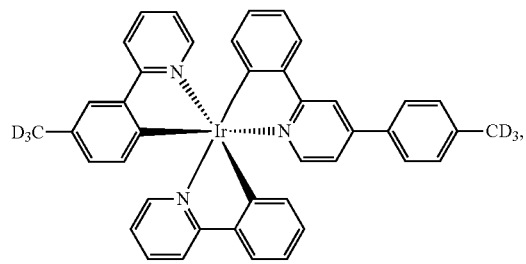
Compound 10
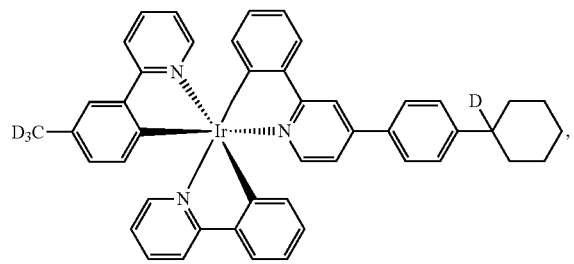

-continued
Compound 11
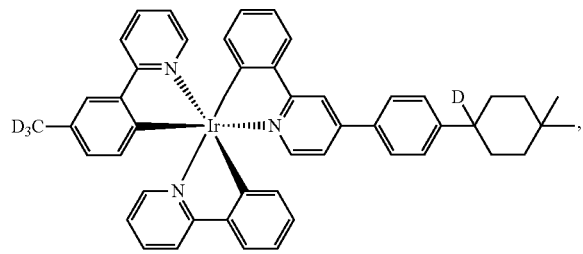
Compound 12
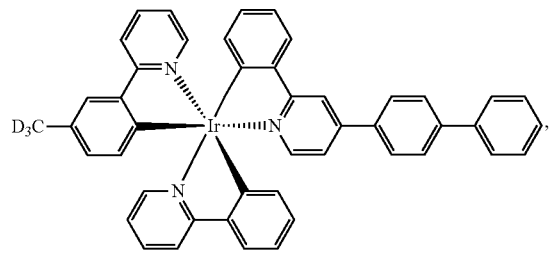
Compound 13
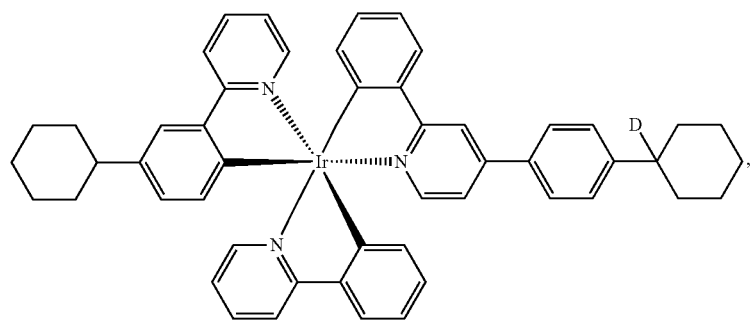
Compound 14
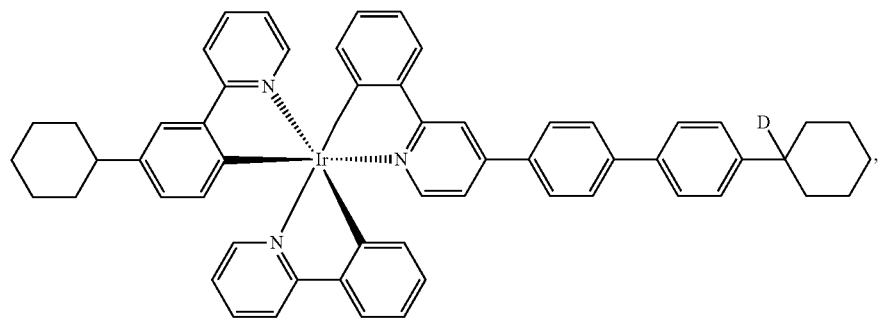
Compound 15
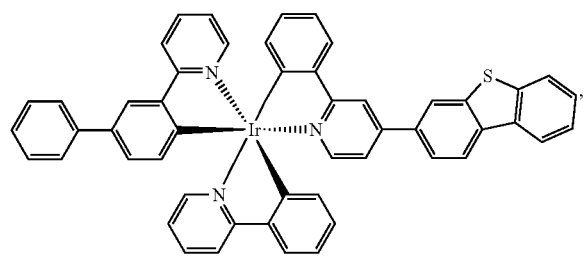
Compound 16
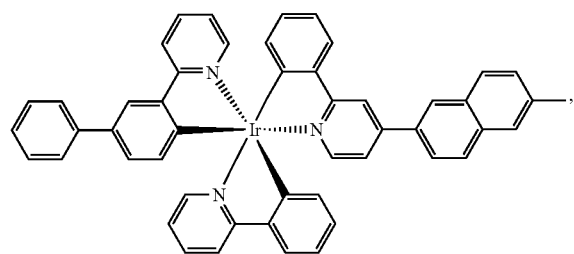
Compound 17
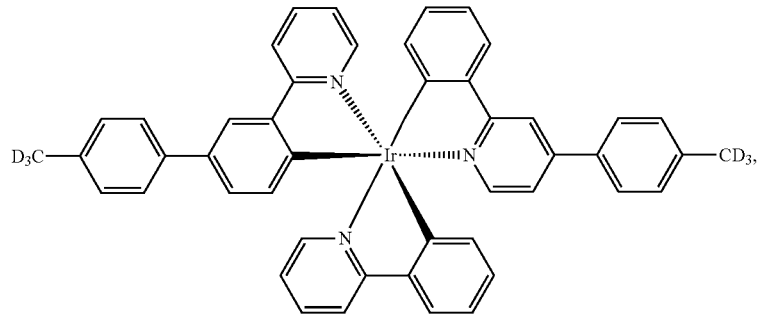

-continued
Compound 18
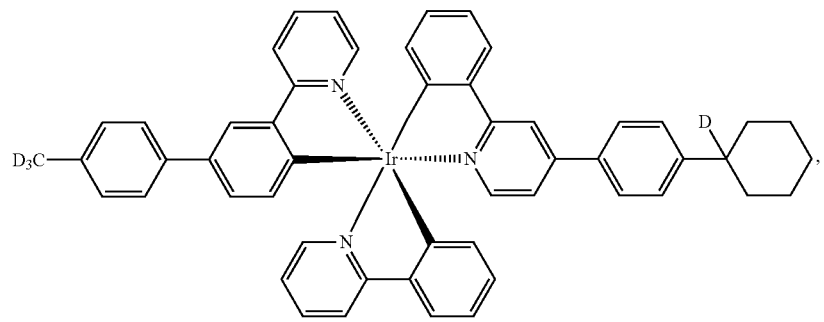
Compound 19
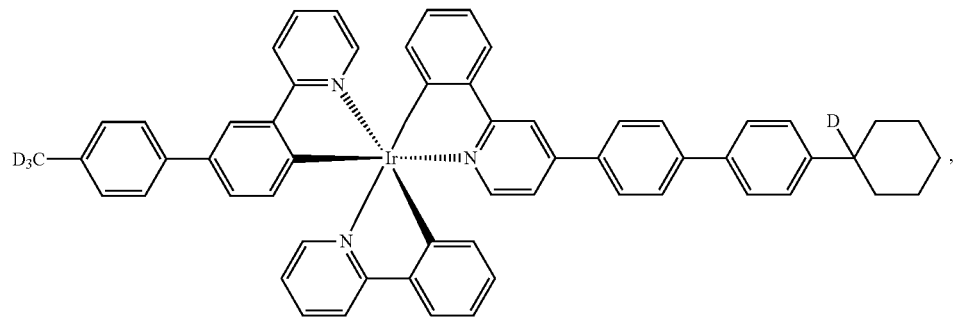
Compound 20
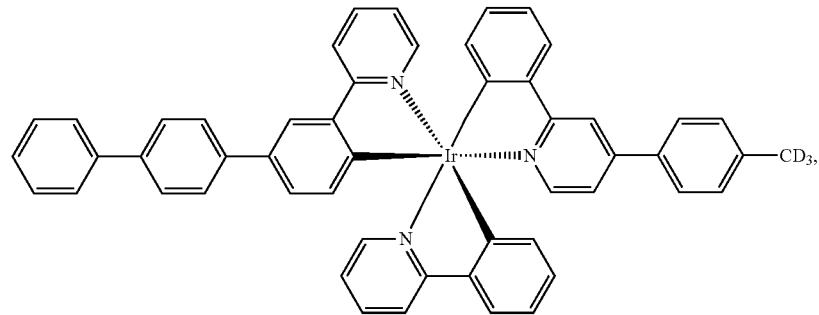
Compound 21
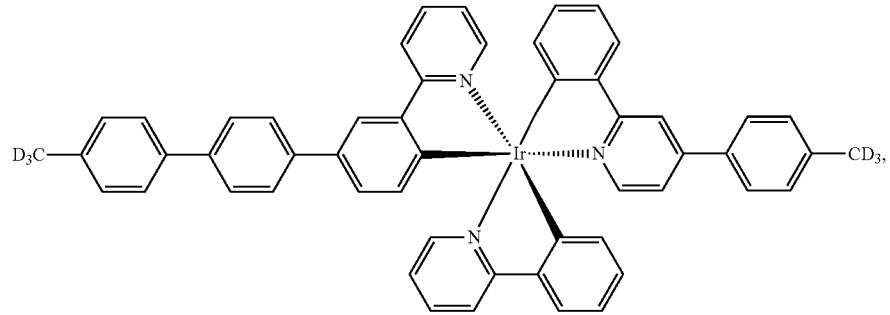
Compound 22
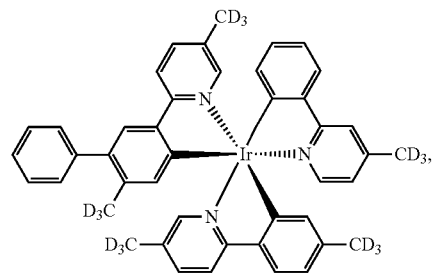
Compound 23
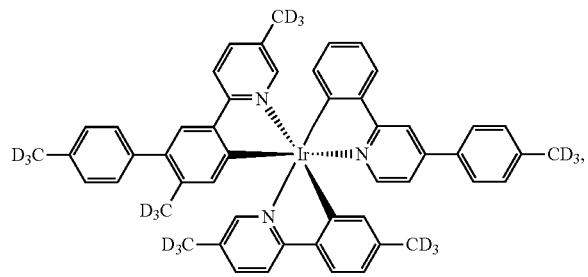

-continued
Compound 24
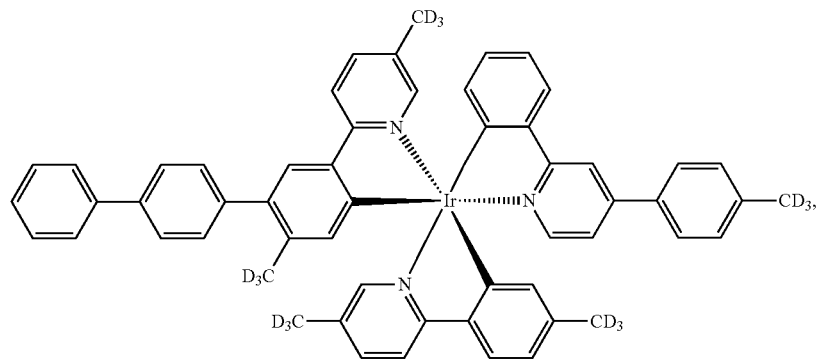
Compound 25
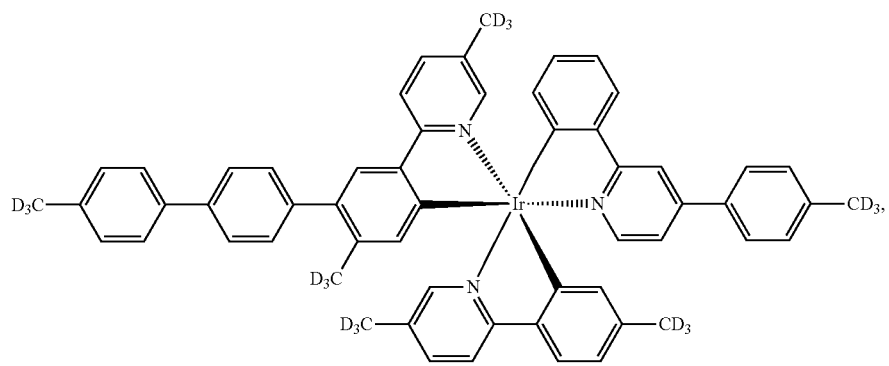
Compound 26
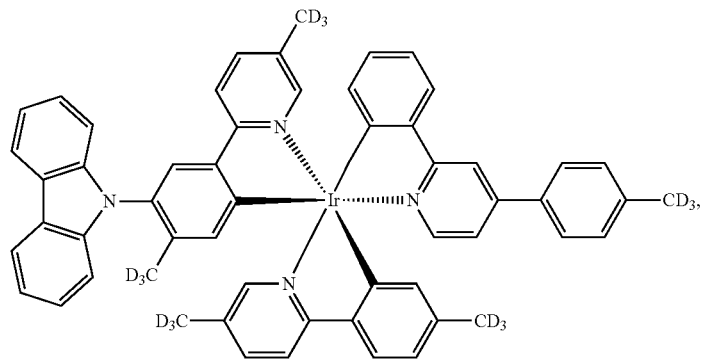
Compound 27
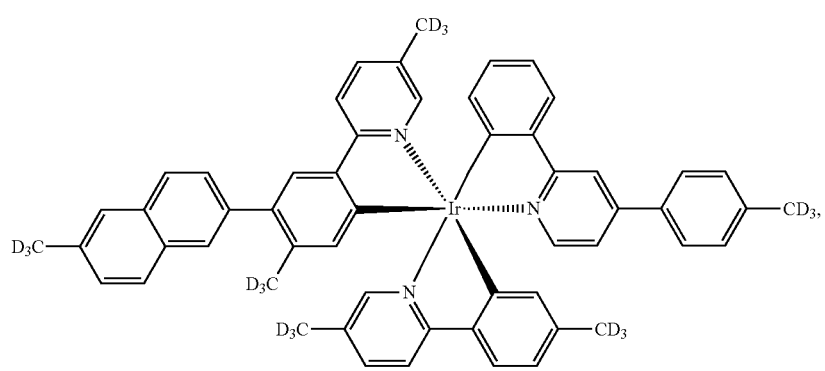

Compound 28
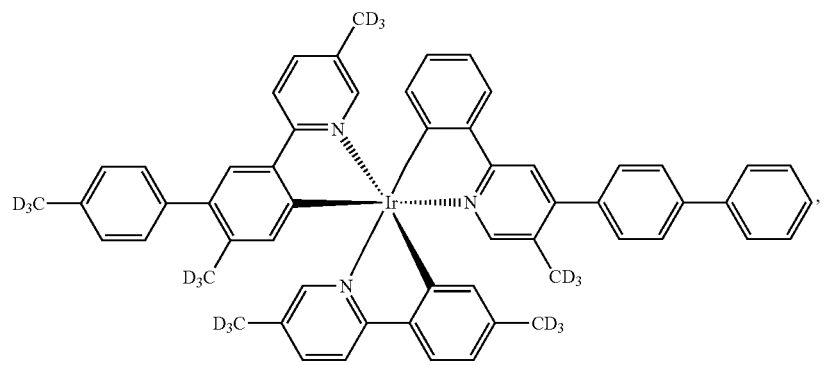
Compound 29
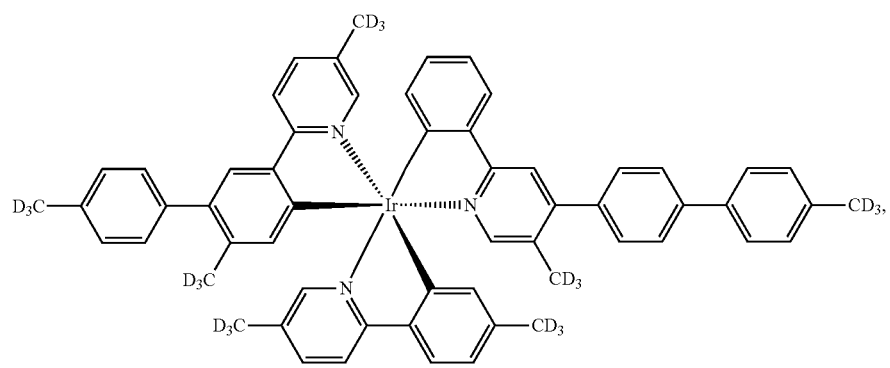
Compound 30
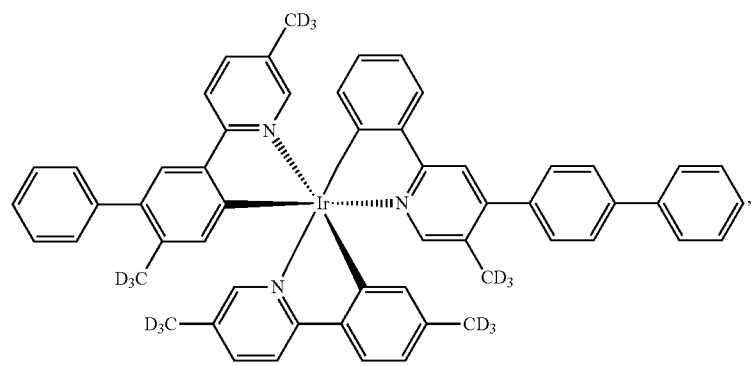
Compound 31
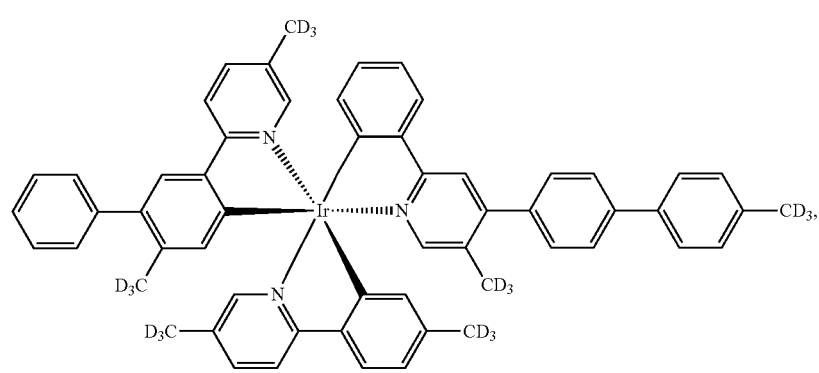

Compound 32
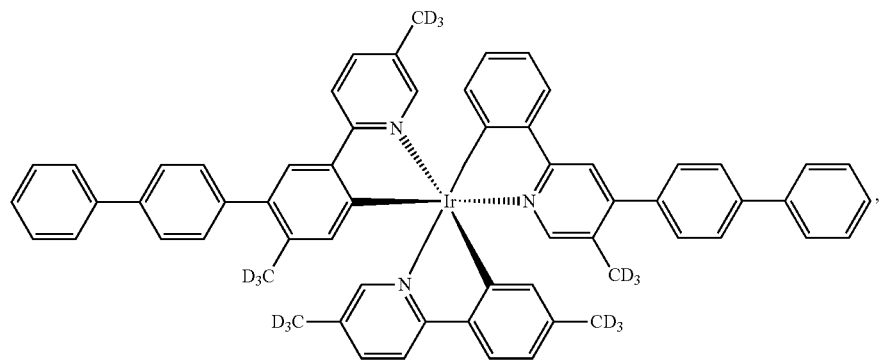
Compound 33
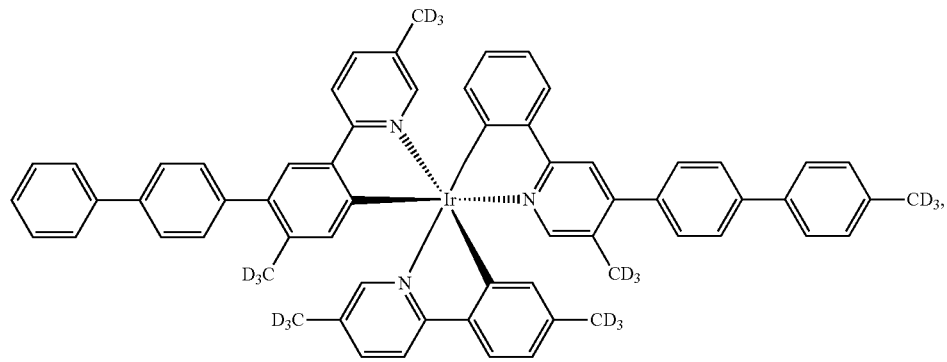
Compound 34
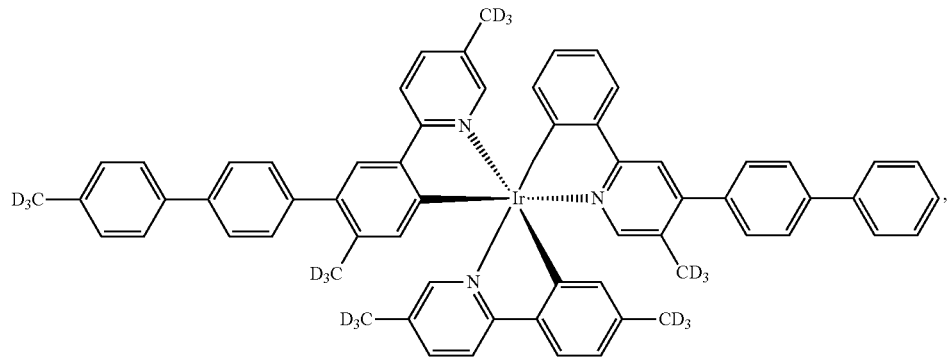
Compound 35
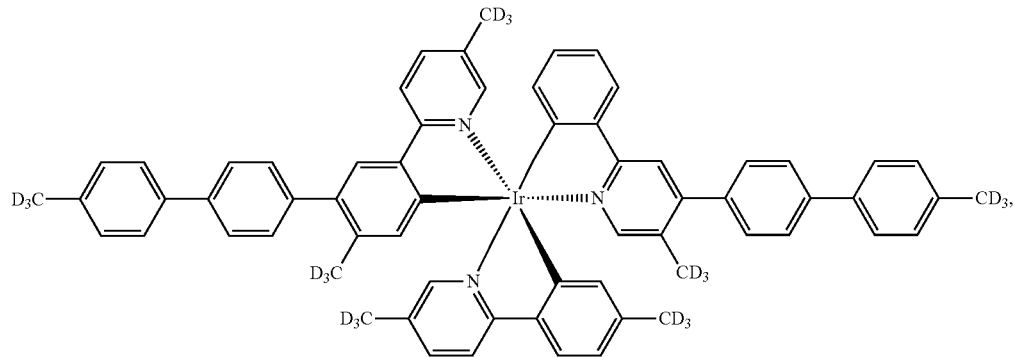

Compound 36
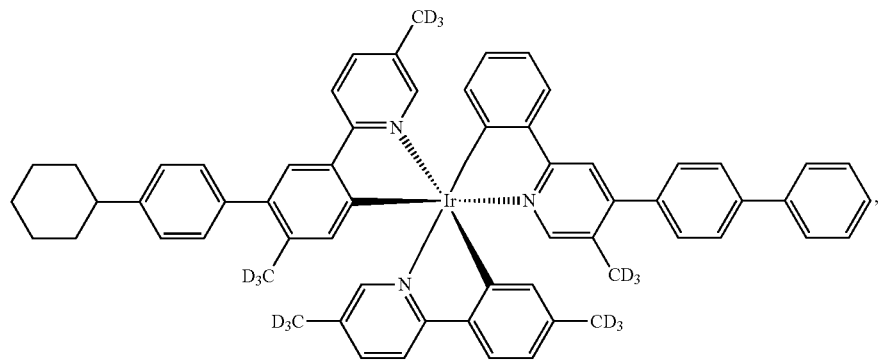
Compound 37
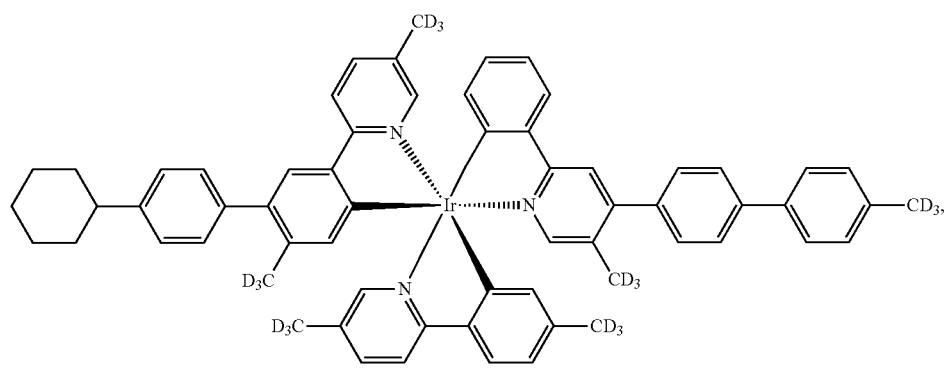
Compound 38
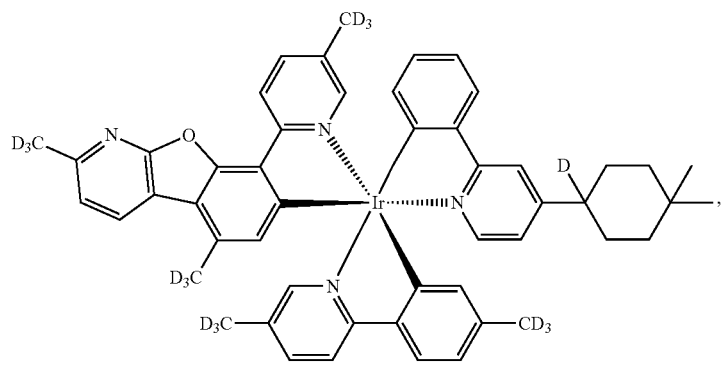
Compound 39
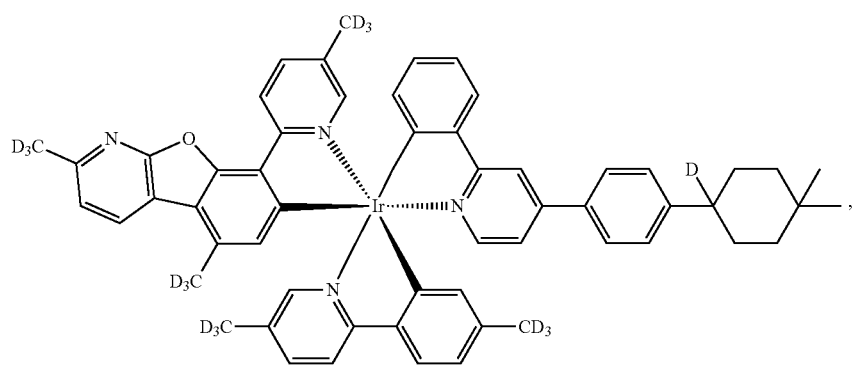

-continued
Compound 40
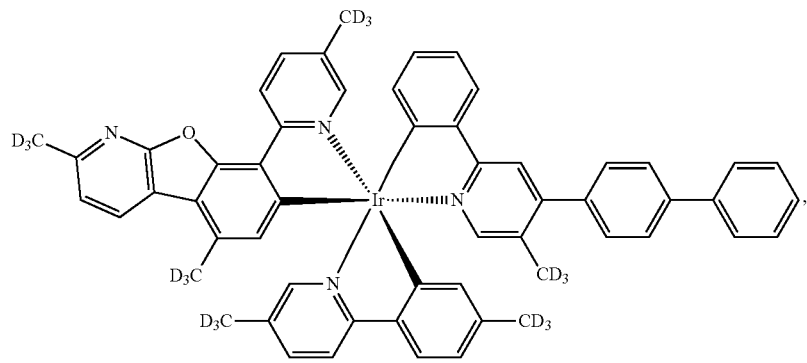
Compound 41
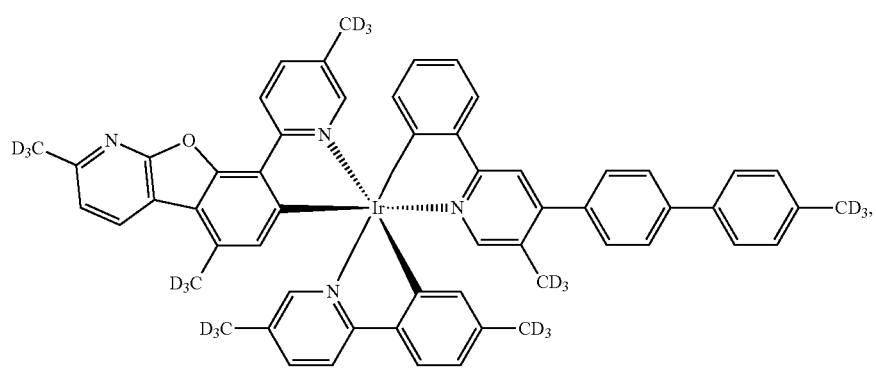
Compound 42
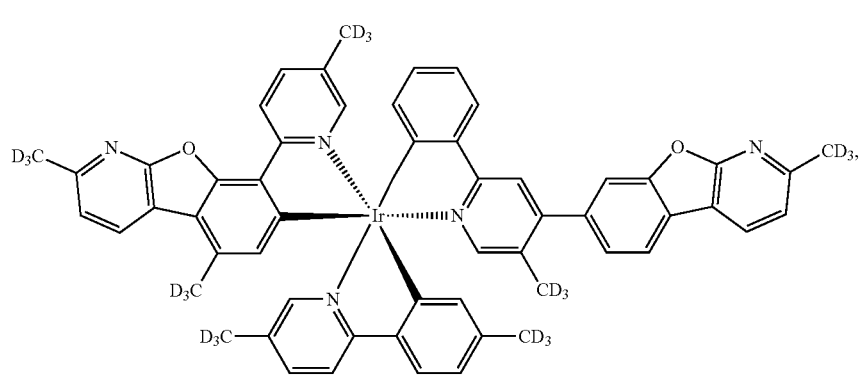
Compound 43
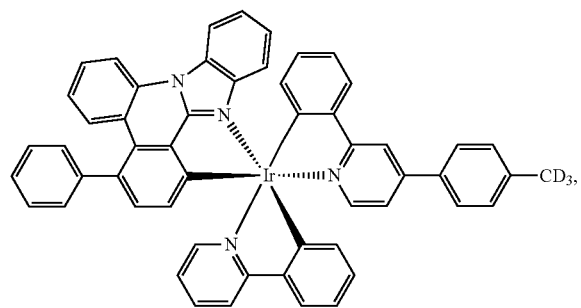
Compound 44
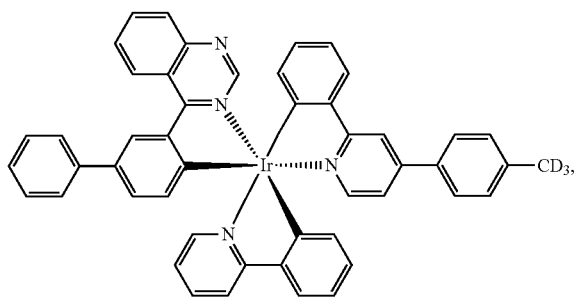

Compound 45
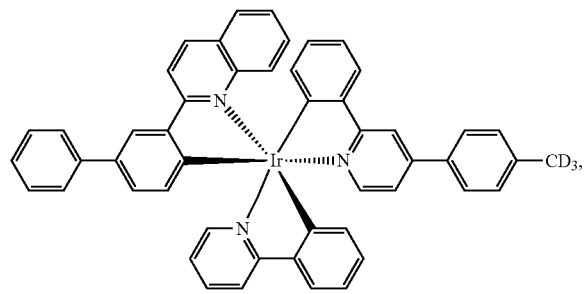
Compound 46
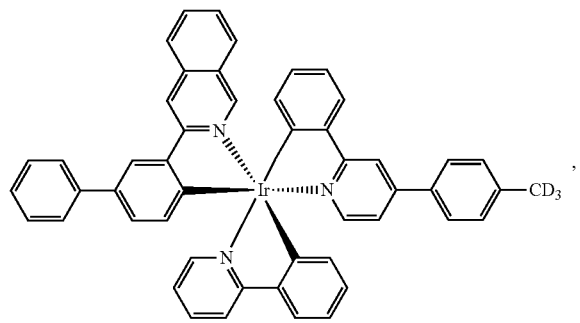
Compound 47
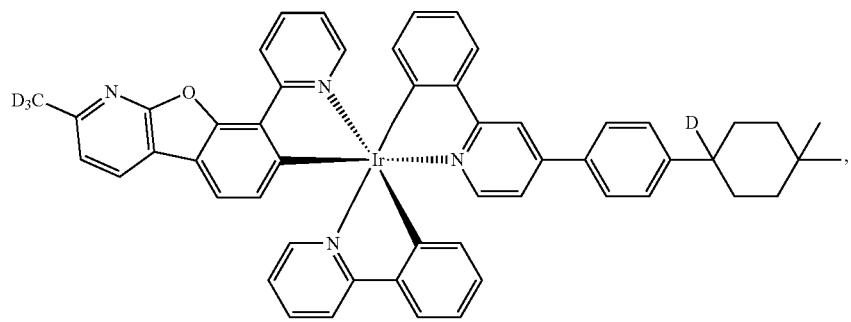
Compound 48
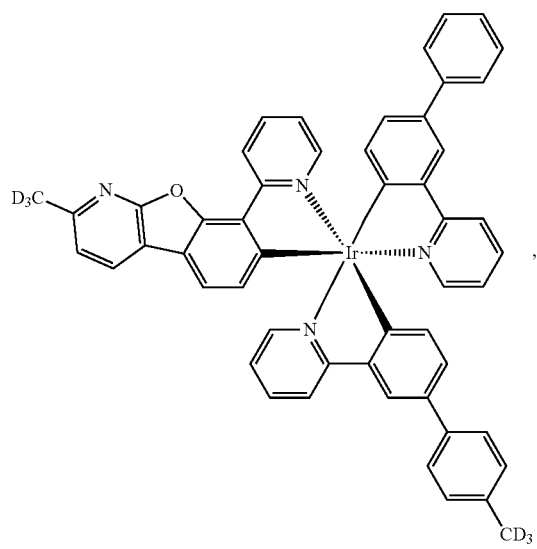
Compound 49
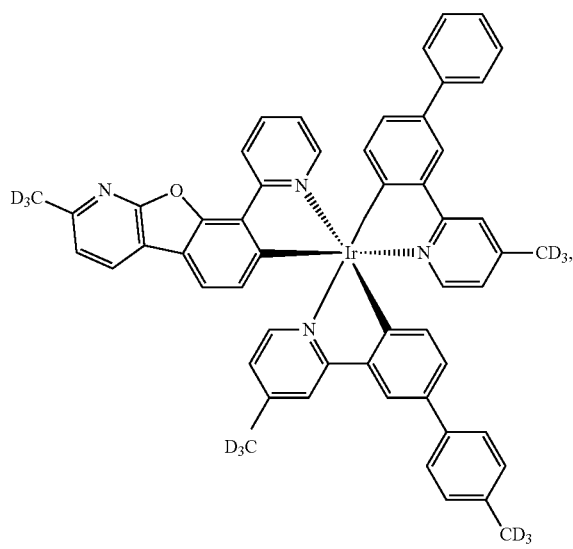

Compound 50
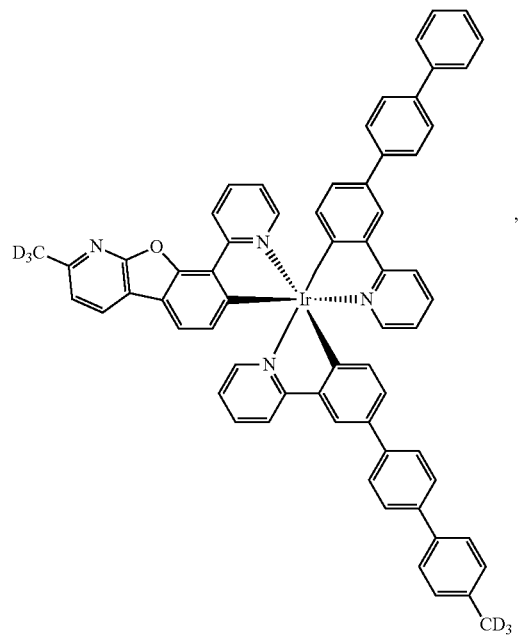
Compound 51
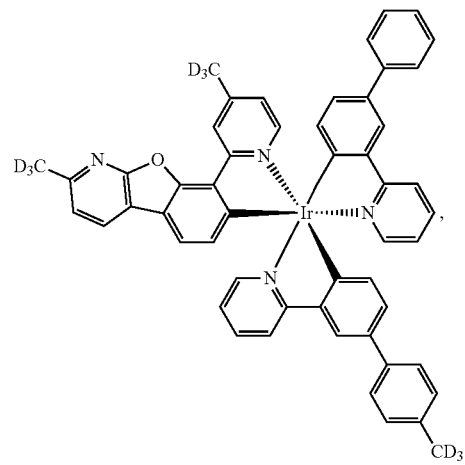
Compound 52
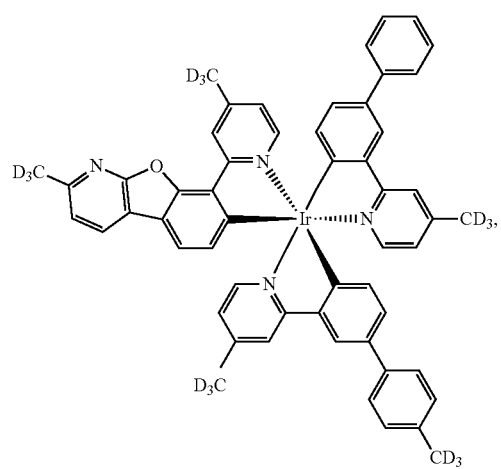
Compound 53
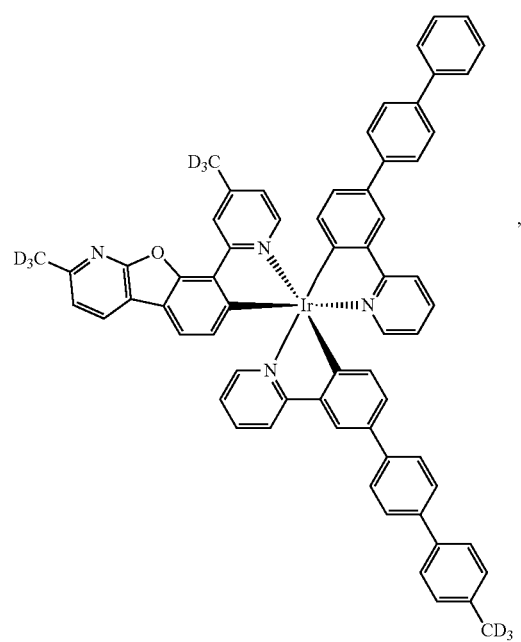

-continued
Compound 54
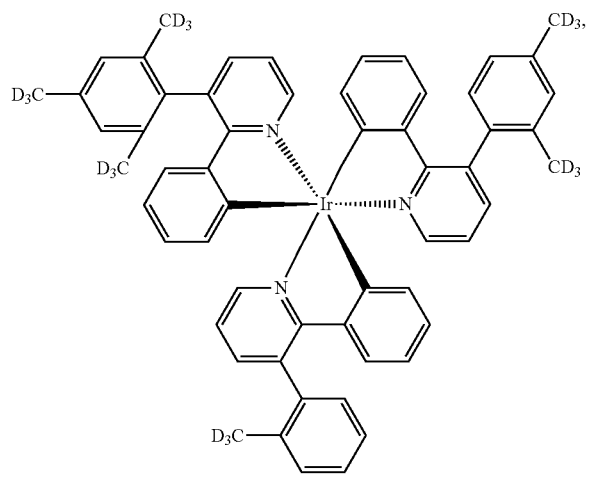
Compound 55
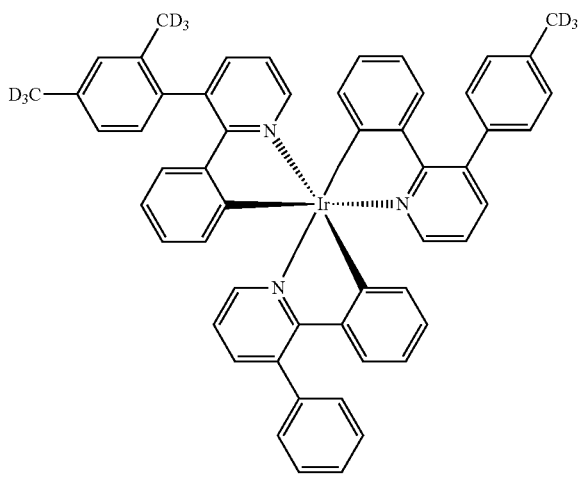
Compound 56
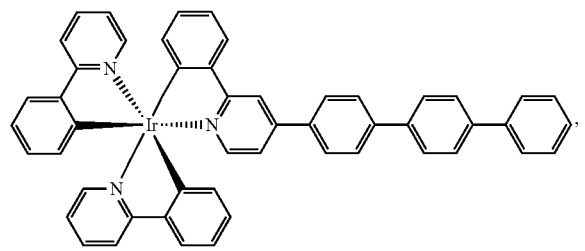
Compound 57
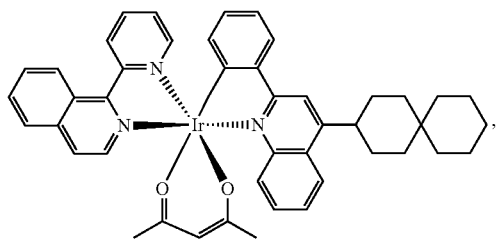
Compound 58
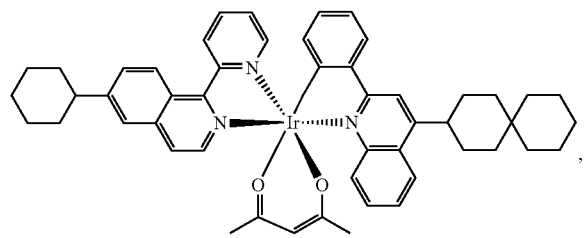
Compound 59
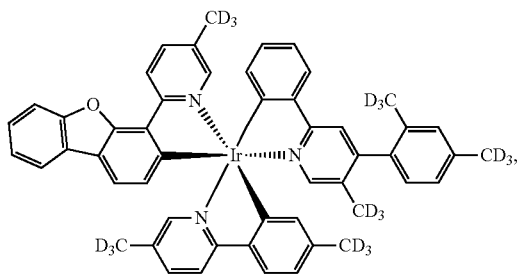
Compound 60
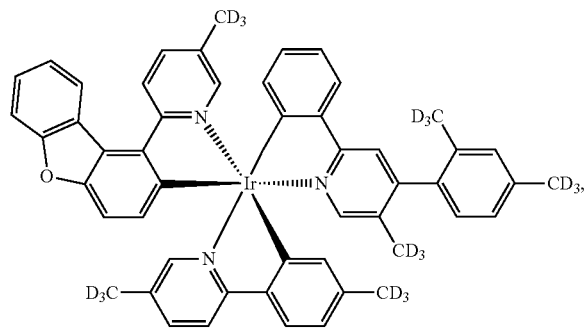
Compound 61
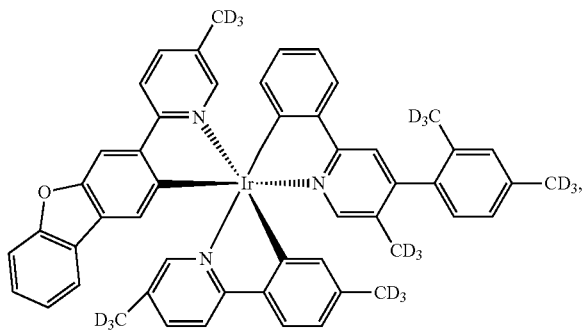

Compound 62
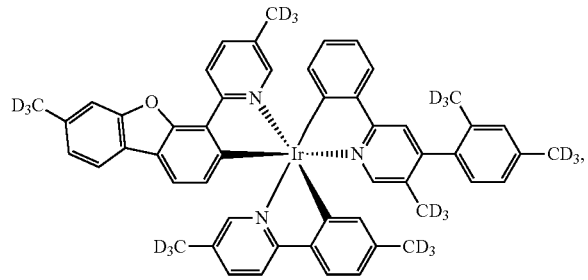
Compound 63
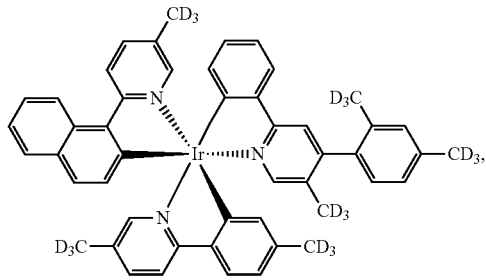
Compound 64
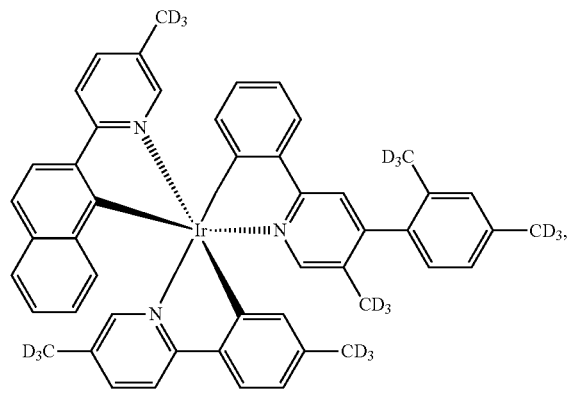
Compound 65
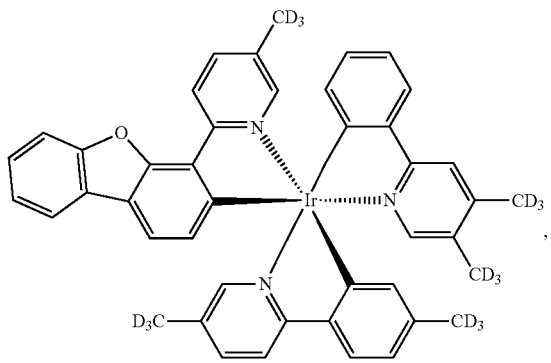
Compound 66
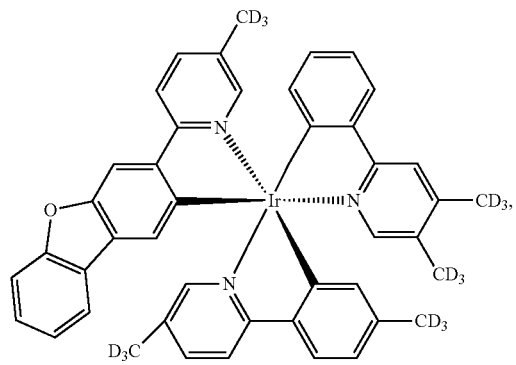
Compound 67
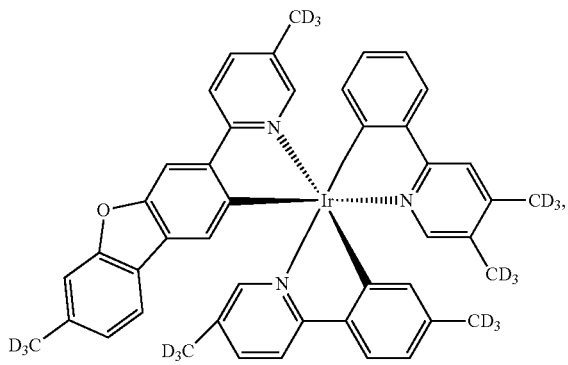
Compound 68
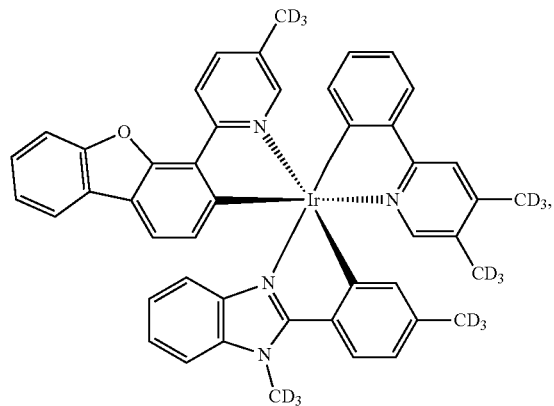
Compound 69
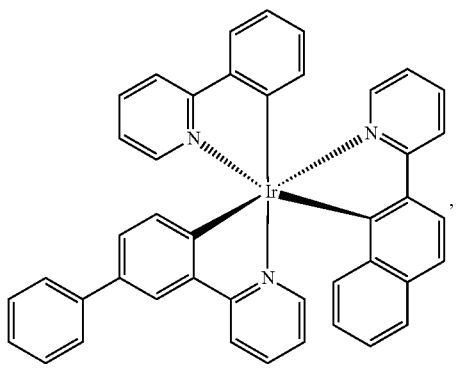

Compound 70
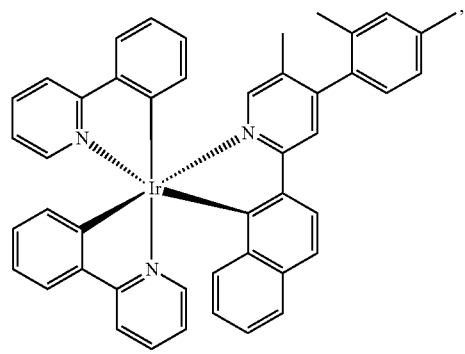
Compound 71
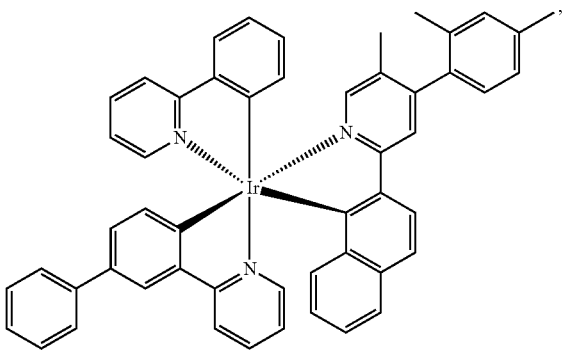
Compound 72
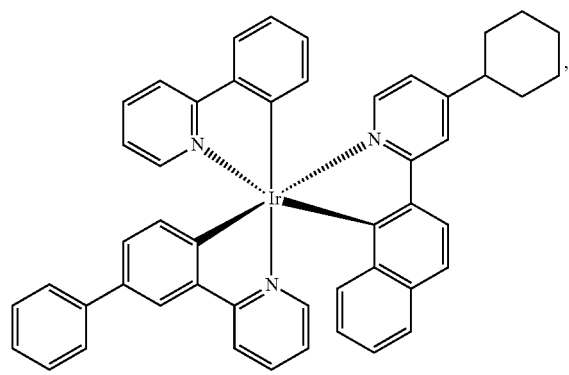
Compound 73
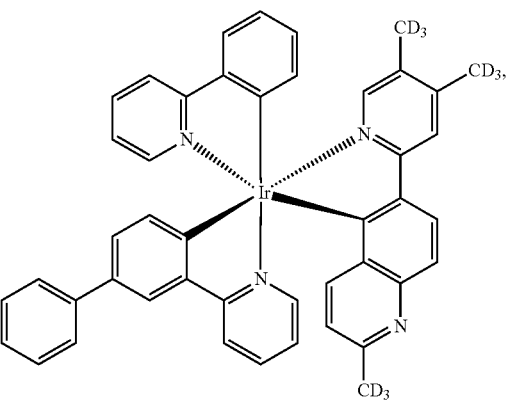
Compound 74
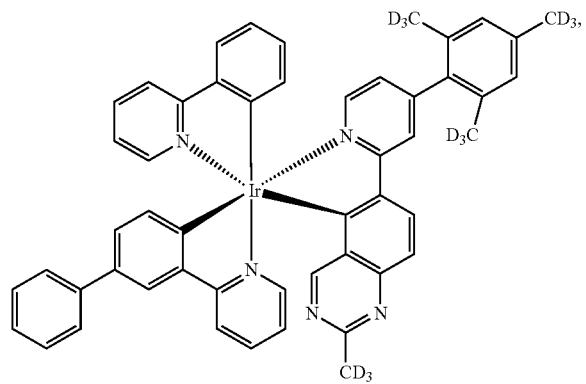
Compound 75
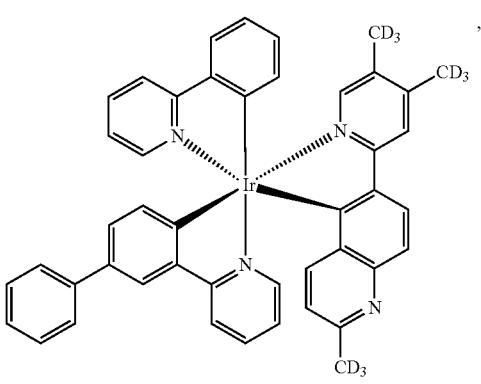
Compound 76
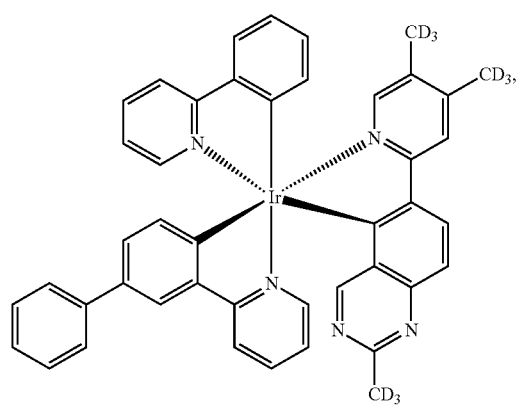

-continued
Compound 77
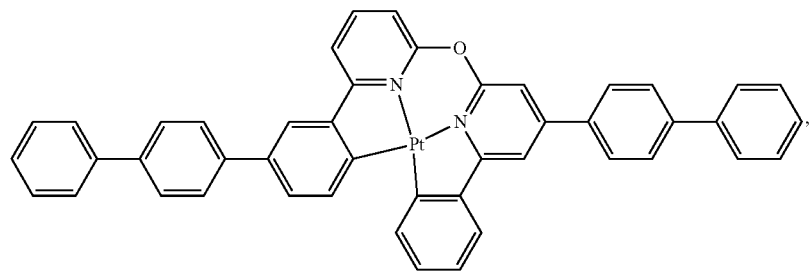
Compound 78
Compound 79
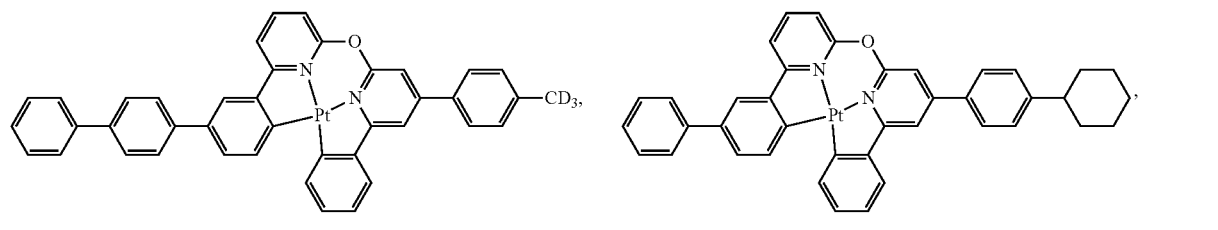
Compound 80
Compound 81
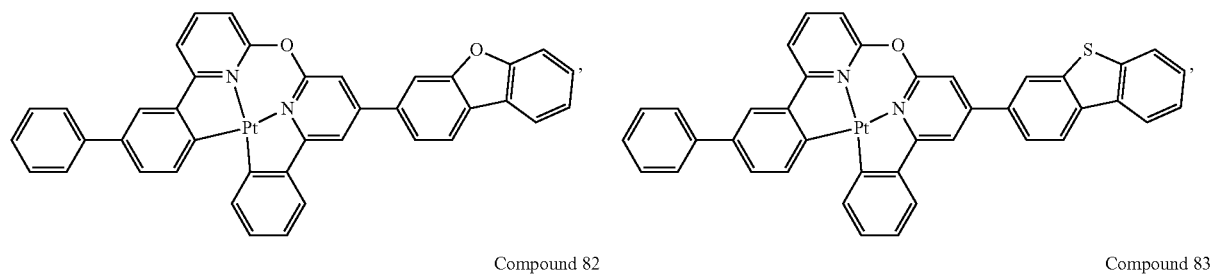
Compound 82
Compound 83
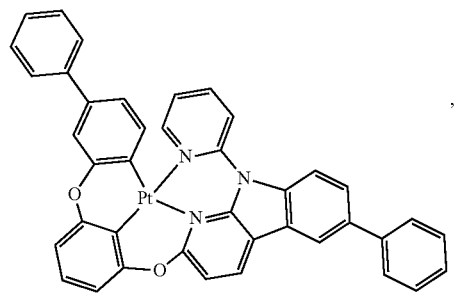
Compound 84
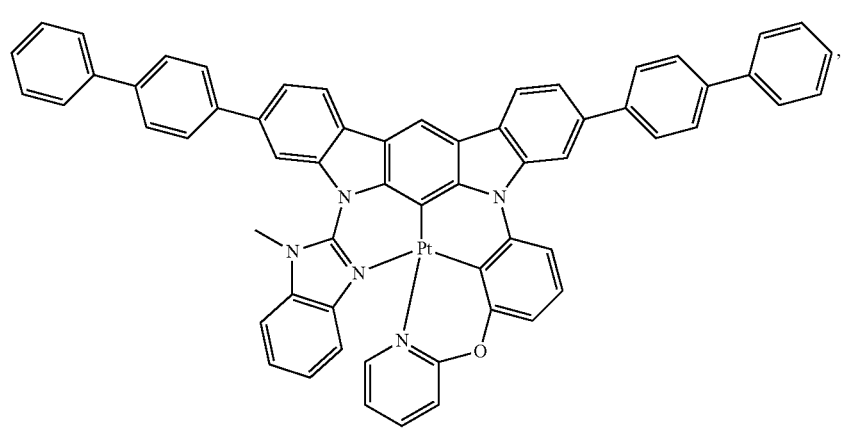

Compound 85
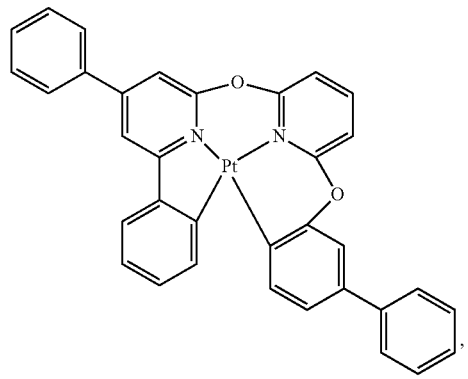
Compound 86
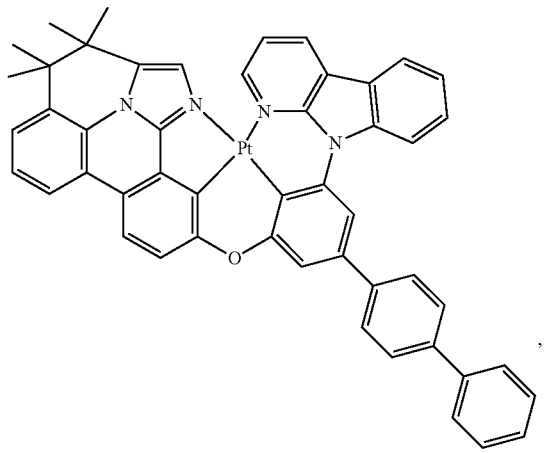
Compound 87
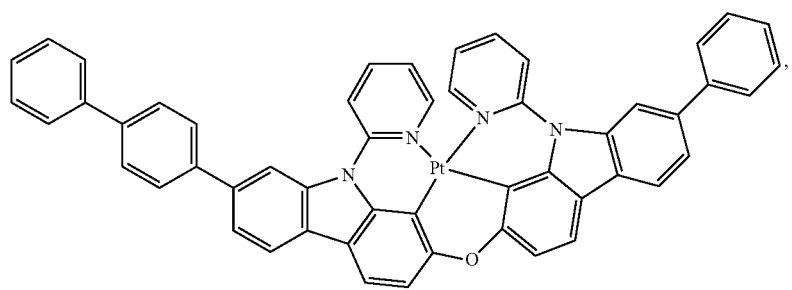
Compound 88
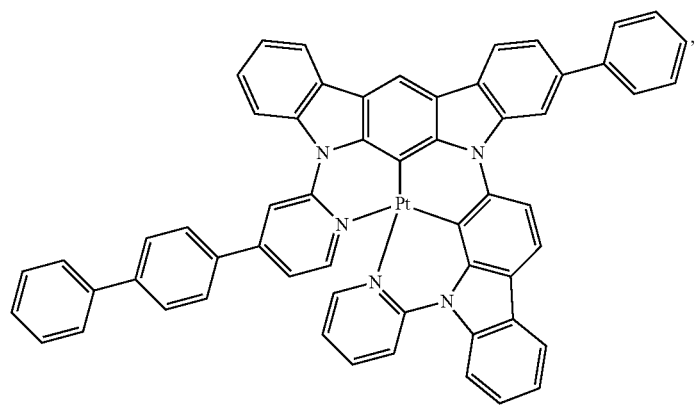
Compound 89
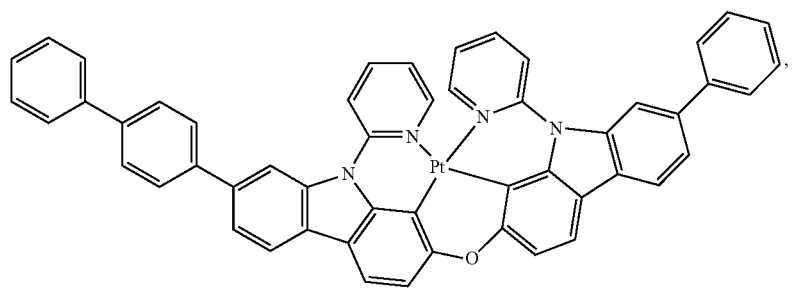

-continued
Compound 90
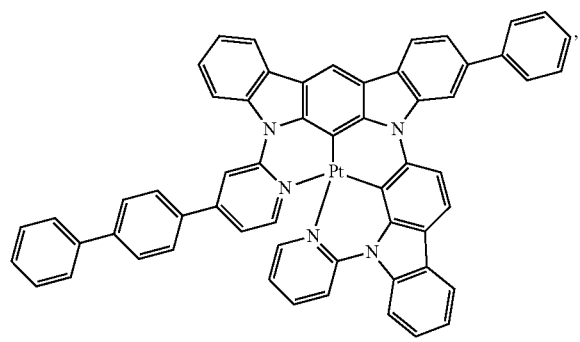
Compound 91
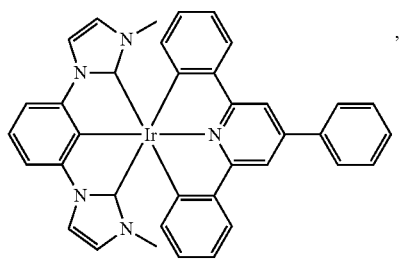
Compound 92
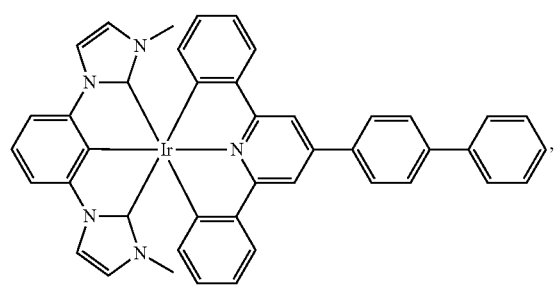
Compound 93
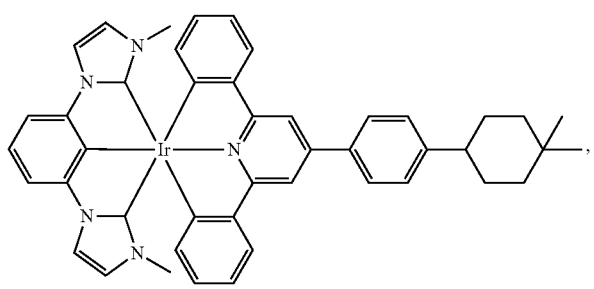
Compound 94
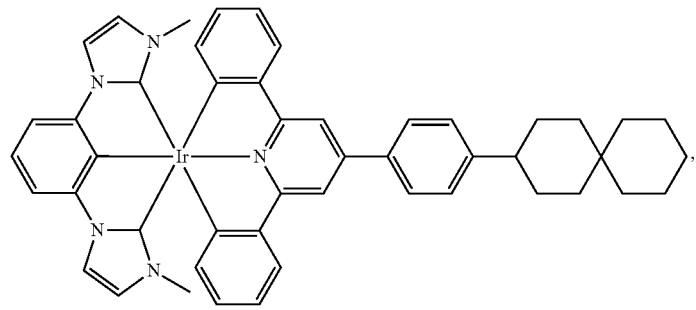
Compound 95
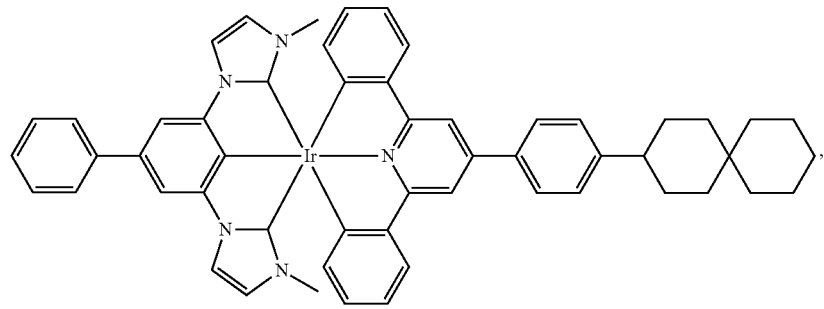
Compound 96
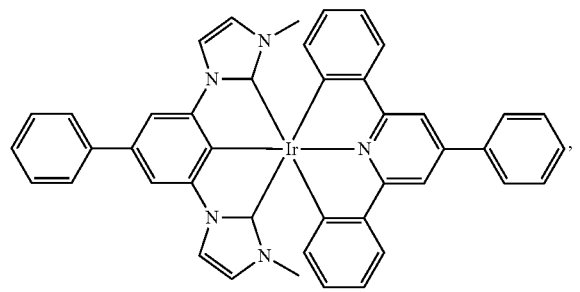
Compound 97
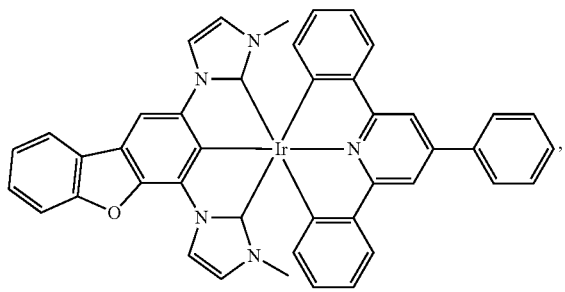

Compound 98
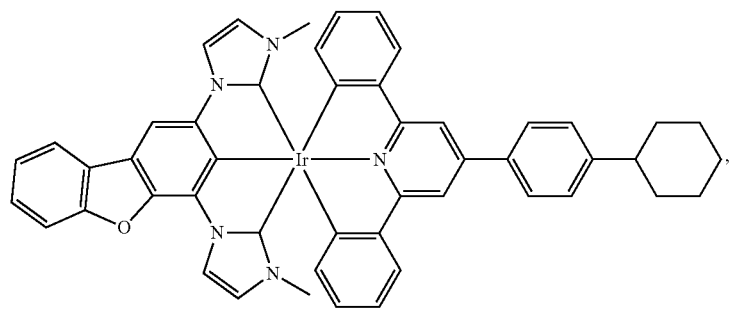
Compound 99
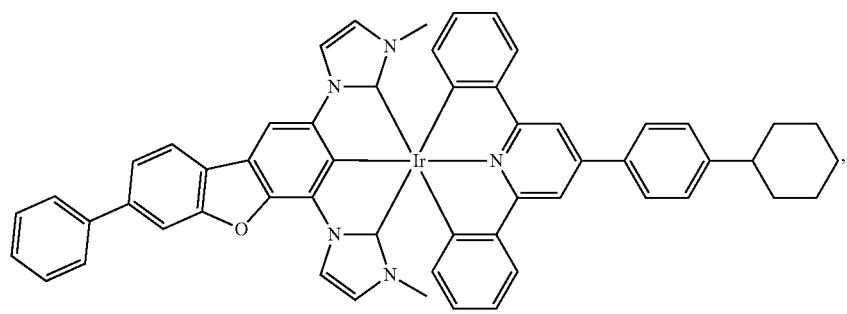
Compound 100
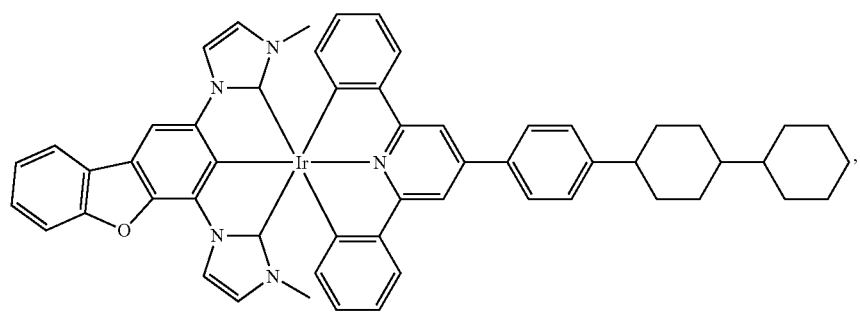
Compound 101
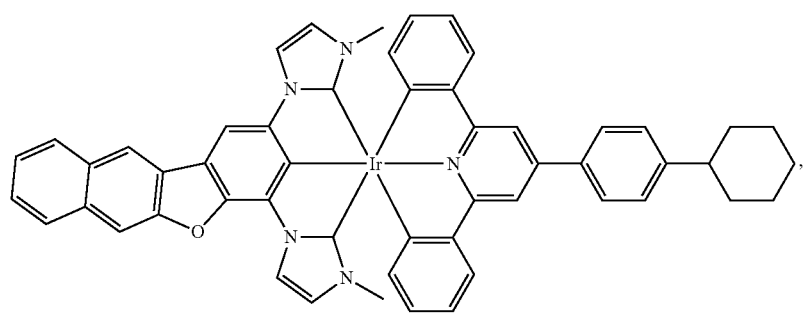
Compound 102
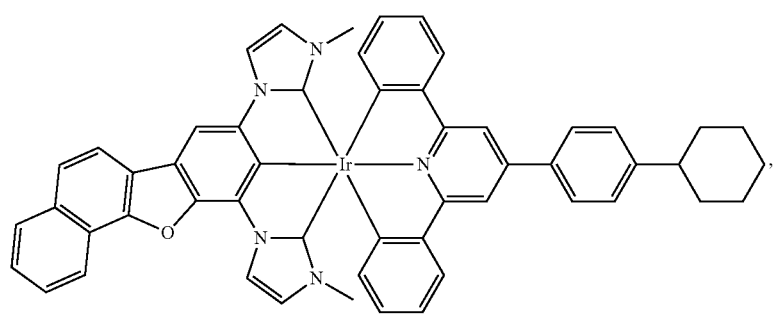

-continued
Compound 103
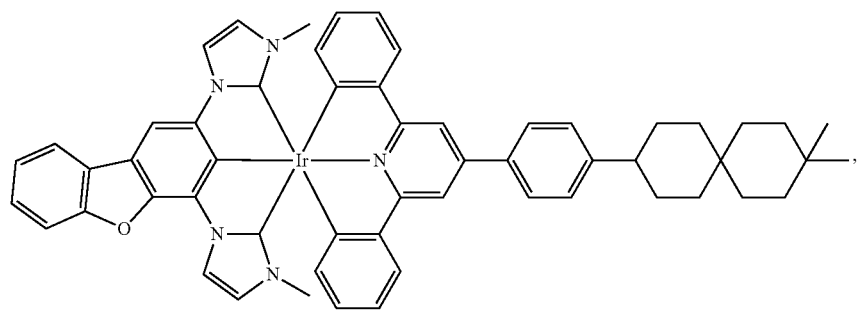
Compound 104
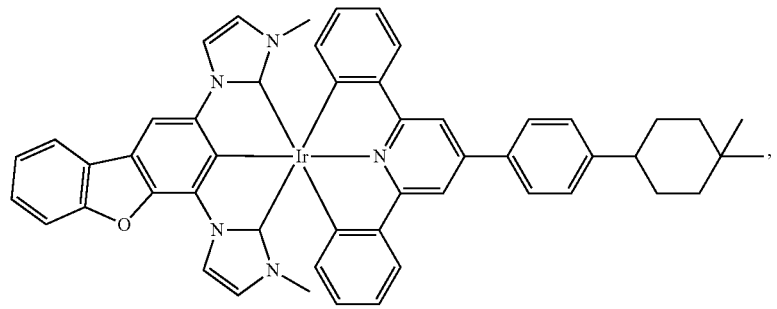
Compound 105
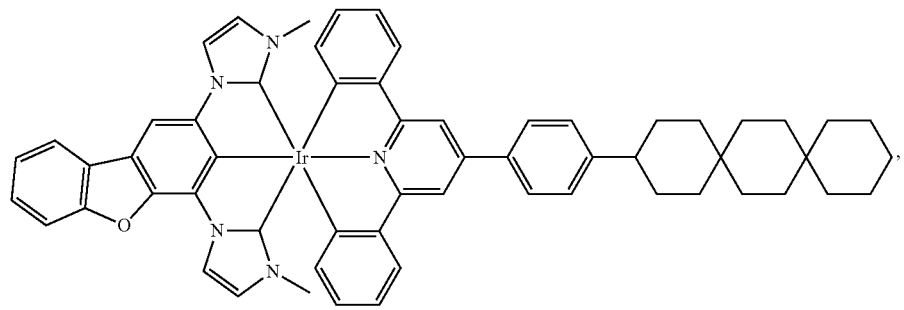
Compound 106
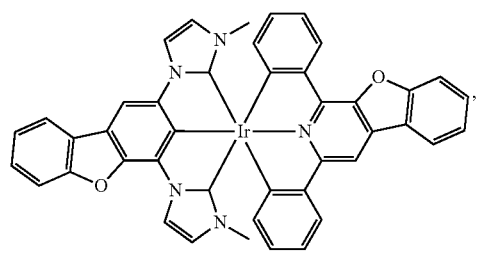
Compound 107
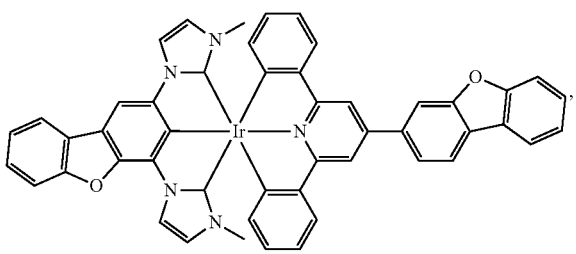
Compound 108
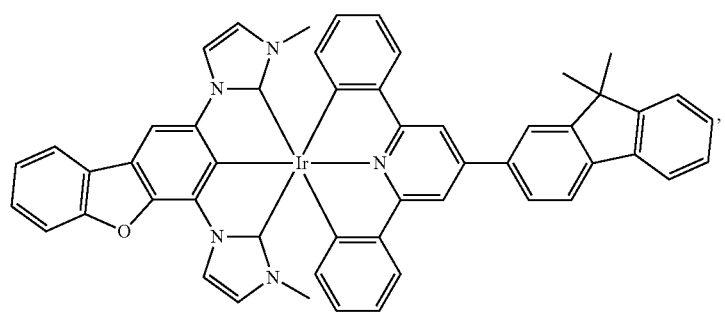

-continued
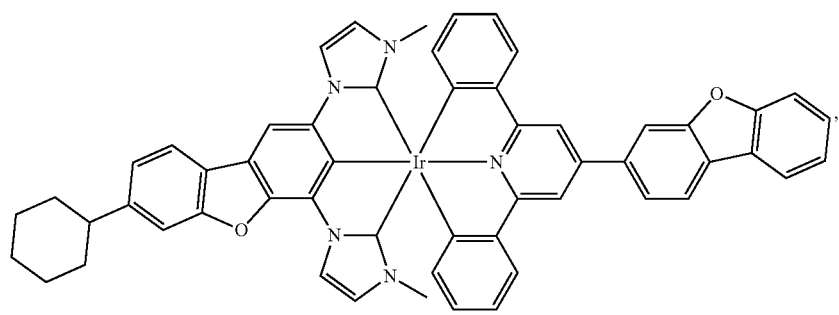
Compound 109
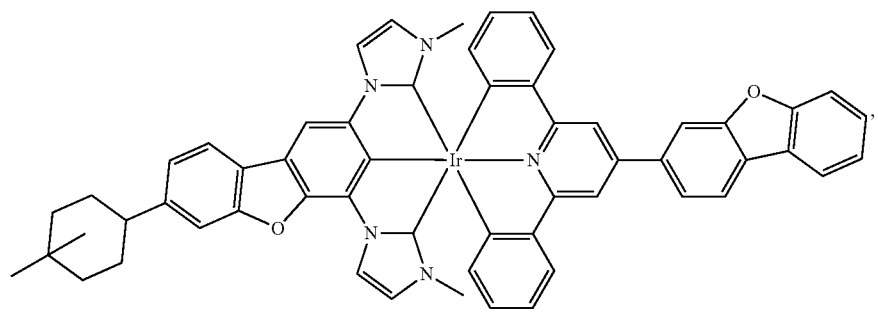
Compound 110
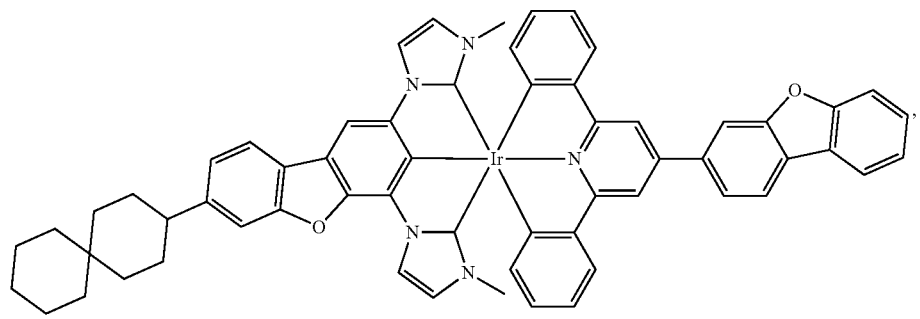
Compound 111
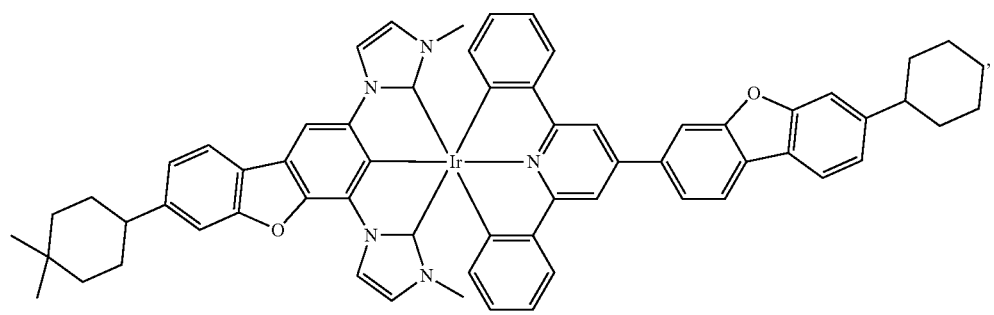
Compound 112
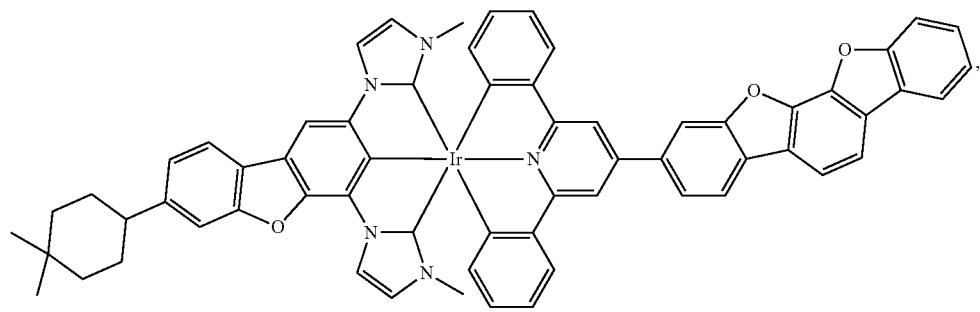
Compound 113

Compound 114
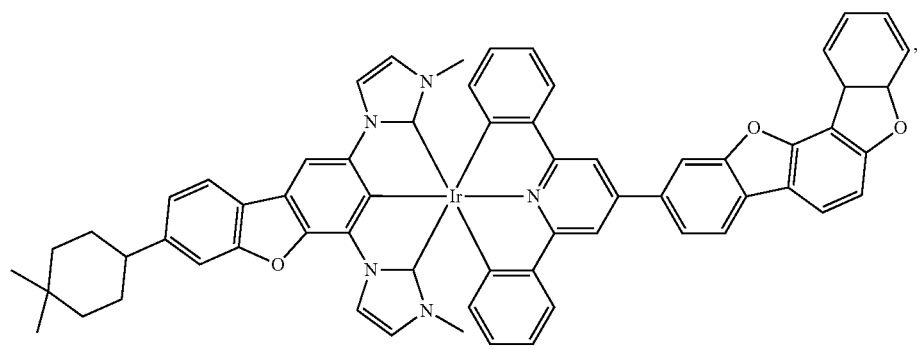
Compound 115
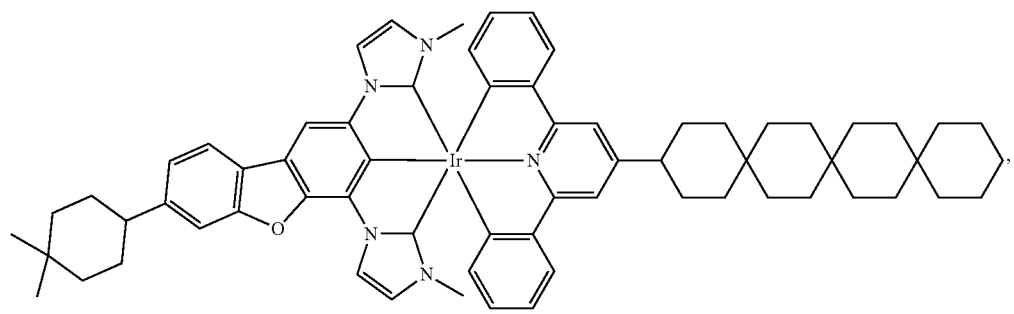
Compound 116
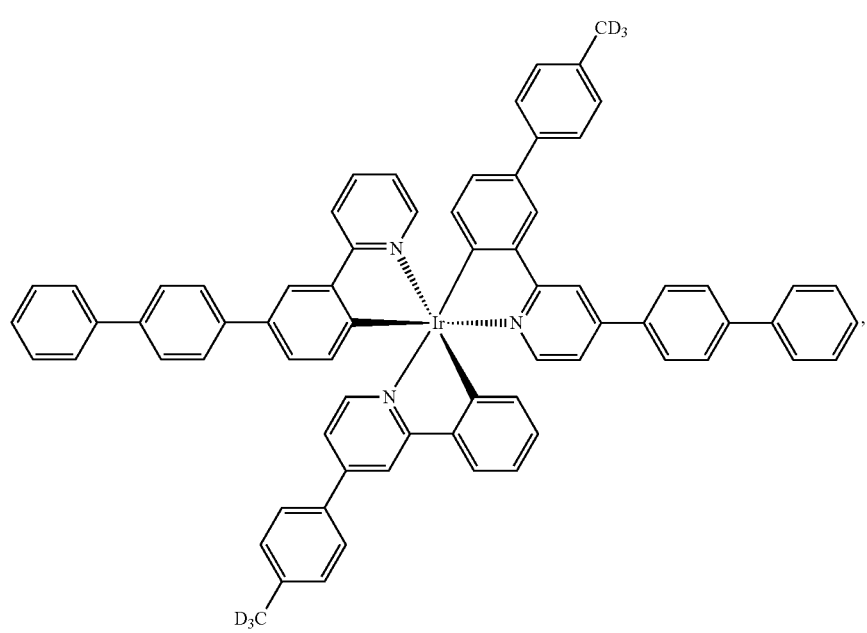

-continued
Compound 117
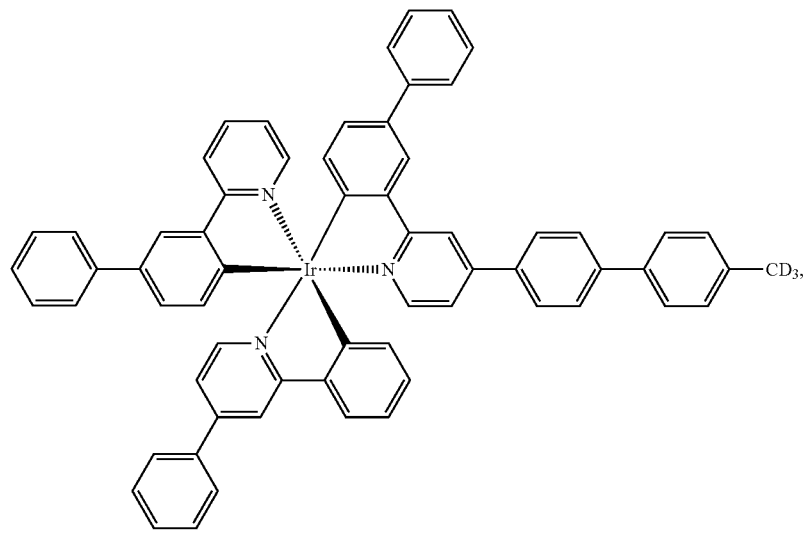
Compound 118
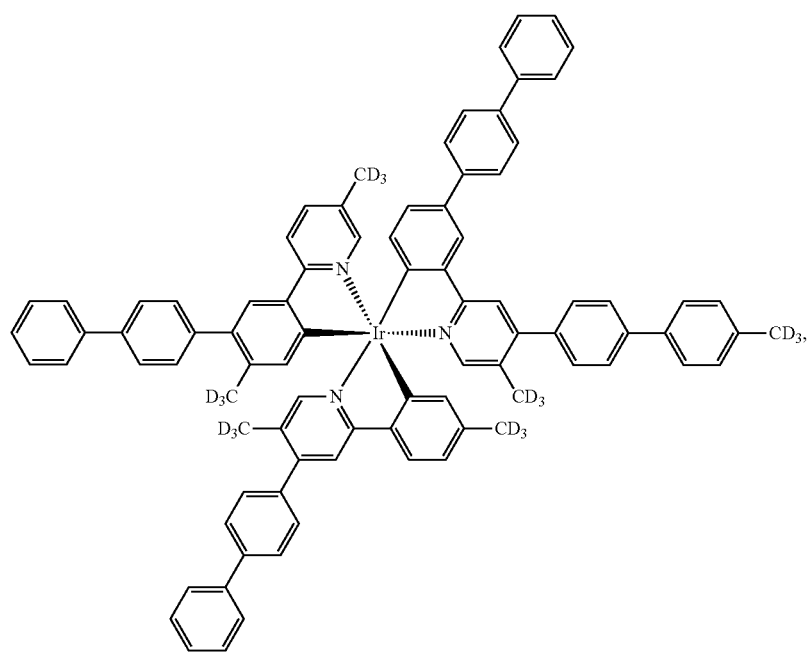

Compound 119
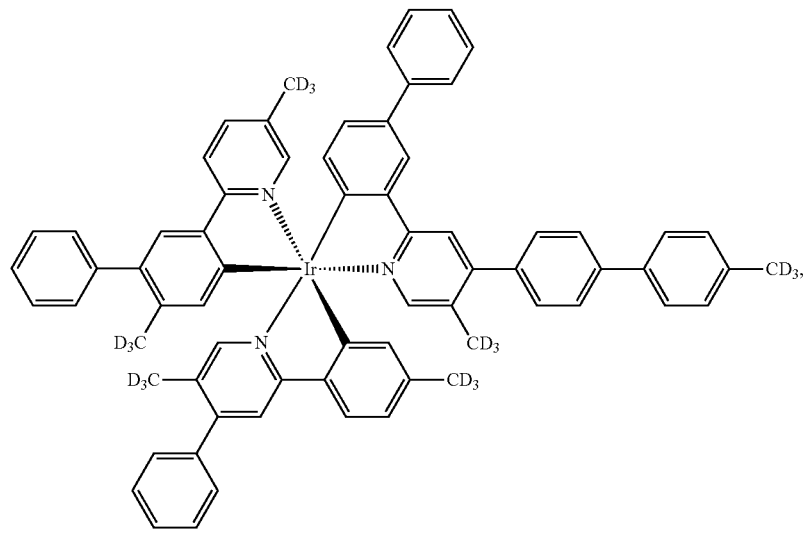
Compound 120
Compound 121
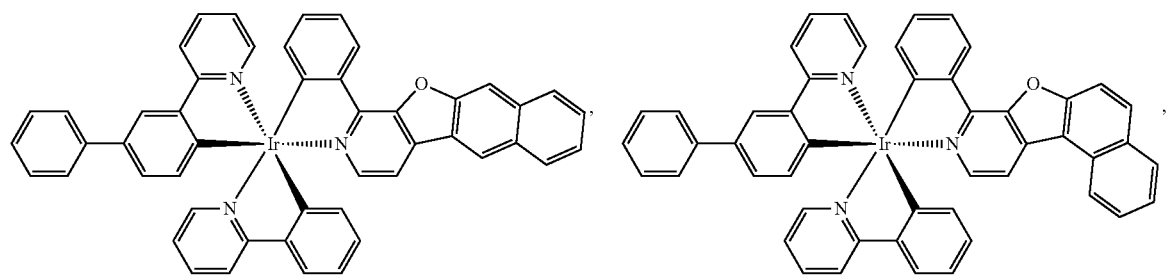
Compound 122
Compound 123
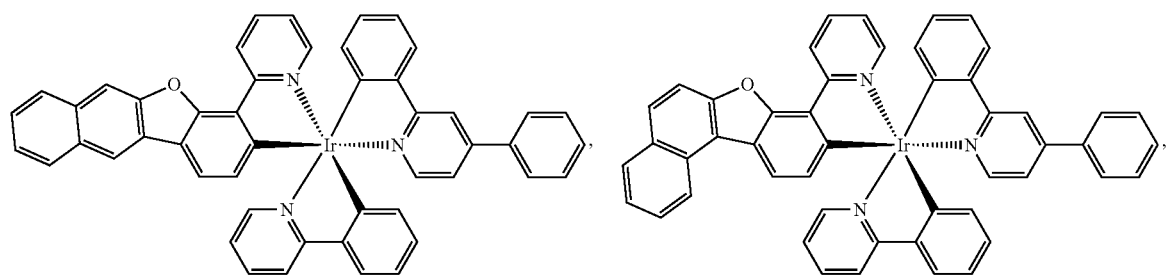
Compound 124
Compound 125
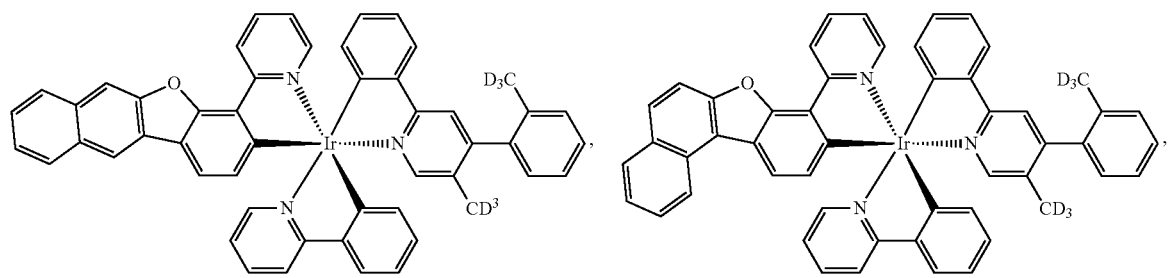

Compound 126
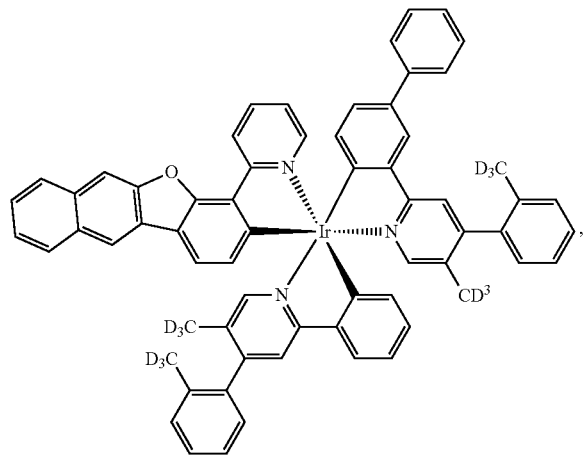
Compound 127
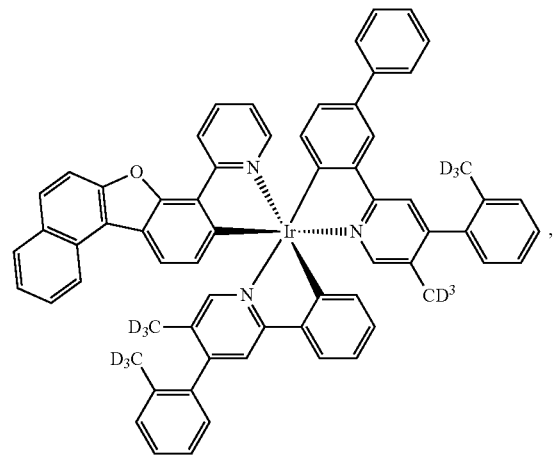
Compound 128
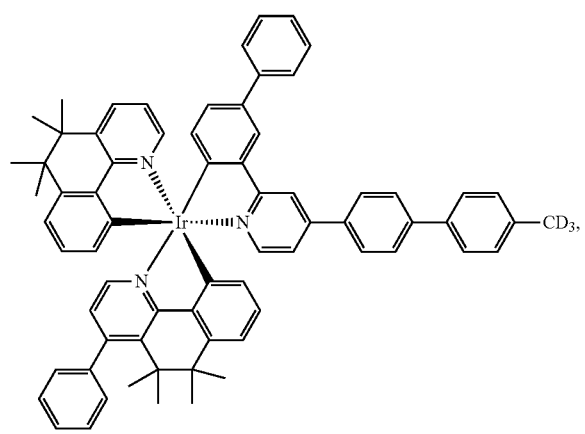
Compound 129
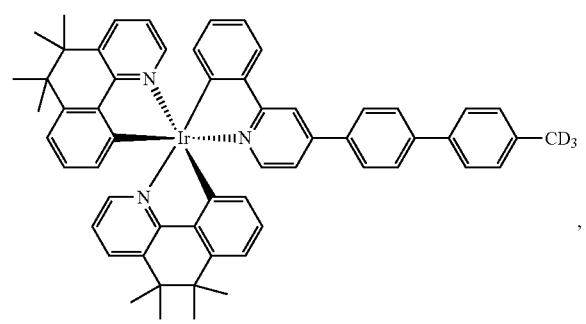
Compound 130
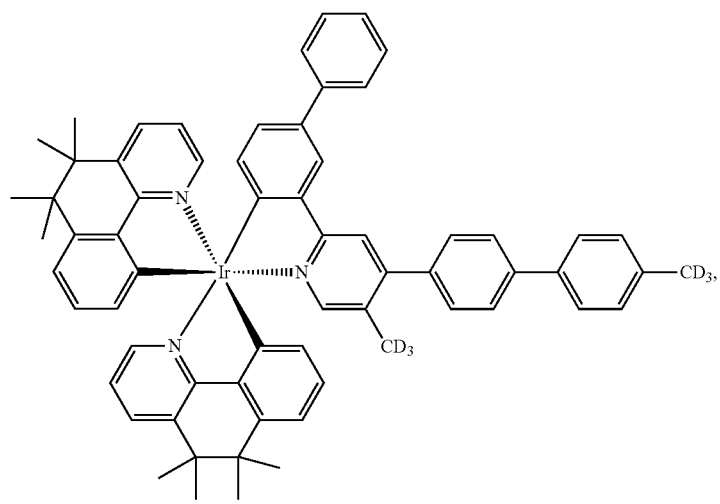

-continued
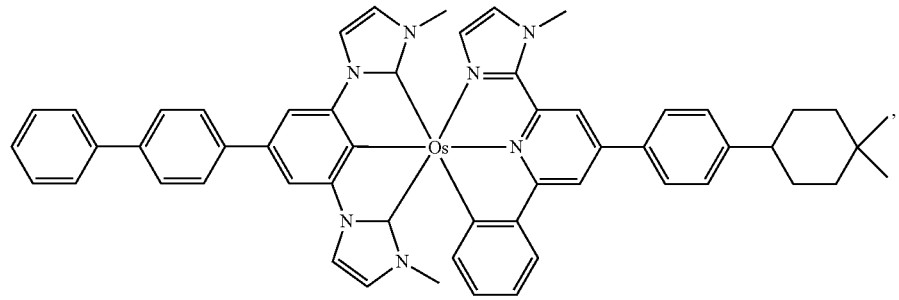
Compound 131
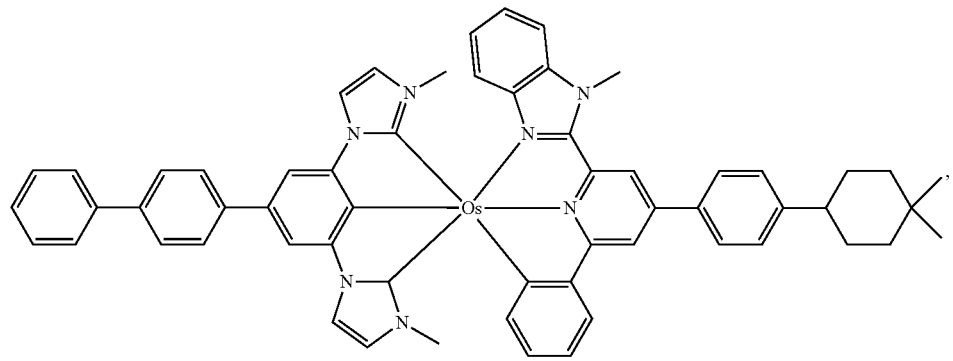
Compound 132
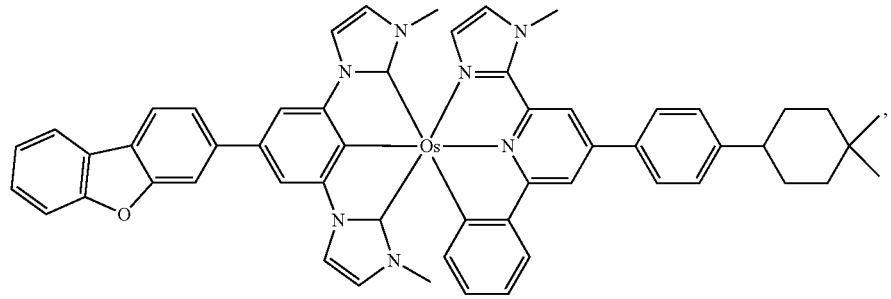
Compound 133
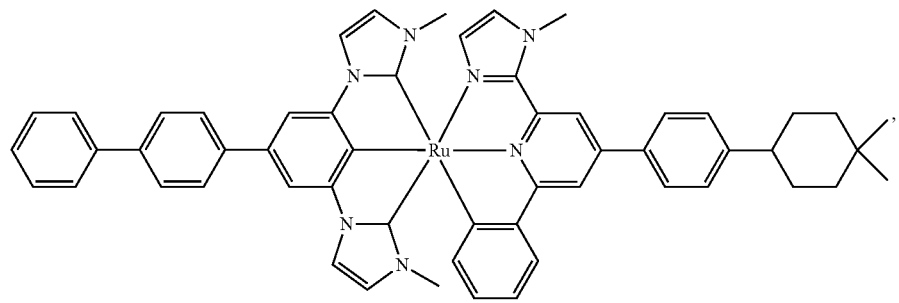
Compound 134
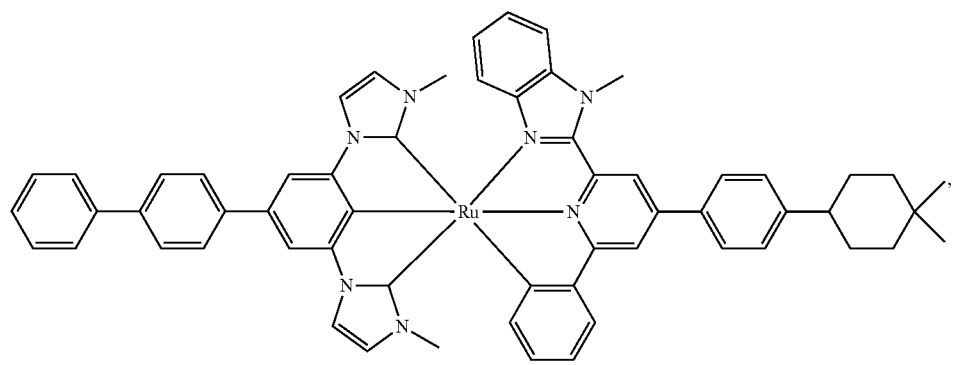
Compound 135

-continued
Compound 136
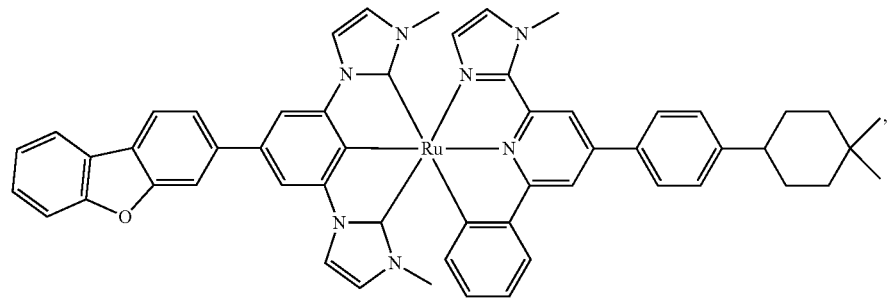
Compound 137
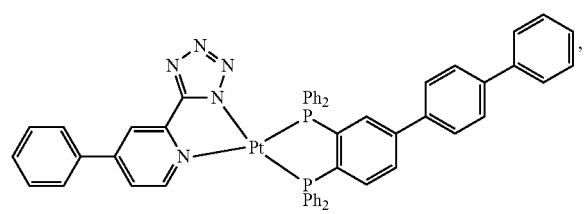
Compound 138
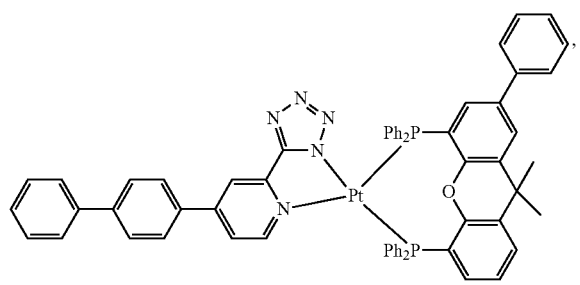
Compound 139
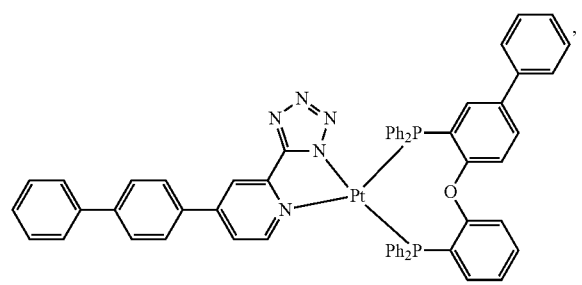
Compound 140
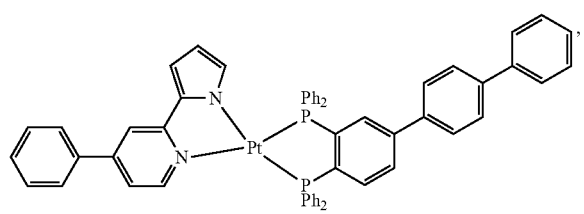
Compound 141
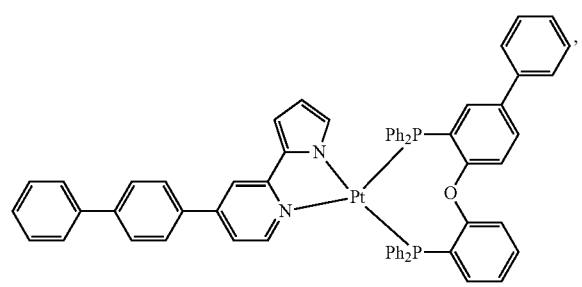
Compound 142
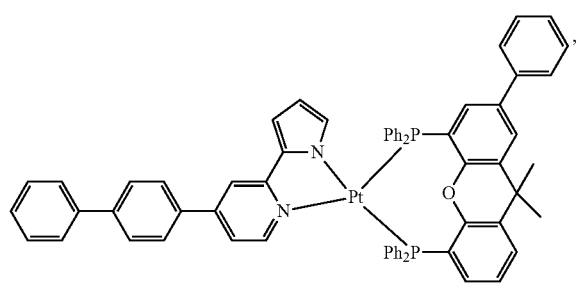

-continued
Compound 143
Compound 144
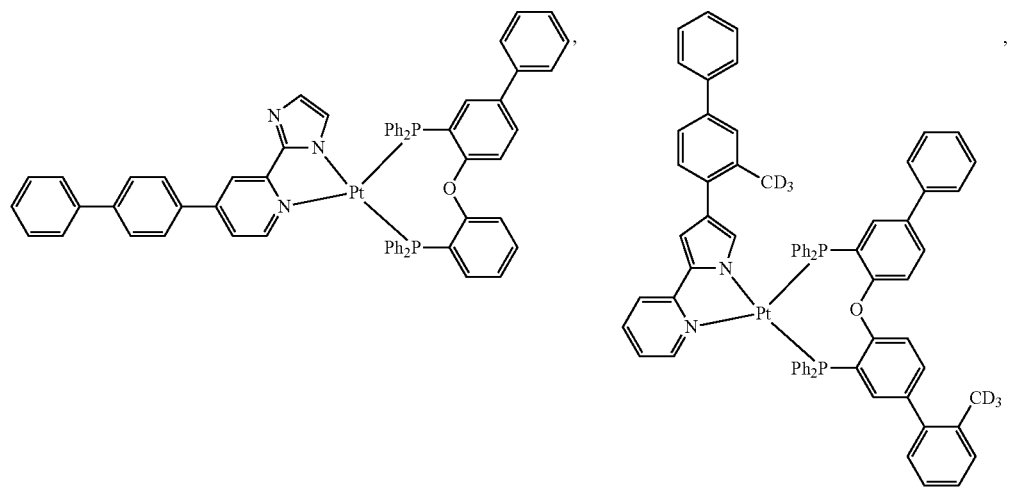
Compound 145
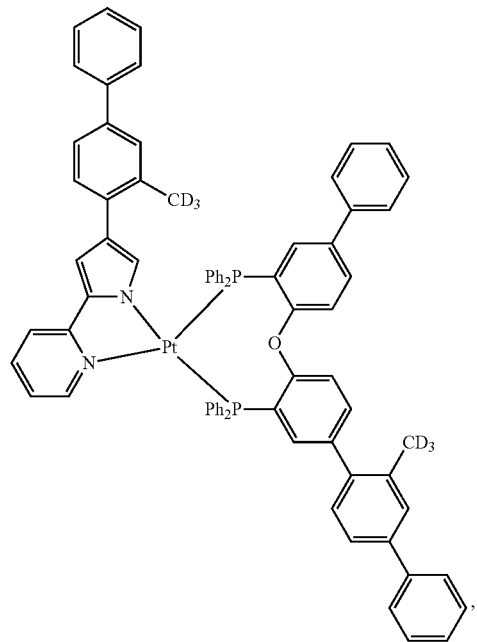
Compound 146
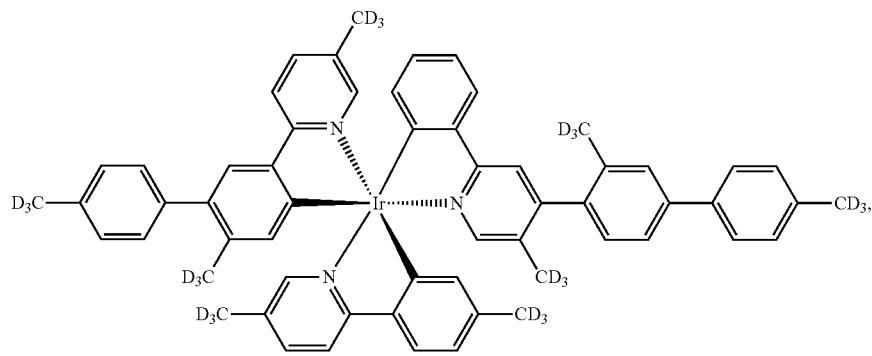

Compound 147
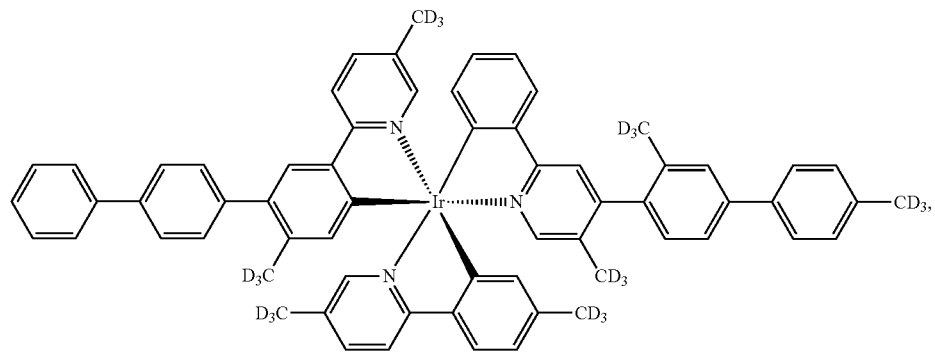
Compound 148
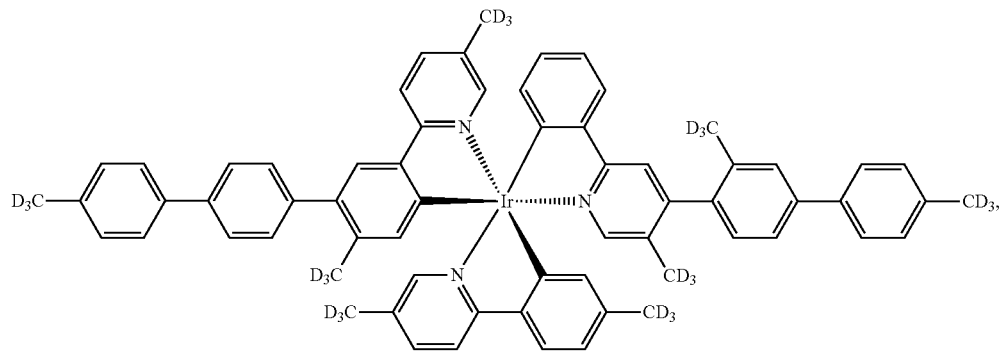
Compound 149
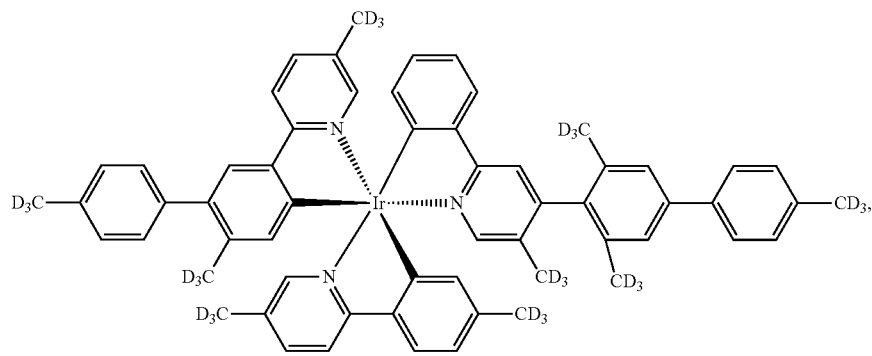
Compound 150
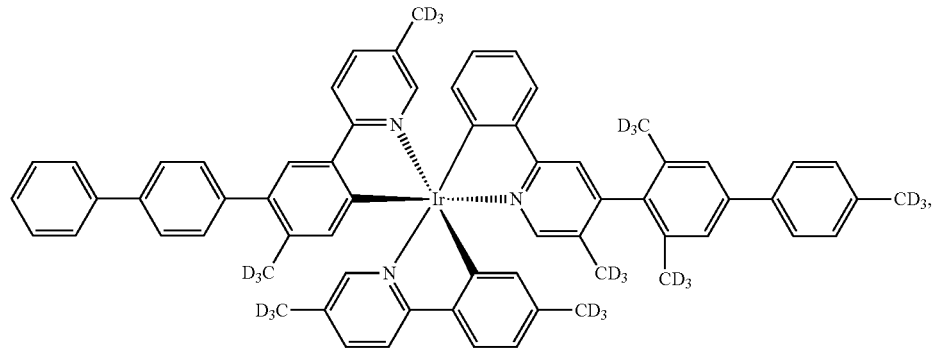

Compound 151

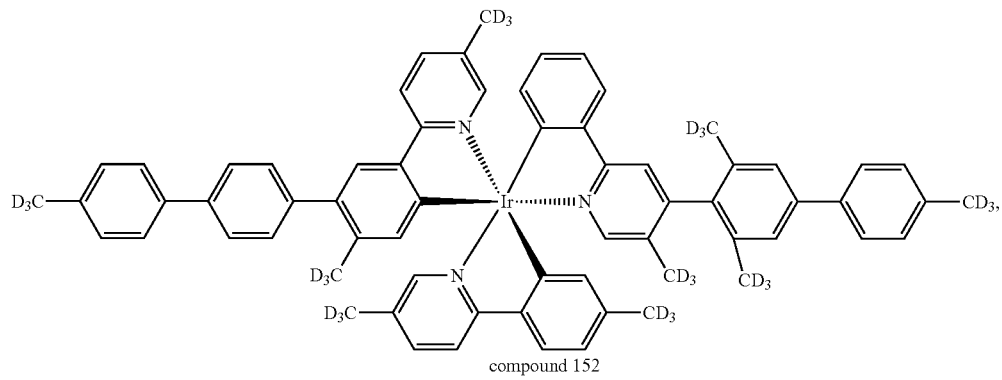

compound 152

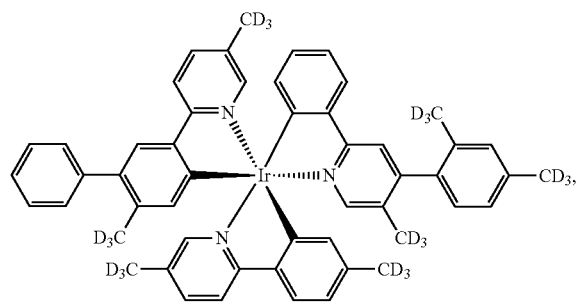

Compound 153

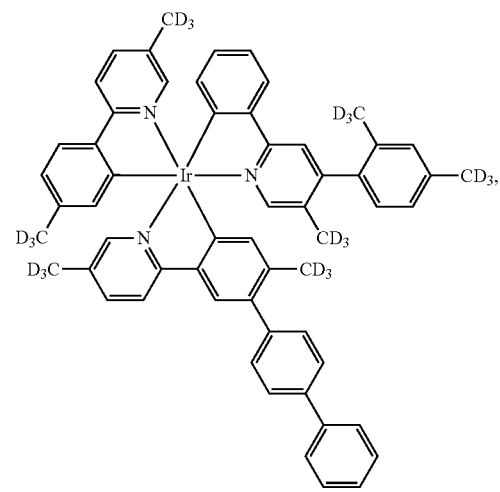

Compound 154

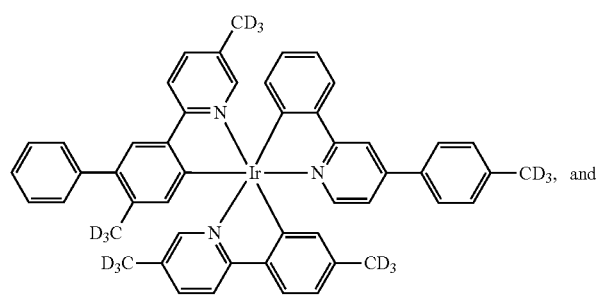

Compound 155

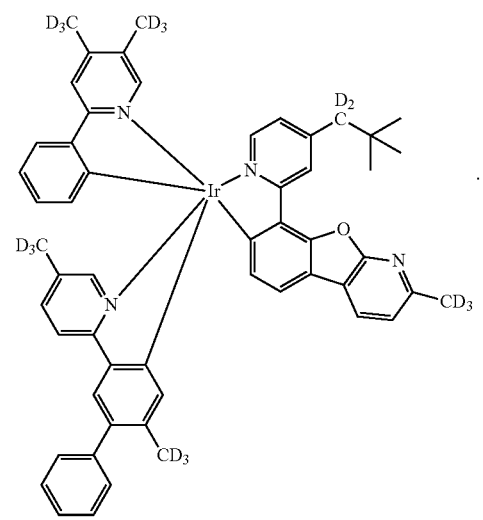

According to another aspect of the present disclosure, an OLED is disclosed. The OLED comprising: an anode; a cathode; and an organic layer, disposed between the anode and the cathode, comprising a compound having a metal coordination complex structure;

wherein the compound is capable of functioning as an emitter in an organic light emitting device at room temperature;

wherein the compound has at least two ligands coordinated to the metal;

wherein the compound has a first substituent $R^1$ at one of the ligands' periphery;

wherein a first distance is the distance between the metal and an atom in $R^1$ that is the farthest away from the metal;

wherein the first distance is longer than any distance between the metal and any other atoms in the compound; and wherein when a sphere having a radius r is defined whose center is the metal and the radius r is the smallest radius that will allow the sphere to enclose all atoms in the compound that are not part of $R^1$, the first distance is longer than the radius r by at least 2.9 Å.

In some embodiments of the OLED, the organic layer is an emissive layer and the compound having a metal coordination complex structure is an emissive dopant or a non-emissive dopant.

In some embodiments of the OLED where the organic layer further comprises a host, the host comprises a triphenylene containing benzo-fused thiophene or benzo-fused furan;

wherein any substituent in the host is an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-C_nH_{2n+1}$, $C\equiv CC_nH_{2n+1}$, $Ar_1$, $Ar_1-Ar_2$, and $C_nH_{2n}-Ar$, or the host has no substitution;

wherein n is from 1 to 10; and wherein $Ar_1$ and $Ar_2$ are independently selected from the group consisting of benzene, biphenyl, naphthalene, triphenylene, carbazole, and heteroaromatic analogs thereof.

In some embodiments of the OLED where the organic layer further comprises a host, the host comprises at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

In some embodiments of the OLED where the organic layer further comprises a host, the host is selected from the group consisting of:

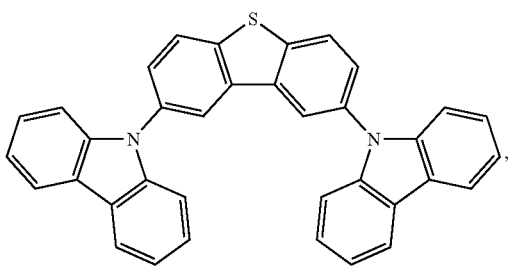

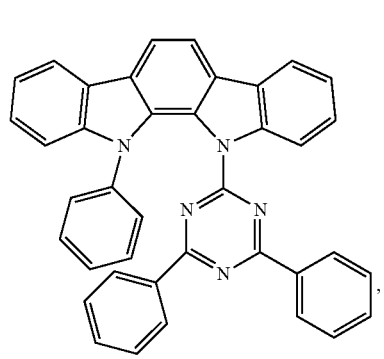

-continued

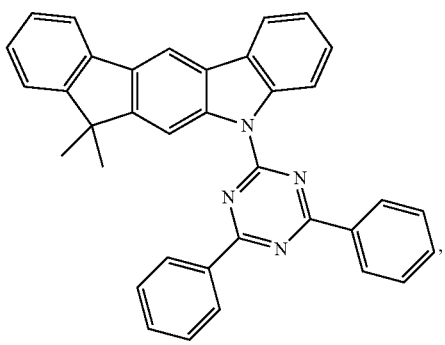

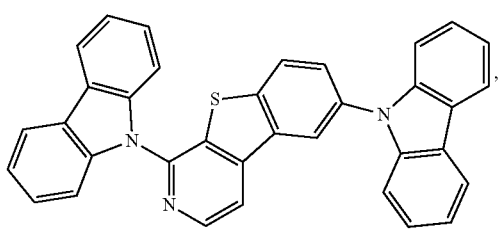

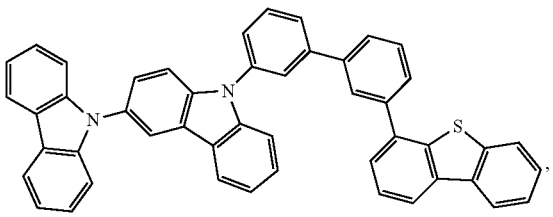

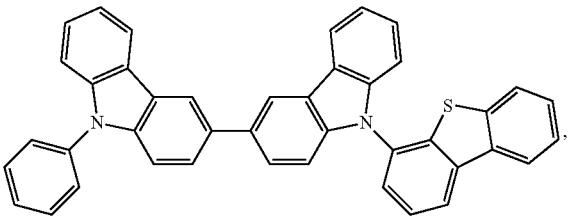

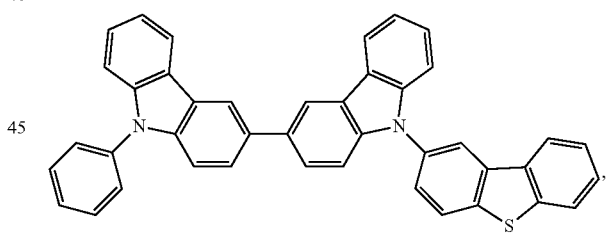

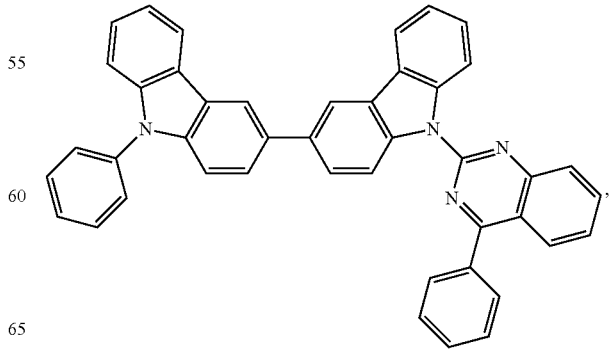

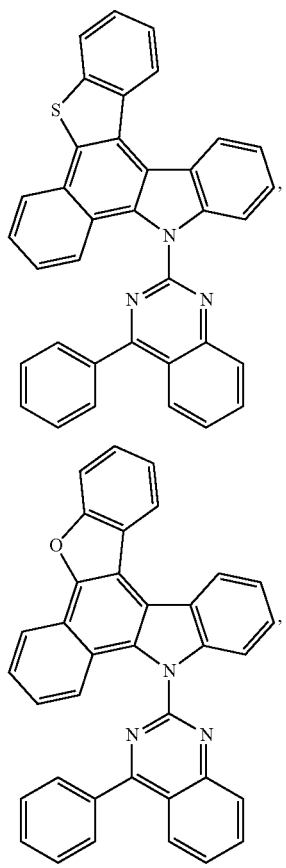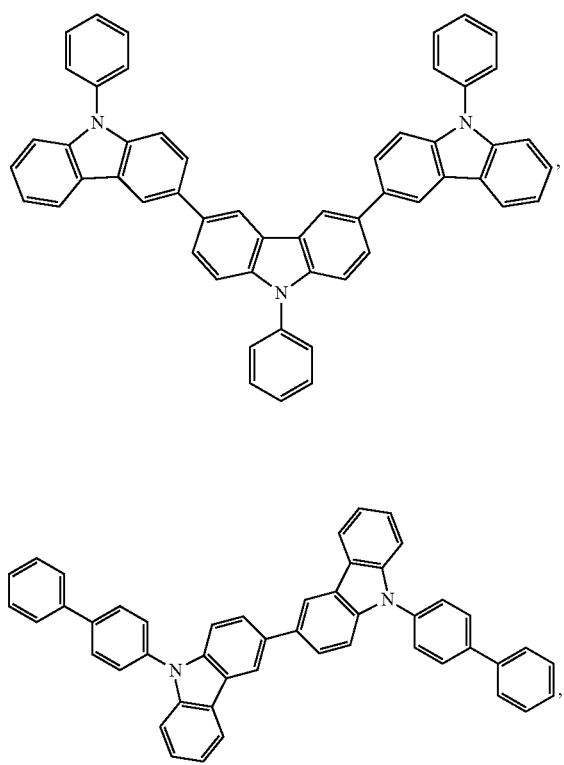

-continued

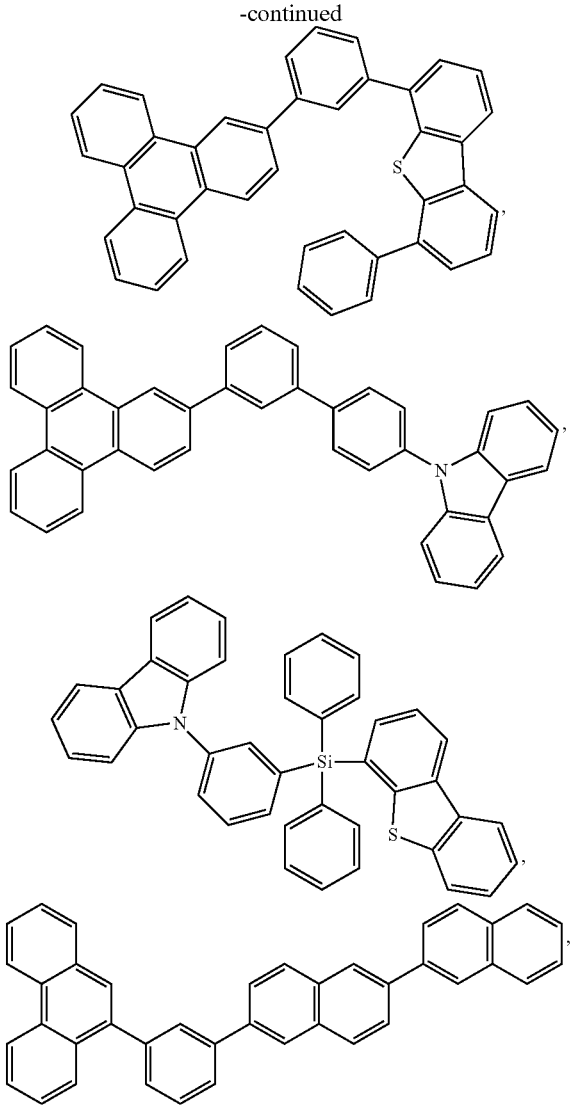

and combinations thereof.

In some embodiments of the OLED where the organic layer further comprises a host, the host comprises a metal complex.

In some embodiments of the OLED, the compound having a metal coordination complex structure has a HDR of at least 0.7. In some embodiments of the OLED, the compound having a metal coordination complex structure has a HDR of at least 0.75. In some embodiments of the OLED, the compound having a metal coordination complex structure has a HDR of at least 0.8. In some embodiments of the OLED, the HDR of the compound having a metal coordination complex structure is at least 0.85. In some embodiments of the OLED, the HDR of the compound having a metal coordination complex structure is at least 0.9. In some embodiments of the OLED, the HDR of the compound having a metal coordination complex structure is at least 0.95.

In some embodiments of the OLED, the organic layer further comprises a host; and the compound has a HDR that is higher by at least 5% when compared to the exact same device with mCP (1,3-bis(N-carbazolyl)benzene) as the host. In some embodiments of the OLED, the compound has a HDR that is higher by at least 10% compared to the exact same device with mCP as host. In some embodiments of the OLED, the compound has a HDR that is higher by at least 20% when compared to the exact same device with mCP as the host. In some embodiments of the OLED, the compound has a HDR that is higher by at least 30% when compared to the exact same device with mCP as the host. In some embodiments of the OLED, the compound has a HDR that is higher by at least 40% when compared to the exact same device with mCP as the host.

According to another aspect of the present disclosure, an OLED is disclosed which comprises: an anode; a cathode; and an emissive layer, disposed between the anode and the cathode, comprising a phosphorescent emitting compound; wherein the phosphorescent emitting compound has an intrinsic emission spectrum with a FWHM value of no more than 45 nm, and the OLED has an EQE of at least 25% at 0.1 mA/cm$^2$ at room temperature when a voltage is applied across the device. In some embodiments, the FWHM value of the phosphorescent emitting compound's intrinsic emission spectrum is no more than 43 nm. In some embodiments, the FWHM value of the phosphorescent emitting compound's intrinsic emission spectrum is no more than 41 nm. In some embodiments, the FWHM value of the phosphorescent emitting compound's intrinsic emission spectrum is no more than 39 nm. In some embodiments, the FWHM value of the phosphorescent emitting compound's intrinsic emission spectrum is no more than 37 nm. In some embodiments, the FWHM value of the phosphorescent emitting compound's intrinsic emission spectrum is no more than 35 nm. In some embodiments, the FWHM value of the phosphorescent emitting compound's intrinsic emission spectrum is no more than 33 nm. In some embodiments, the FWHM value of the phosphorescent emitting compound's intrinsic emission spectrum is no more than 31 nm. In some embodiments, the FWHM value of the phosphorescent emitting compound's intrinsic emission spectrum is no more than 29 nm. In some embodiments, the FWHM value of the phosphorescent emitting compound's intrinsic emission spectrum is no more than 27 nm. In some embodiments, the OLED has an EQE of at least 27%. In some embodiments, the OLED has an EQE of at least 29%. In some embodiments, the OLED has an EQE of at least 31%. In some embodiments, the device lifetime to 95% luminance is 8 hours for a 400 nm≤$\lambda_{max}$<500 nm emitter, as measured at 20 mA/cm$^2$, 30 hours for a 500 nm≤$\lambda_{max}$<590 nm emitter as measured at 80 mA/cm$^2$, and 150 hours for a 590 nm≤$\lambda_{max}$<750 nm emitter, as measured at 80 mA/cm$^2$. In some embodiments, the device lifetime to 95% luminance is 12 hours for a 400 nm≤$\lambda_{max}$<500 nm emitter, as measured at 20 mA/cm$^2$, 45 hours for a 500 nm≤$\lambda_{max}$<590 nm emitter as measured at 80 mA/cm$^2$, and 225 hours for a 590 nm≤$\lambda_{max}$<750 nm emitter, as measured at 80 mA/cm$^2$. In some embodiments, the device lifetime to 95% luminance is 16 hours for a 400 nm≤$\lambda_{max}$<500 nm emitter, as measured at 20 mA/cm$^2$, 60 hours for a 500 nm≤$\lambda_{max}$<590 nm emitter as measured at 80 mA/cm$^2$, and 300 hours for a 590 nm≤$\lambda_{max}$<750 nm emitter, as measured at 80 mA/cm$^2$. In some embodiments, the device lifetime to 95% luminance is 20 hours for a 400 nm≤$\lambda_{max}$<500 nm emitter, as measured at 20 mA/cm$^2$, 75 hours for a 500 nm≤$\lambda_{max}$<590 nm emitter as measured at 80 mA/cm$^2$, and 375 hours for a 590 nm≤$\lambda_{max}$<750 nm emitter, as measured at 80 mA/cm$^2$.

The intrinsic emission spectrum of a phosphorescent emitting compound is defined as the photoluminescence spectrum of a thermally evaporated <1-10% doped thin film of the emitter in the same host material used in the OLED stack. As one of ordinary skill in the art would recognize, the doping percentage should be limited to a regime that minimizes aggregation quenching and broadening. It is worth noting that this emission spectrum may exhibit slight broadening or narrowing in an OLED due to optical and chemical factors.

It was found that the photoluminescence full width at half maximum (FWHM) of emitters was significantly decreased due to benzoannulation on an existing ring of the ligands. The photoluminescence spectral narrowing of emitters will improve device performance such as EQE. For example, when the following Compound A (FWHM:65 nm in solution) was fused with an extra benzene ring, the benzoannulated Compound B has a FWHM of 19 nm, which is significantly narrower than Compound A. Likewise in solid state PMMA thin film, Compound B has a FWHM of 21 nm, which is 47 nm narrower than Compound A in 5% doped PMMA solid film (FWHM:68 nm).

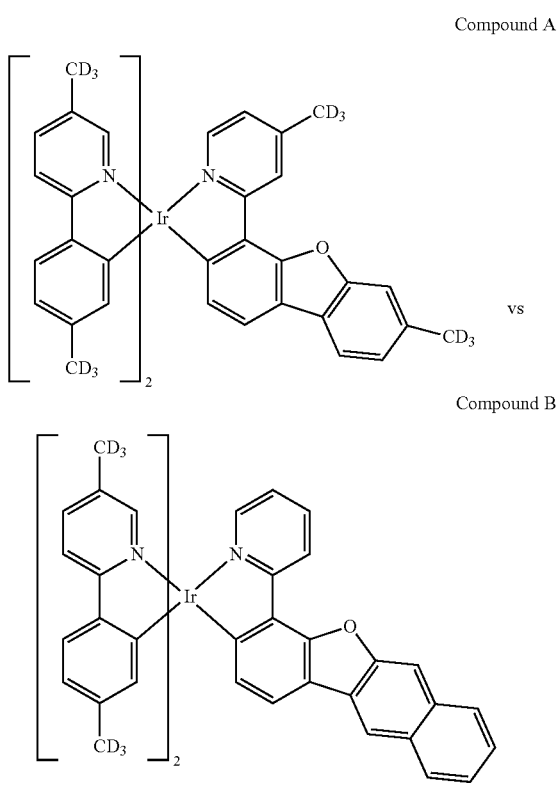

Compound A vs

Compound B

In some embodiments of the OLED, the phosphorescent emitting compound is a metal coordination complex, wherein the metal is selected from the group consisting of Ir, Rh, Re, Ru, Os, Pt, Pd, Au, Ag, and Cu. In some embodiments, the metal is Ir. In some embodiments, the metal is Pt.

In some embodiments of the OLED where the phosphorescent emitting compound is a metal coordination complex, the phosphorescent emitting compound is a benzene ring coordinated to the metal; wherein the benzene ring is fused by a second aromatic ring. In some embodiments, the second aromatic ring is fused by a third aromatic ring. In some embodiments, the third aromatic ring is fused by a fourth aromatic ring.

In some embodiments of the OLED where the phosphorescent emitting compound in the OLED has an intrinsic emission spectrum with a FWHM value of no more than 45 nm and an EQE of at least 25% measured at 0.1 mA/cm² at room temperature when a voltage is applied across the device, the phosphorescent emitting compound has a HDR of at least 0.7. In some embodiments of the OLED, the phosphorescent emitting compound has a HDR of at least 0.75. In some embodiments of the OLED, the phosphorescent emitting compound has a HDR of at least 0.8. In some embodiments of the OLED, the phosphorescent emitting compound has a HDR of at least 0.85. In some embodiments of the OLED, the phosphorescent emitting compound has a HDR of at least 0.9. In some embodiments of the OLED, the phosphorescent emitting compound has a HDR of at least 0.95.

In some embodiments of the OLED where the phosphorescent emitting compound in the OLED has an intrinsic emission spectrum with a FWHM value of no more than 45 nm and an EQE of at least 25% at room temperature when a voltage is applied across the device, the emissive layer further comprises a host; and the compound has a horizontal dipole ratio increased by at least 5% when compared to the exact same device with mCP (1,3-bis(N-carbazolyl)benzene) as host. In some embodiments, the compound has a horizontal dipole ratio increased by at least 10% when compared to the exact same device with mCP (1,3-bis(N-carbazolyl)benzene) as host.

In some embodiments of the OLED where the phosphorescent emitting compound in the OLED has an intrinsic emission spectrum with a FWHM value of no more than 45 nm and an EQE of at least 25% at room temperature when a voltage is applied across the device, the phosphorescent emitting compound is a compound having a metal coordination complex structure; wherein the compound is capable of functioning as an emitter in an organic light emitting device at room temperature; wherein the compound has at least two ligands coordinated to the metal; wherein the compound has a first substituent $R^1$ at one of the ligands' periphery; wherein a first distance is the distance between the metal and an atom in $R^1$ that is the farthest away from the metal; wherein the first distance is longer than any distance between the metal and any other atoms in the compound; and wherein when a sphere having a radius r is defined whose center is the metal and the radius r is the smallest radius that will allow the sphere to enclose all atoms in the compound that are not part of $R^1$, the first distance is longer than the radius r by at least 2.9 Å.

According to another aspect of the present disclosure, a consumer product comprising an OLED is disclosed, wherein the OLED comprising: an anode; a cathode; and an organic layer, disposed between the anode and the cathode, comprising a compound having a metal coordination complex structure; wherein the compound is capable of functioning as an emitter in an organic light emitting device at room temperature; wherein the compound has at least two ligands coordinated to the metal; wherein the compound has a first substituent $R^1$ at one of the ligands' periphery; wherein a first distance is the distance between the metal and an atom in $R^1$ that is the farthest away from the metal; wherein the first distance is longer than any distance between the metal and any other atoms in the compound; and wherein when a sphere having a radius r is defined whose center is the metal and the radius r is the smallest radius that will allow the sphere to enclose all atoms in the compound that are not part of $R^1$, the first distance is longer than the radius r by at least 2.9 Å.

According to another aspect of the present disclosure, a consumer product comprising an OLED is disclosed, wherein the OLED comprising: an anode; a cathode; and an emissive layer, disposed between the anode and the cathode, comprising a phosphorescent emitting compound; wherein the phosphorescent emitting compound has an intrinsic emission spectrum with a FWHM no more than 45 nm and an EQE of at least 25% measured at 0.1 mA/cm² at room temperature when a voltage is applied across the device.

In some embodiments, the consumer products mentioned above are selected from the group consisting of a flat panel display, a computer monitor, a medical monitors television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display, a 3-D display, a virtual reality or augmented reality display, a vehicle, a large area wall, a theater or stadium screen, and a sign.

Experimental

Figure 11:
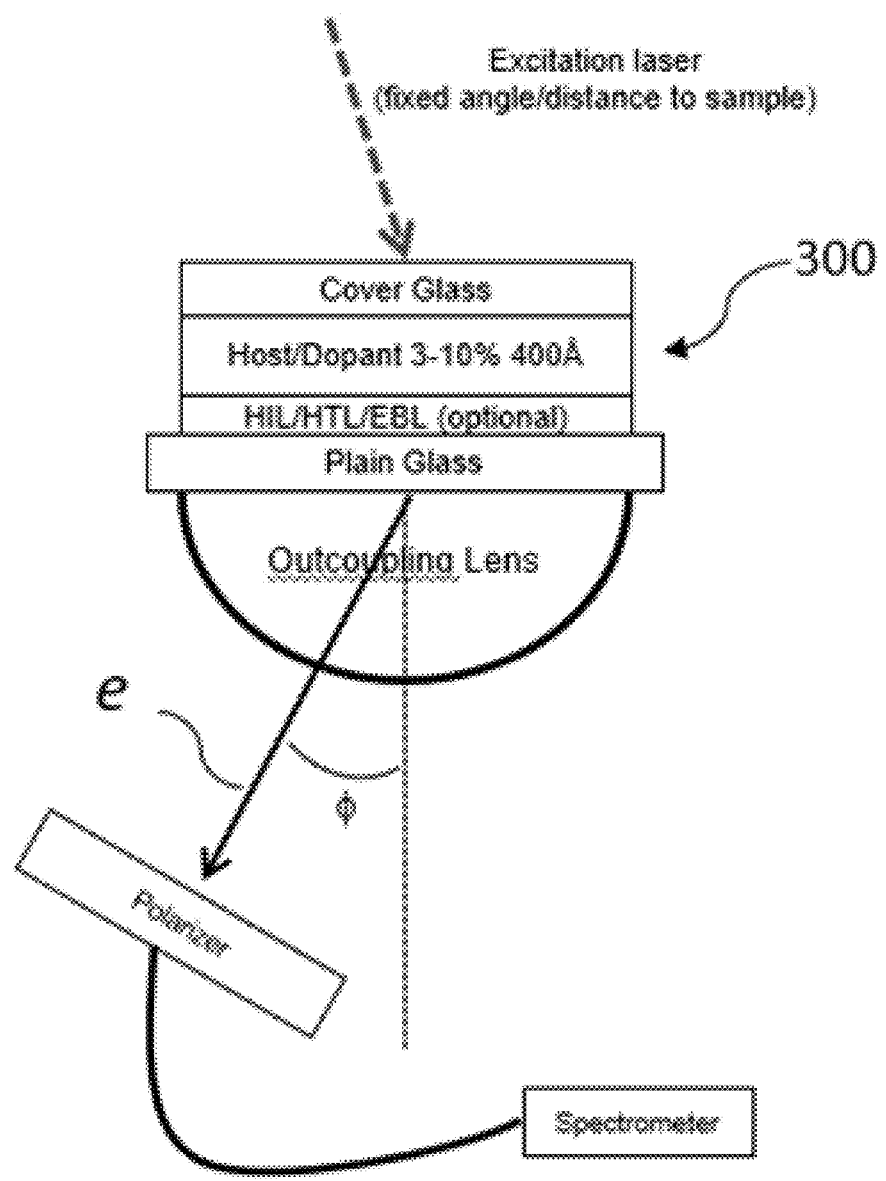
FIG. 11 shows the experimental setup for the angle dependent photoluminescence experiment used to measure emitter alignment.

As previously indicated, the average transition dipole moment (TDM) alignment for a given representative EML structure can be determined through angle dependent photoluminescence measurements. The angular dependence of the p-polarized emission is highly sensitive to the HDR. As such, as shown in FIG. 11, the HDR of a given emitter doped EML sample 300 can be determined by comparing the measured p-polarized emission e as a function of detection angle Φ to the angular dependence simulated based on the optical properties of the sample and the contribution of the two in-plane and one out-of-plane transition dipole modes.

Figure 12:
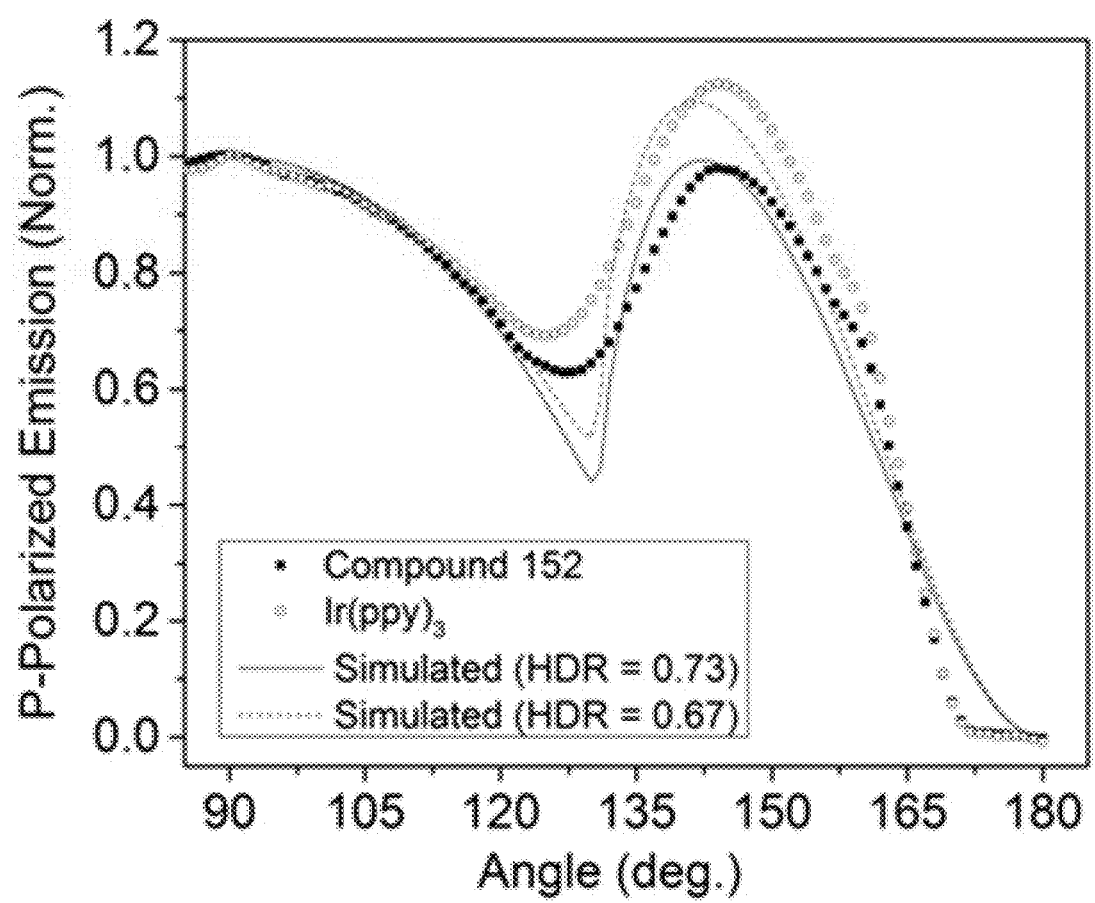
FIG. 12 shows an experimental data comparing horizontally oriented emitter Compound 152 with randomly (isotropically) oriented emitter tris(2-phenylpyridine) iridium.

Photoluminescence measurements of Compound 152 confirm increased TDM horizontal alignment with the substitution patterns described above. As shown in FIG. 12, the substitution pattern of Compound 152 produces a preferentially horizontally aligned EML with HDR=0.73 as opposed to the randomly oriented nature of tris(2-phenylpyridine) iridium (HDR=0.67).

Synthesis of Compound 152

Step 1

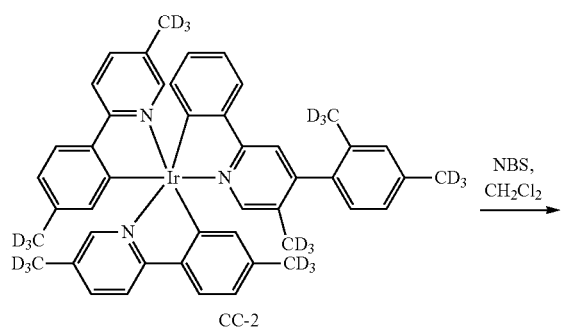

CC-2

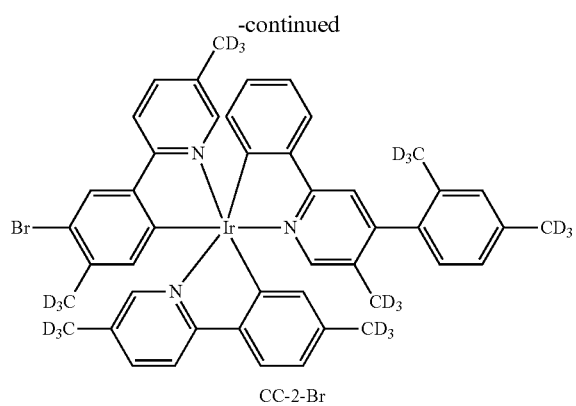

CC-2-Br

CC-2 (2.3 g, 2.71 mmol) was dissolved in dry dichloromethane (400 ml). The mixture was degassed with N₂ and cooled to 0° C. 1-Bromopyrrolidine-2,5-dione (0.81 g, 2.71 mmol) was dissolved in DCM (300 mL) and added dropwise. After addition, the temperature was gradually raised to room temperature and stirred for 12 hrs. Saturated NaHCO₃ (20 mL) solution was added. The organic phase was separated and collected. The solvent was removed and the residue was coated on Celite and purified on silica gel column eluted with toluene/heptane 70/30 (v/v) to give the product CC-2-Br (0.6 g, 24%).

Step 2

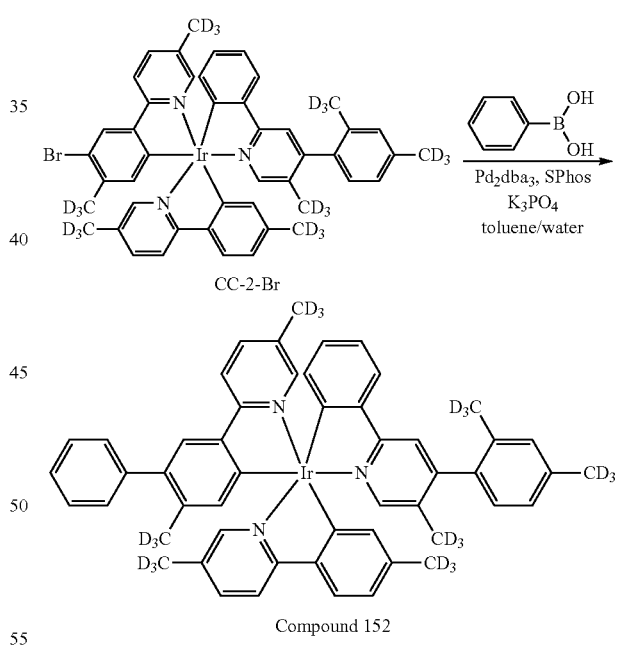

Compound 152

CC-2-Br (0.72 g, 0.775 mmol) was dissolved in a mixture of toluene (40 ml) and water (4 ml). The mixture was purged with N₂ for 10 mins. K₃PO₄ (0.411 g 1.937 mmol), SPhos (0.095 g, 0.232 mmol), Pd₂dba₃ (0.043 g, 0.046 mmol), and phenylboronic acid (0.189 g, 1.55 mmol) were added. The mixture was heated under N₂ at 110° C. for 12 hrs. The reaction then was cooled down to room temperature, the product was extracted with DCM. The organic phase was separated and collected. The solvent was removed and the residue was coated on Celite and purified on silica gel column eluted with toluene/heptane 70/30 (v/v). The product was further purified by recrystallization from toluene/MeOH to give Compound 152 (0.7 g).

Synthesis of Compound 153

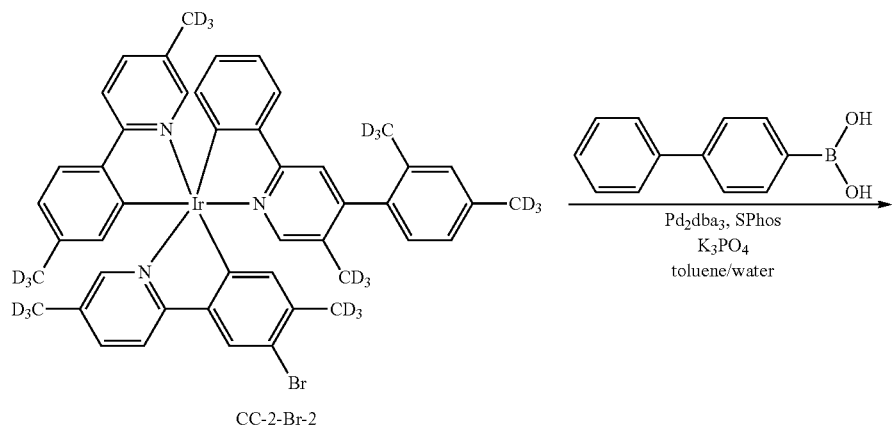

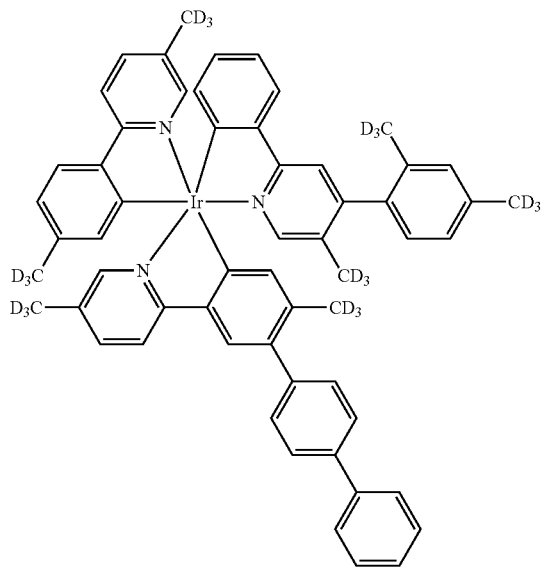

Compound 153

CC-2-Br-2 (0.6 g, 0.646 mmol) was dissolved in a mixture of toluene (100 ml) and water (10 ml). The mixture was purged with N₂ for 10 mins. K₃PO₄ (0.343 g 1.61 mmol), SPhos (0.080 g, 0.19 mmol), Pd₂dba₃ (0.035 g, 0.039 mmol), and [1,1-biphenyl]4-ylboronic acid (0.256 g, 1.29 mmol) were added. The mixture was heated under N₂ at 110° C. for 12 hrs. Then the reaction was cooled down to room temperature, the product was extracted with DCM and organic phase was separated. The solvent was removed and the residue was coated on Celite and purified on silica gel column eluted with toluene/heptane 70/30 (v/v). The product was further purified by recrystallization from toluene/MeOH to give Compound 153 (0.64 g).

Synthesis of Compound 154

Step 1

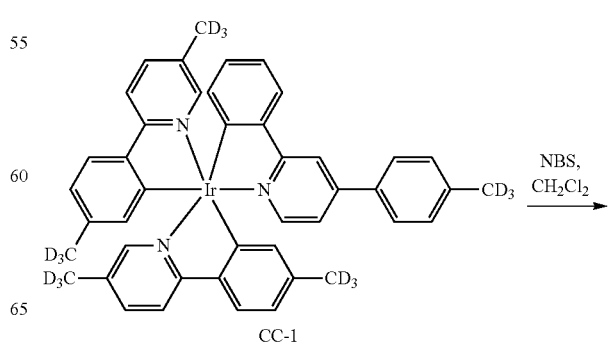

-continued

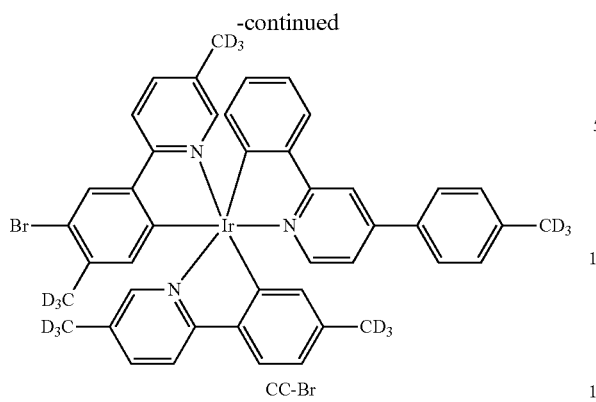
CC-Br

CC-1 (2.04 g, 2.500 mmol) was dissolved in dry dichloromethane (400 ml). The mixture was degassed with N$_2$ and cooled to 0° C. 1-bromopyrrolidine-2,5-dione (0.445 g, 2.500 mmol) was dissolved in DCM (200 mL) and dropwise added. After addition, the temperature was gradually raised to room temperature and stirred for 16 hrs. Sat. NaHCO$_3$ (20 mL) solution was added. The organic phase was separated and collected. The solvent was removed and the residue was coated on Celite and purified on silica gel column eluted by using 70/30 toluene/heptane to give the product CC-Br (0.6 g).

Step 2

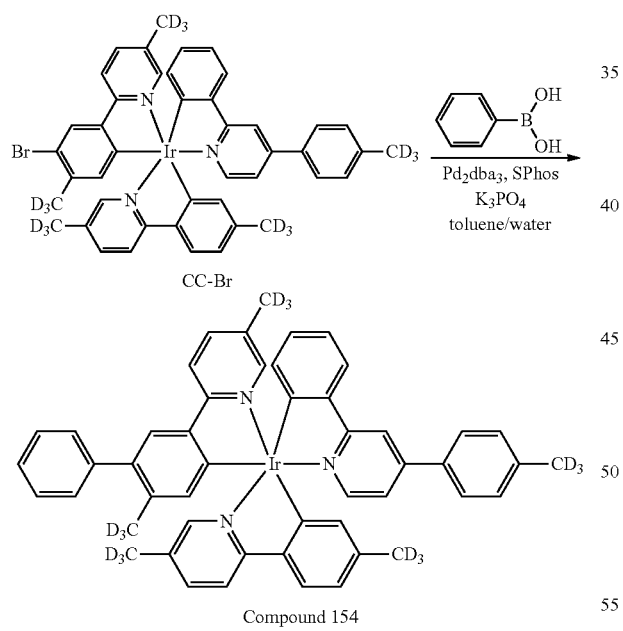
Compound 154

CC-Br (1.16 g, 1.296 mmol) was dissolved in a mixture of toluene (120 ml) and water (12.00 ml). The mixture was purged with N$_2$ for 10 mins. K$_3$PO$_4$ (0.688 g, 3.24 mmol, SPhos (0.160 g, 0.389 mmol), Pd$_2$dba$_3$ (0.071 g, 0.078 mmol), and phenylboronic acid (0.316 g, 2.59 mmol) was added. The mixture was heated under N$_2$ at 110° C. for 16 hrs. After the reaction was cooled down to room temperature, the product was extracted with DCM. The organic phase was separated and collected. The solvent was removed and the residue was coated on Celite and purified on silica gel column eluted by using 70/30 toluene/heptane. The product was further purified by recrystallization in toluene/MeOH to give Compound 154 (1.0 g).

Synthesis of Compound 155

Step 1

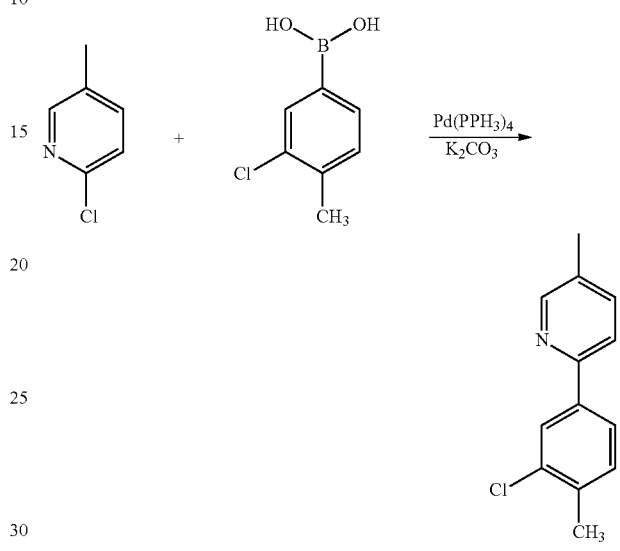
61

2-Chloro-5-methylpyridine (10.03 g, 79 mmol), (3-chloro-4-methylphenyl)boronic acid (13.4 g, 79 mmol), and potassium carbonate (21.74 g, 157 mmol) were dissolved in the mixture of DME (150 ml) and water (20 ml) under nitrogen to give a colorless suspension. Pd(PPh$_3$)$_4$ (0.909 g, 0.786 mmol) was added to the reaction mixture, then the reaction mixture was degassed and heated to 95° C. for 12 hrs. Then it was cooled down to room temperature, separated organic phase and evaporated. The residue was subjected to column chromatography on silica gel column, eluted with heptanes/THF 9/1 (v/v), providing after crystallization from heptanes 10 g (58% yield) of white solid.

Step 2

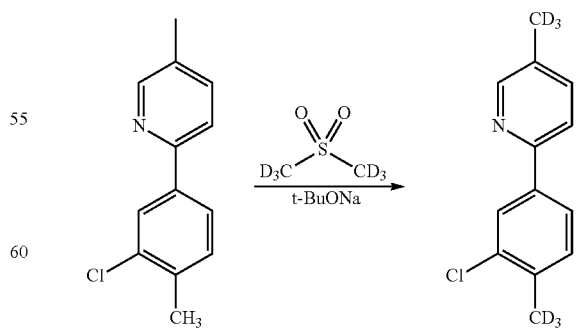

2-(3-Chloro-4-methylphenyl)-5-methylpyridine (10 g, 45.9 mmol), ((methyl-d3)sulfonyl)methane-d$_3$ (92 g, 919 mmol), and sodium 2-methylpropan-2-olate (2.65 g, 27.6 mmol)

were dissolved together under nitrogen to give a dark solution. The reaction mixture was heated to 80° C. under nitrogen for 12 hrs, cooled down, diluted with ethyl acetate, washed with water, dried over sodium sulfate, filtered and evaporated. Purified by column chromatography on silica gel, eluted with heptanes/THF 9/1 (v/v), providing white solid, then crystallized from heptanes, providing colorless crystalline material (9.1 g, 81% yield).

Step 3

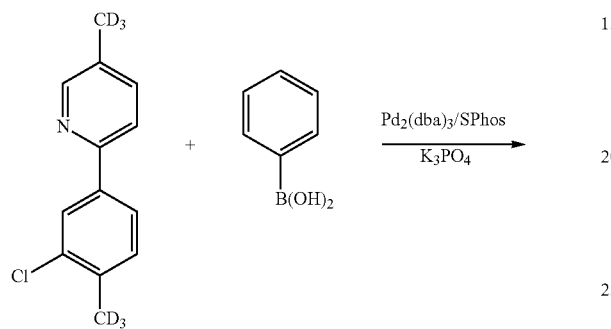

Step 4

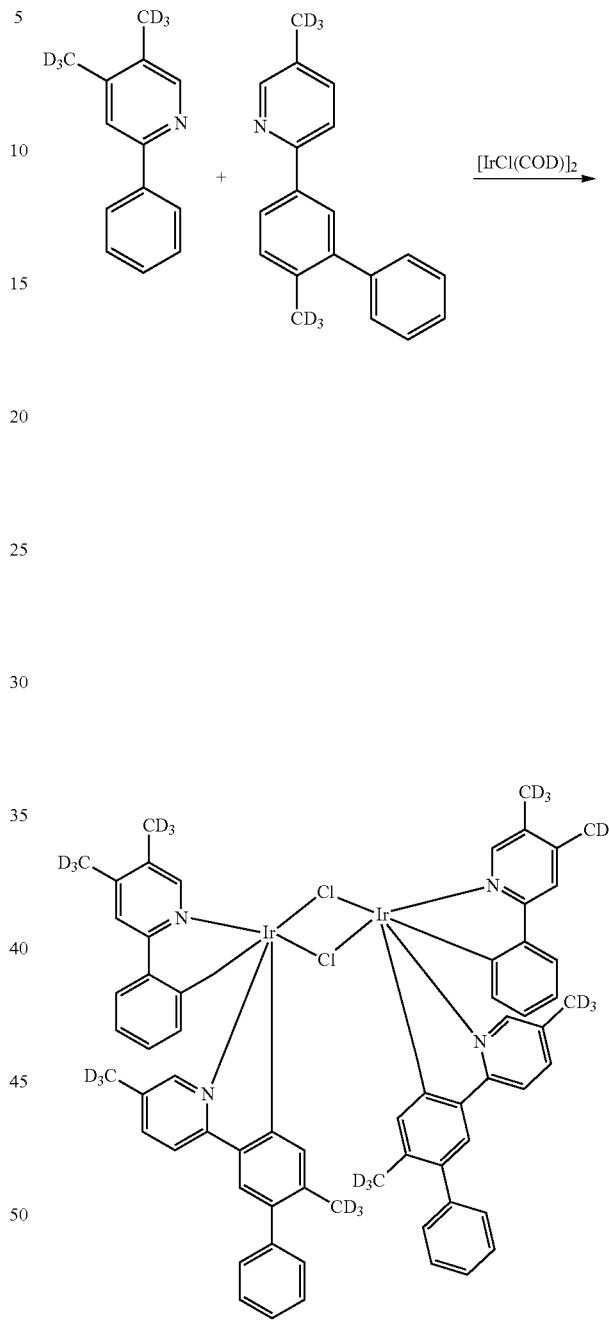

2-(3-Chloro-4-(methyl-$d_3$)phenyl)-5-(methyl-$d_3$)pyridine (7.45 g, 33.3 mmol), phenylboronic acid (6.09 g, 49.9 mmol), potassium phosphate (15.34 g, 66.6 mmol), Pd$_2$(dba)$_3$ (0.305 g, 0.333 mmol) and dicyclohexyl(2',6'-dimethoxy-[1,1'-biphenyl]-2-yl)phosphane (SPhos, 0.273 g, 0.666 mmol) were dissolved in the mixture of DME (150 ml) and water (25 ml) under nitrogen to give a red suspension. The reaction mixture was degassed and heated to reflux under nitrogen. After overnight heating about 80% conversion was achieved. Addition of more Ph boronic acid and catalyst didn't improve conversion. Purified by column chromatography on silica gel, eluted with heptanes/THF 9/1, then recrystallized from heptanes to obtain white solid (6.2 g, 70% yield).

Under nitrogen atmosphere 4,5-bis(methyl-$d_3$)-2-phenylpyridine (1.427 g, 7.54 mmol), 5-(methyl-$d_3$)-2-(6-(methyl-d3)-[1,1'-biphenyl]-3-yl)pyridine (2 g, 7.54 mmol), and [IrCl(COD)]2 (2.53 g, 3.77 mmol) were dissolved in ethoxyethanol (50 ml) under nitrogen to give a red solution. The reaction mixture was heated to reflux for 1 hr, then precipitate was formed. Added additional 30 mL of ethoxyethanol and reflux was continued for 48 hrs, then the reaction mixture was cooled down to room temperature. The crude material was used without additional purification in the next step.

Step 5

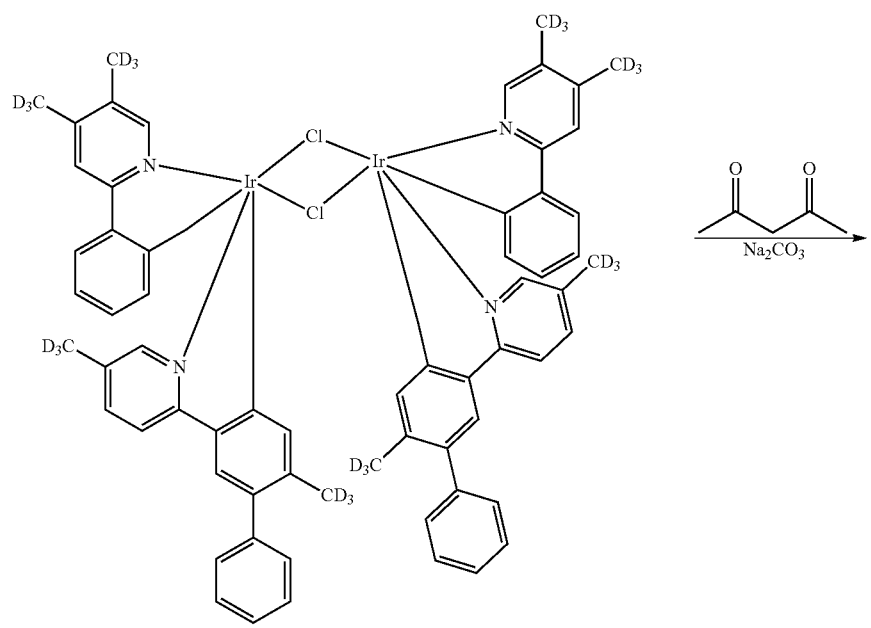

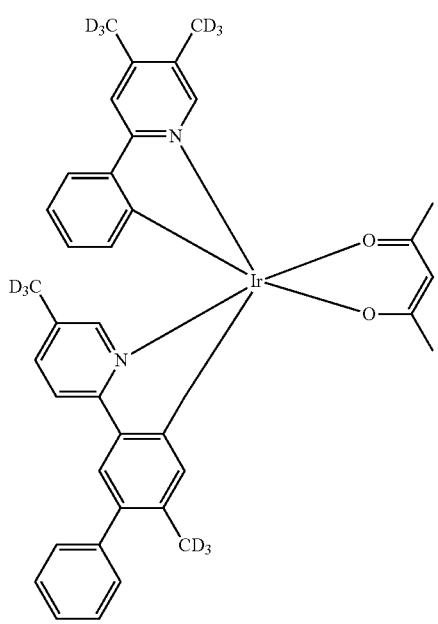

Iridium dimer suspended in ethoxyethanol was mixed under nitrogen atmosphere with pentane-2,4-dione (2.59 g, 25.9 mmol) and sodium carbonate (3.43 g, 32.3 mmol) in 50 ml of methanol, stirred 24 hrs under nitrogen at 55° C. and evaporated. The yellow residue was subjected to column chromatography on silica gel column, eluted with gradient mixture heptanes/toluene, providing 5 g (36% yield) of the target complex.

113
Step 6

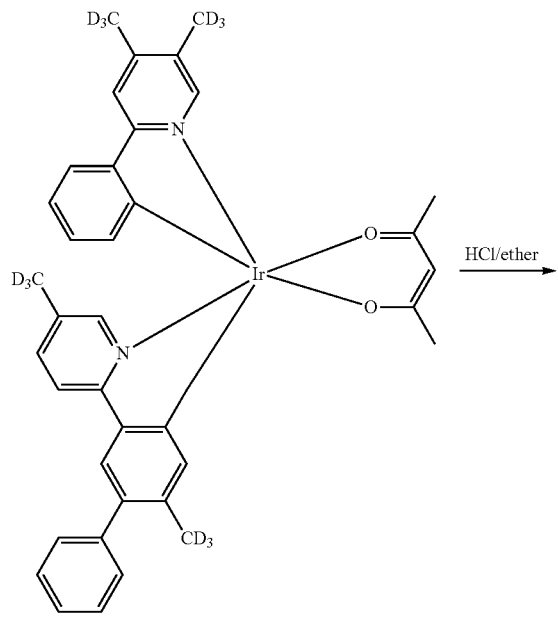

The acac complex (5 g, 6.72 mmol) was dissolved in DCM (20 mL), then HCl in ether (16.80 ml, 33.6 mmol) was added as one portion, stirred for 10 min, evaporated. The residue was triturated in methanol. The solid was filtered and washed with methanol and heptanes to obtain yellow solid (4.55 g, 100% yield).

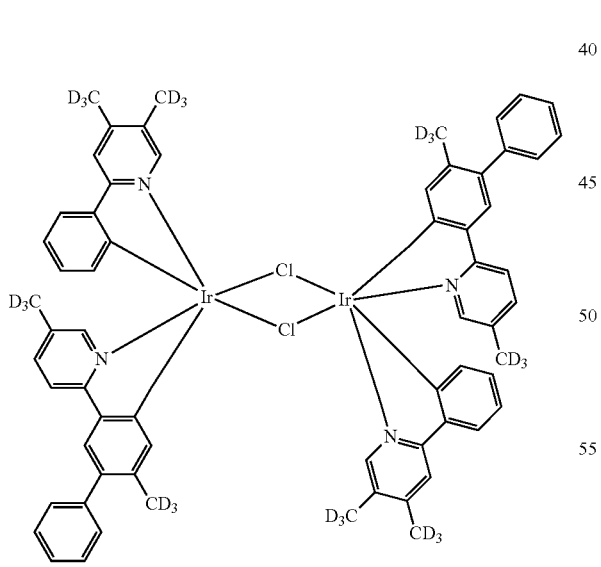

114
Step 7

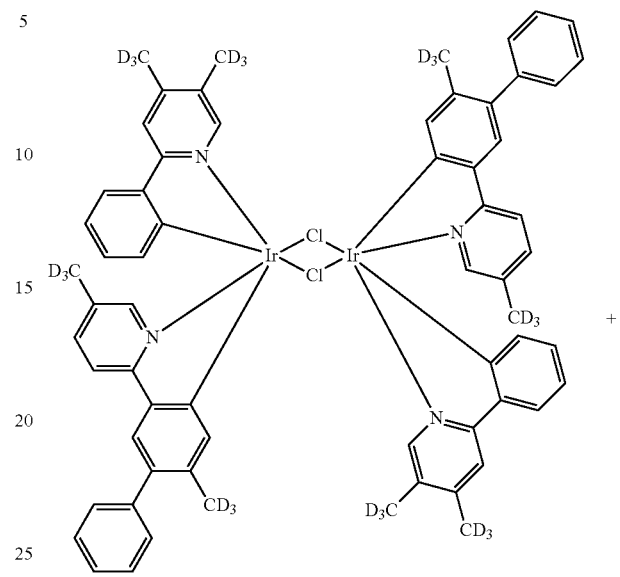

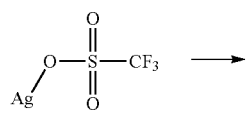

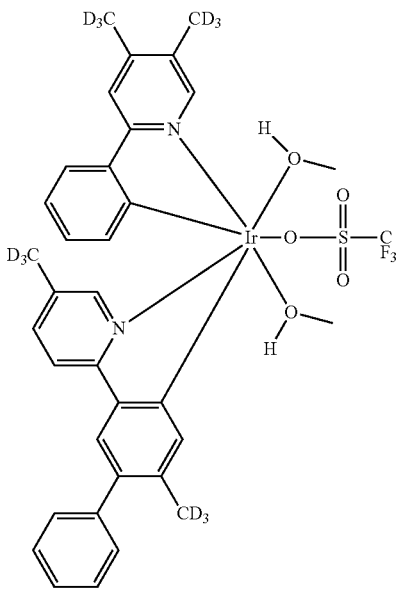

The Ir dimer (4.55 g, 3.34 mmol) and (((trifluoromethyl)sulfonyl)oxy)silver (2.062 g, 8.03 mmol) were suspended in 50 ml of DCM/methanol 1/1 (v/v) mixture and stirred over 72 hrs at room temperature, filtered through celite and evaporated, providing yellow solid (4.75 g, 83% yield).

Step 8

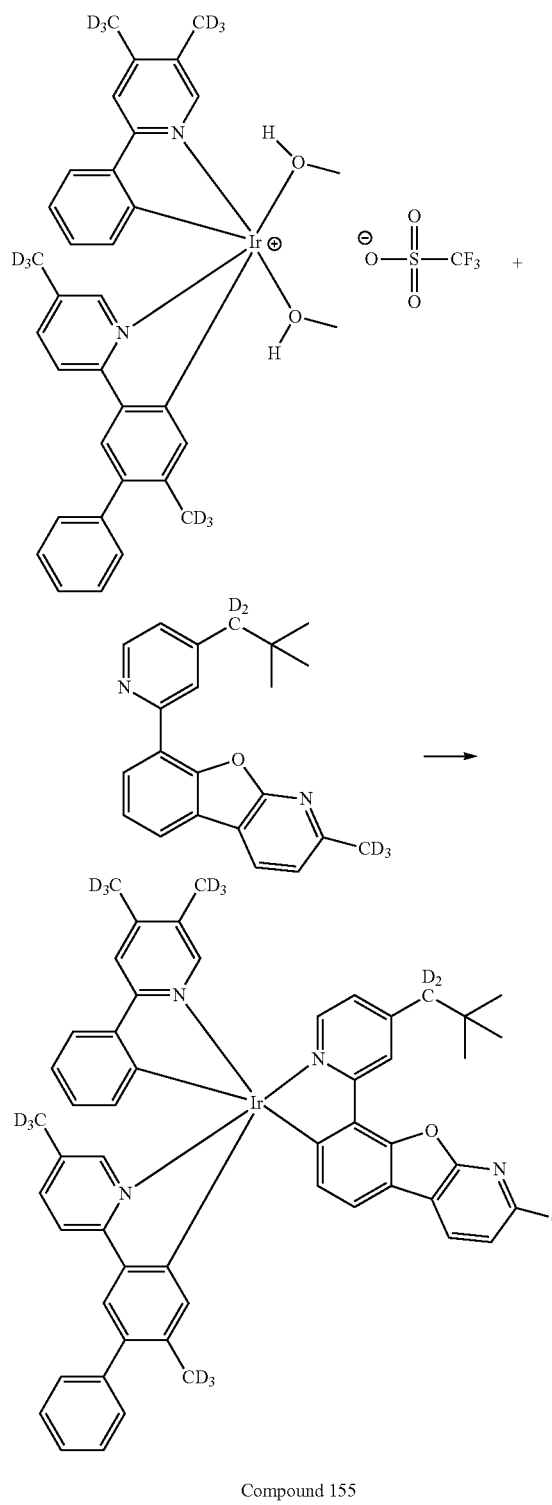

Compound 155

The mixture of triflic salt (3 g, 3.5 mmol) and 8-(4-(2,2-dimethylpropyl-1,1-d2)pyridin-2-yl)-2-(methyl-d$_3$)benzofuro[2,3-b]pyridine (2.56 g, 7.7 mmol) in 30 mL of methanol were stirred under nitrogen at 65° C. for 5 days. Then material was cooled down, and methanol was evaporated. The residue was subjected to column chromatography on the silica gel column, eluted with 2% of ethyl acetate in toluene, providing two isomers of the product (1.7 g with high R$_f$ and 0.7 g of complex with low R$_f$). Complex with low R$_f$ is the target Compound 155.

Device Examples

All example devices were fabricated by high vacuum (<10$^{-7}$ Torr) thermal evaporation. The anode electrode was 750 Å of indium tin oxide (ITO). The cathode consisted of 10 Å of Liq (8-hydroxyquinoline lithium) followed by 1,000 Å of Al. All devices were encapsulated with a glass lid sealed with an epoxy resin in a nitrogen glove box (<1 ppm of H$_2$O and O$_2$) immediately after fabrication with a moisture getter incorporated inside the package. The organic stack of the device examples consisted of sequentially, from the ITO Surface: 100 Å of HAT-CN as the hole injection layer (HIL); 450 Å of HTM as a hole transporting layer (HTL); emissive layer (EML) with thickness 400 Å. Emissive layer containing H-host (H1): E-host (H2) in 6:4 ratio and 12 weight % of green emitter. 350 Å of Liq (8-hydroxyquinoline lithium) doped with 40% of ETM as the ETL. Device structure is shown in Table 2 below. Table 2 shows the schematic device structure. The chemical structures of the device materials are shown below.

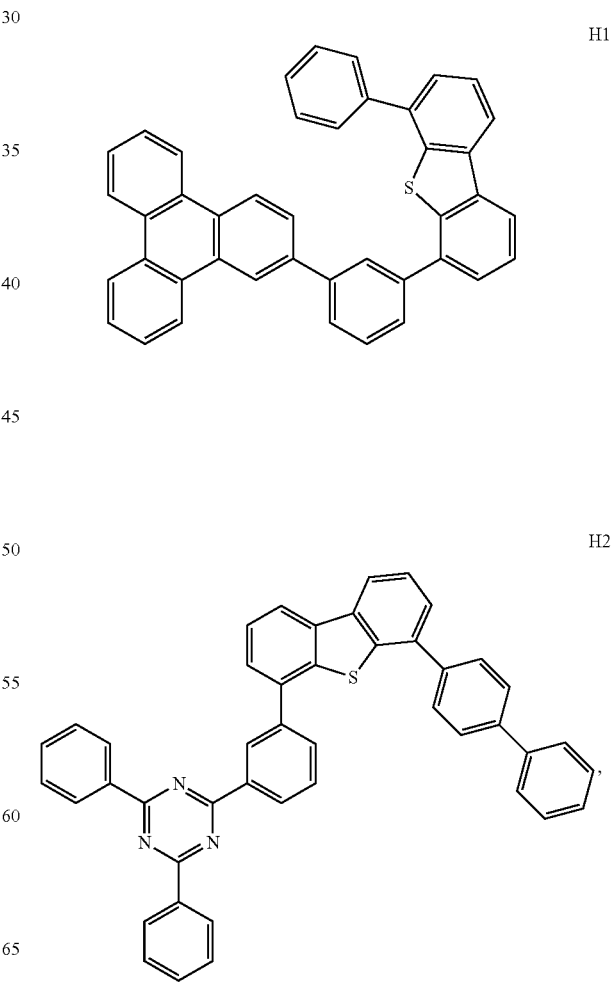

Compound 152
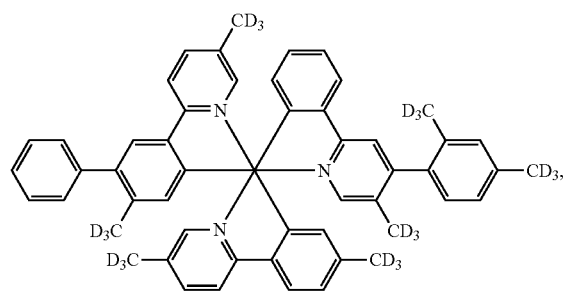
Compound 153
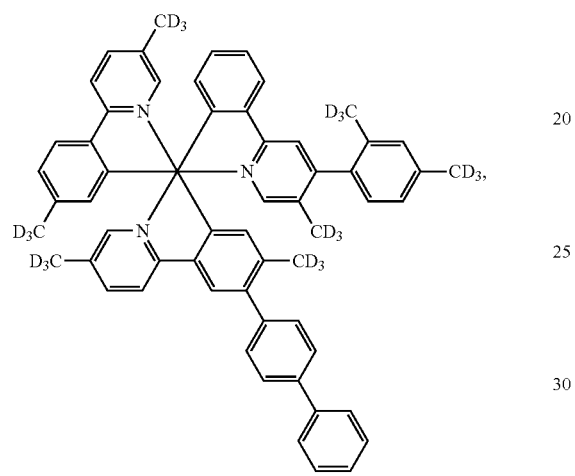
Comparative example
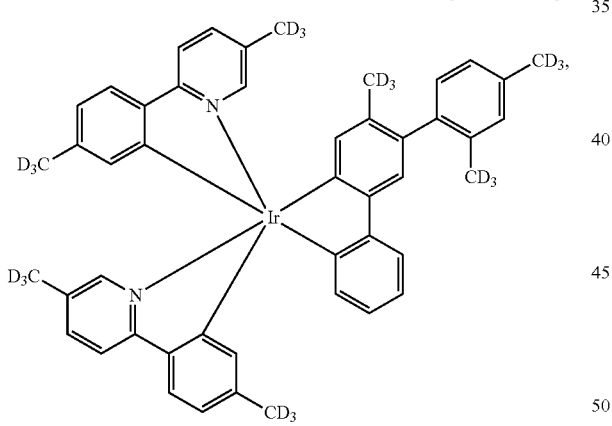
CC-1
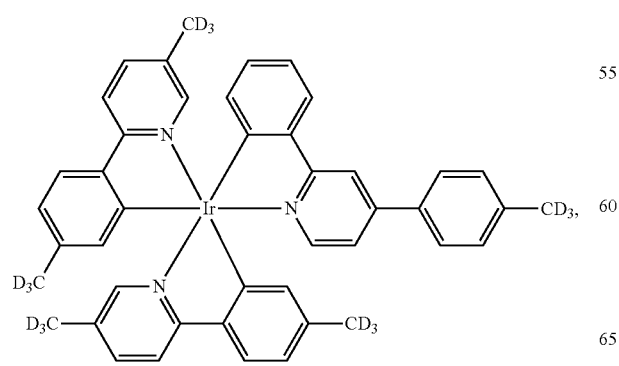
CC-2
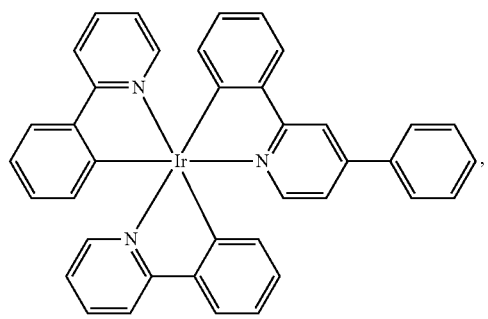
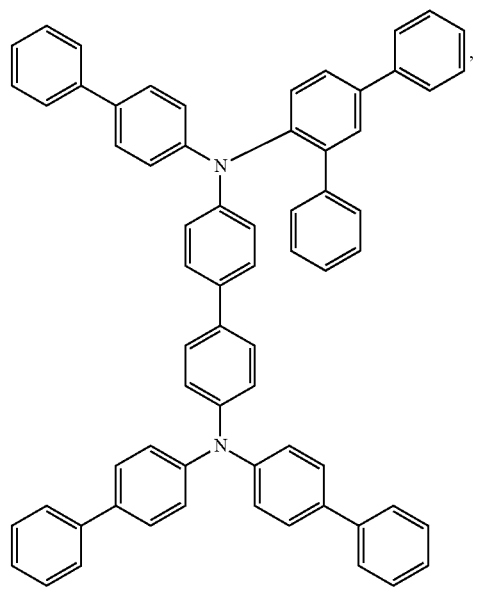
HTM
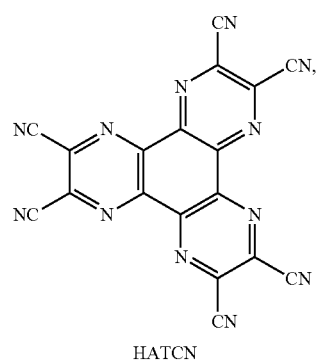
HATCN -continued

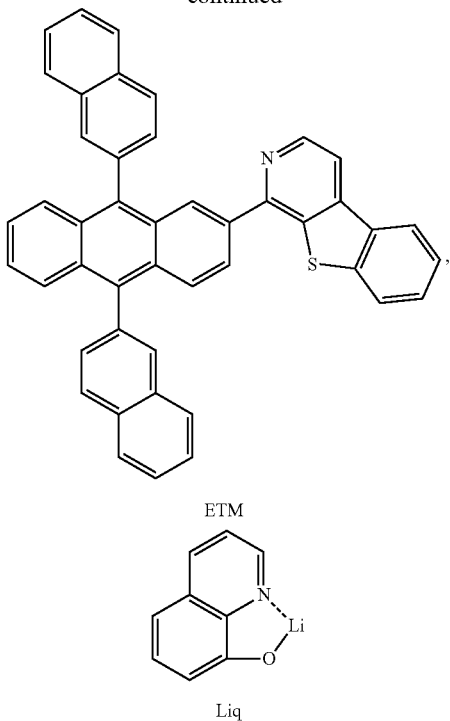

ETM

Liq

Upon fabrication the devices have been measured for EL, JVL, and lifetime tested at DC 80 mA/cm². Device performance is shown in Table 3, voltage, LE, EQE, PE, and LT97% are all normalized to the comparative compound.

TABLE 2 schematic device structure

| Layer | Material | Thickness [Å] |
| --- | --- | --- |
| Anode | ITO | 800 |
| HIL | HAT-CN | 100 |
| HTL | HTM | 450 |
| Green EML | H1:H2: example dopant | 400 |
| ETL | Liq:ETM 40% | 350 |
| EIL | Liq | 10 |
| Cathode | Al | 1,000 |

TABLE 3

Device performance

| Emitter [12%] | 1931 CIE | | λ max [nm] | FWHM [nm] | At 10 mA/cm² | | | | at 80 mA/cm²* | |
| --- | --- | --- | --- | --- | --- | --- | --- | --- | --- | --- |
| | x | y | | | Voltage [rel] | LE [rel] | EQE [rel] | PE [rel] | Lo [nits] | $LT_{97\%}$ [rel] |
| Comparative example | 0.319 | 0.624 | 521 | 73 | 1.00 | 1.00 | 1.00 | 1.00 | 46,497 | 1.00 |
| Compound 153 | 0.315 | 0.628 | 519 | 71 | 1.02 | 1.04 | 1.03 | 1.02 | 46,542 | 1.70 |
| Compound 152 | 0.313 | 0.628 | 518 | 71 | 0.99 | 1.12 | 1.12 | 1.14 | 51,738 | 3.00 |

Comparing Compounds 152 and 153 with the comparative example; the efficiency of both compound 152 and 153 are higher than the comparative example. Presumably Compound 152 and Compound 153 have higher horizontal emitting dipole orientation than comparative example. Elongated and planar substituents with high electrostatic potential enlarge the interacting surface region between Ir complex and host molecules; resulting in stacking Ir complexes parallel to film surface and increasing the out coupling efficiency. Moreover, the $LT_{97\%}$ at 80 mA/cm² of both Compound 152 and Compound 153 is greater than comparative example; indicating the elongated substituents not only increase the efficiency; but also increase the stability of the complexes in device.

Provided in Table 4 below is a summary of the device data recorded at 9000 nits for device examples, the EQE value is normalized to Device C-2.

TABLE 4

| Device ID | Dopant | Color | EQE (rel) |
| --- | --- | --- | --- |
| Device 3 | Compound 154 | Yellow | 1.24 |
| Device C-1 | CC-1 | Yellow | 1.10 |
| Device C-2 | CC-2 | Yellow | 1.00 |

The data in Table 4 show that the device using the inventive compound as the emitter achieves the same color but with higher efficiency in comparison with the comparative examples. It is noted that the only difference between the inventive compound (Compound 154) and the comparative compound (CC-1) is that the inventive compound has a phenyl moiety replacing one of the protons in the comparative compounds, which increases the distance between the terminal atoms in one direction across the Ir metal center. The device results show that the larger aspect ratio of the emitter molecule seems to be critical in achieving higher device efficiency.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804 and US2012146012.

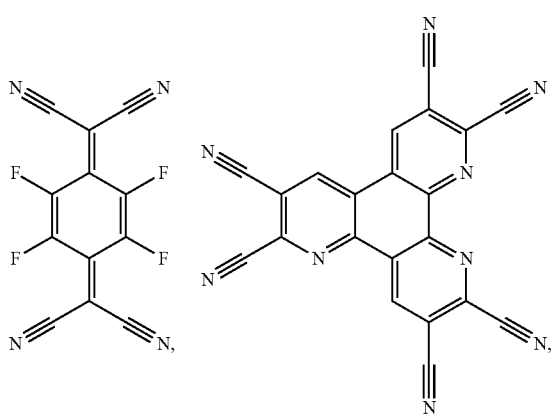

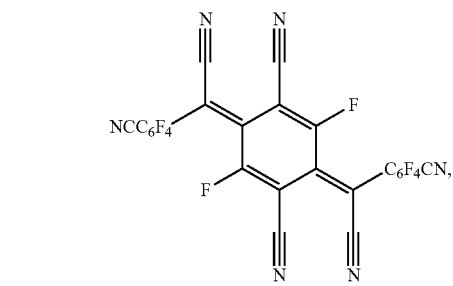

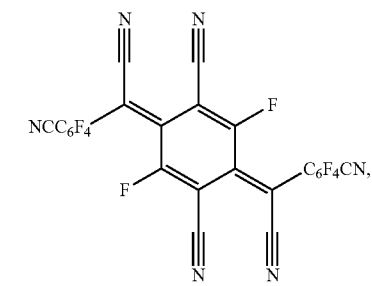

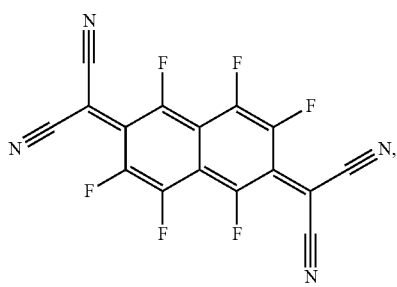

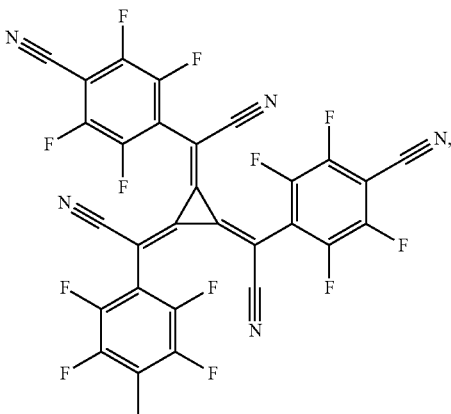

-continued

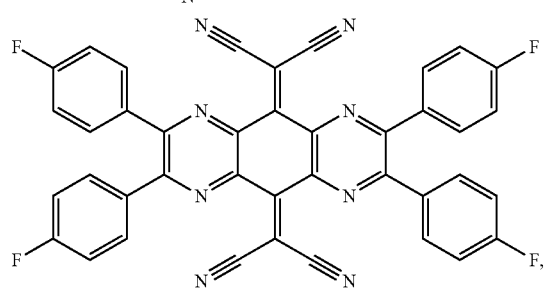

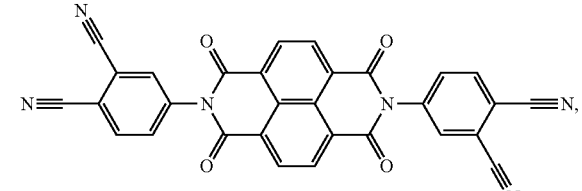

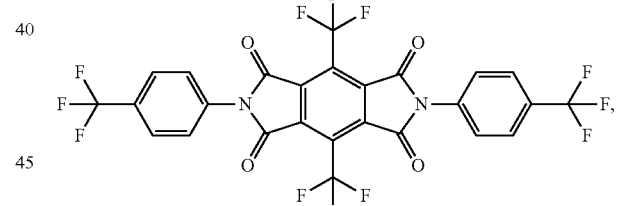

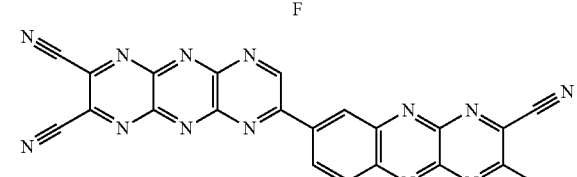

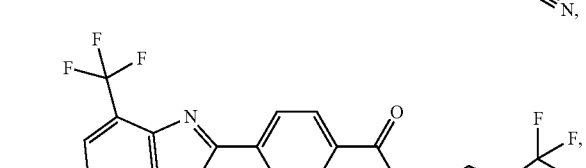

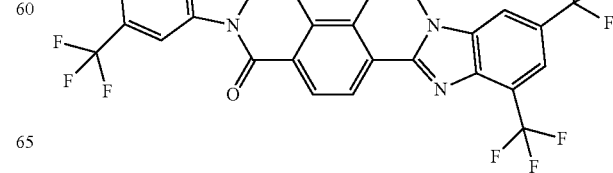

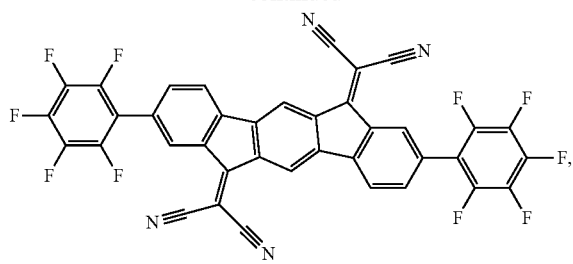

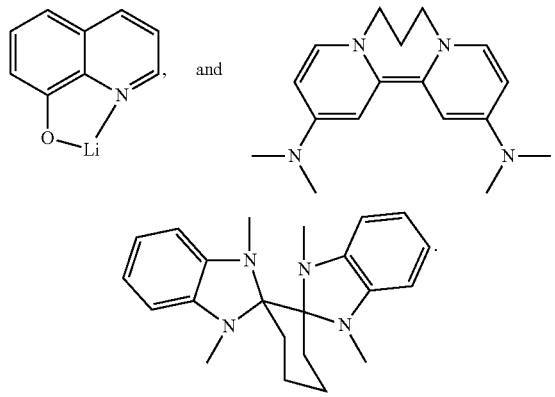

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

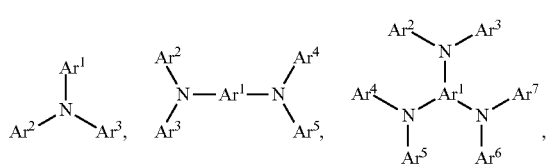

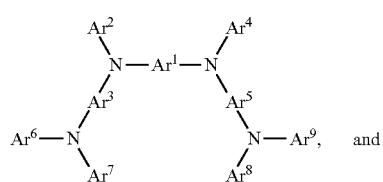

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

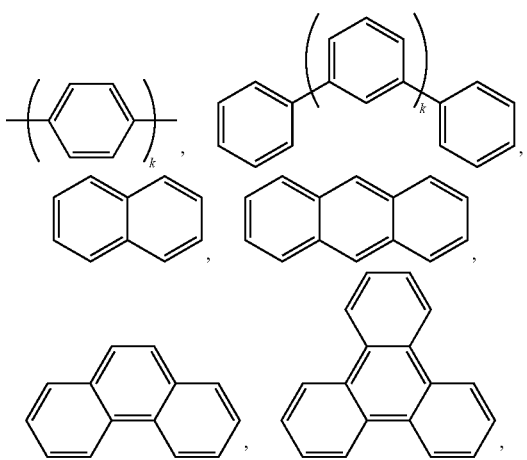

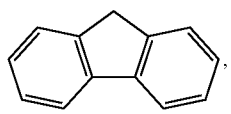 , and 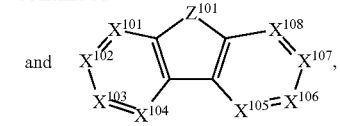

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

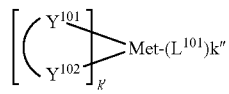

wherein Met is a metal, which can have an atomic weight greater than 40; $(Y^{101}\text{-}Y^{102})$ is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, $(Y^{101}\text{-}Y^{102})$ is a 2-phenylpyridine derivative. In another aspect, $(Y^{101}\text{-}Y^{102})$ is a carbene ligand. In another aspect, Met is selected from Ir, Pt, Os, and Zn. In a further aspect, the metal complex has a smallest oxidation potential in solution vs. $Fc^+/Fc$ couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

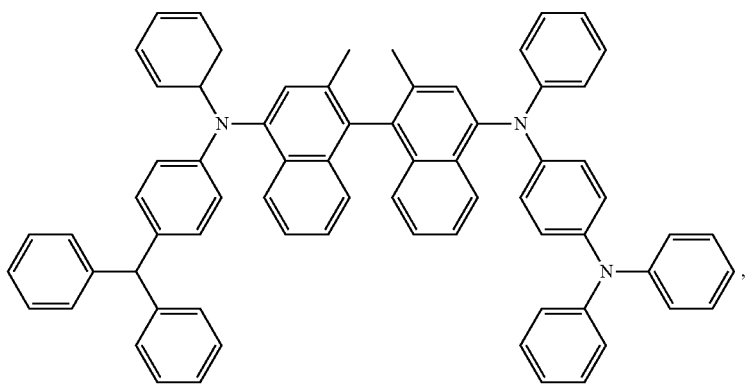

-continued
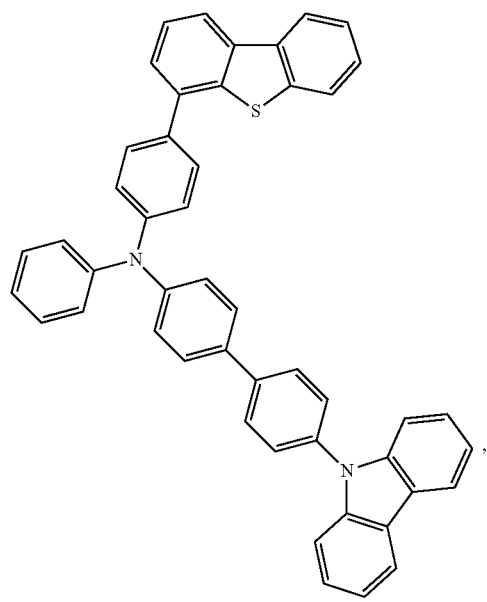
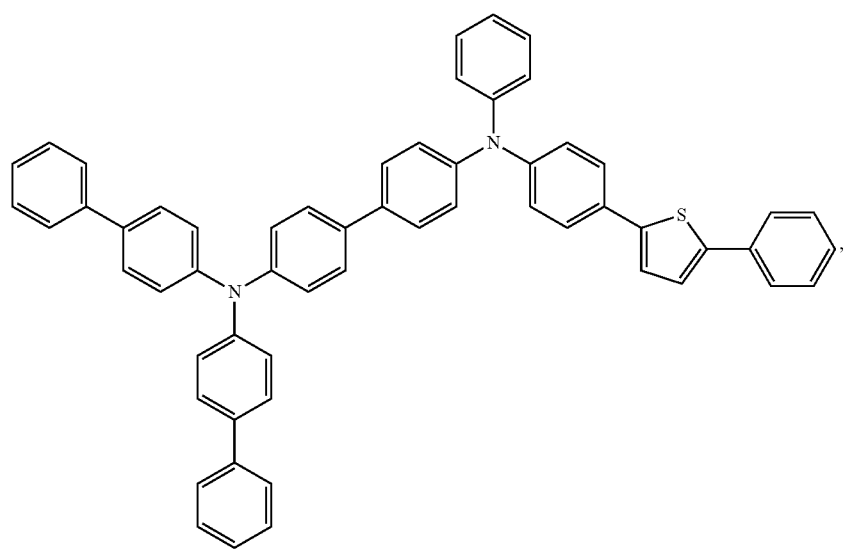
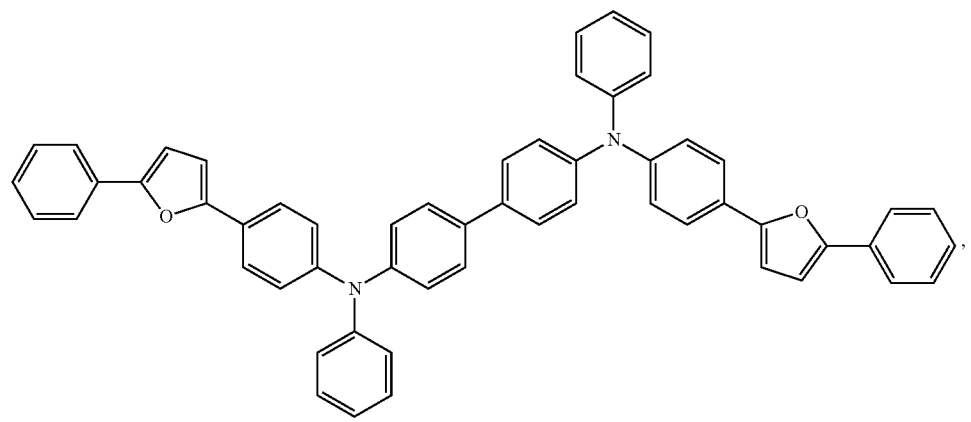

-continued
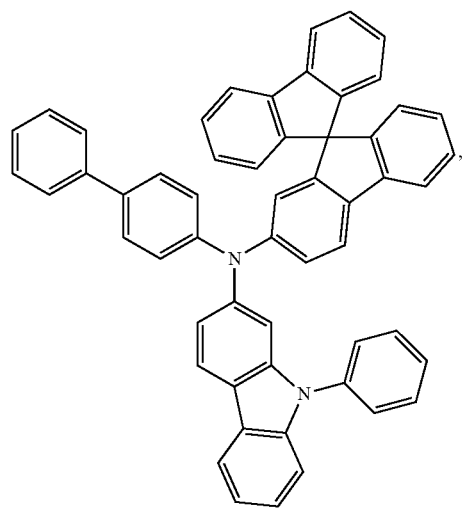 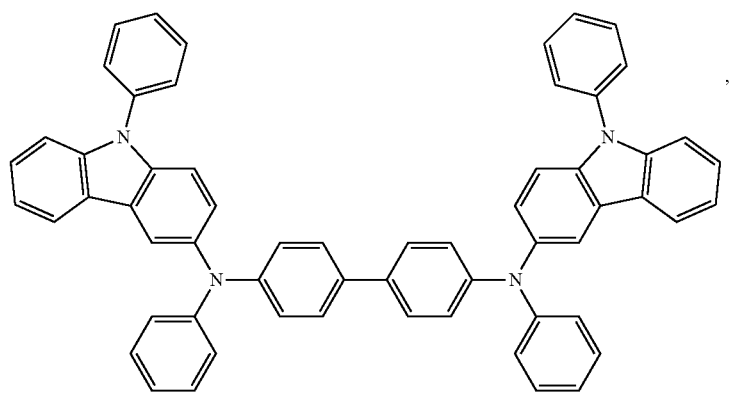
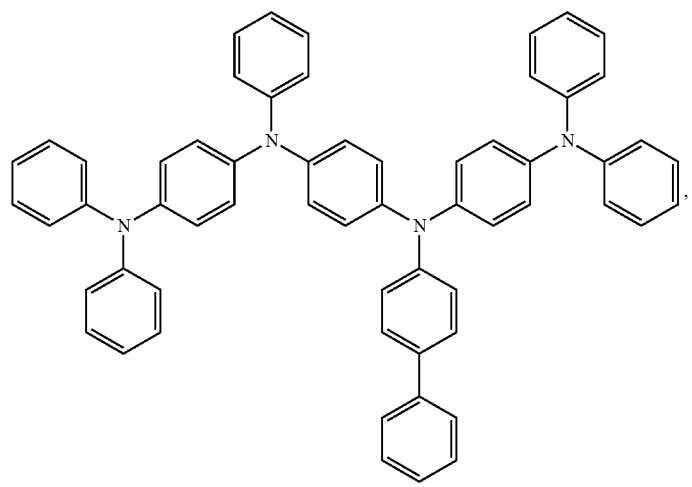
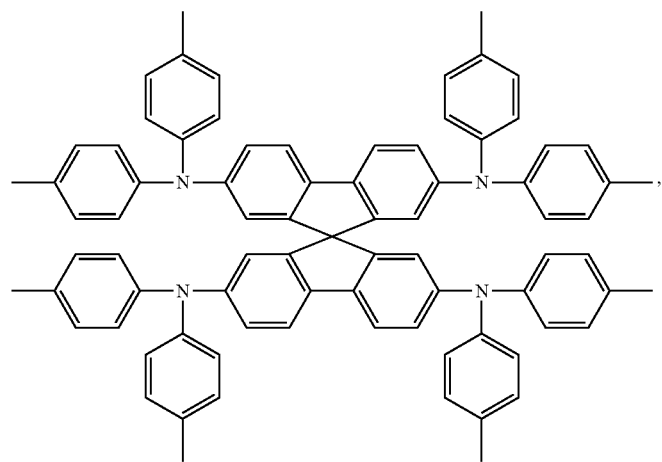

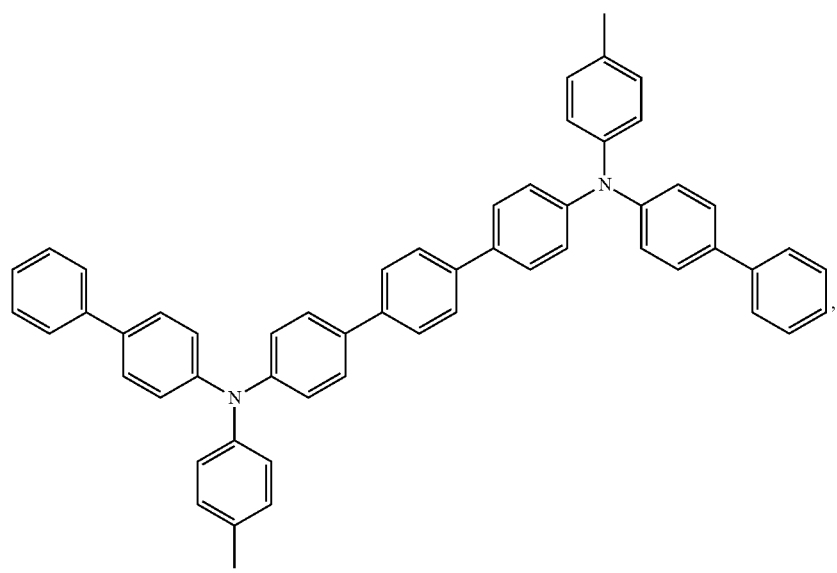
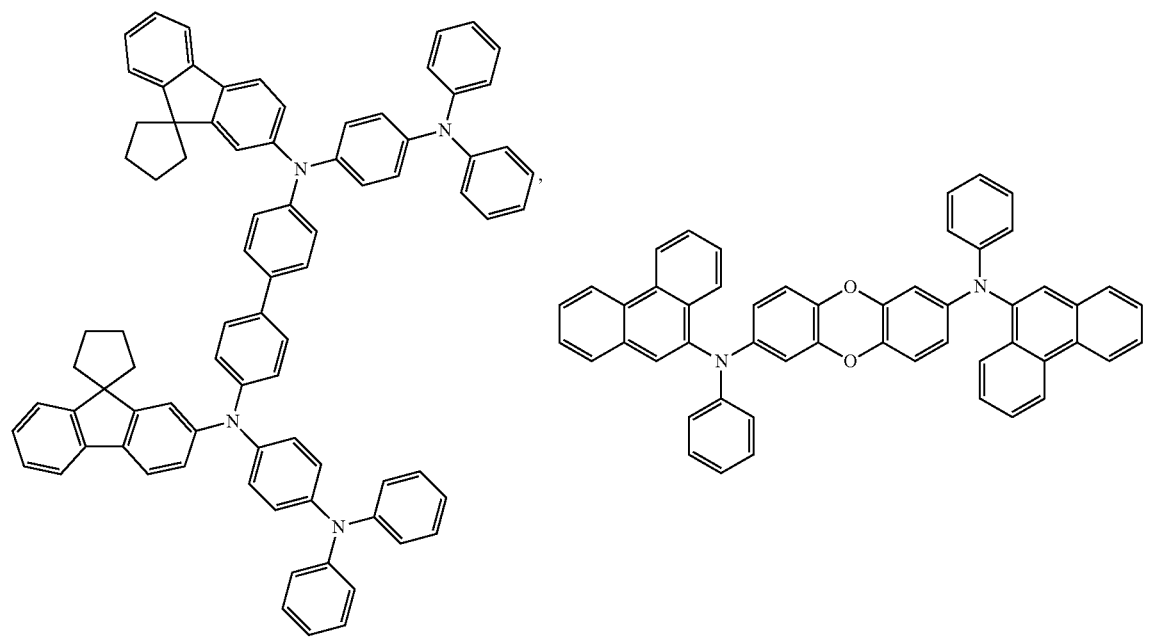
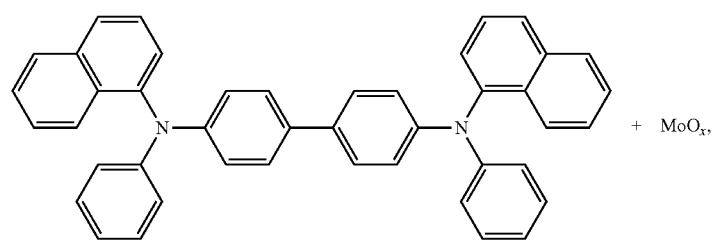

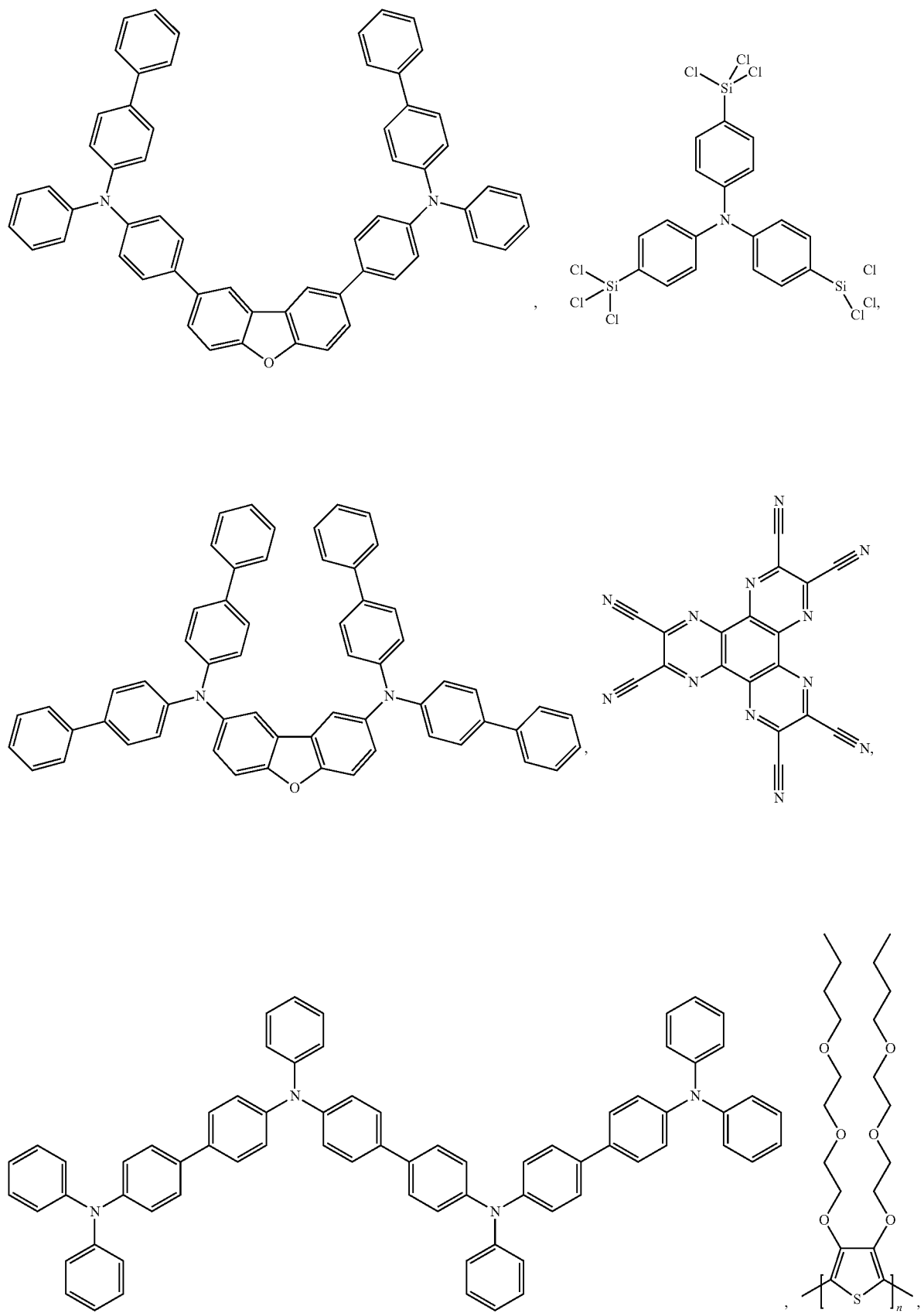

-continued
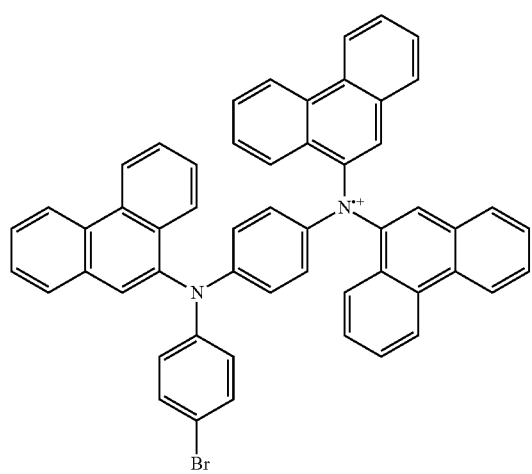
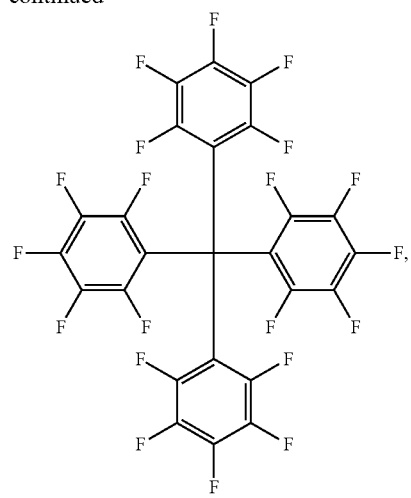
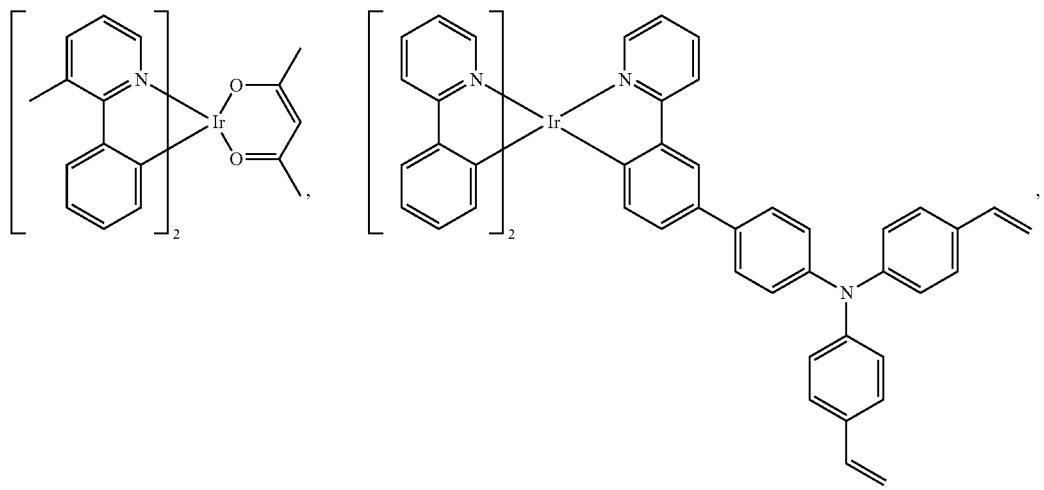
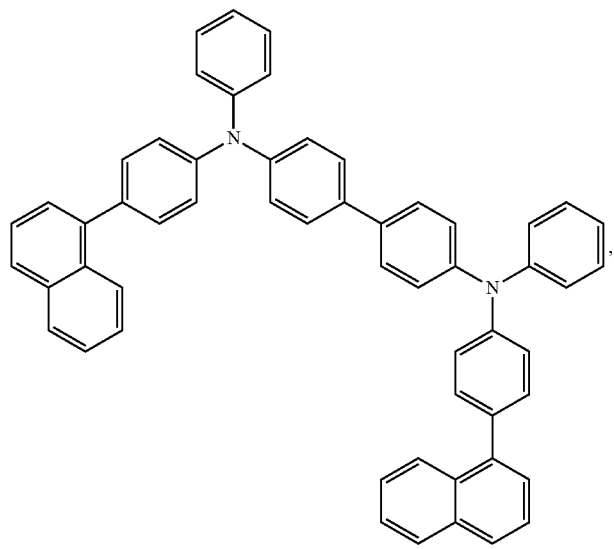

-continued
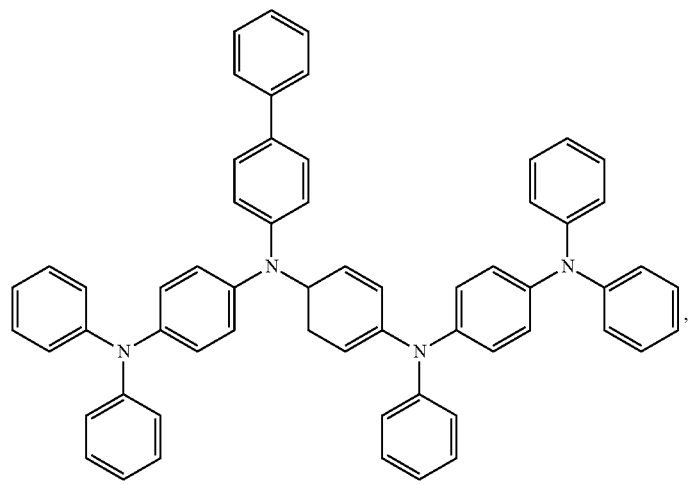
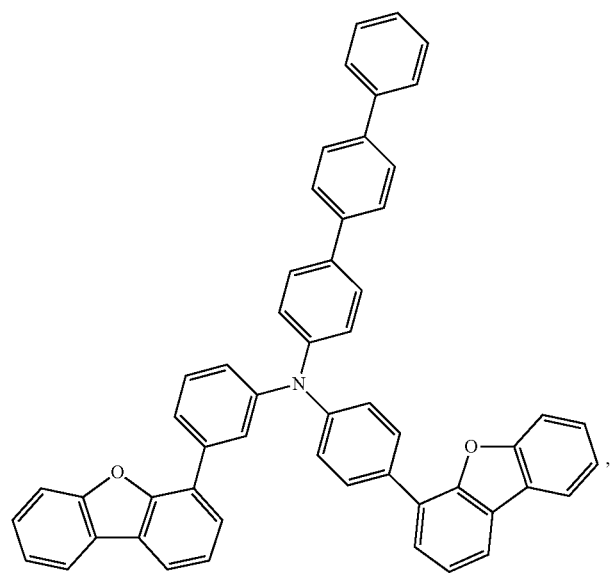
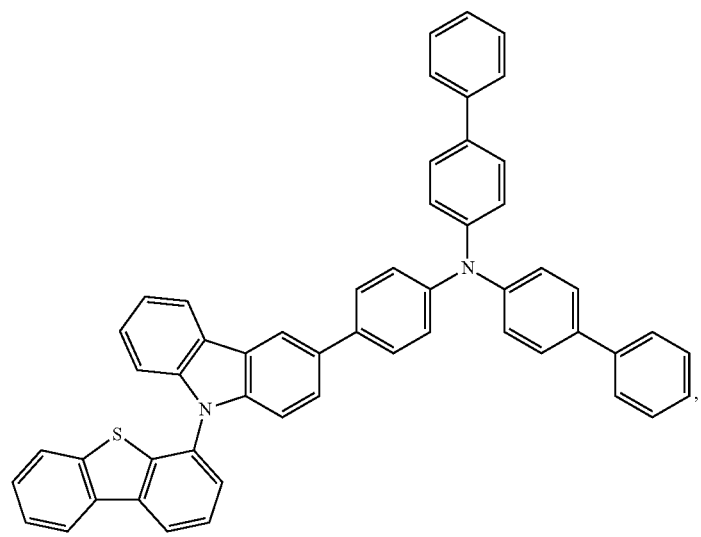

-continued
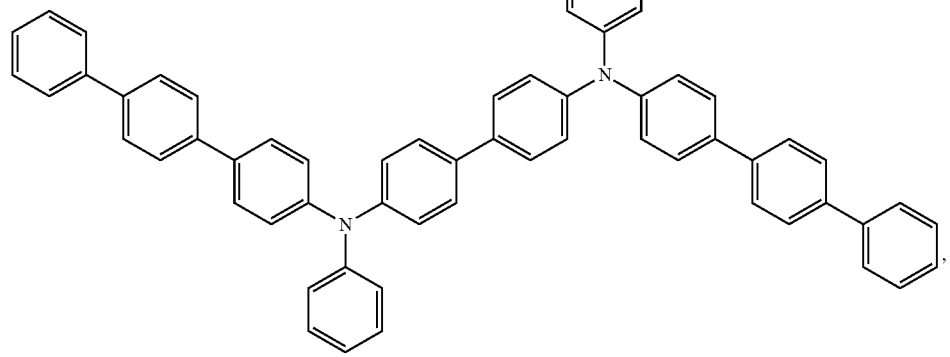
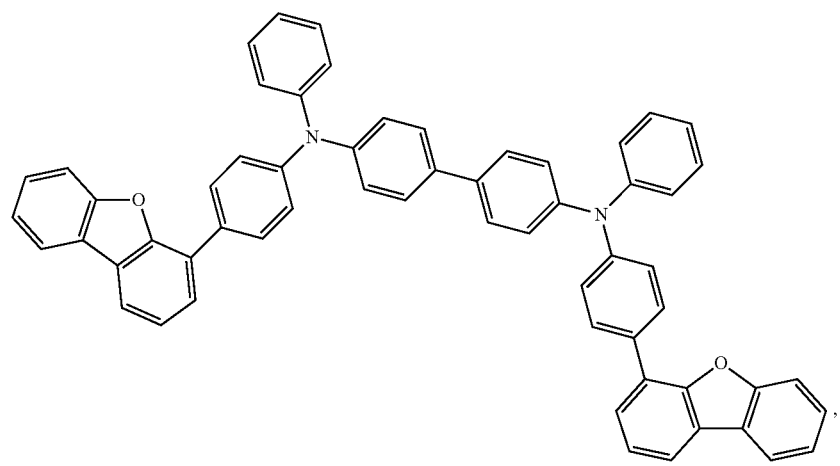
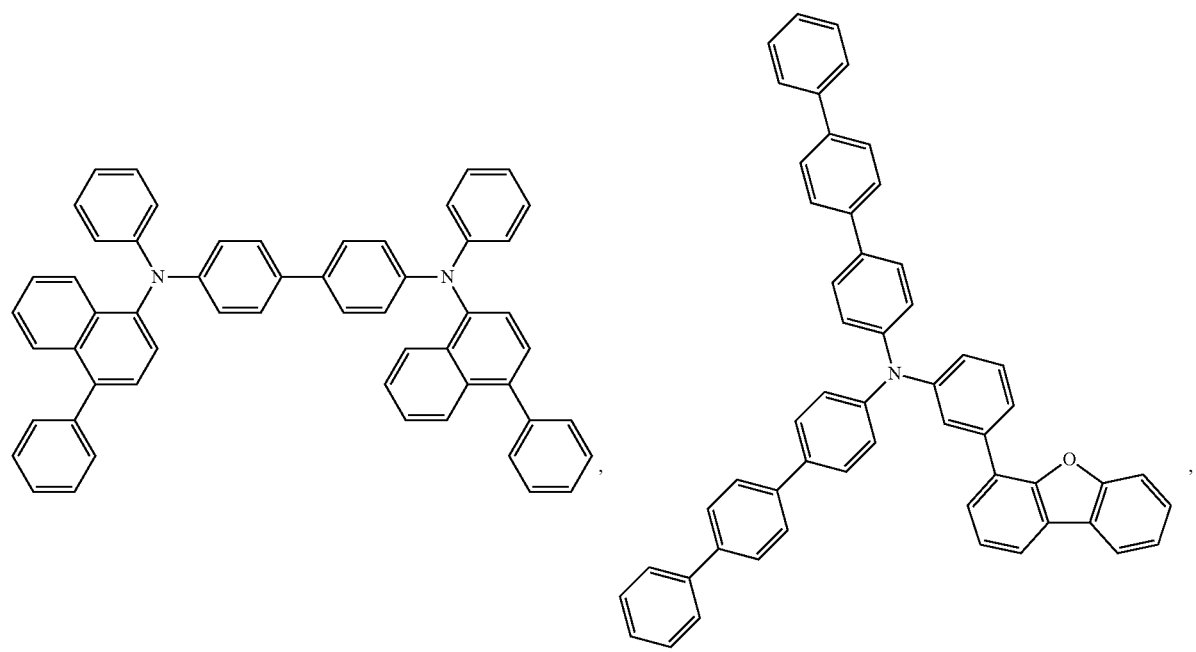

141 142
-continued
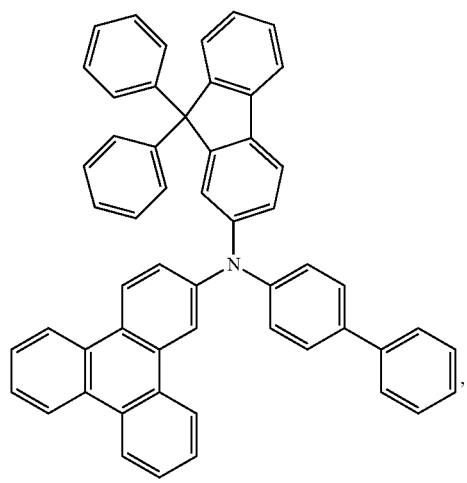
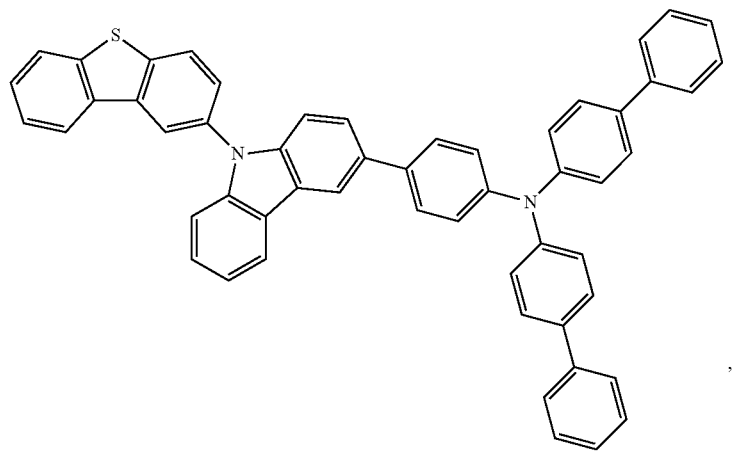
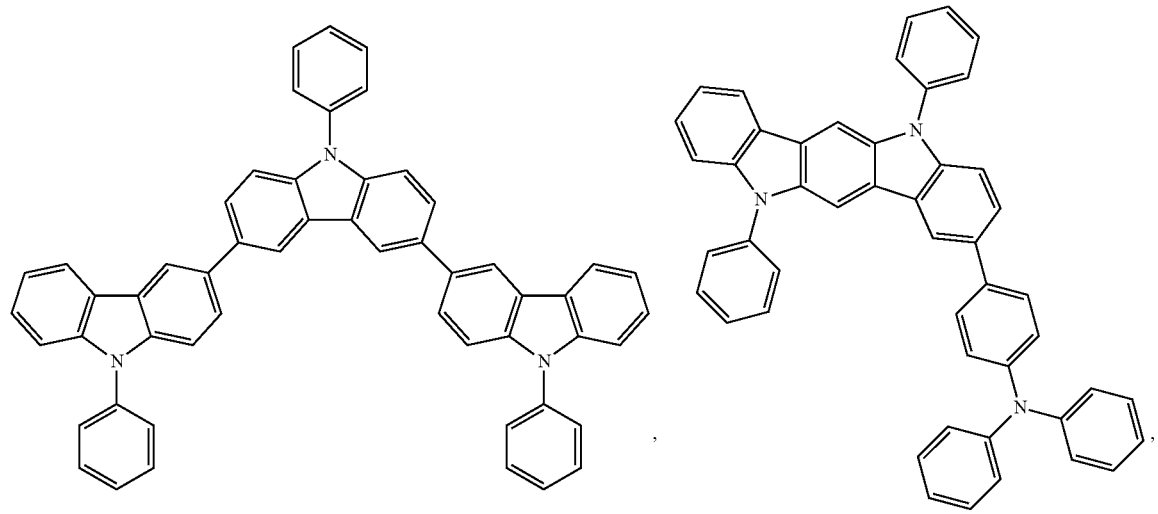
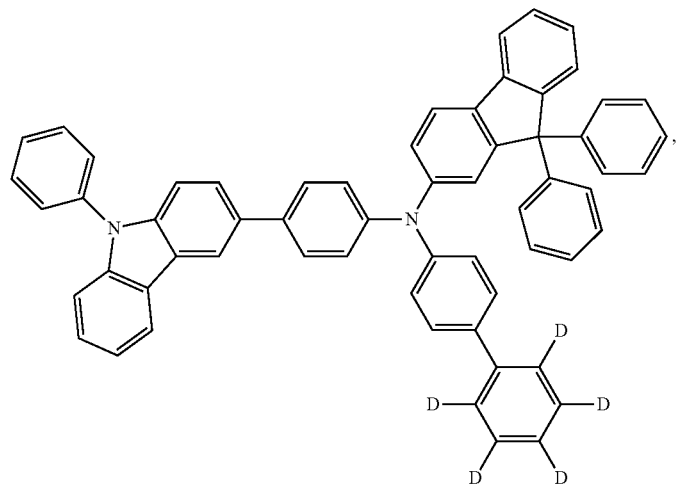

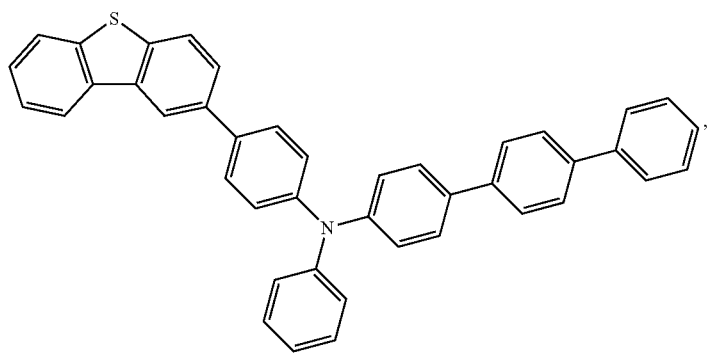
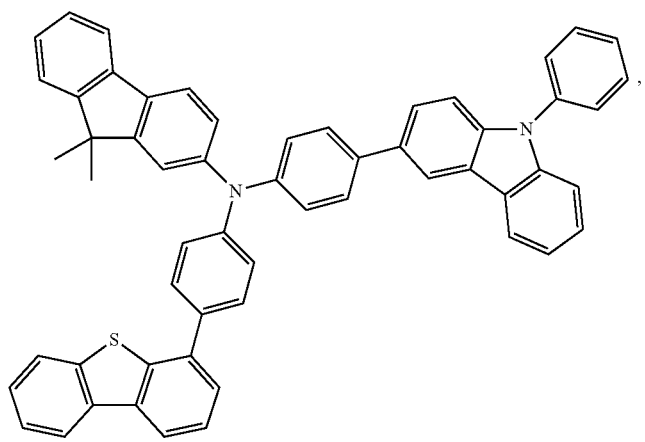
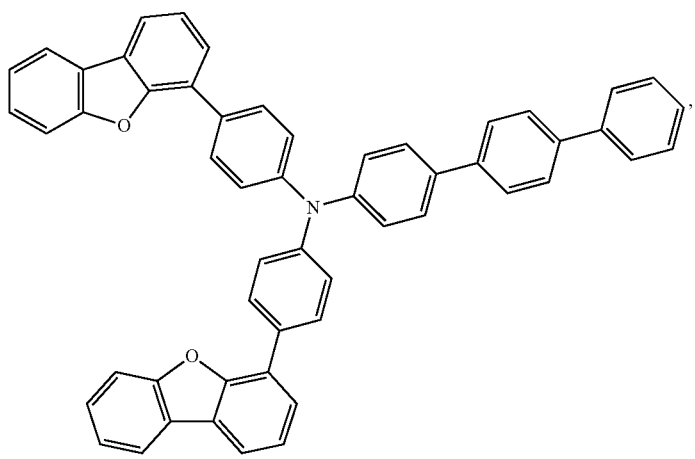

-continued
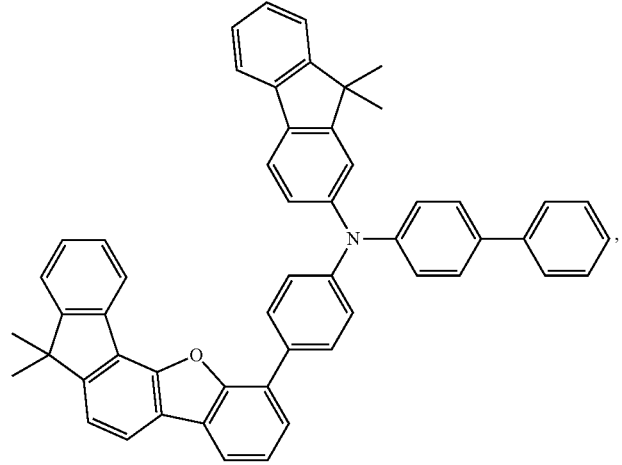 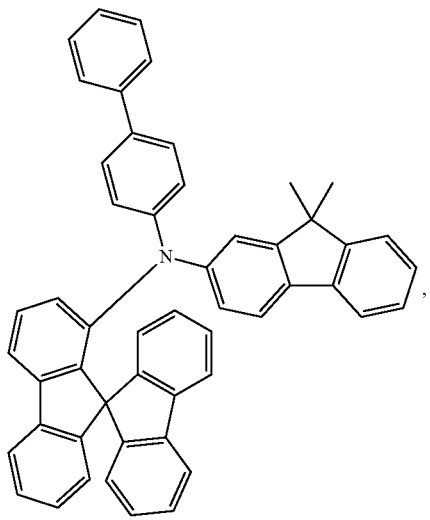
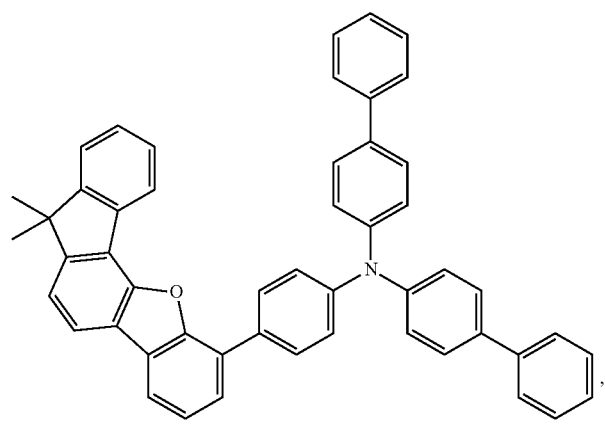
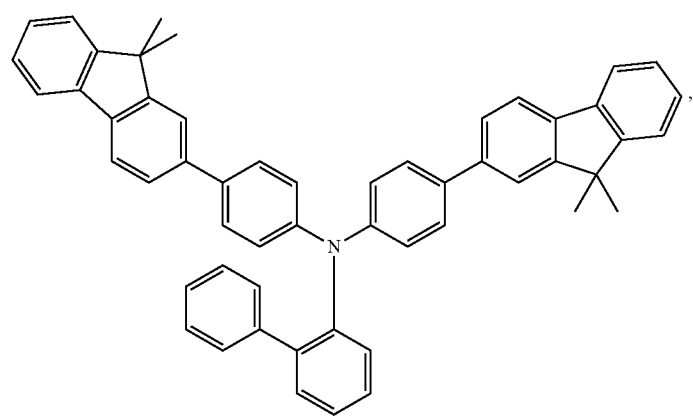

-continued
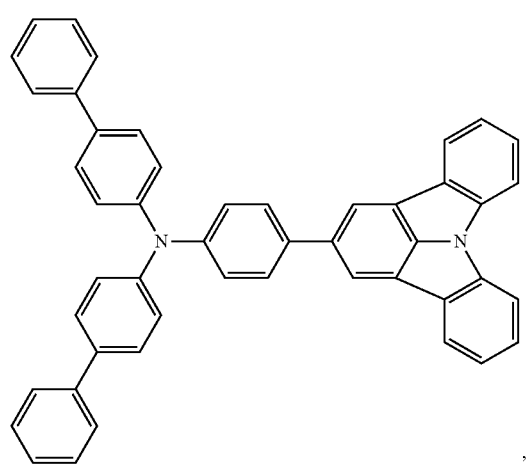
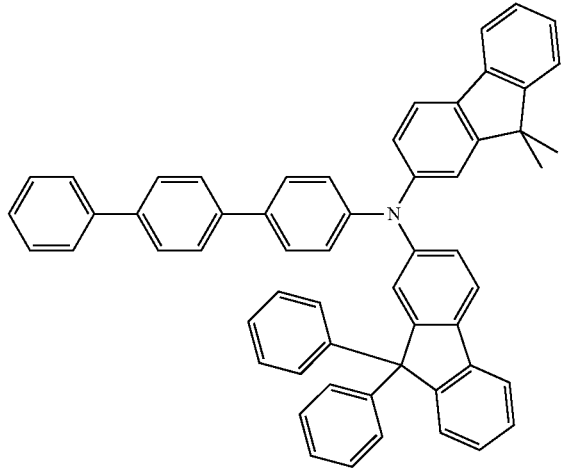
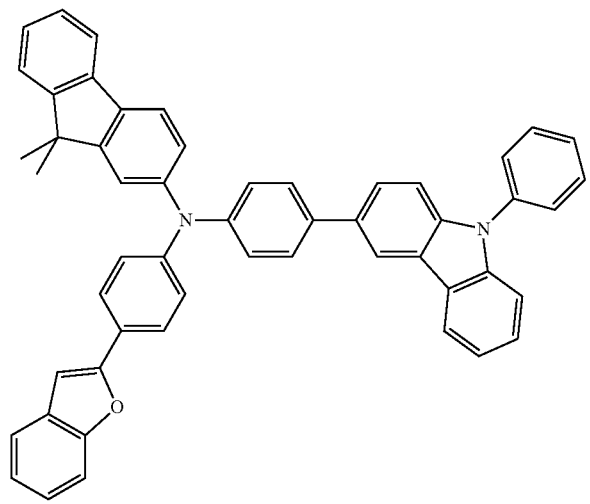
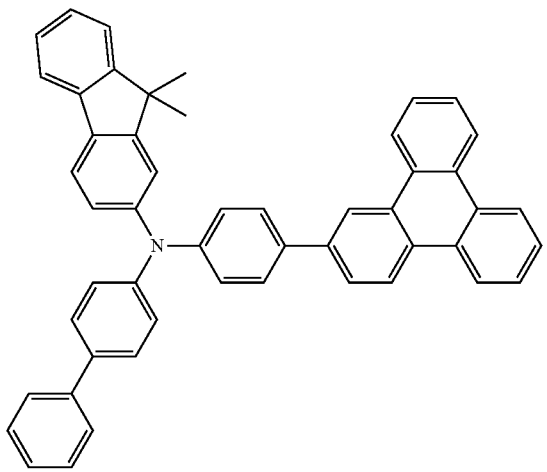
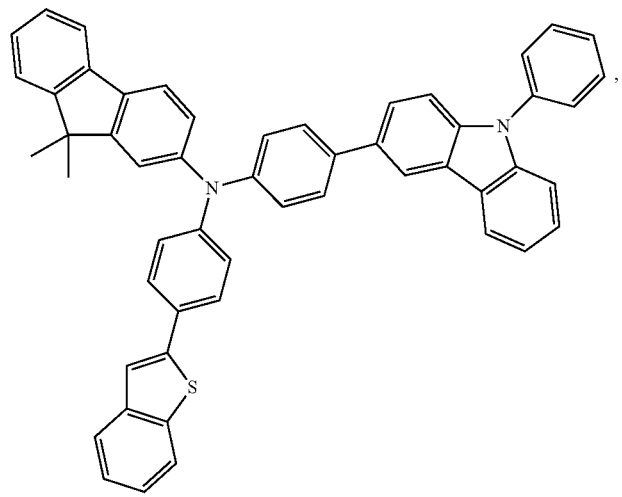

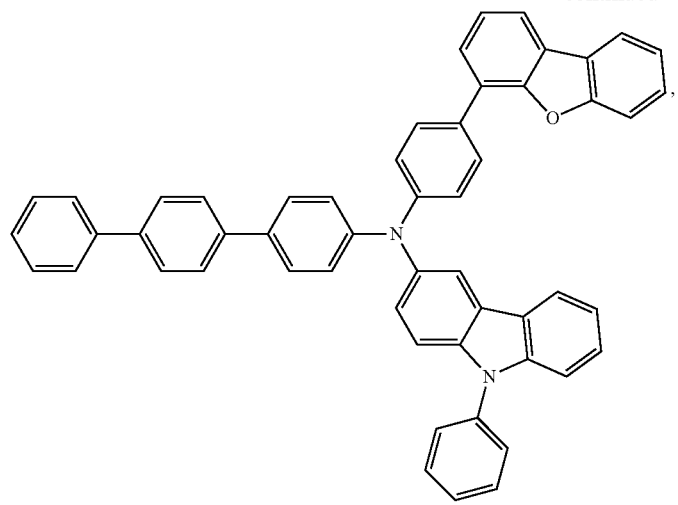
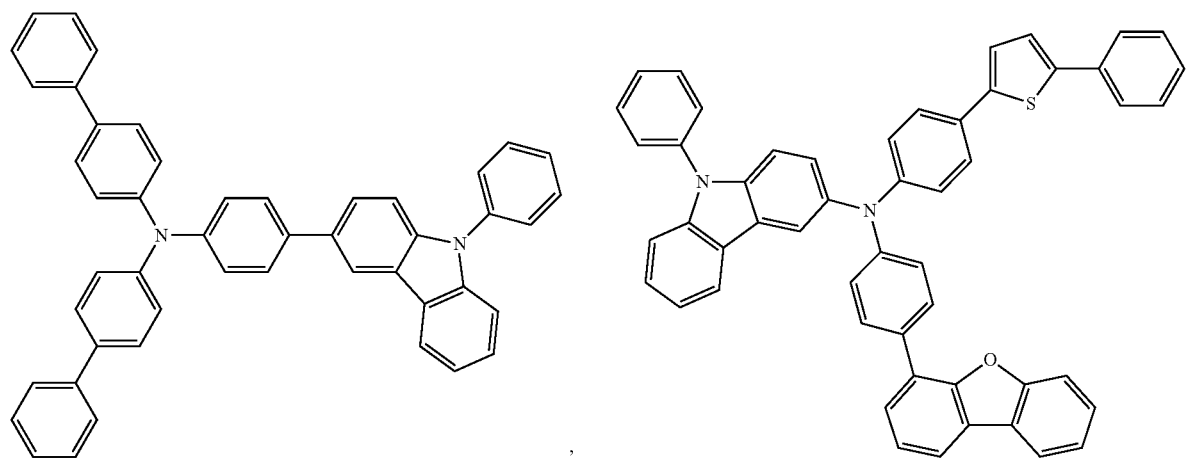
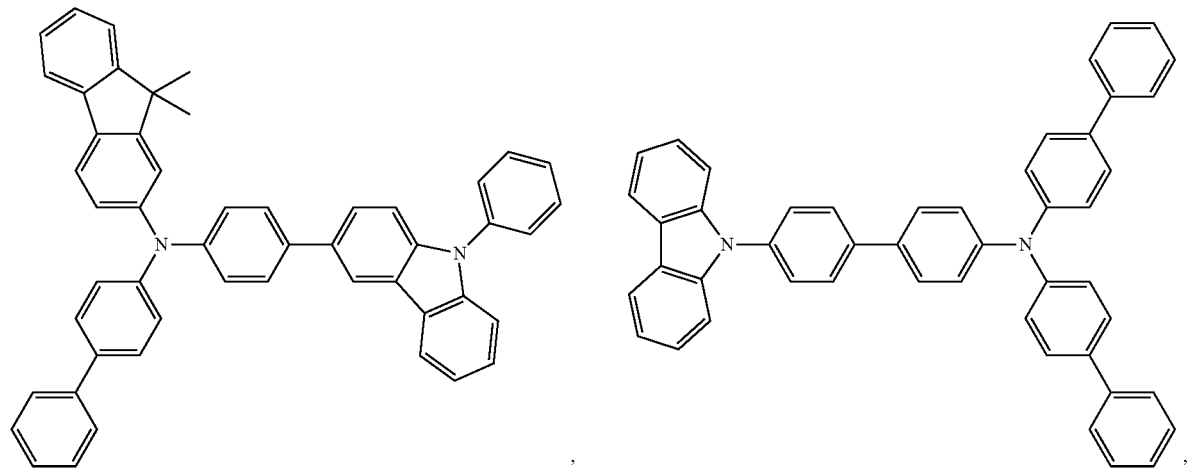

-continued
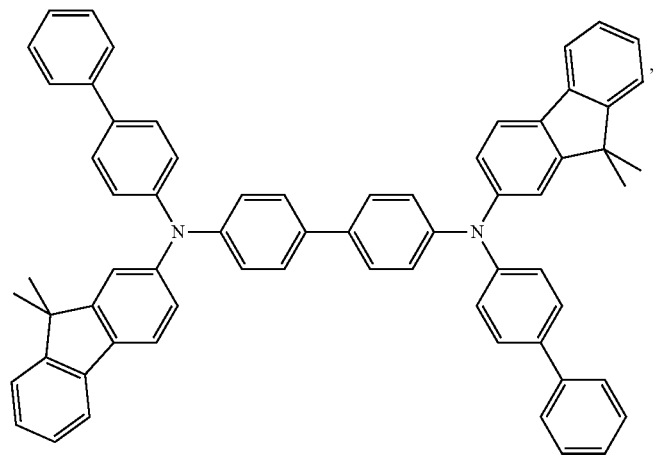
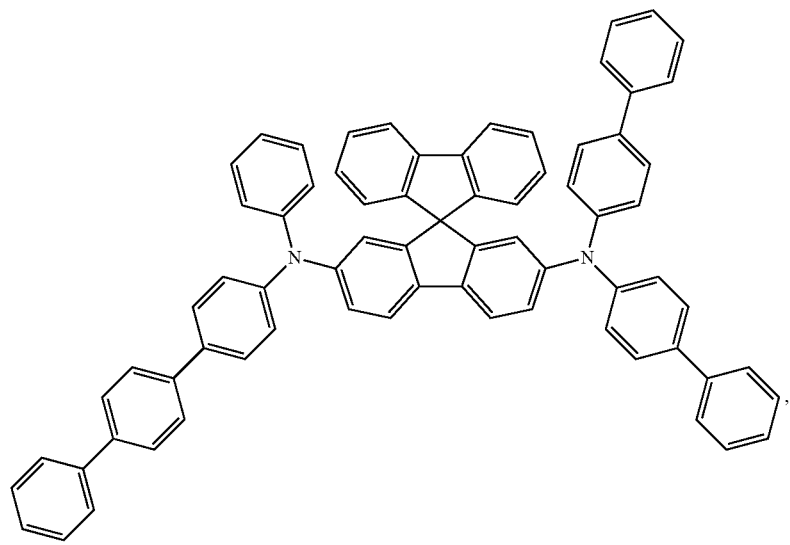
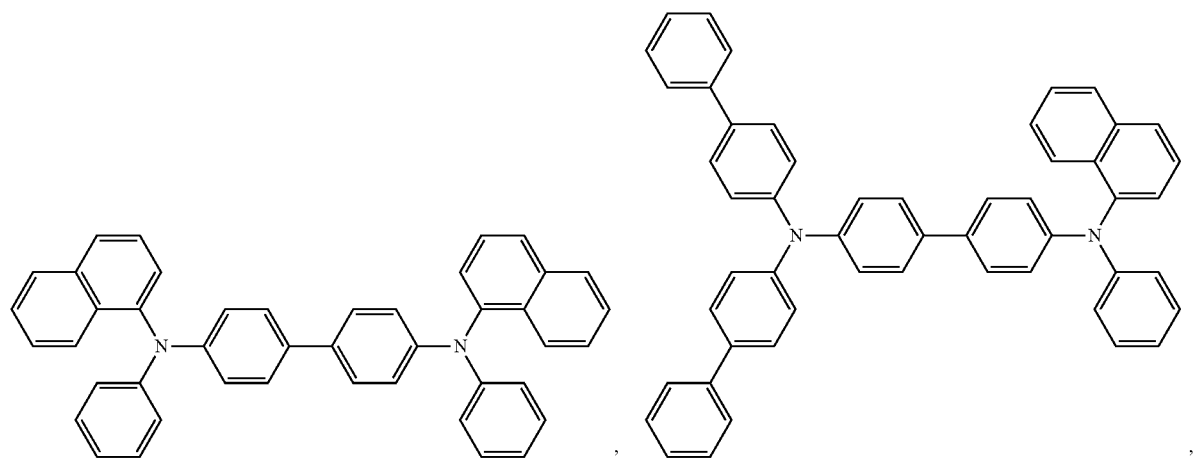

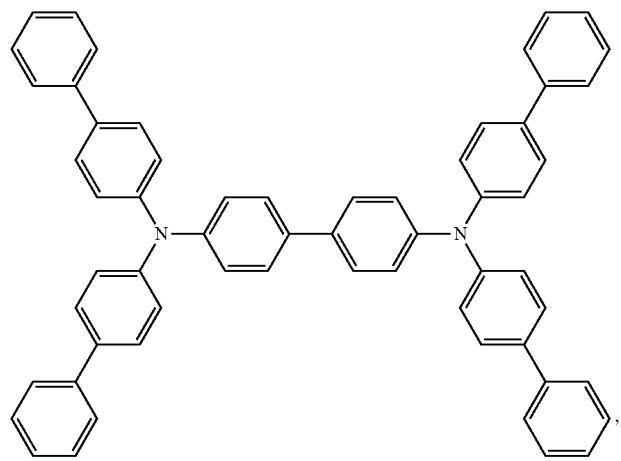
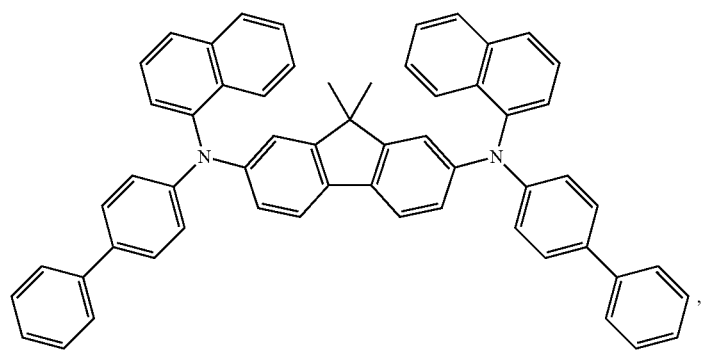
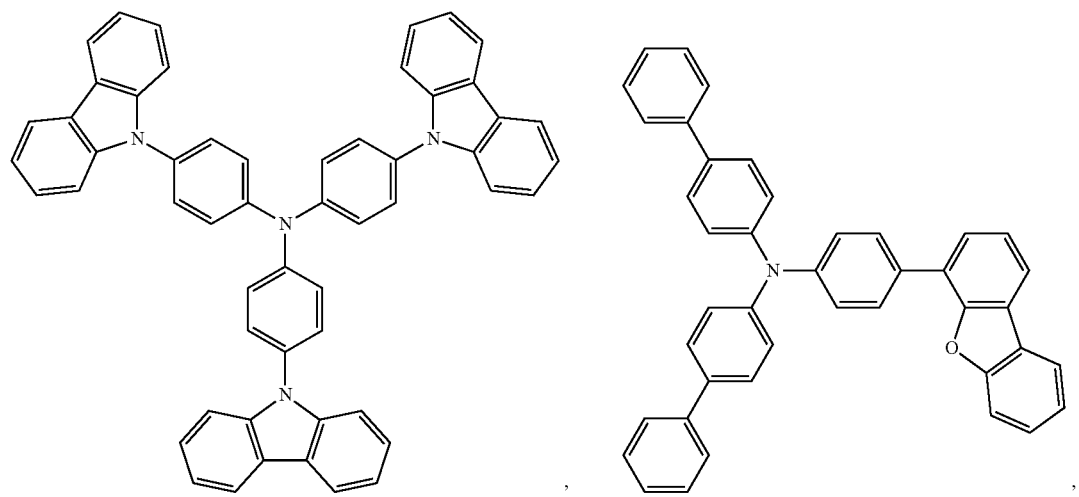

-continued

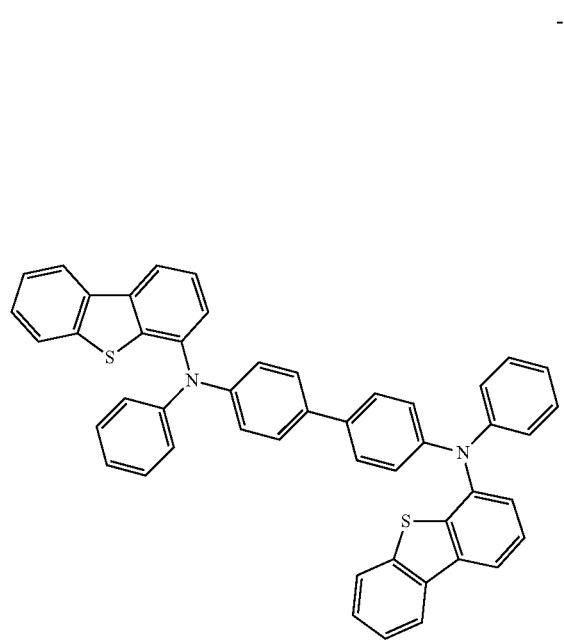
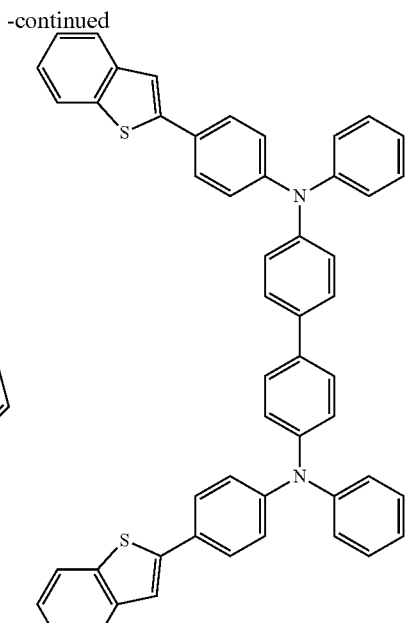
, and

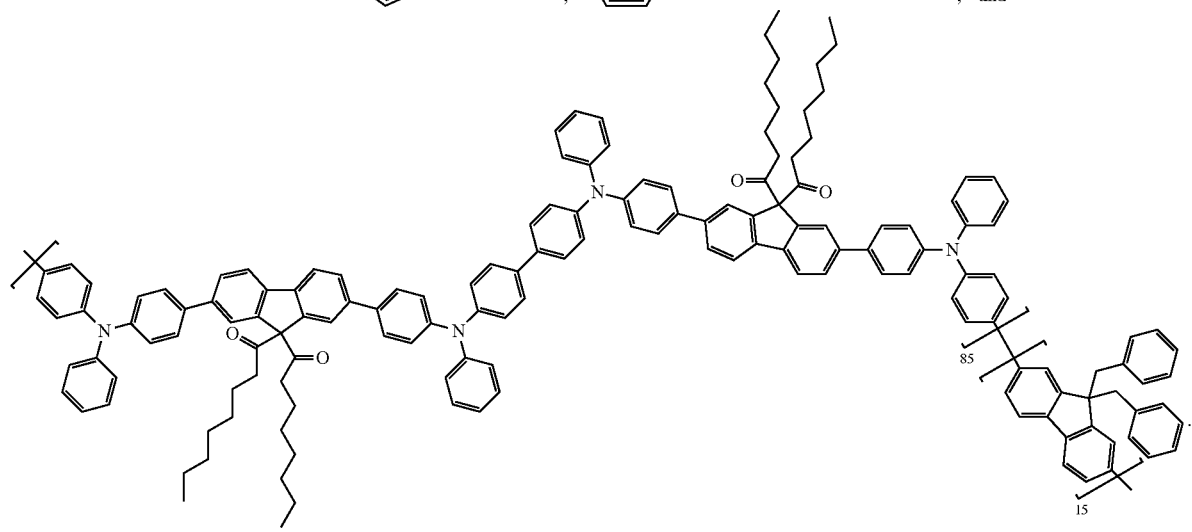

EBL:

An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

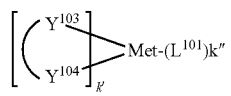

wherein Met is a metal; $(Y^{103}\text{-}Y^{104})$ is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

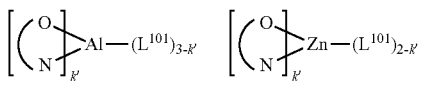

wherein (O—N) is a bidentate ligand, having metal coordinated to atoms O and N.

In another aspect, Met is selected from Ir and Pt. In a further aspect, $(Y^{103}\text{-}Y^{104})$ is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, the host compound contains at least one of the following groups in the molecule:

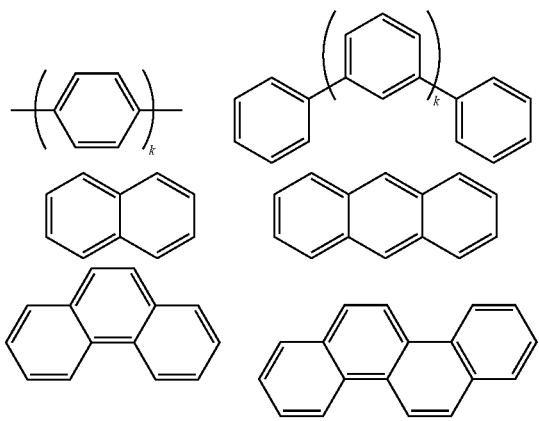

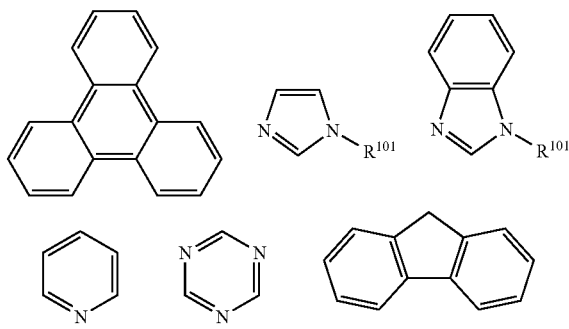

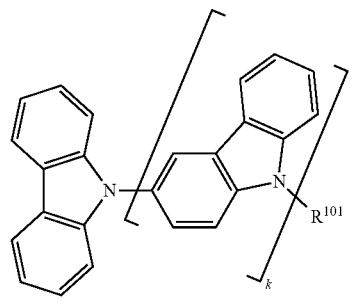

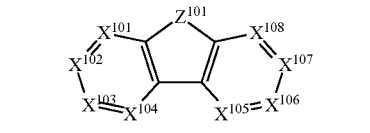

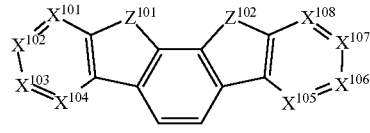

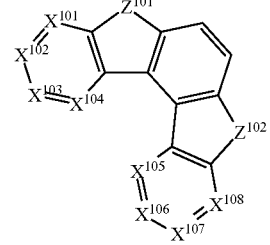

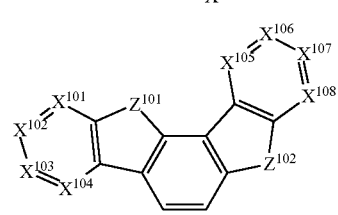

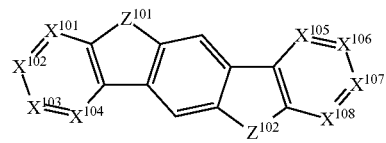

-continued

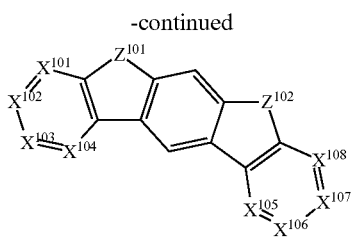

wherein each of $R^{101}$ to $R^{107}$ is independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20; k'" is an integer from 0 to 20. $X^{101}$ to $X^{108}$ is selected from C (including CH) or N. $Z^{101}$ and $Z^{102}$ is selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472,

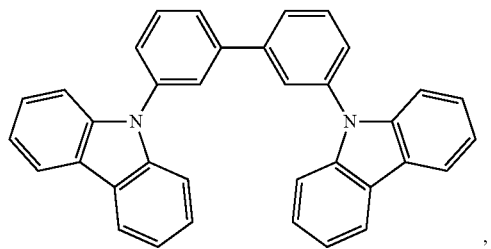

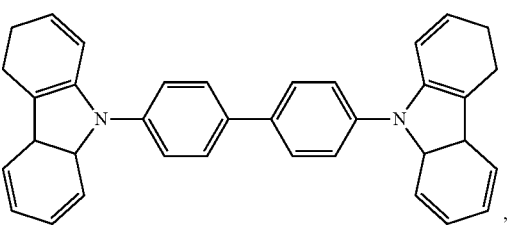

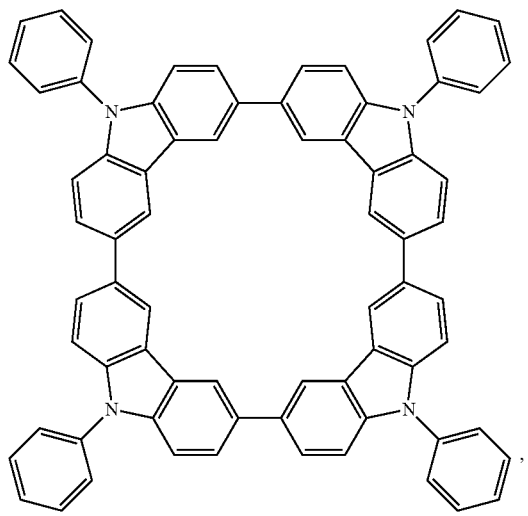

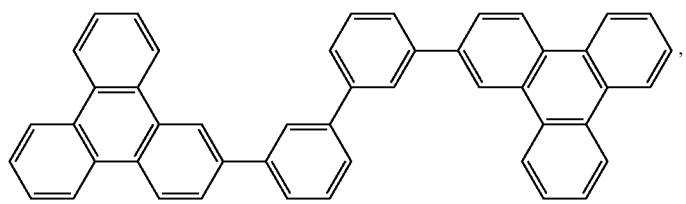

161
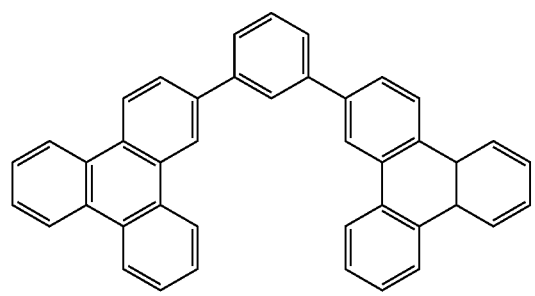
162
-continued
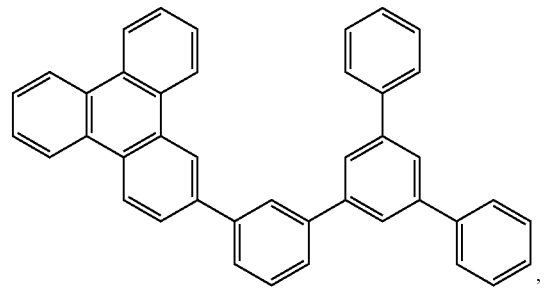
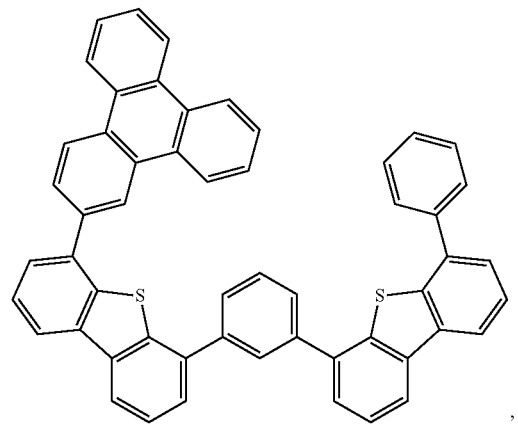
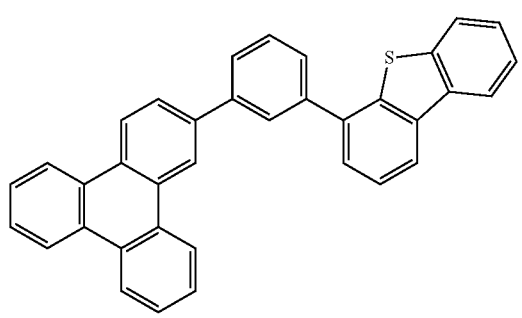
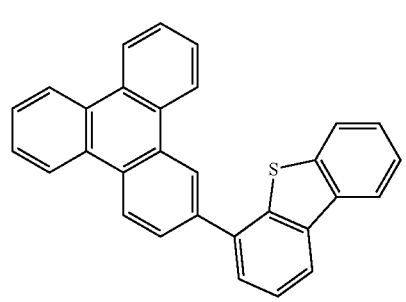
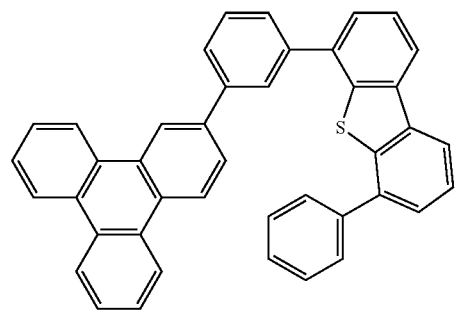
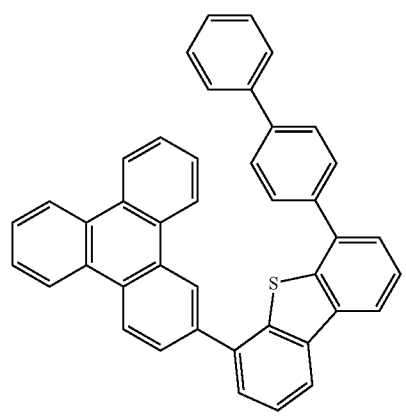
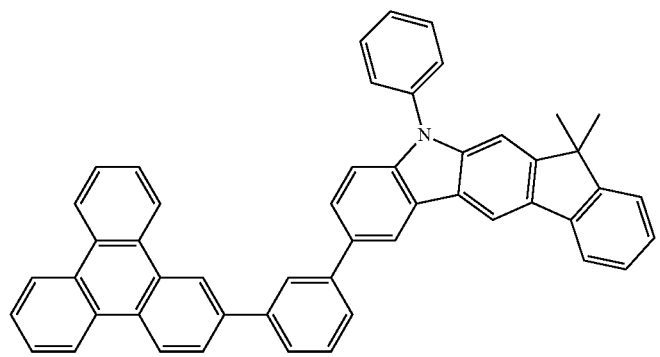

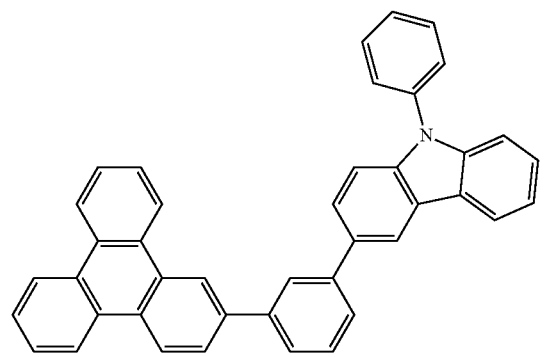,
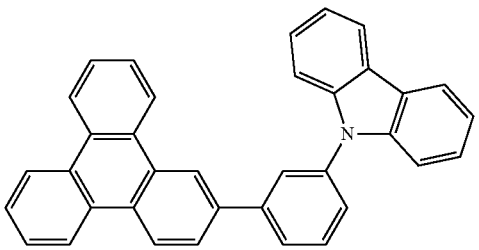,
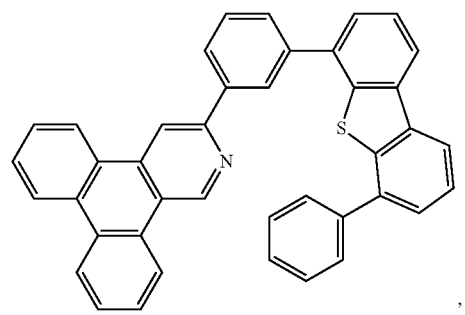,
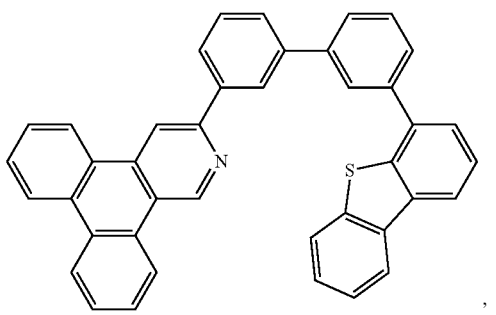,
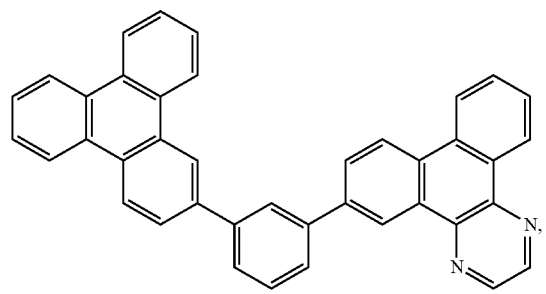,
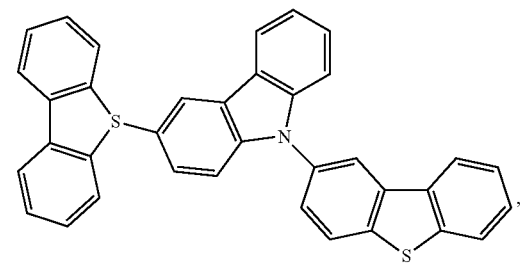,
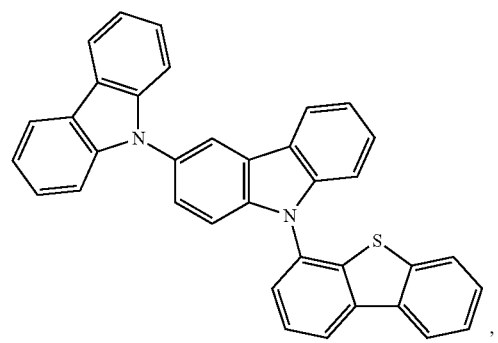,
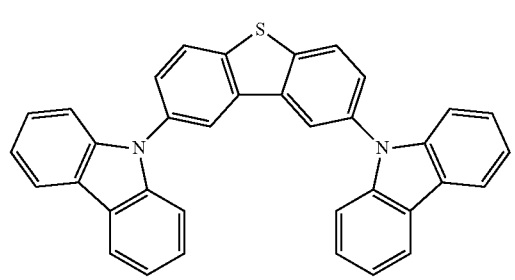,
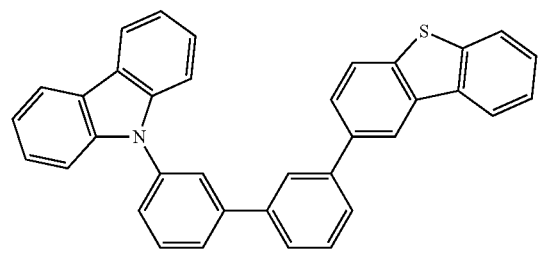,
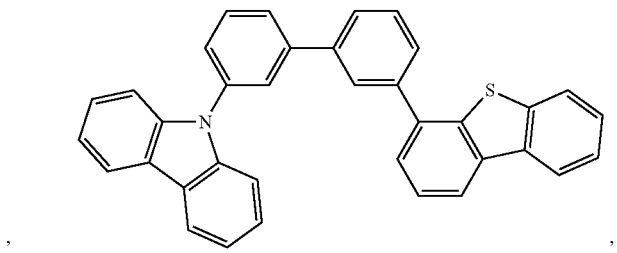, -continued
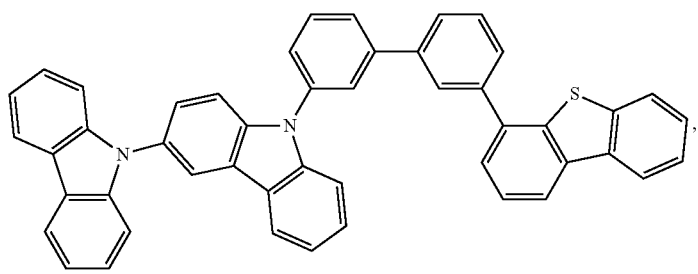
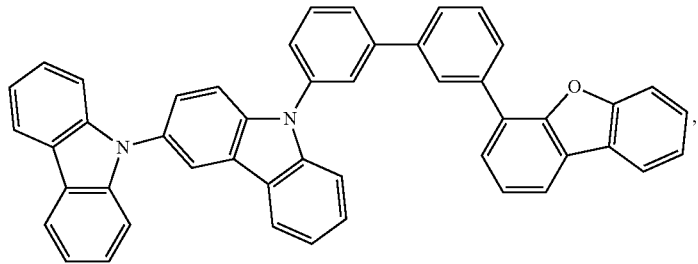
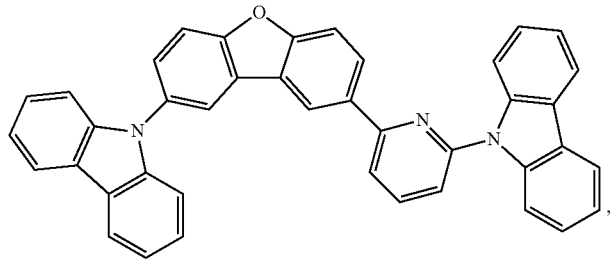
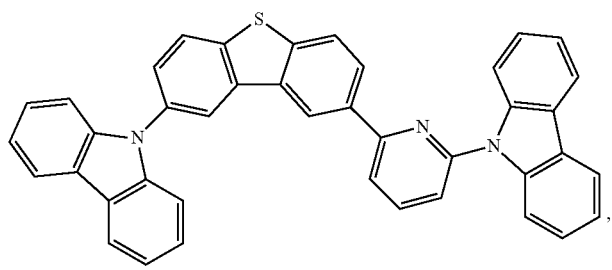
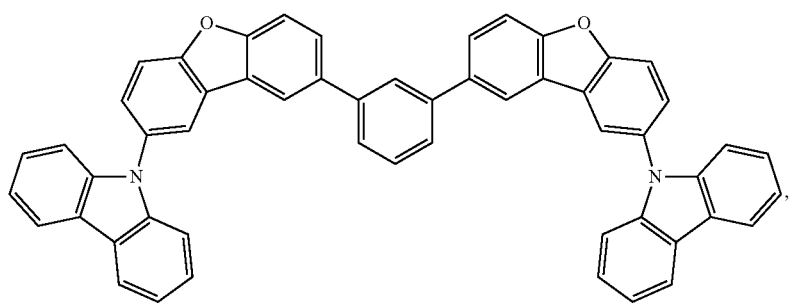
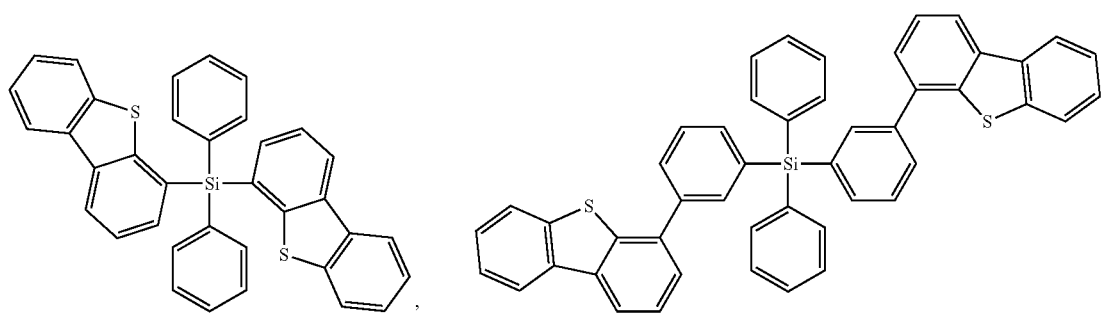

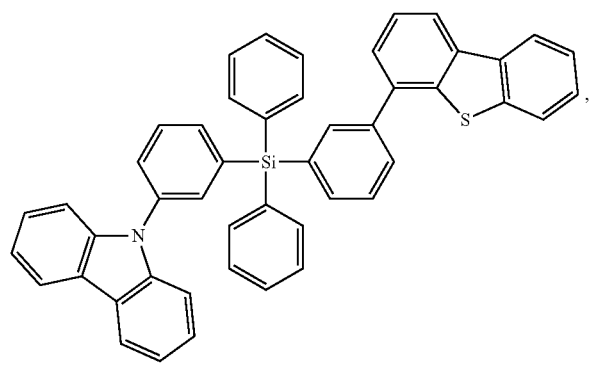
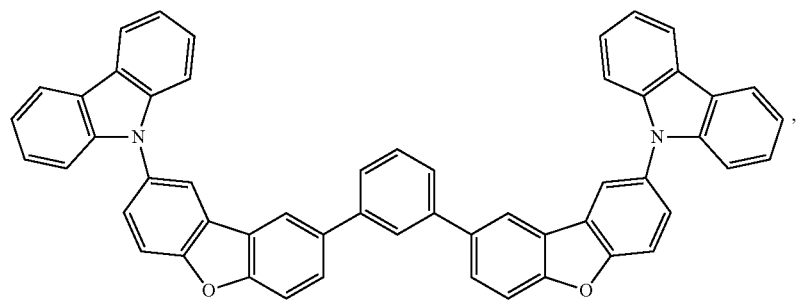
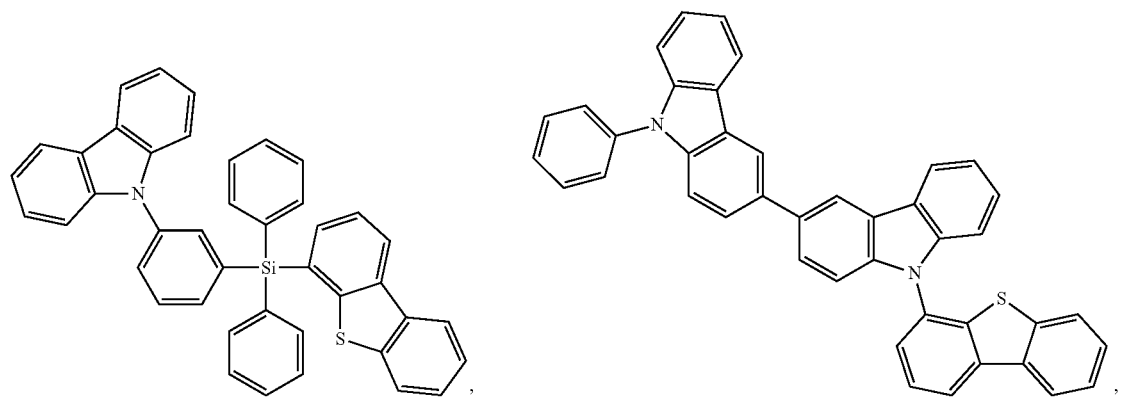
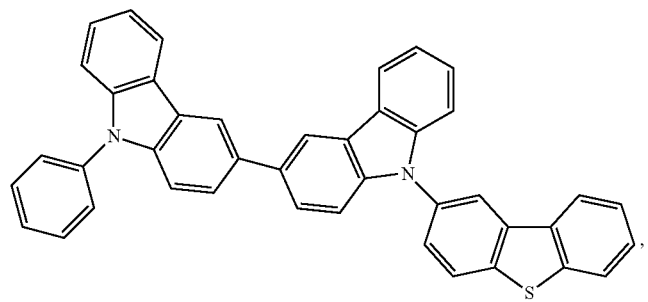

-continued
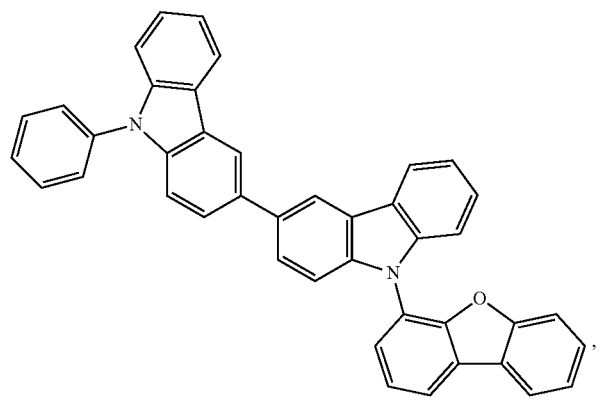
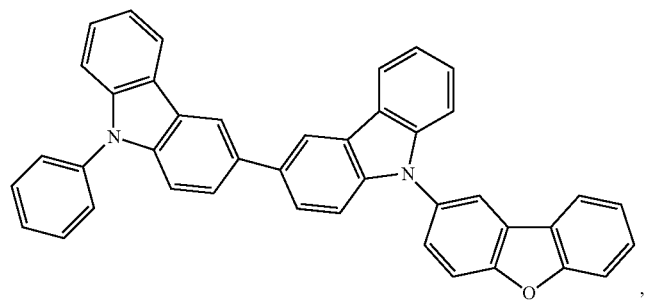
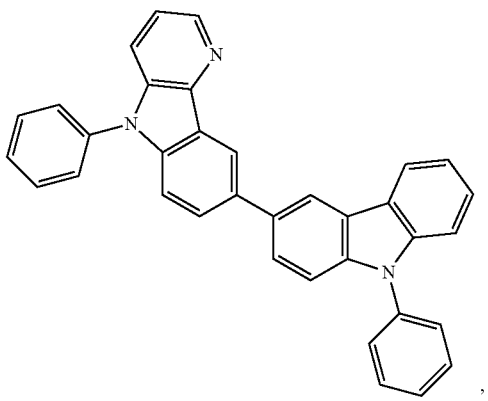
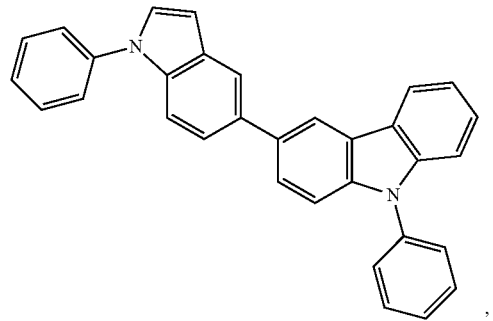
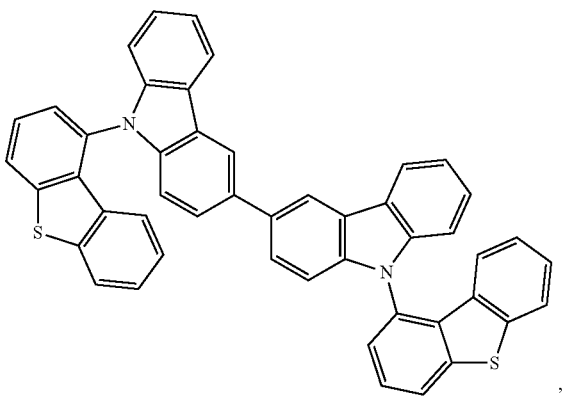
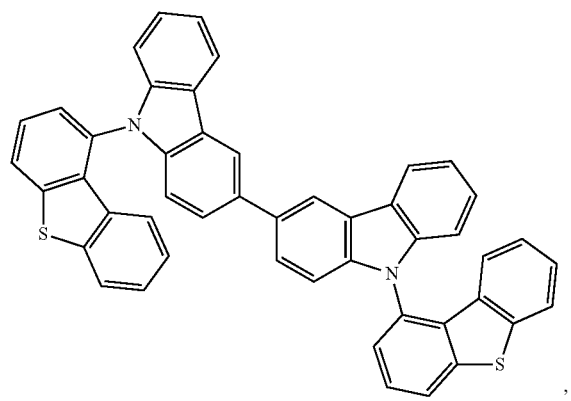

-continued
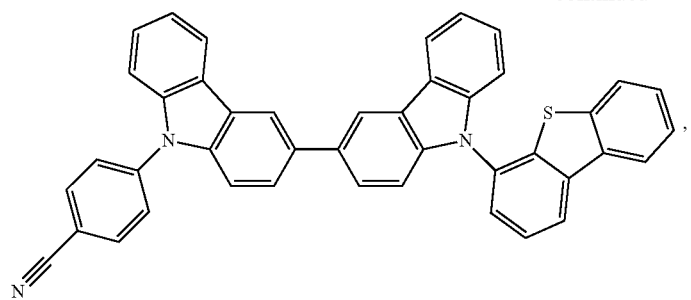
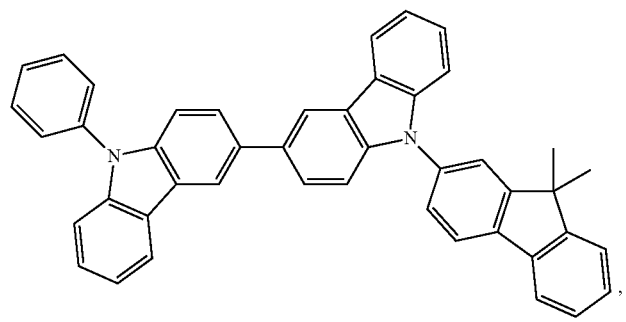
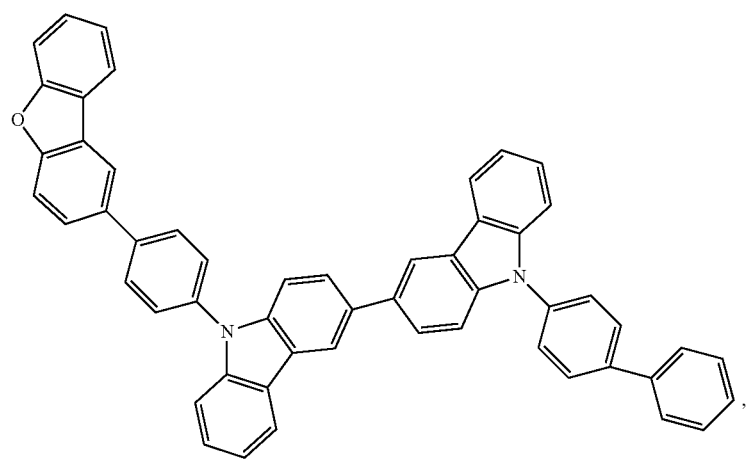
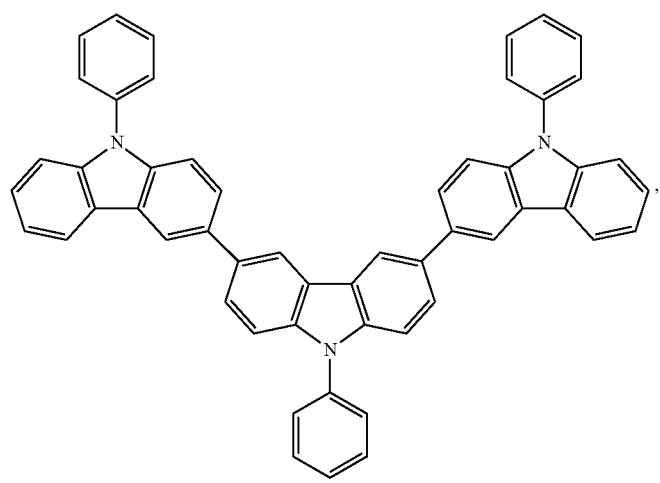

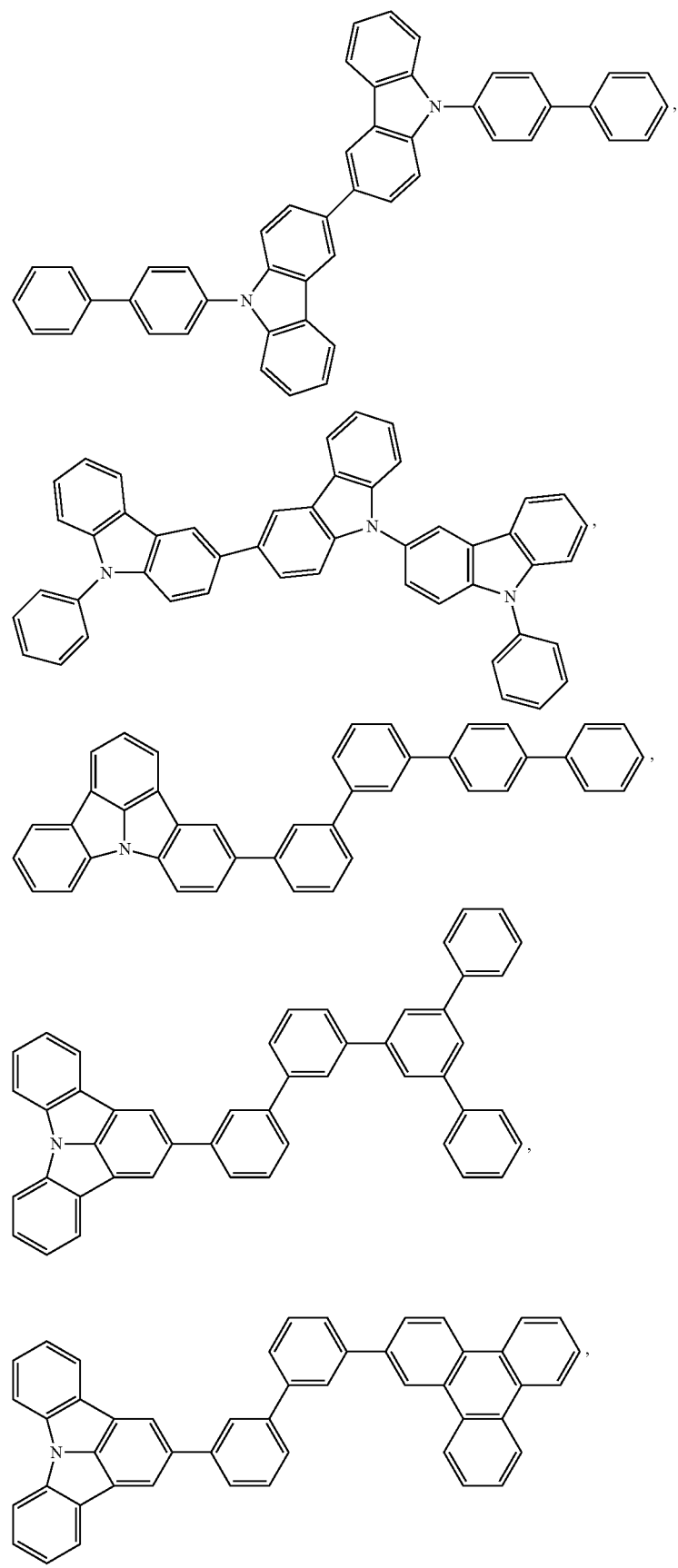

-continued
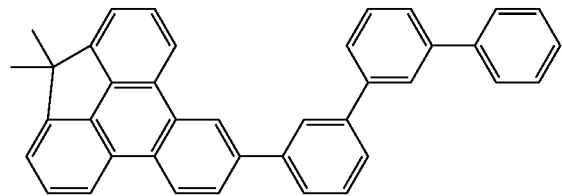
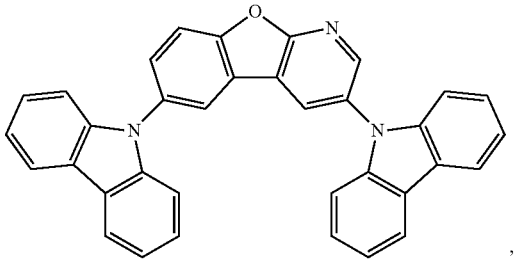
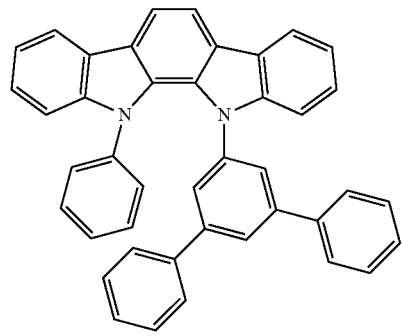
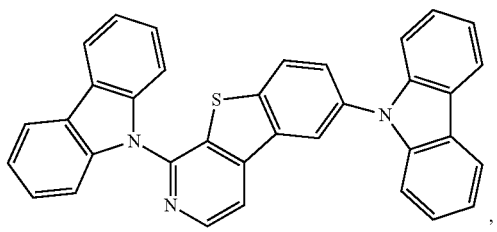
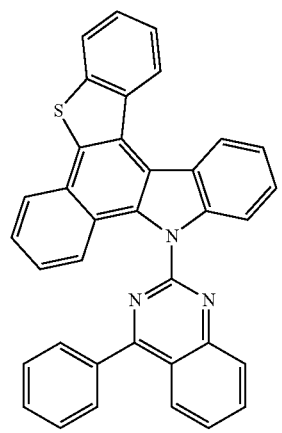
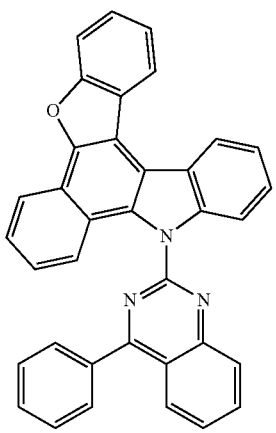
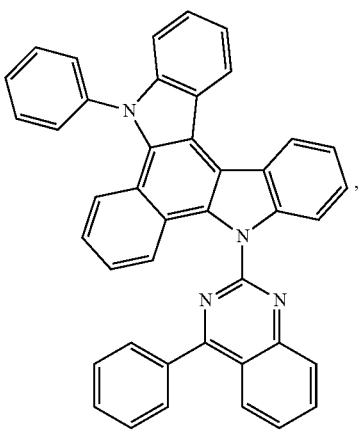
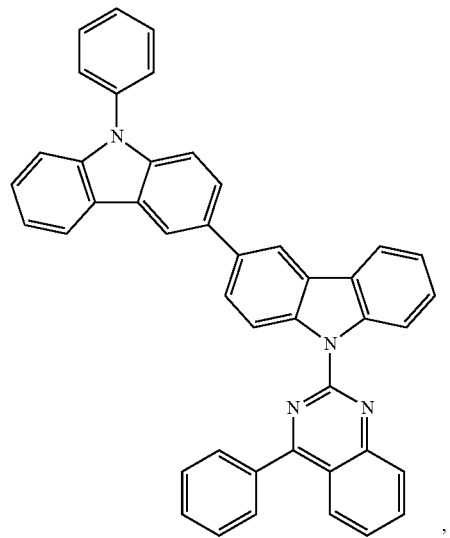
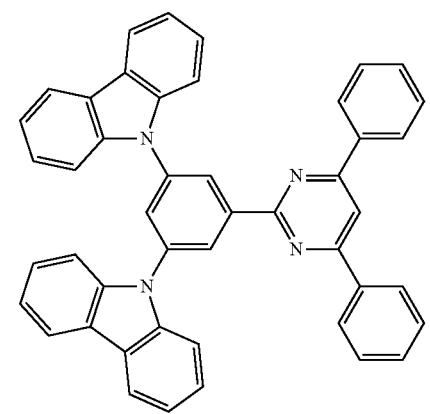

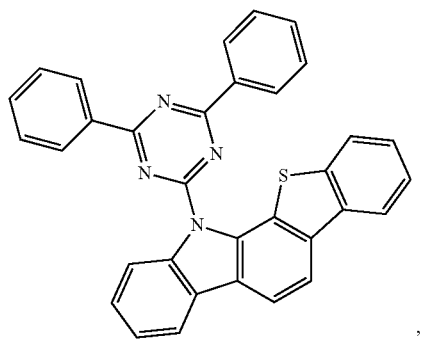
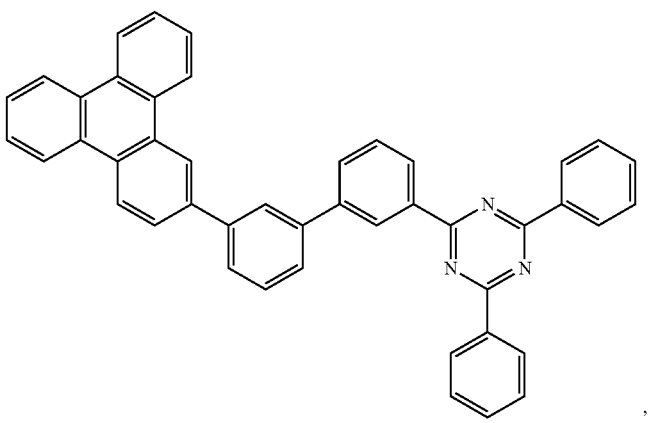
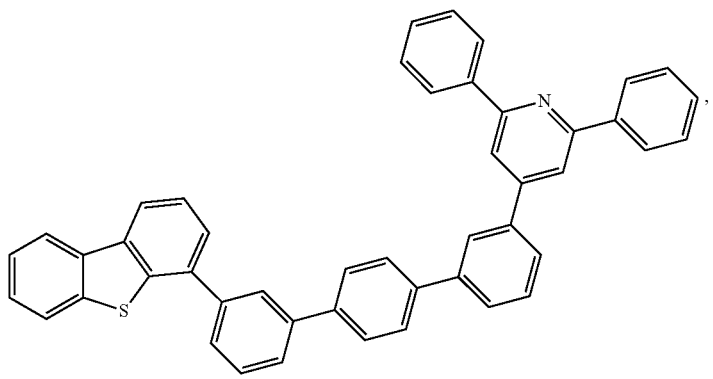
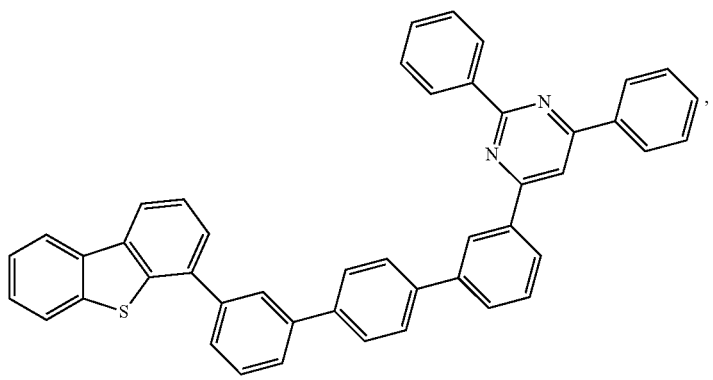
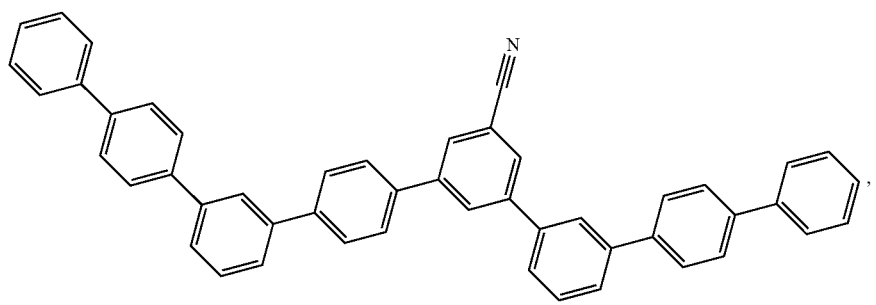

-continued
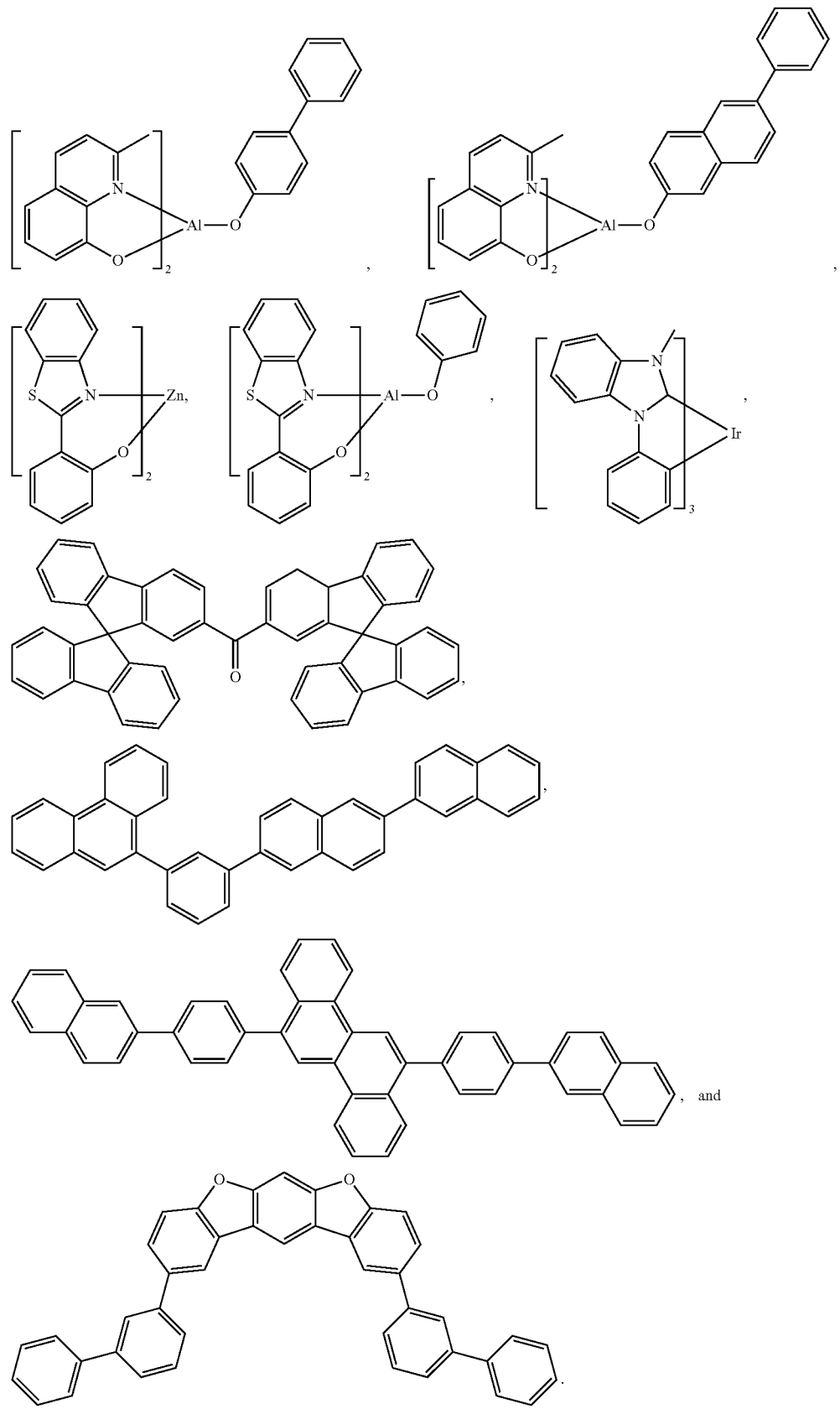

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981, WO08035571, WO2002015645, WO2003040257, WO2005019373, WO2006056418, WO2008054584, WO2008078800, WO2008096609, WO2008101842, WO2009000673, WO2009050281, WO2009100991, WO2010028151, WO2010054731, WO2010086089, WO2010118029, WO2011044988, WO2011051404, WO2011107491, WO2012020327, WO2012163471, WO2013094620, WO2013107487, WO2013174471, WO2014007565, WO2014008982, WO2014023377, WO2014024131, WO2014031977, WO2014038456, WO2014112450.

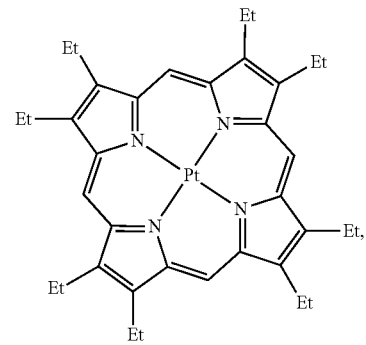

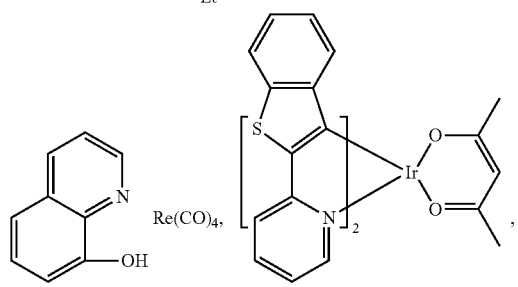

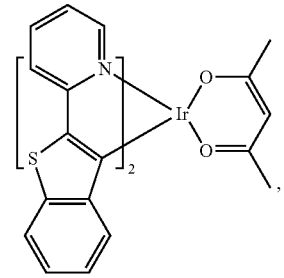

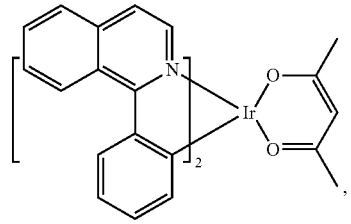

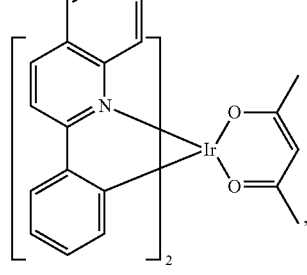

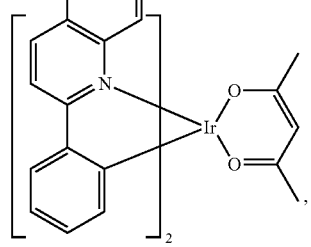

-continued
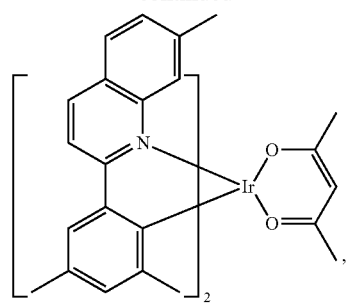
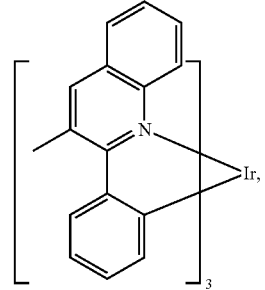
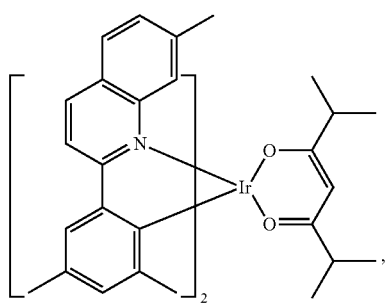
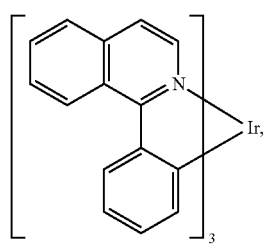
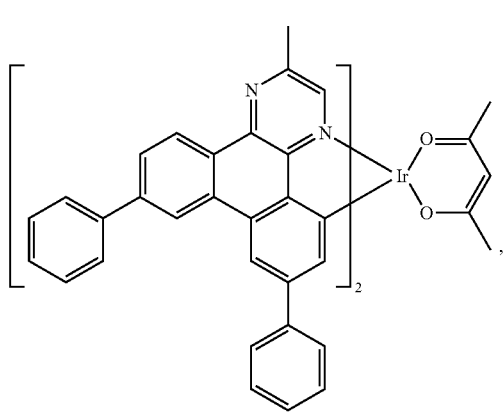
-continued
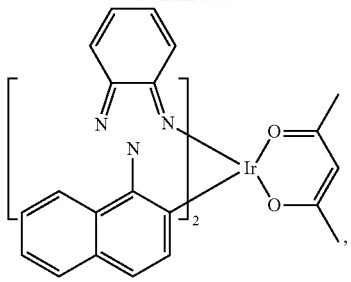
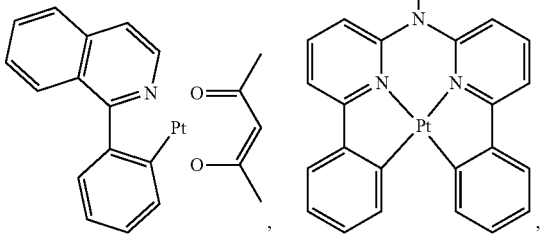
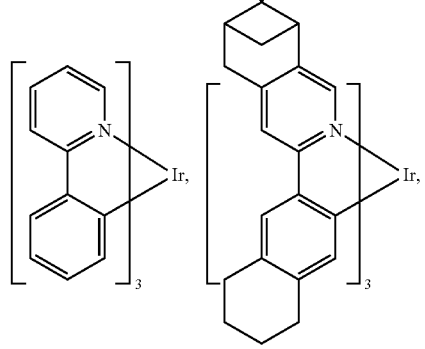
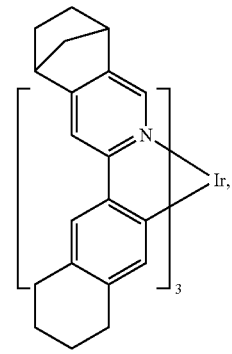
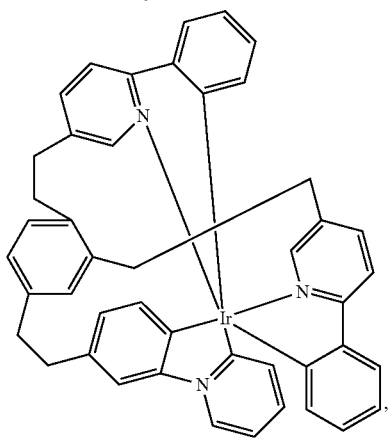

-continued
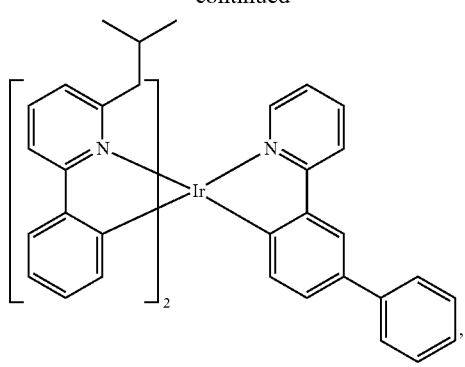
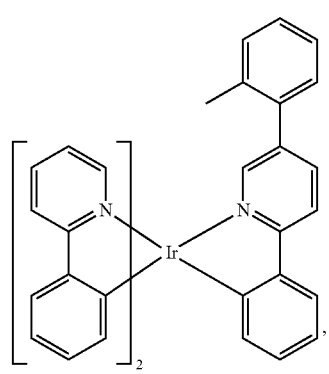
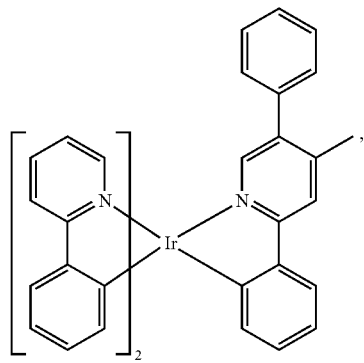
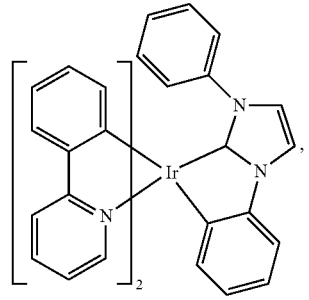
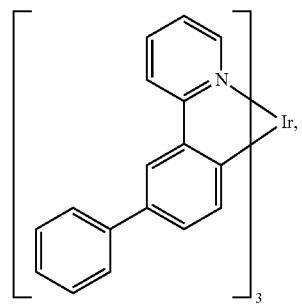
-continued
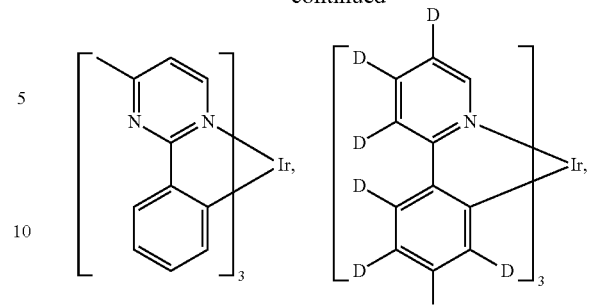
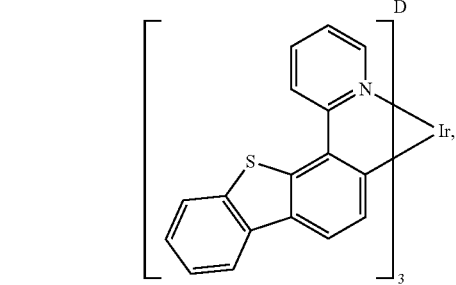
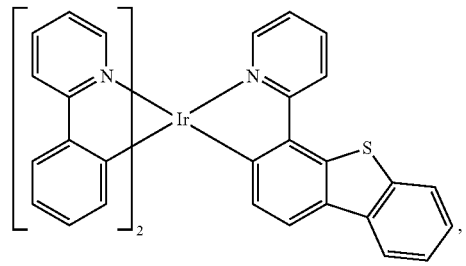
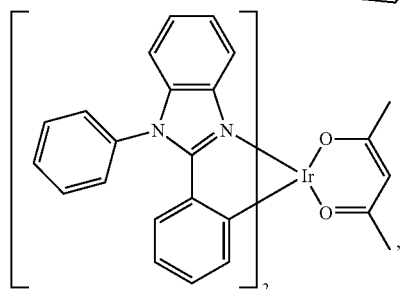
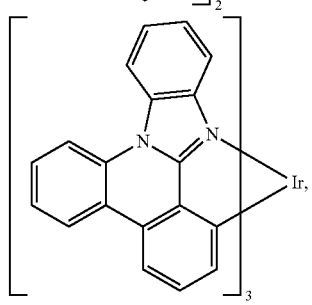
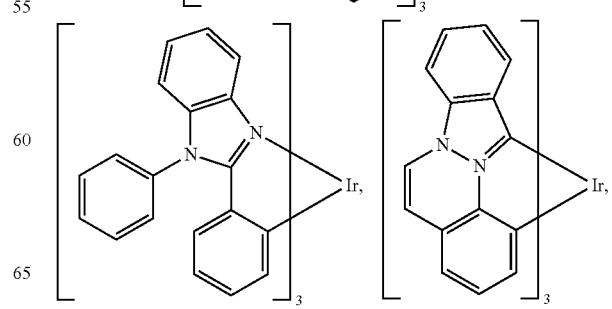

-continued
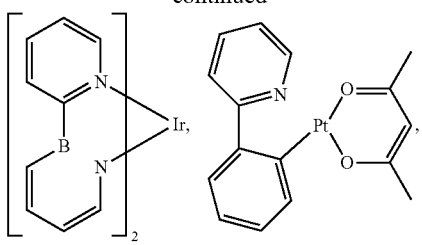
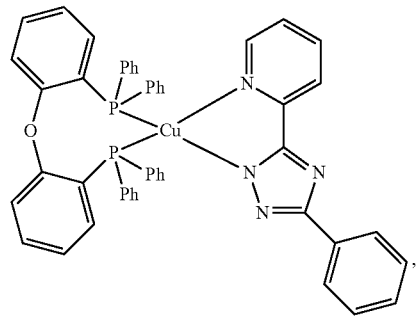
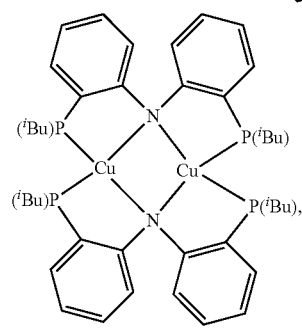
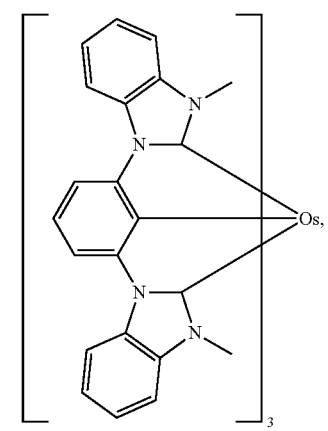
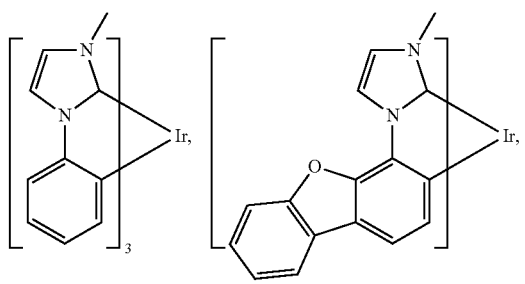
-continued
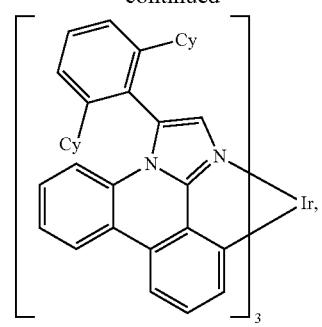
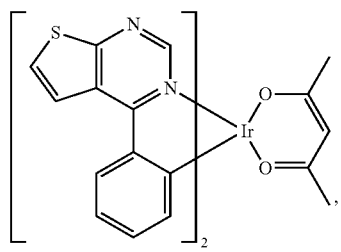
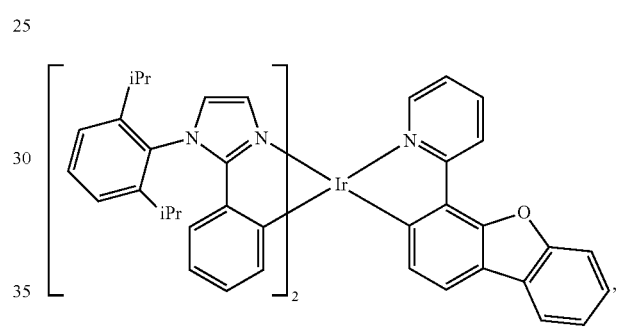
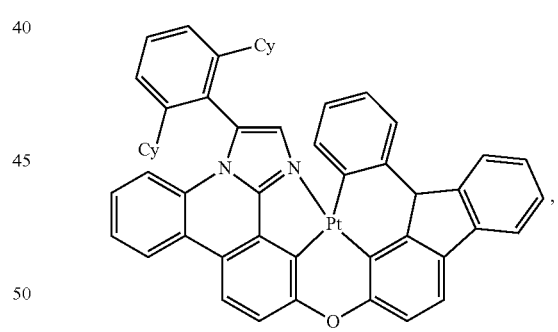
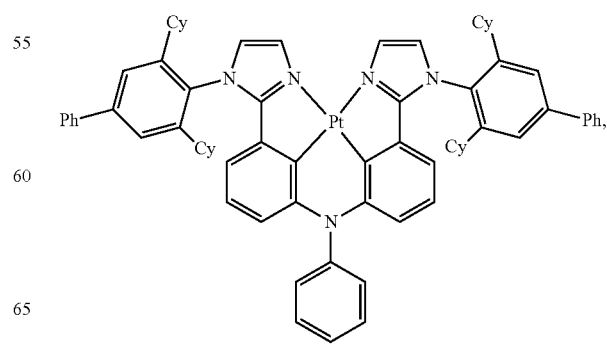

189
-continued
190
-continued
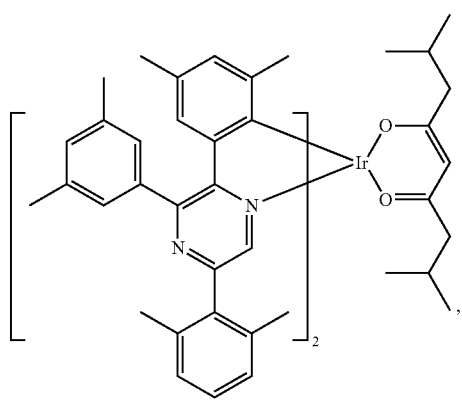
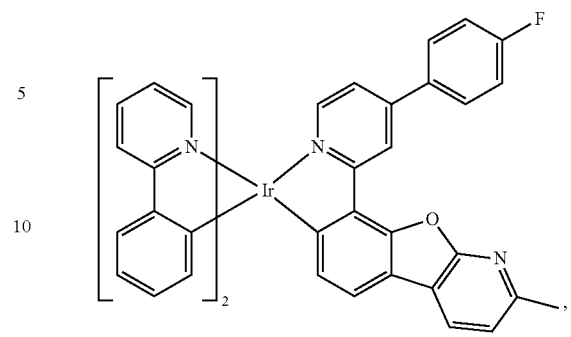
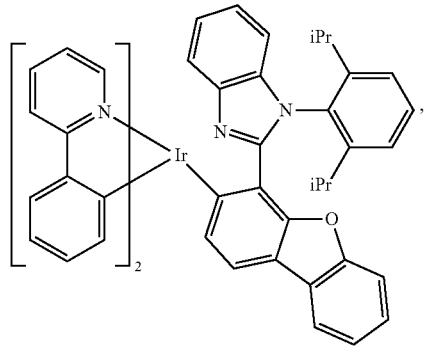
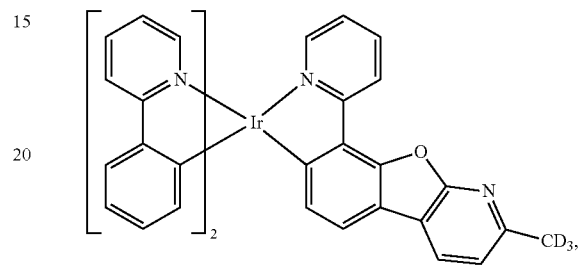
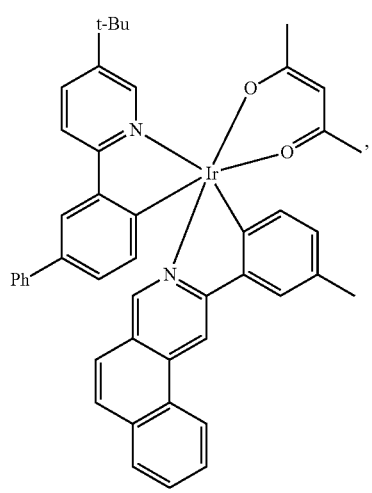
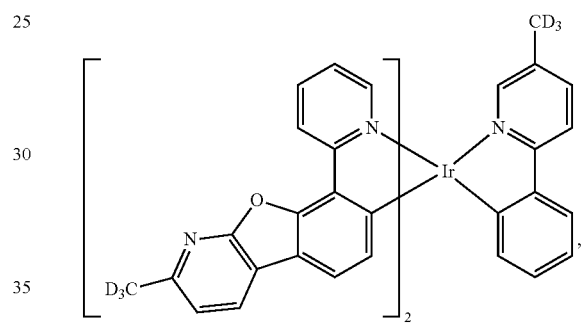
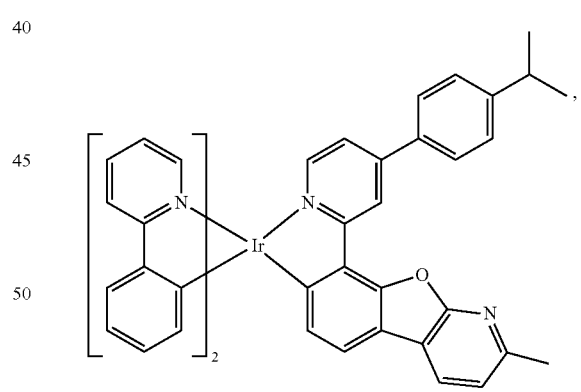
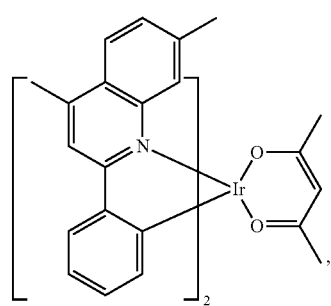
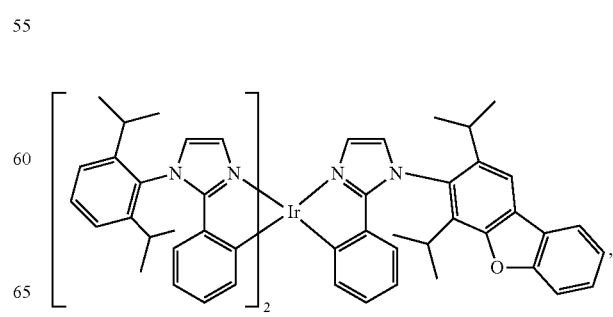

191
-continued
192
-continued
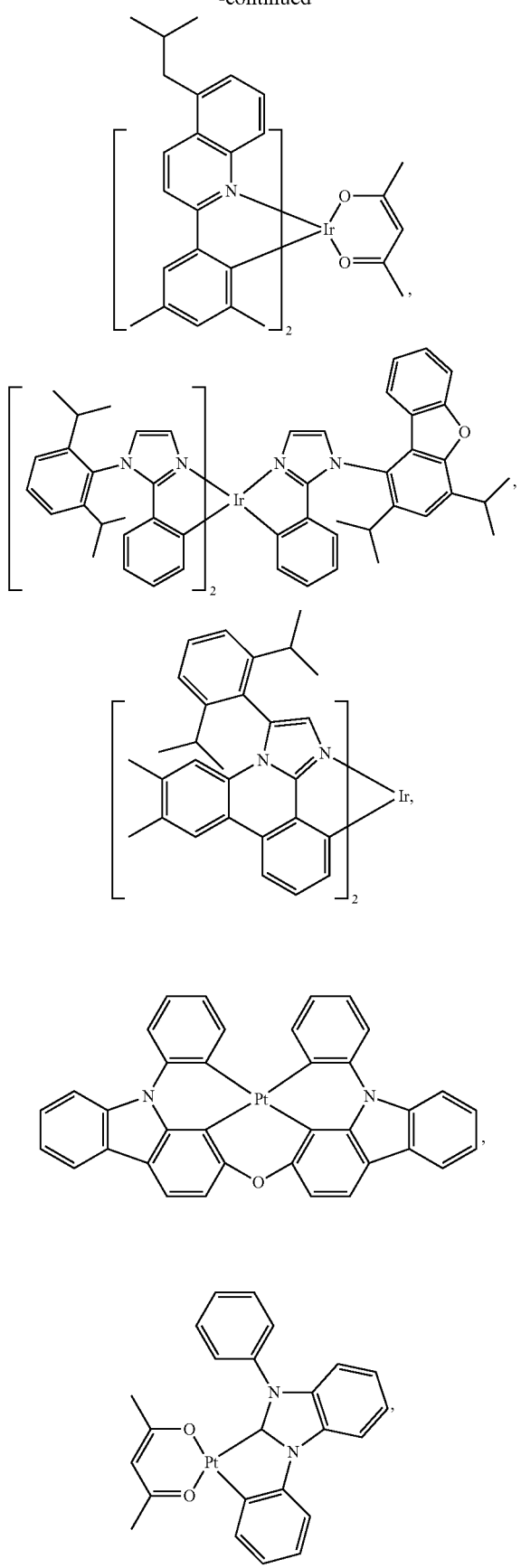
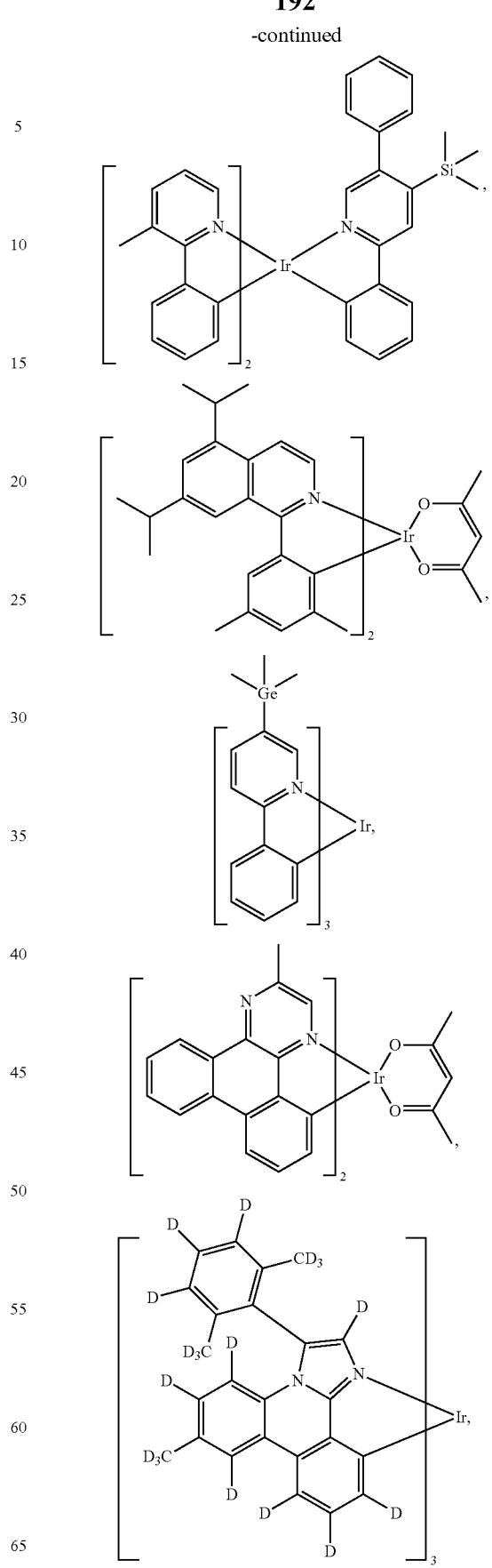

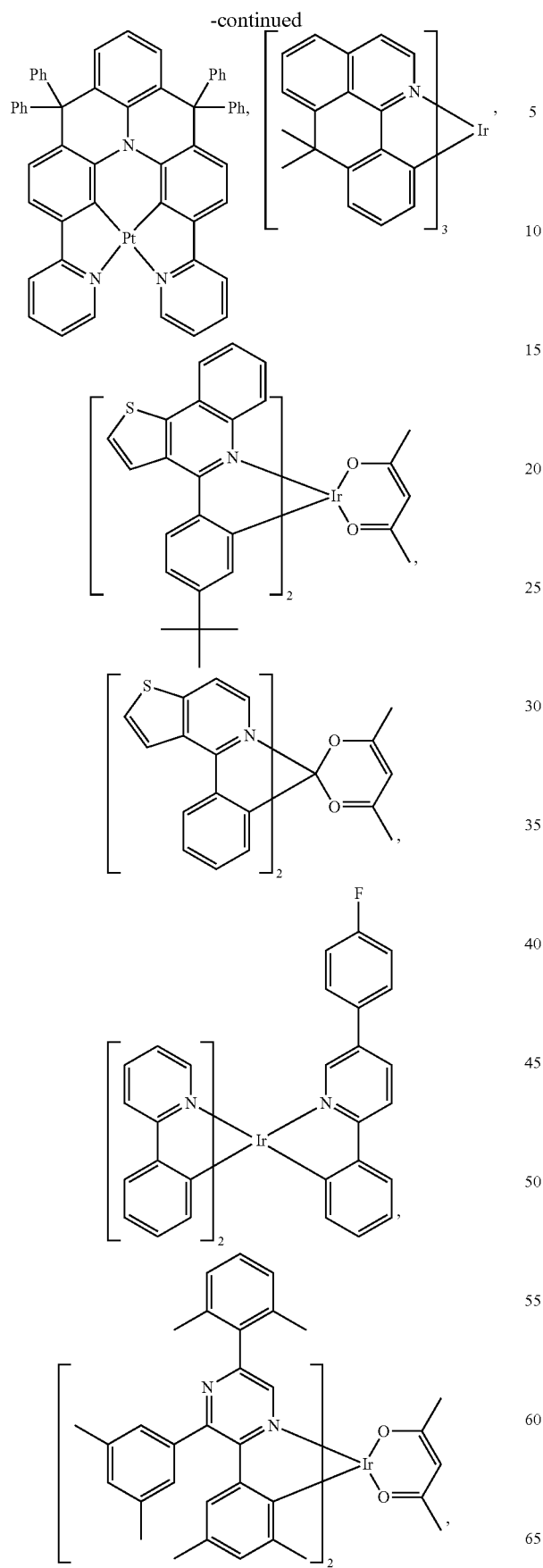
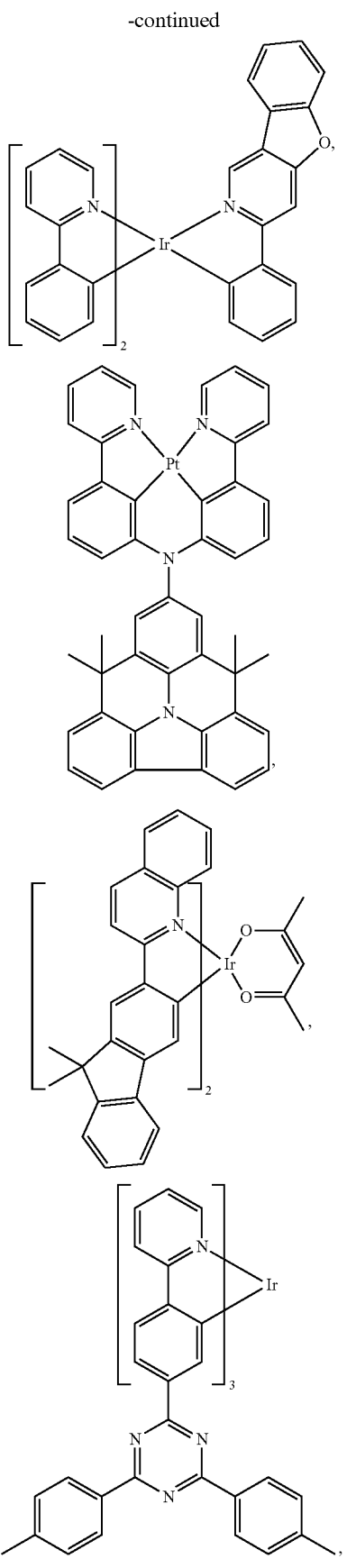

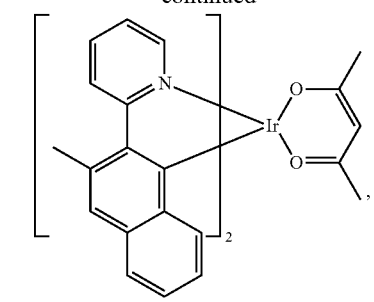
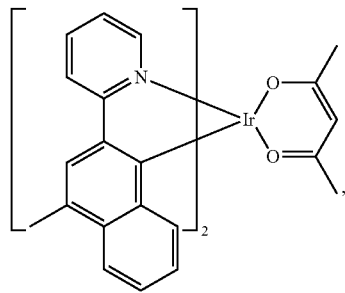
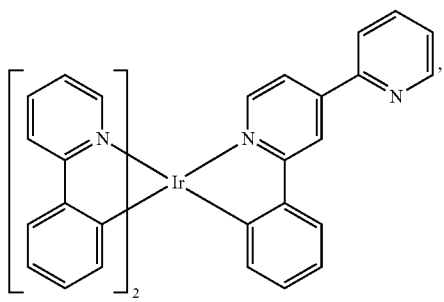
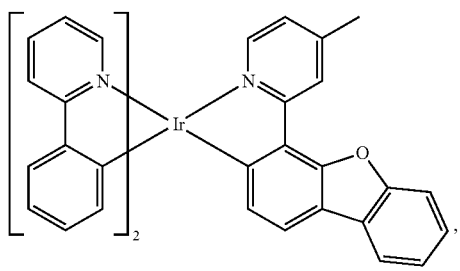
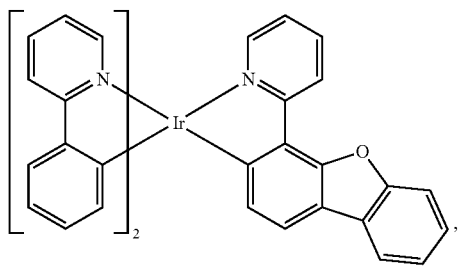
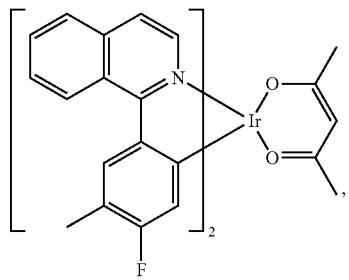
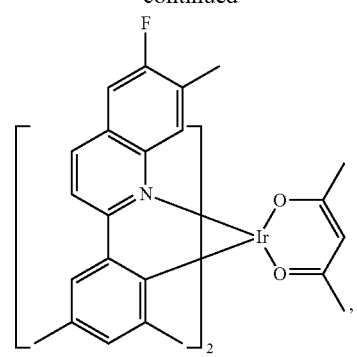
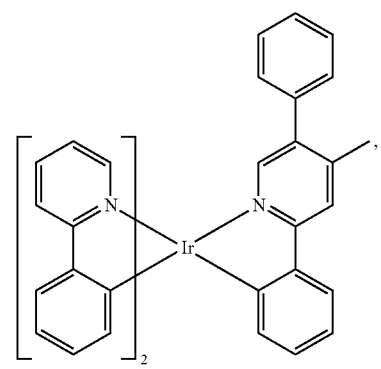
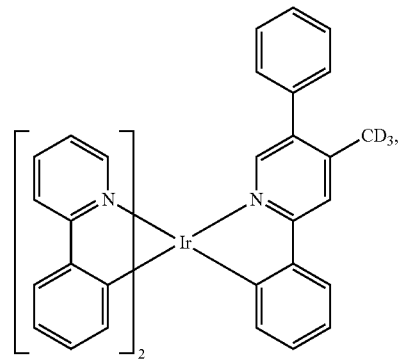
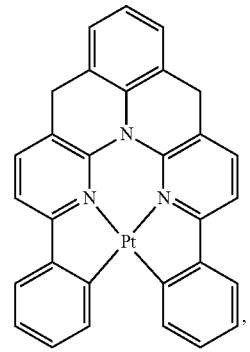

-continued
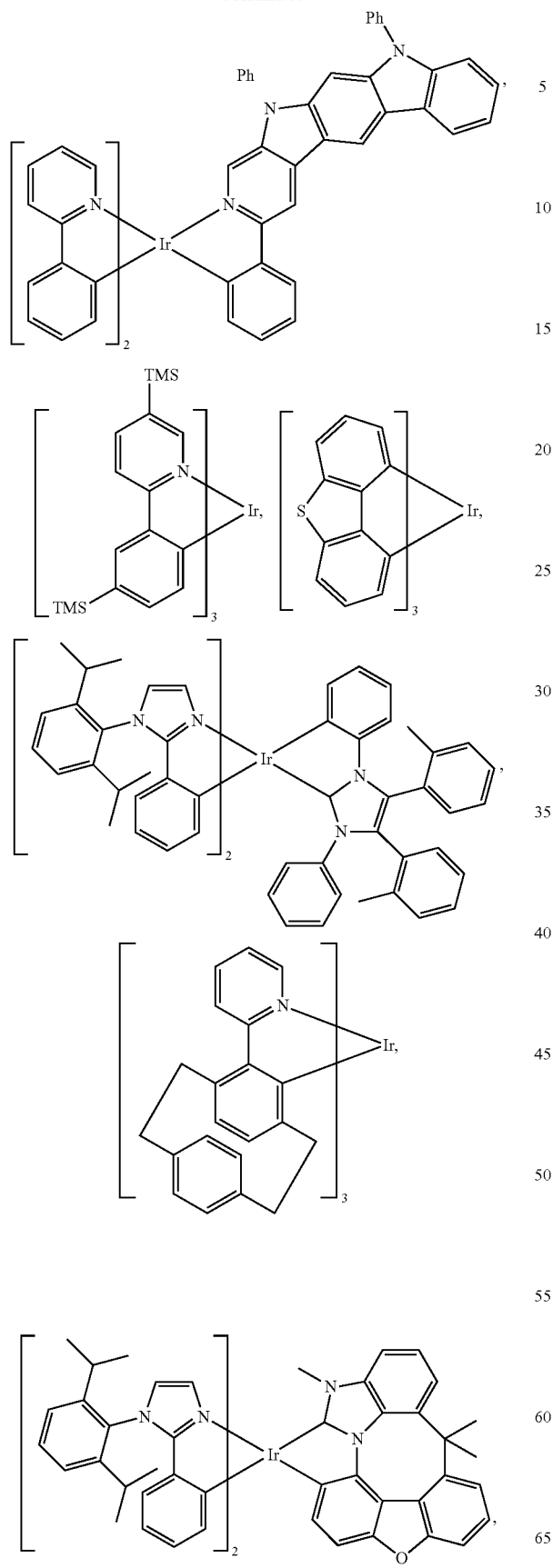
-continued
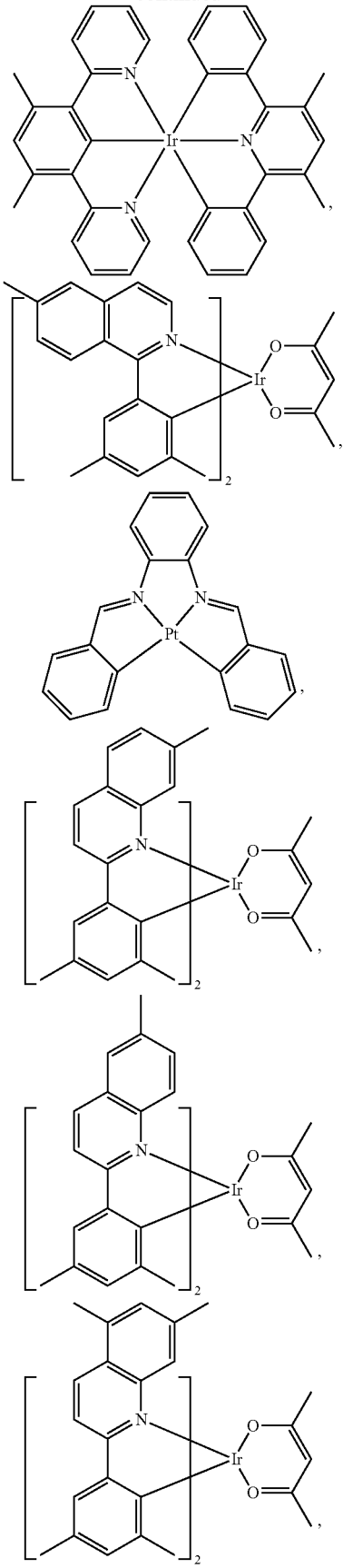

199 -continued
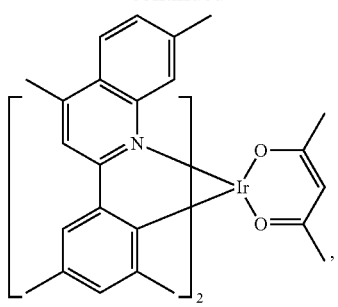
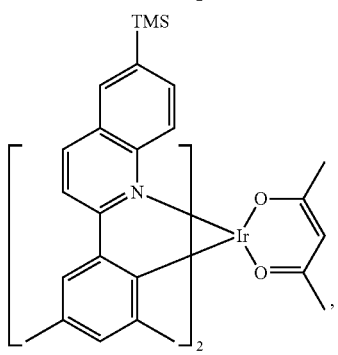
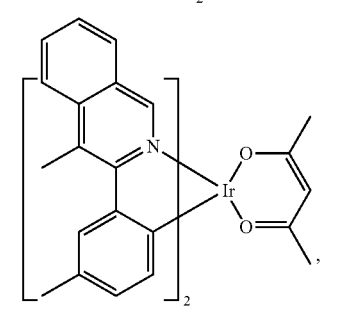
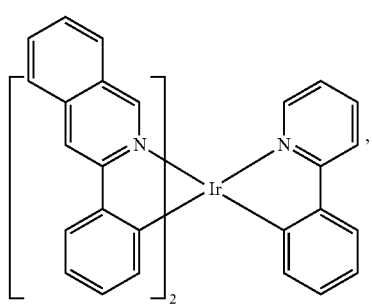
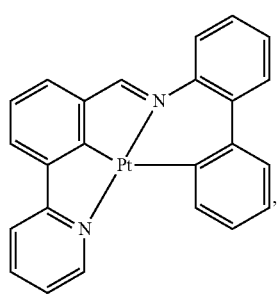
200 -continued
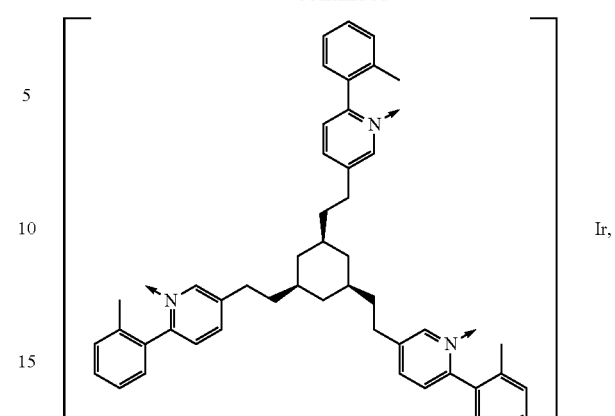
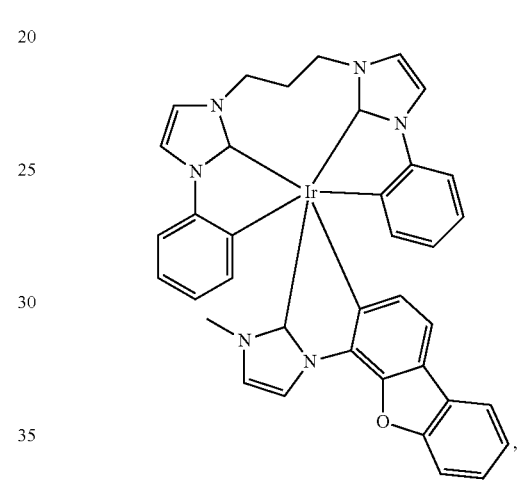
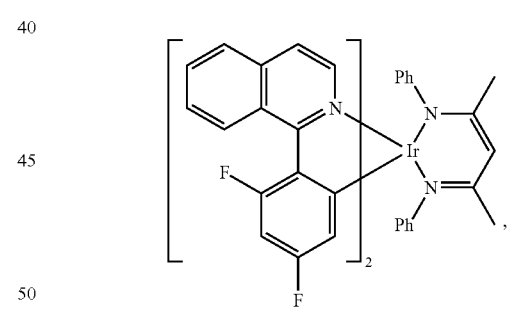
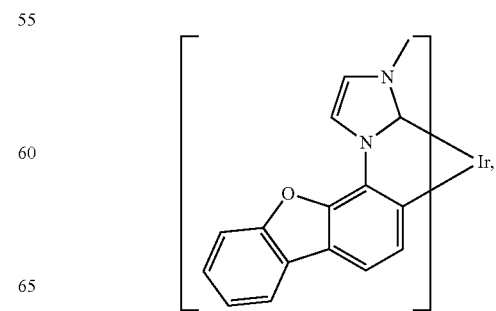

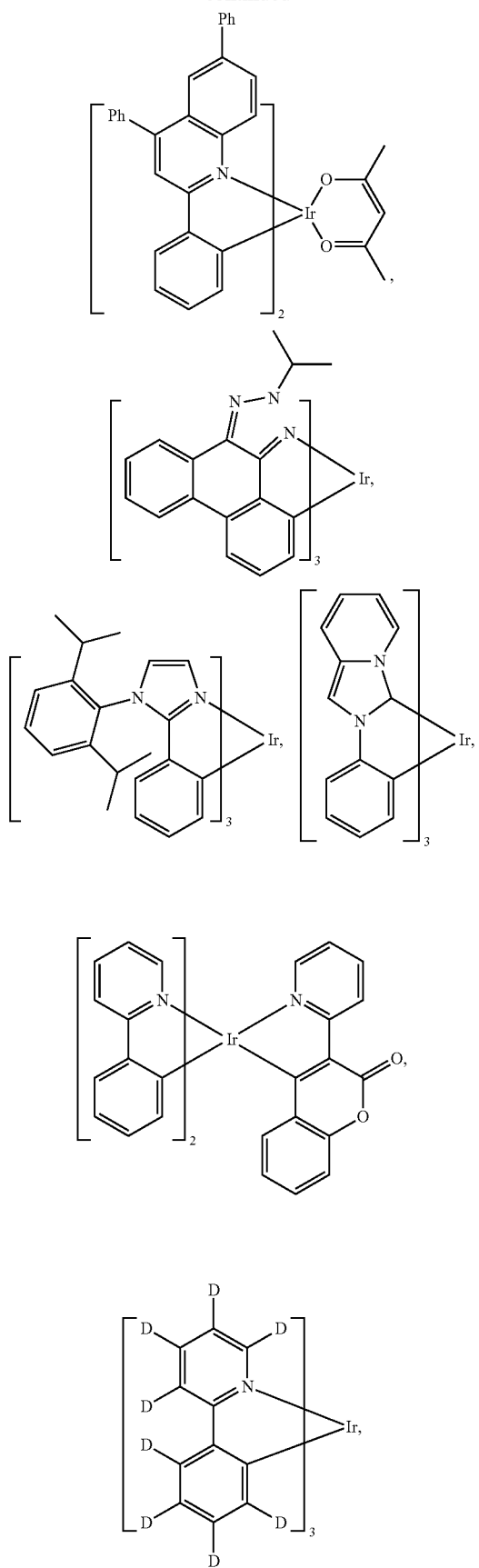
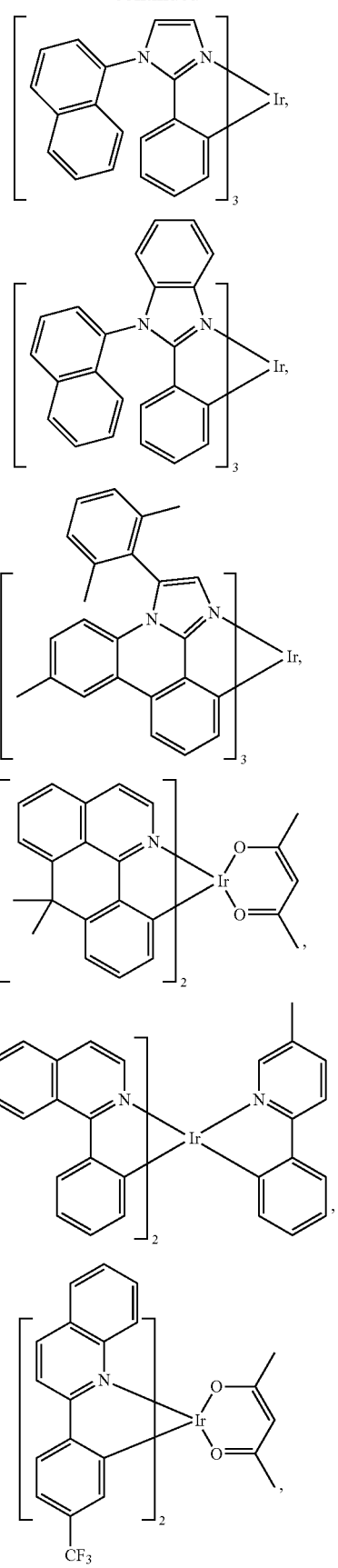

-continued

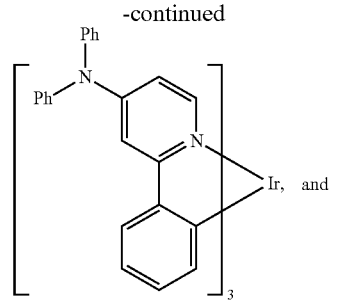

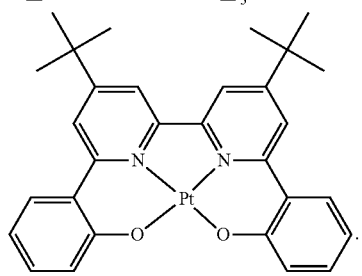

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

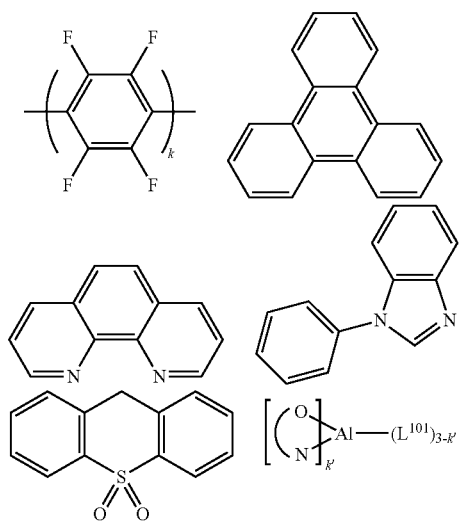

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

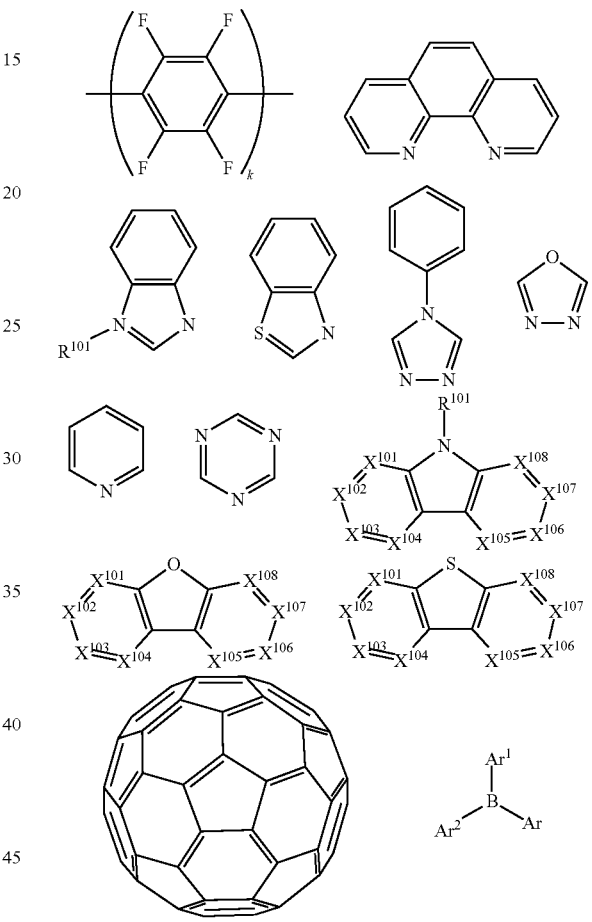

wherein $R^{101}$ is selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

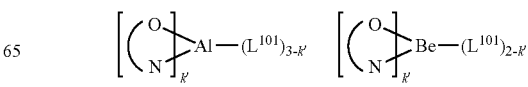

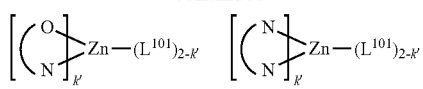

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

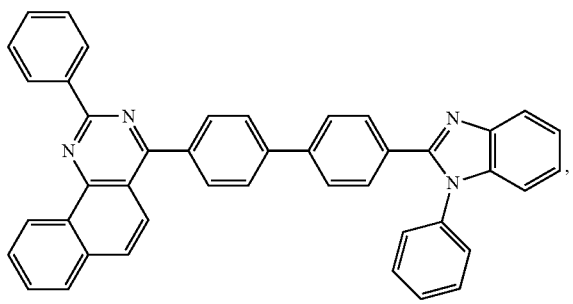

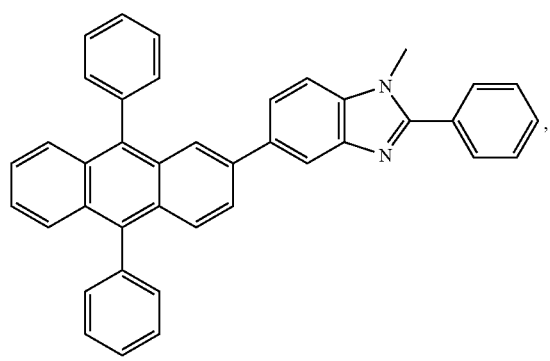

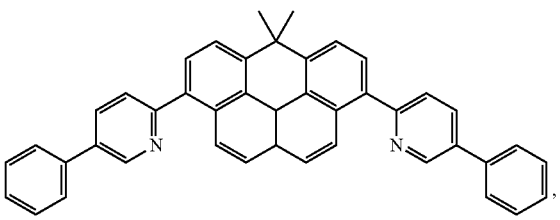

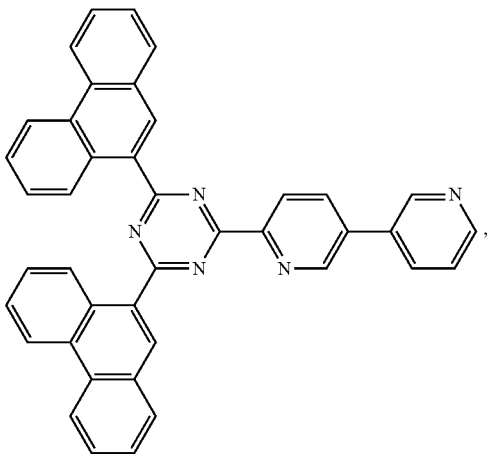

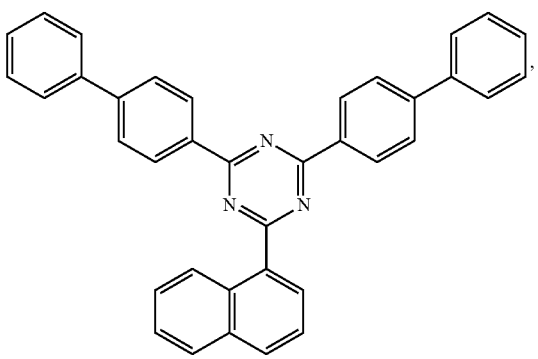

207
-continued
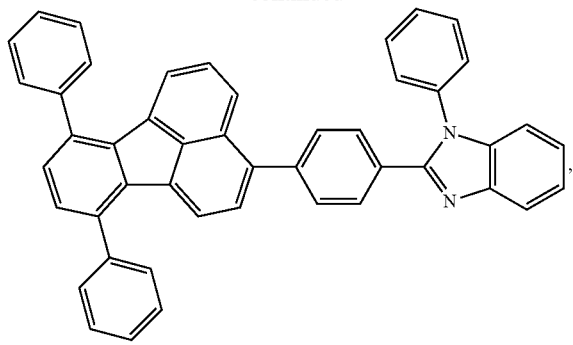
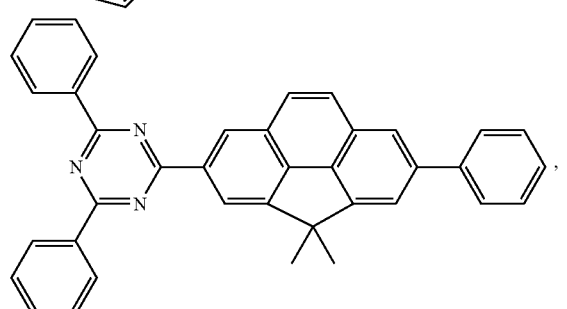
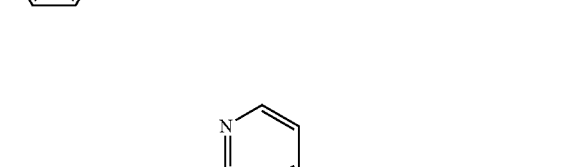
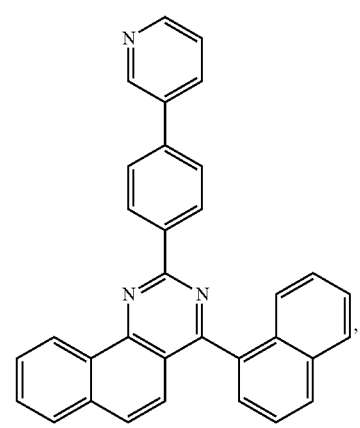
208
-continued
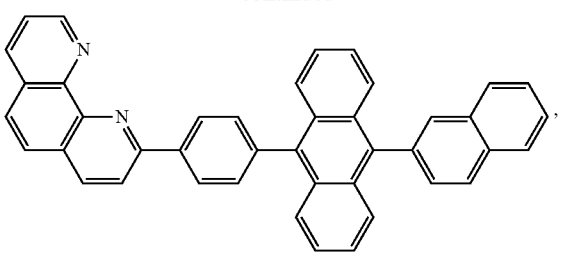
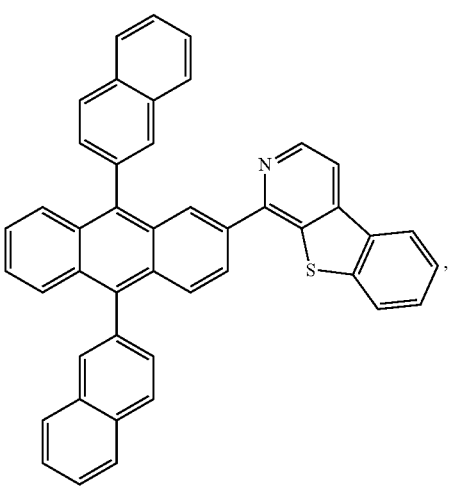
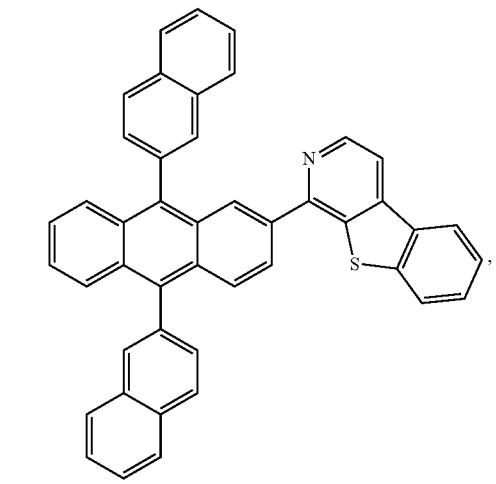
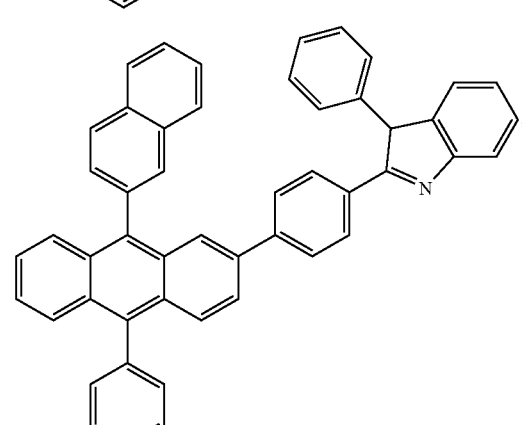

209
-continued
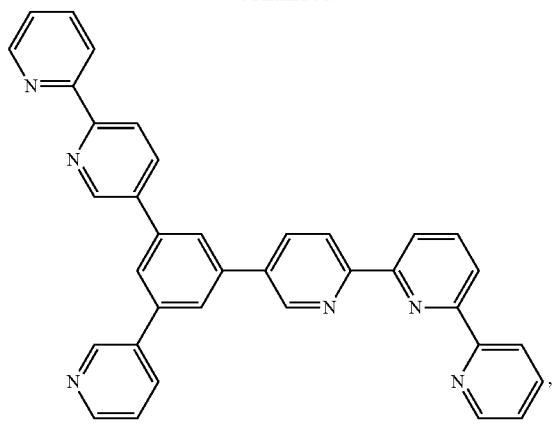
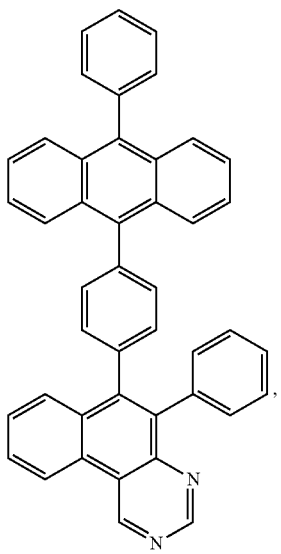
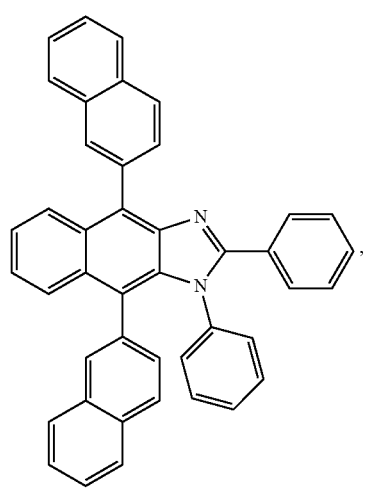
210
-continued
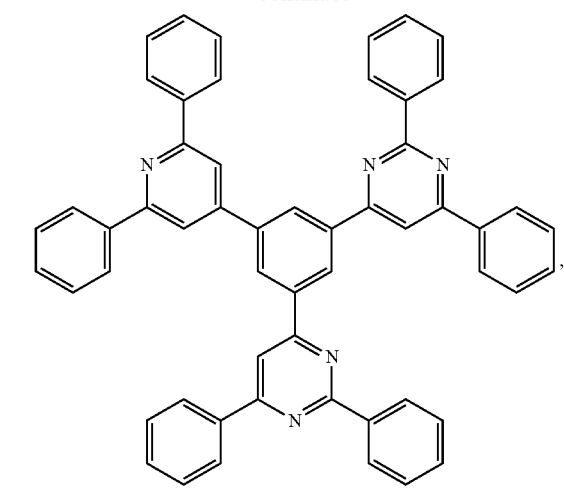
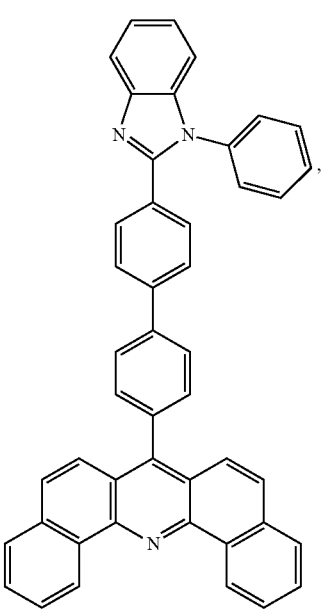
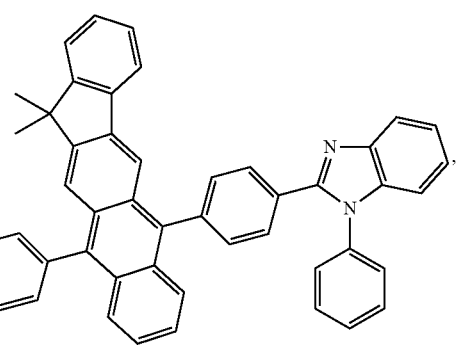

211
-continued
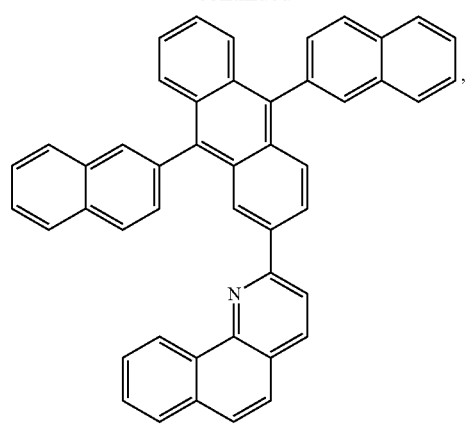
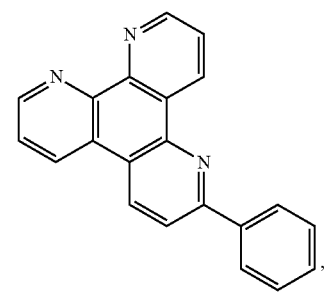
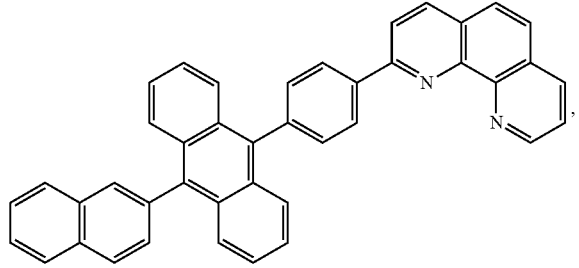
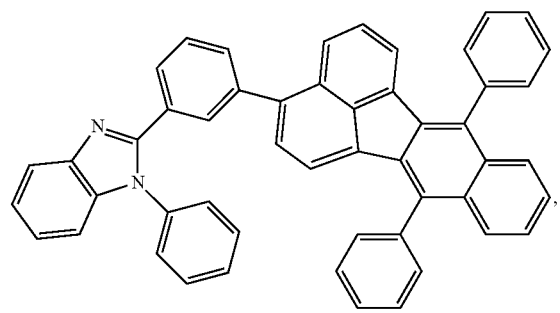
212
-continued
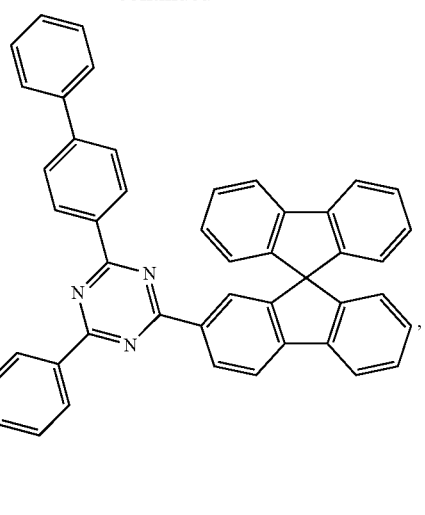
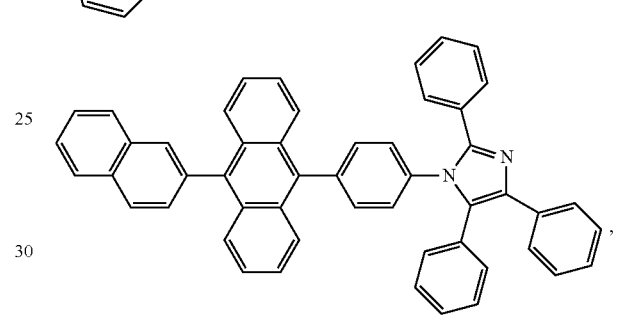
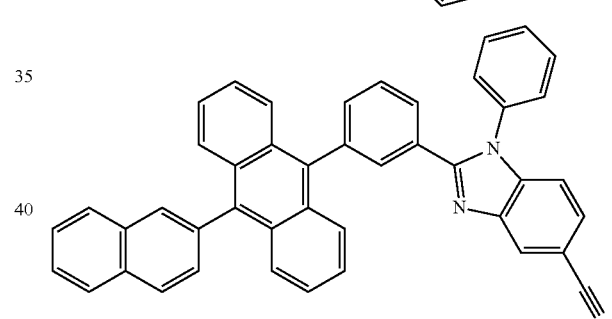
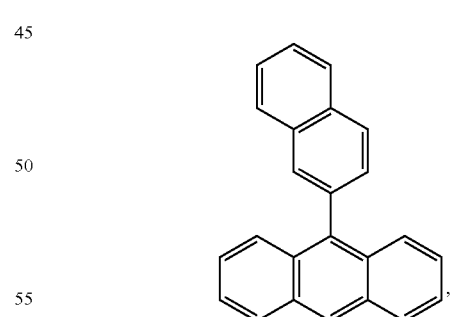
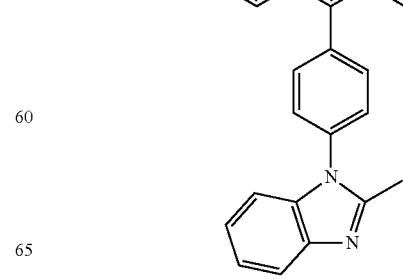

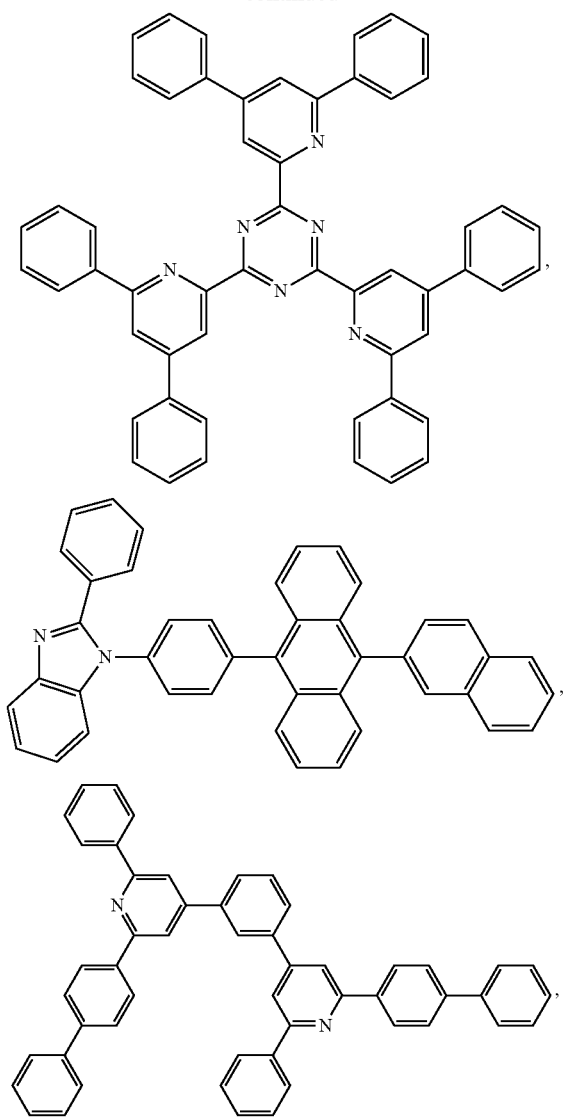

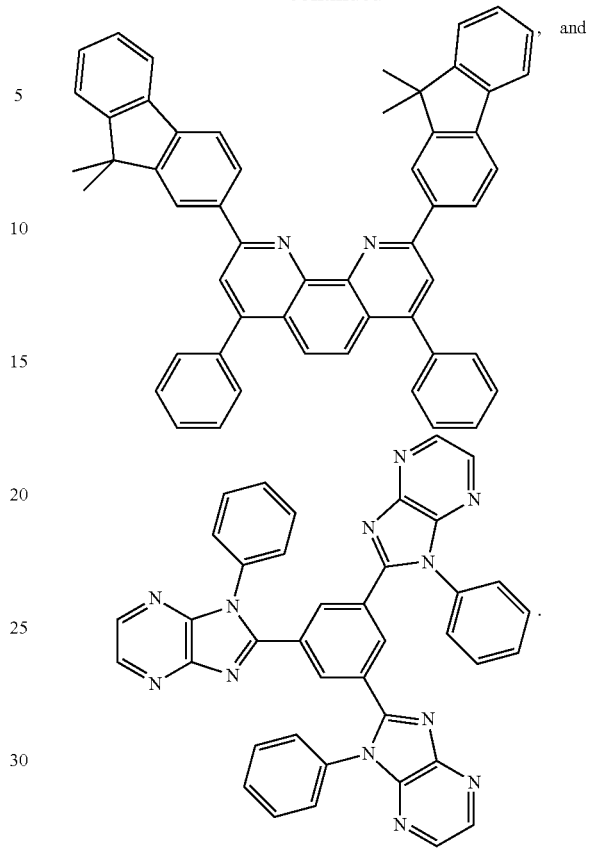

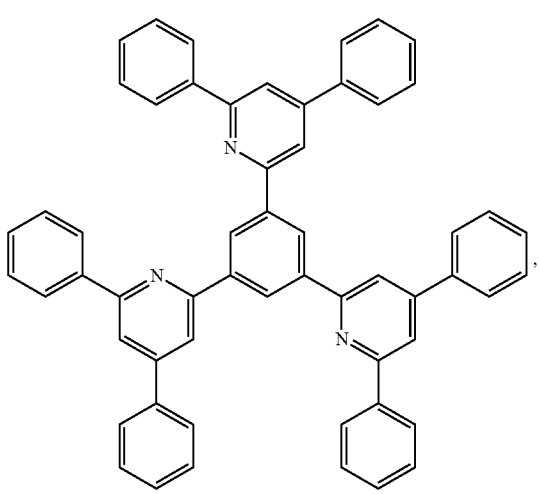

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound having a metal coordination complex structure;
   wherein the compound is capable of functioning as an emitter in an organic light emitting device at room temperature;
   wherein when there are more than one ligand in the compound each ligand is different from each other;
   wherein the compound has the formula of $M(L^1)(L^2)(L^3)$ and $L^1$, $L^2$, and $L^3$ are different from each other;
   wherein each of $L^1$, $L^2$, and $L^3$ is a ligand having at least two six-membered rings bridged together, wherein two adjacent bridged six-membered rings are each coordinated to the metal, and at least one of the two bridged six-membered rings having at least one nitrogen atom;
   wherein the compound has a first substituent $R^1$ at one of the ligands' periphery;
   wherein a first distance is the distance between the metal and an atom in $R^1$ that is the farthest away from the metal;
   wherein the first distance is longer than any distance between the metal and any other atoms in the compound; and
   wherein when a sphere having a radius r is defined whose center is the metal and the radius r is the smallest radius that will allow the sphere to enclose all atoms in the compound that are not part of $R^1$, the first distance is longer than the radius r by at least 2.9 Å.

2. The compound of claim 1, wherein the compound has a second substituent $R^2$ at one of the ligands' periphery;
   wherein a second distance is the distance between the metal and an atom in $R^2$ that is the farthest away from the metal; and
   wherein when the radius r is the smallest radius that will allow the sphere to enclose all atoms in the compound that are not part of $R^1$ or $R^2$, the second distance is longer than r by at least 1.5 Å.

3. The compound of claim 2, wherein $R^1$ and $R^2$ are on different ligands.

4. The compound of claim 2, wherein the first and second distances are all longer than r by at least 4.3 Å.

5. The compound of claim 2, wherein $R^1$ is attached to an aromatic ring having a first coordination atom, $R^2$ is attached to an aromatic ring having a second coordination atom; and
   wherein the first coordination atom is in a trans configuration to the second coordination atom relative to the metal.

6. The compound of claim 2, wherein the compound has a third substituent $R^3$ at one of the ligands' periphery;
   wherein a third distance is the distance between the metal and an atom in $R^3$ that is the farthest away from the metal; and
   wherein when the radius r is the smallest radius that will allow the sphere to enclose all atoms in the compound that are not part of $R^1$, $R^2$, or $R^3$, the third distance is longer than r by at least 1.5 Å.

7. The compound of claim 6, wherein $R^1$, $R^2$, and $R^3$ are on different ligands;
   wherein the compound has an octahedral coordination geometry with three bidentate ligands, wherein each of the three bidentate ligands having two coordination atoms and a midpoint defined between the two coordination atoms;
   wherein the three midpoints define a first plane; and
   wherein each atom in $R^1$, $R^2$, and $R^3$ have a point-to-plane distance less than 5 Å relative to the first plane.

8. The compound of claim 7, wherein any atom in $R^1$, $R^2$, and $R^3$ has a point-to-plane distance less than r relative to the first plane.

9. The compound of claim 1, wherein the compound has a transition dipole moment axis; and
   wherein an angle between the transition dipole moment axis and an axis along the first distance is less than 40°.

10. The compound of claim 1, wherein the triplet energy of a first homoleptic metal complex, whose ligands are same as the ligand in the compound having $R^1$, is lower than the triplet energy of a second homoleptic metal complex, whose ligands are any of the other ligands in the compound, by at least 0.05 eV.

11. The compound of claim 1, wherein the compound is capable of functioning as a phosphorescent emitter, a fluorescent emitter, or a delayed fluorescent emitter in an organic light emitting device at room temperature.

12. The compound of claim 1, wherein the compound comprises a first benzene ring coordinated to the metal; and wherein the first benzene ring is fused by a second aromatic ring.

13. The compound of claim 1, wherein the compound has the formula of $M(L^1)_x(L^2)_y(L^3)_z$;
   wherein x is 1, 2, or 3;
   wherein y is 0, 1, or 2;
   wherein z is 0, 1, or 2;
   wherein x+y+z is the oxidation state of the metal M;
   wherein $L^1$, $L^2$, and $L^3$ are each independently selected from the group consisting of:

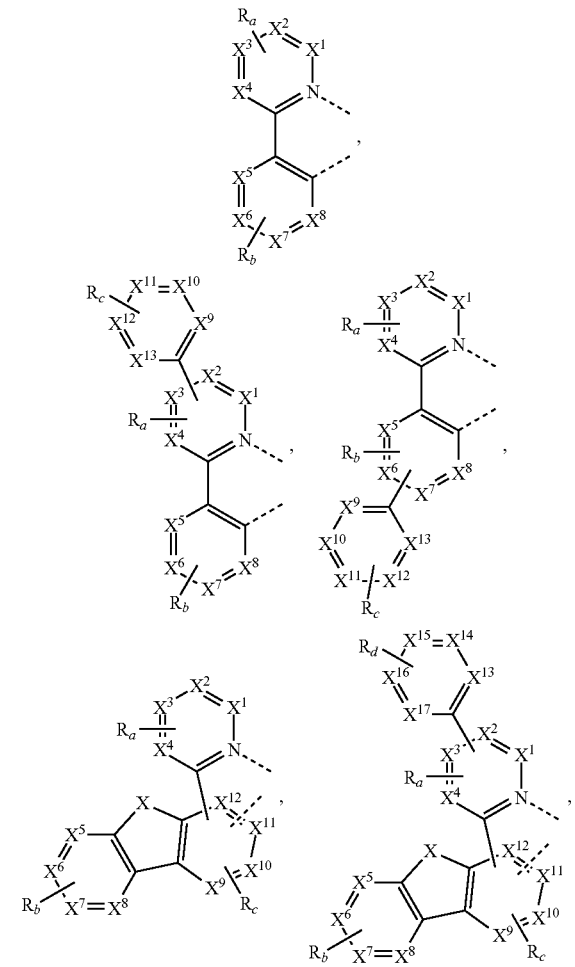

-continued

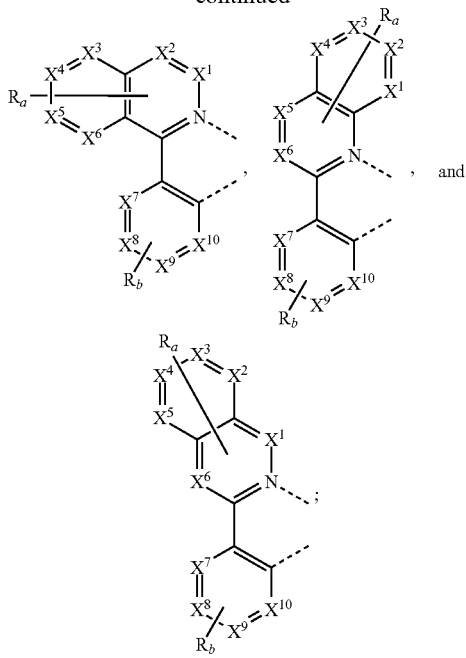

wherein each $X^1$ to $X^{17}$ are independently selected from the group consisting of carbon and nitrogen;
wherein $Z^1$, $Z^2$, and $Z^3$ are independently selected from the group consisting of carbon and nitrogen;
wherein X is selected from the group consisting of BR', NR', PR', O, S, Se, C=O, S=O, SO$_2$, CR'R", SiR'R", and GeR'R";
wherein R' and R" are optionally fused or joined to form a ring;
wherein each $R_a$, $R_b$, $R_c$, and $R_d$ may represent from mono substitution to the possible maximum number of substitution, or no substitution;
wherein R', R", $R_a$, $R_b$, $R_c$, and $R_d$ are each independently selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof; and
wherein any two $R_a$, $R_b$, $R_c$, and $R_d$ are optionally fused or joined to form a ring or form a multidentate ligand; and
wherein at least one of the $R_a$, $R_b$, $R_c$, and $R_d$ includes $R^1$.

14. The compound of claim 13, wherein at least one pair of substituents $R_a$, $R_b$, $R_c$, and $R_d$ within the same ring are joined and fused into a ring.

15. The compound of claim 13, wherein at least one pair of substituents $R_a$, $R_b$, $R_c$, and $R_d$ between two nearby rings are joined and fused into a ring.

16. The compound of claim 1, wherein $R^1$ is selected from the group consisting of:

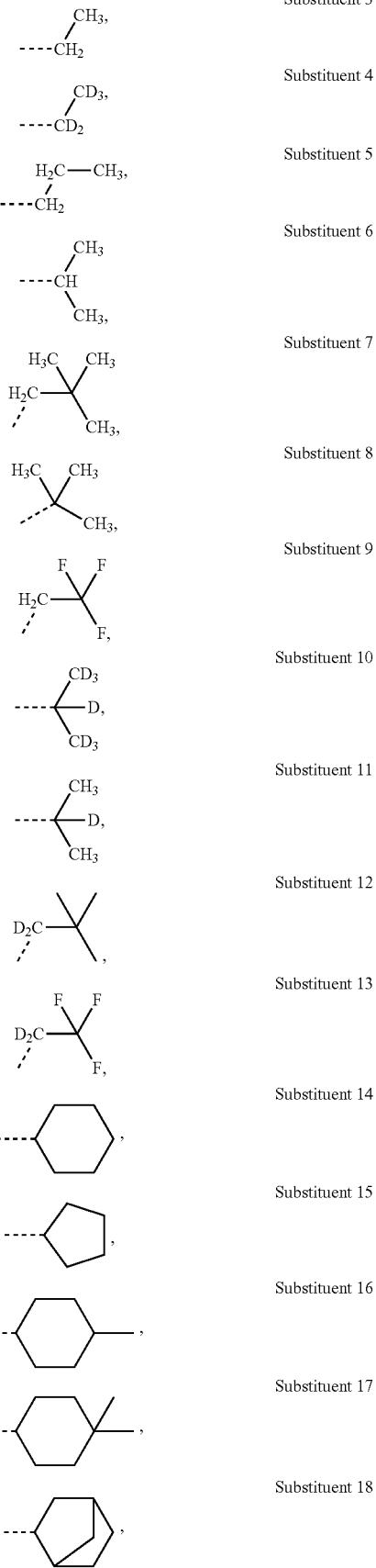

219
-continued

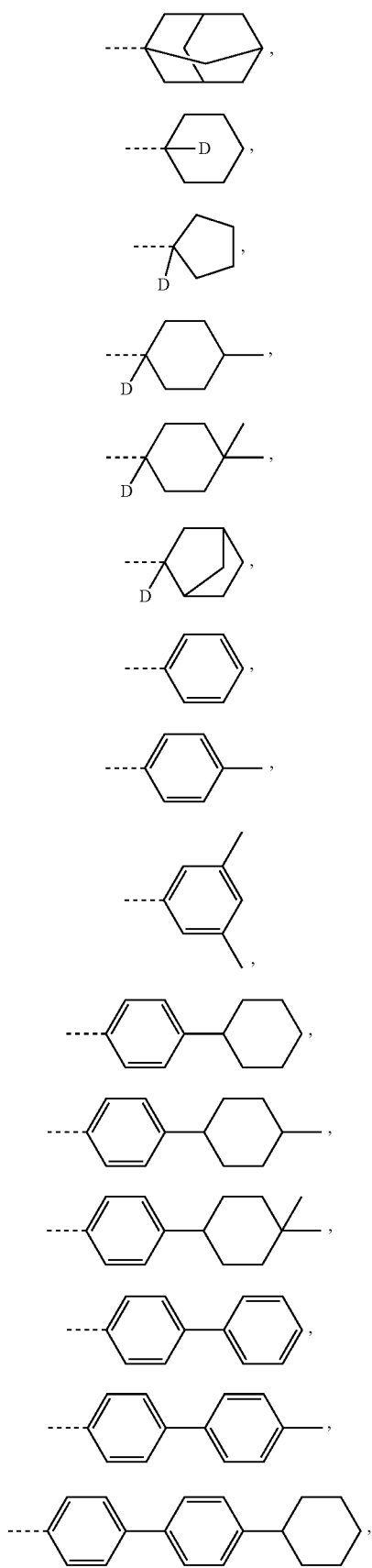

220
-continued

Substituent 19

Substituent 20

Substituent 21

Substituent 22

Substituent 23

Substituent 24

Substituent 25

Substituent 26

Substituent 27

Substituent 28

Substituent 29

Substituent 30

Substituent 31

Substituent 32

Substituent 33

Substituent 34
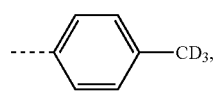

Substituent 35
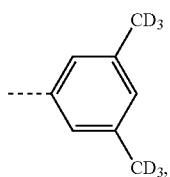

Substituent 36
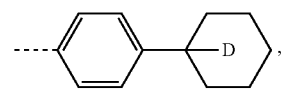

Substituent 37
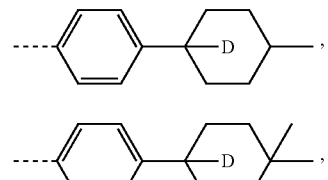

Substituent 38
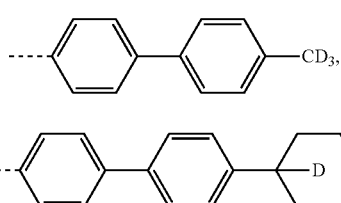

Substituent 39
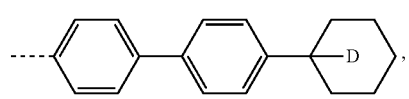

Substituent 40
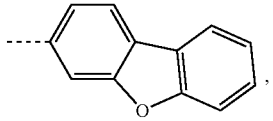

Substituent 41
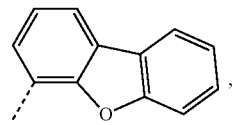

Substituent 42
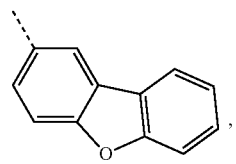

Substituent 43
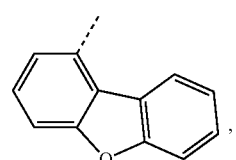

Substituent 44
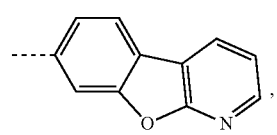

Substituent 45

-continued
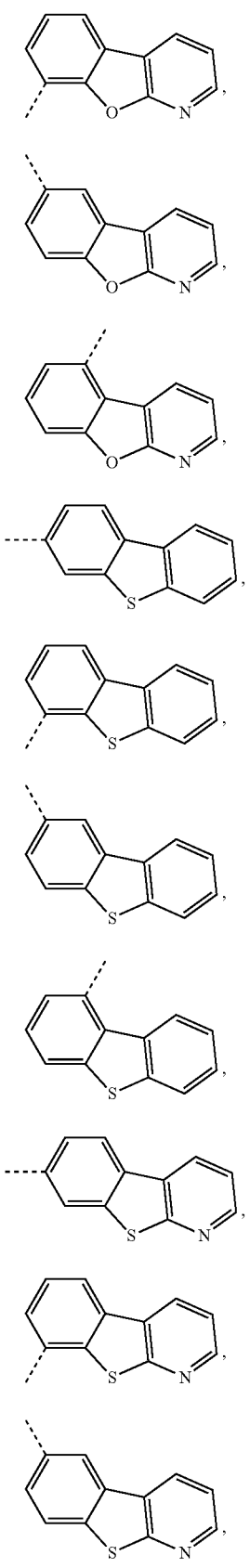
Substituent 46
Substituent 47
Substituent 48
Substituent 49
Substituent 50
Substituent 51
Substituent 52
Substituent 53
Substituent 54
Substituent 55
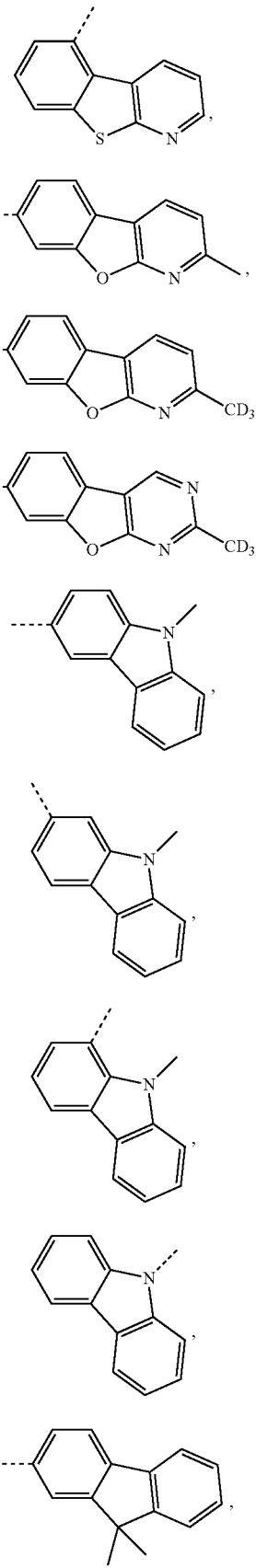
Substituent 56
Substituent 57
Substituent 58
Substituent 59
Substituent 60
Substituent 61
Substituent 62
Substituent 63
Substituent 64

223
-continued
Substituent 65
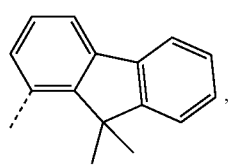
Substituent 66
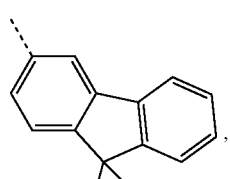
Substituent 67
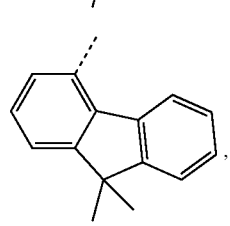
Substituent 68
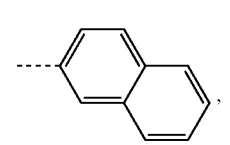
Substituent 69
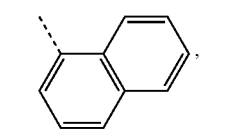
Substituent 70
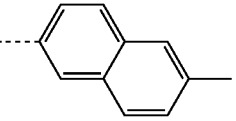
Substituent 71
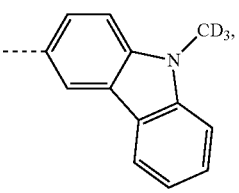
Substituent 72
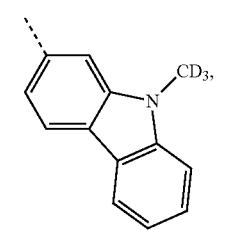
Substituent 73
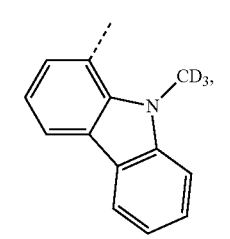
224
-continued
Substituent 74
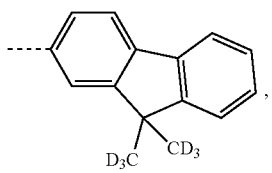
Substituent 75
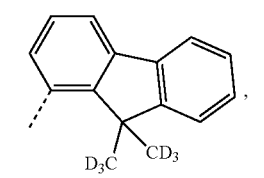
Substituent 76
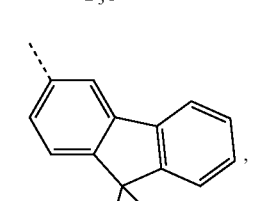
Substituent 77
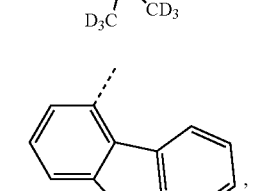
Substituent 78
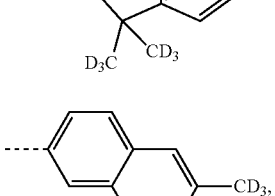
Substituent 79
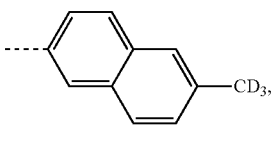
Substituent 80
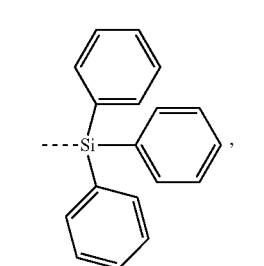
Substituent 81
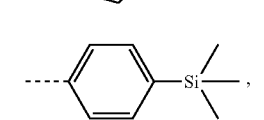
Substituent 82
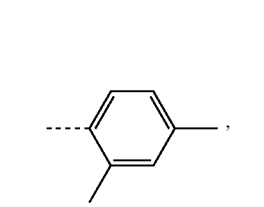

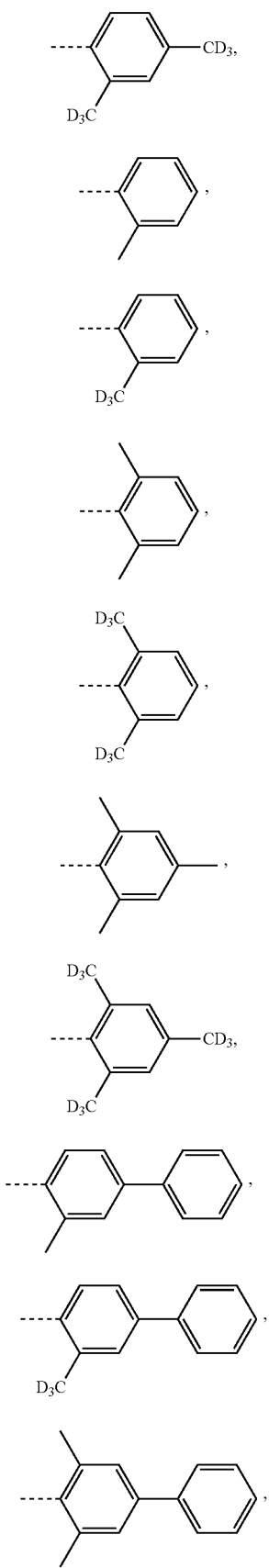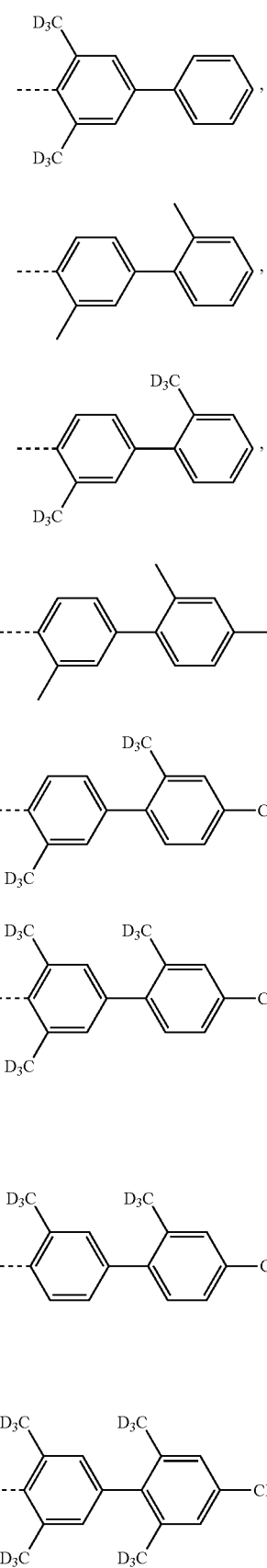

227
-continued
Substituent 101
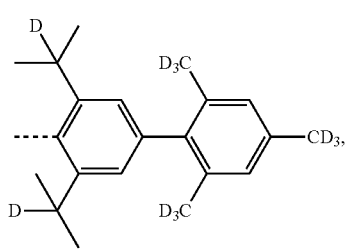
Substituent 102
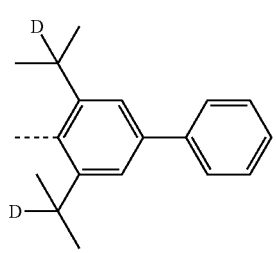
228
-continued
Substituent 103
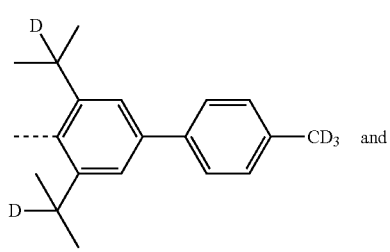
and
Substituent 104
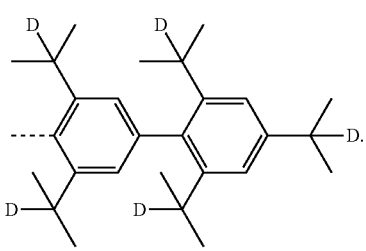
17. The compound of claim 1, wherein the compound is selected from the group consisting of:
Compound 1
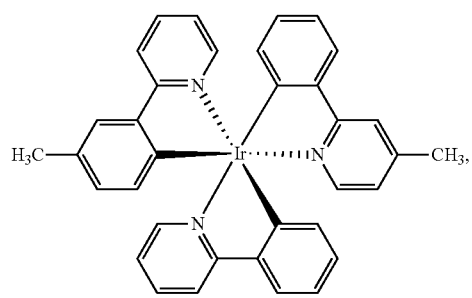
Compound 2
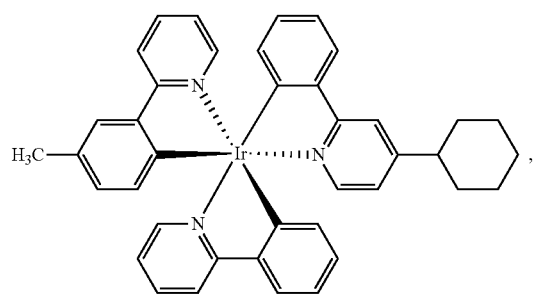
Compound 3
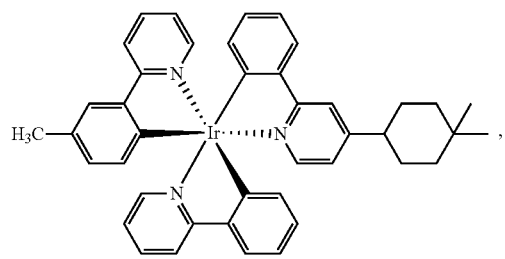
Compound 4
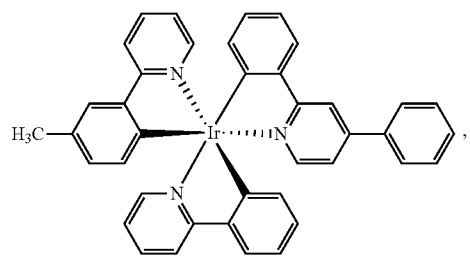
Compound 5
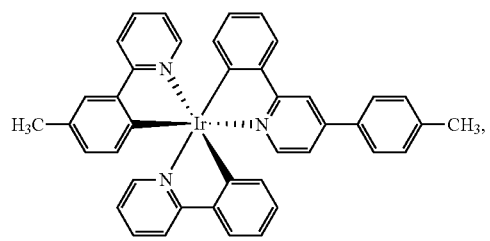
Compound 6
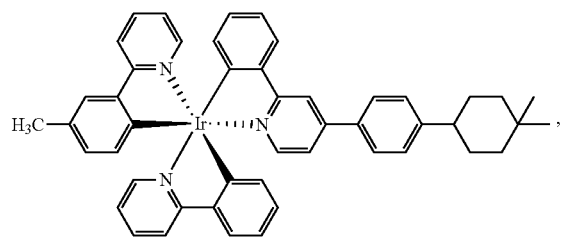

Compound 7
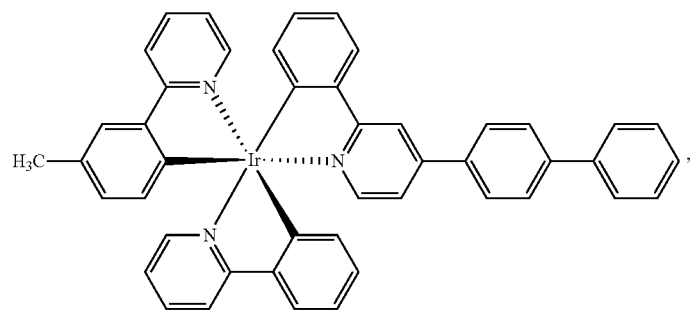
Compound 8
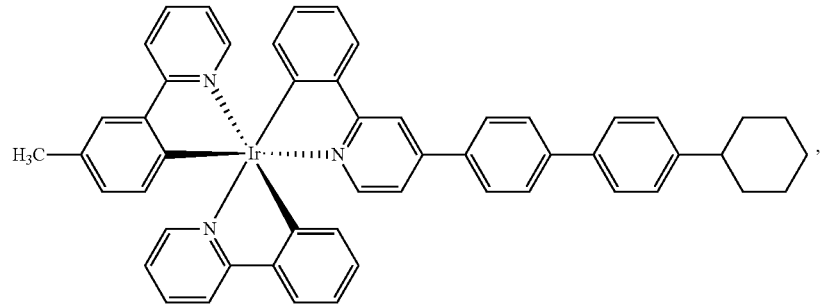
Compound 9
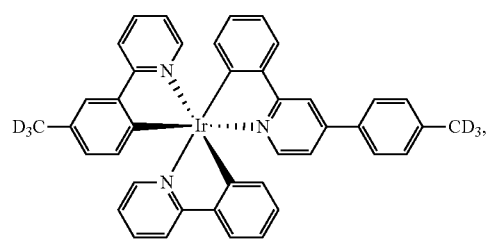
Compound 10
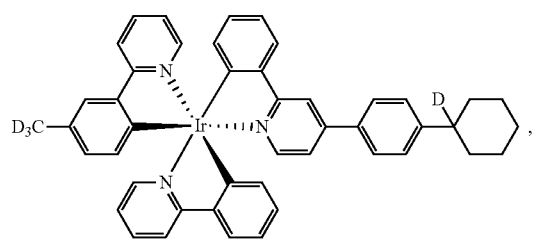
Compound 11
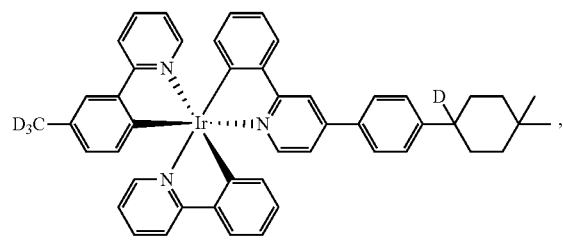
Compound 12
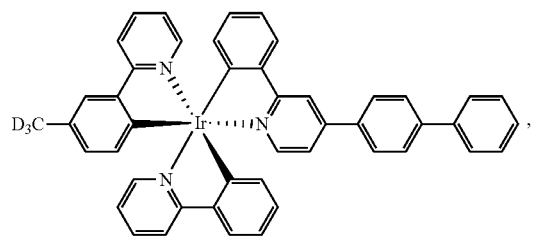
Compound 13
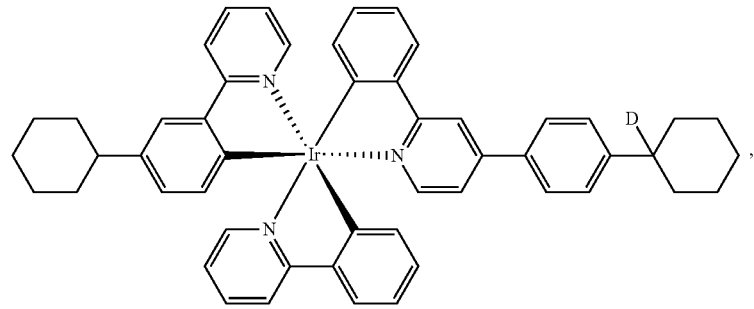

-continued
Compound 14
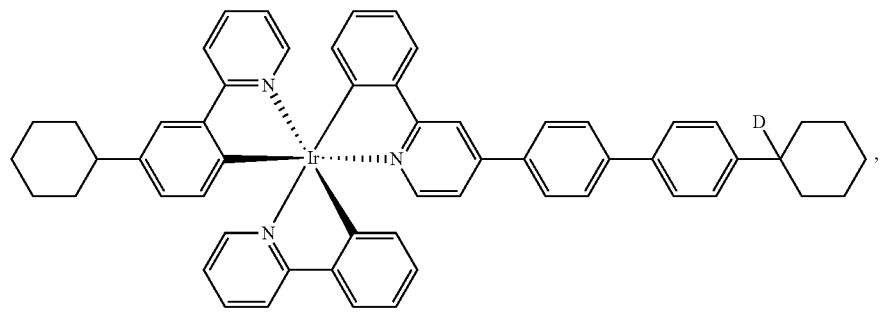
Compound 15
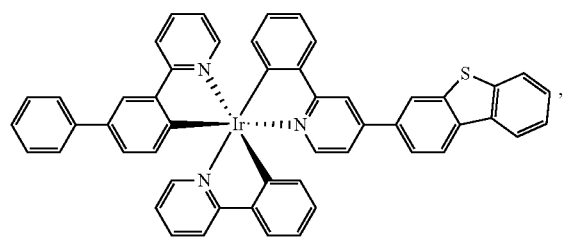
Compound 16
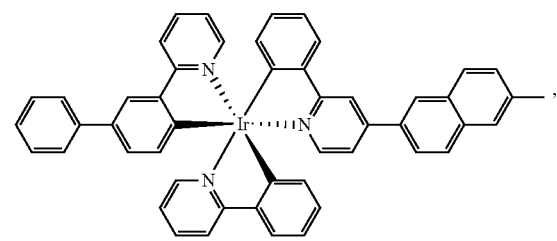
Compound 17
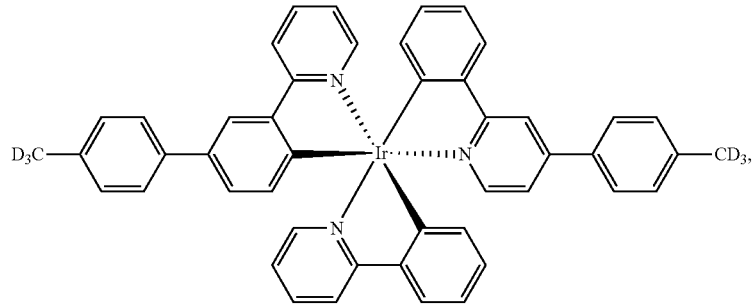
Compound 18
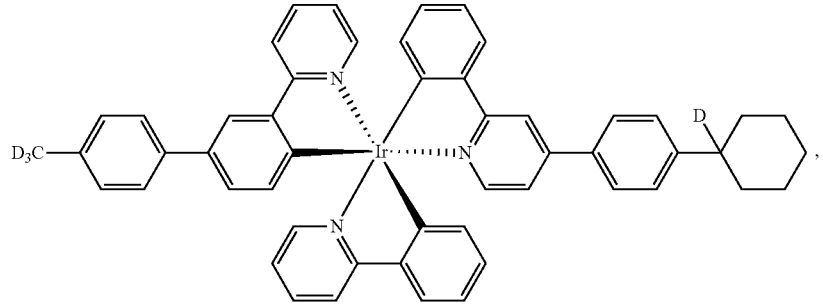
Compound 19
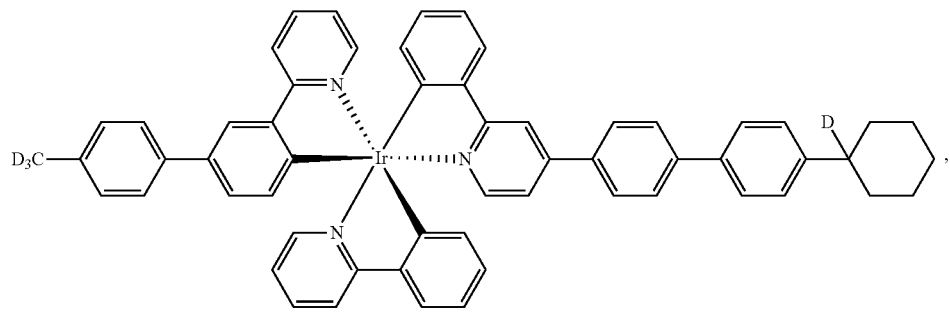

-continued
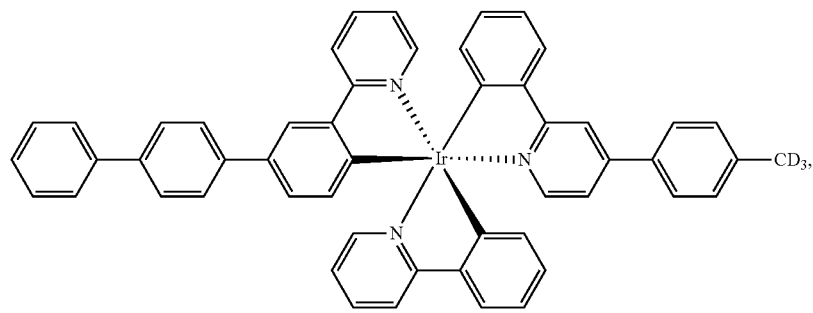
Compound 20
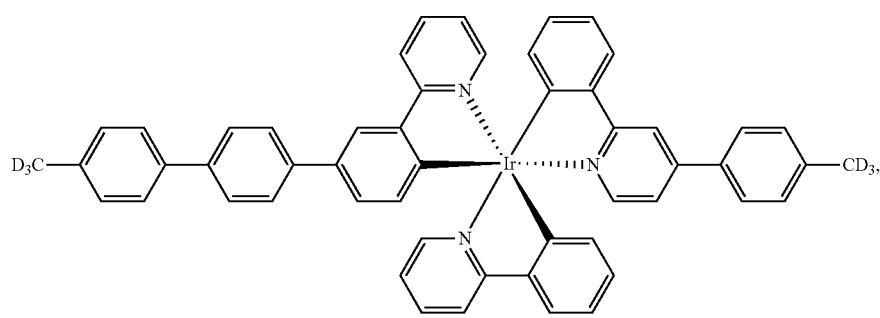
Compound 21
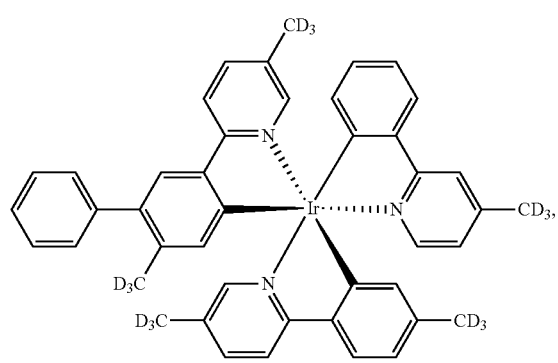
Compound 22
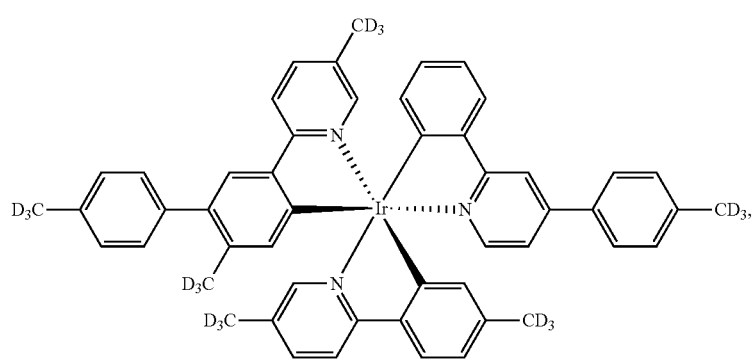
Compound 23

-continued
Compound 24
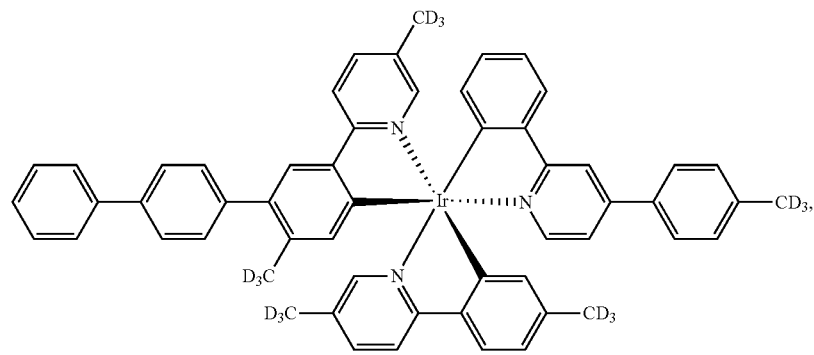
Compound 25
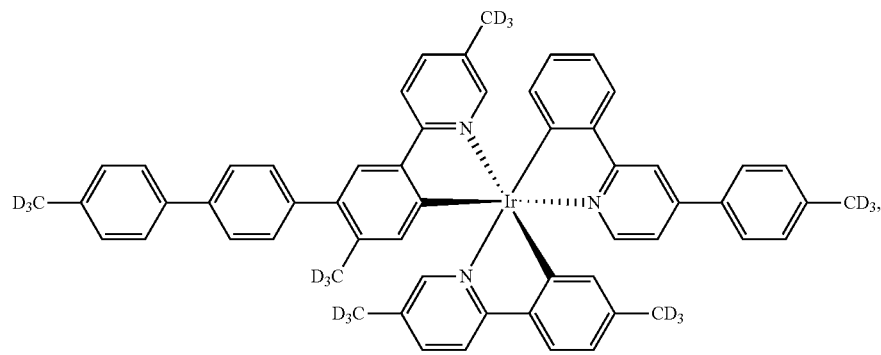
Compound 26
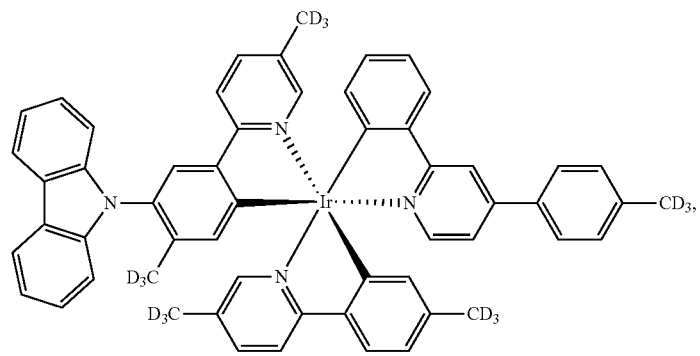
Compund 27
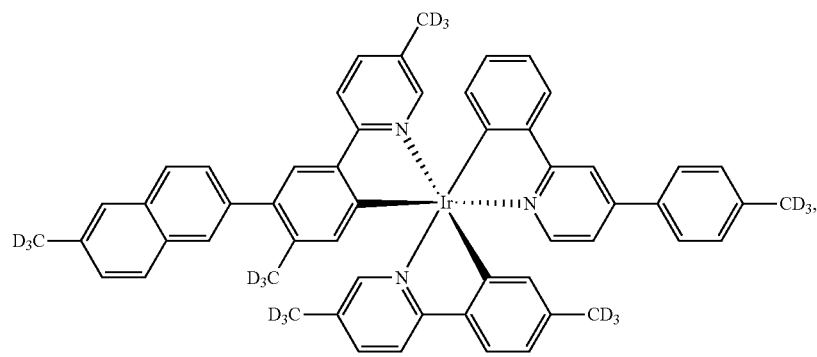

Compound 28
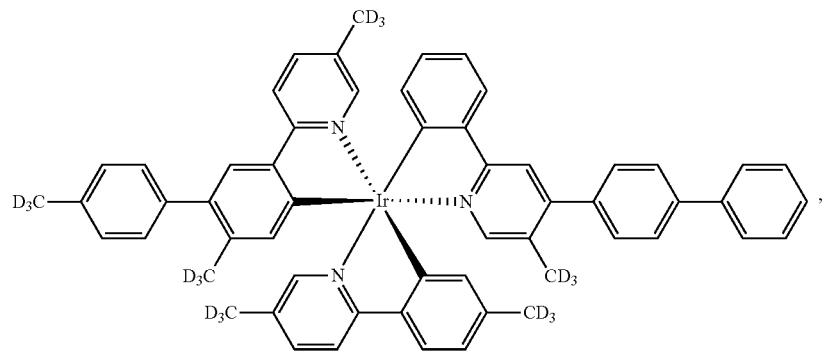
Compound 29
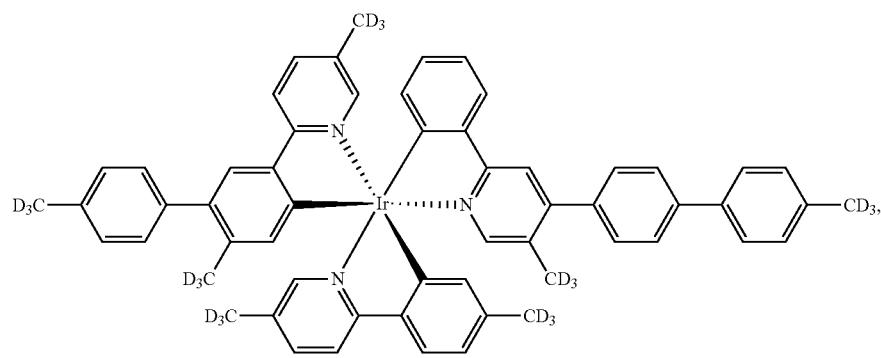
Compound 30
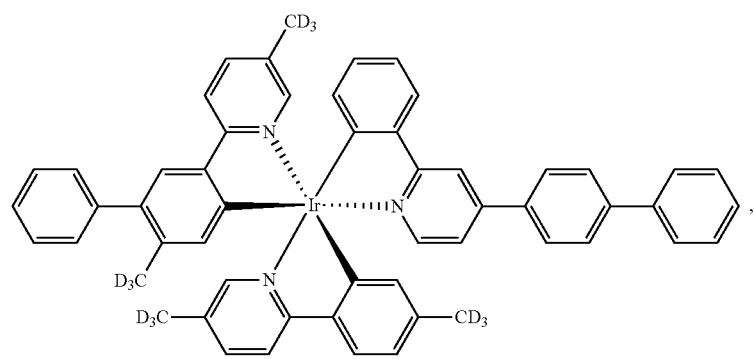
Compound 31
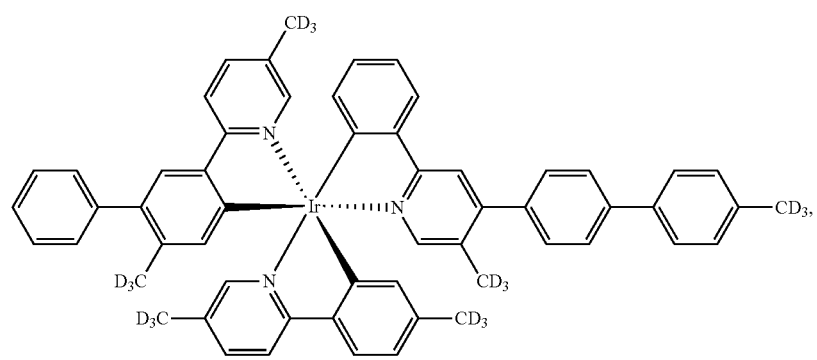

Compound 32
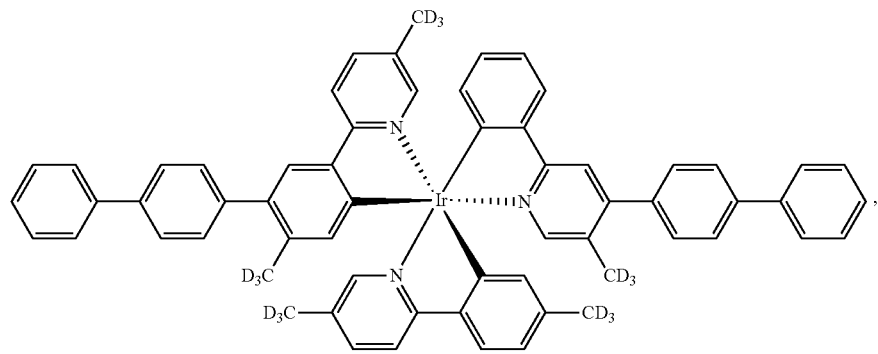
Compound 33
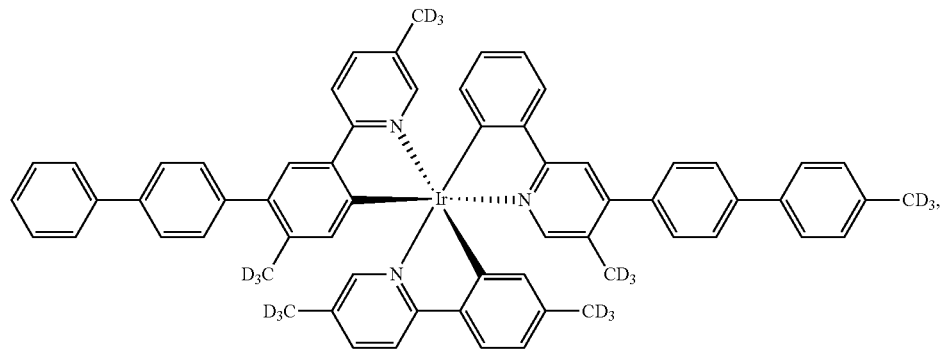
Compound 34
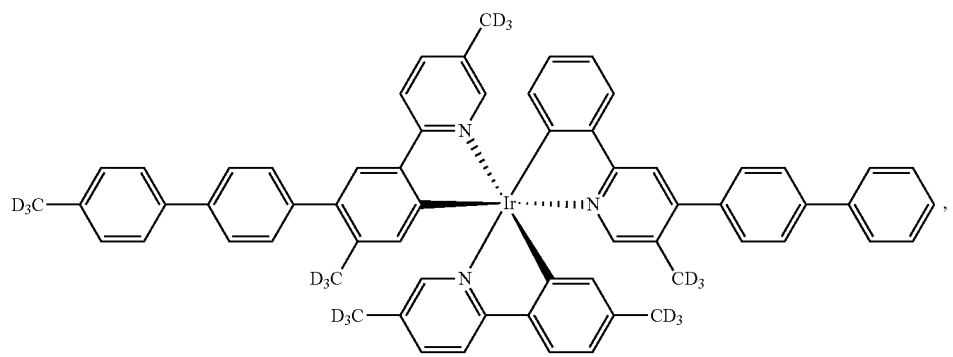
Compound 35
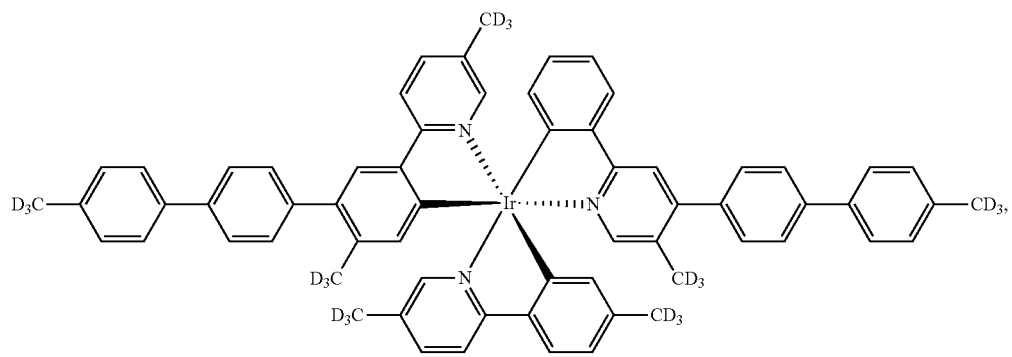

-continued
Compound 36
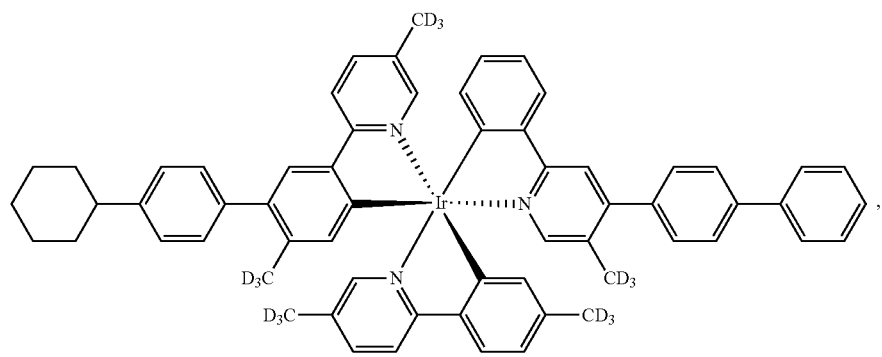
Compound 37
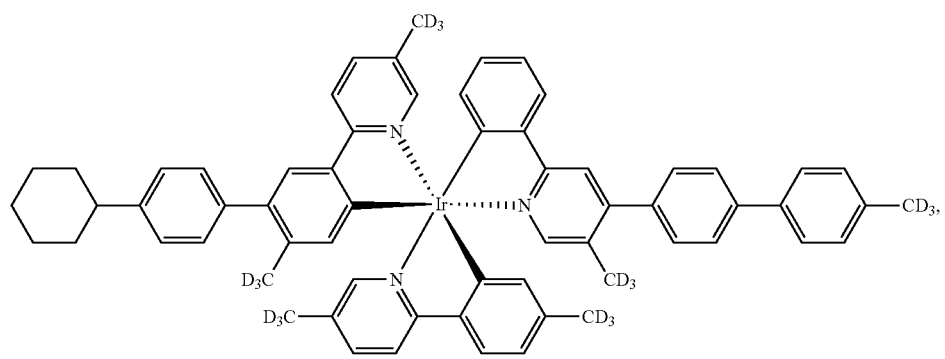
Compound 38
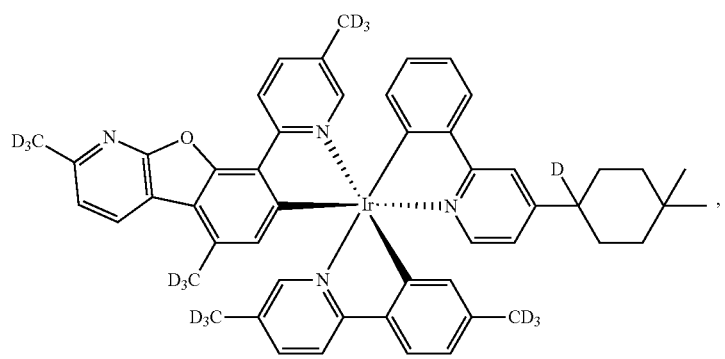
Compound 39
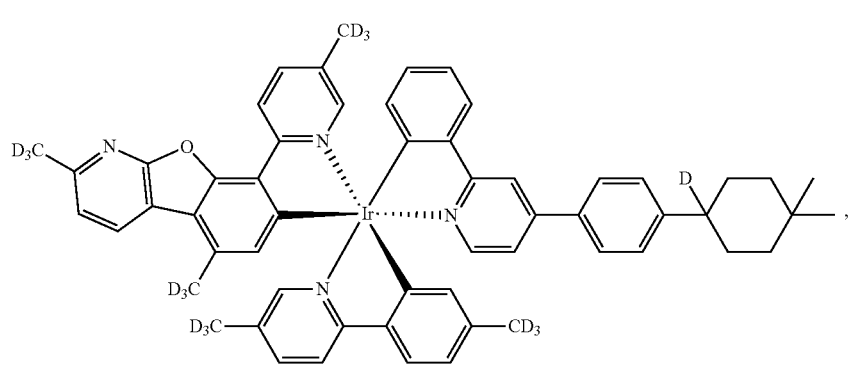

-continued
Compound 40
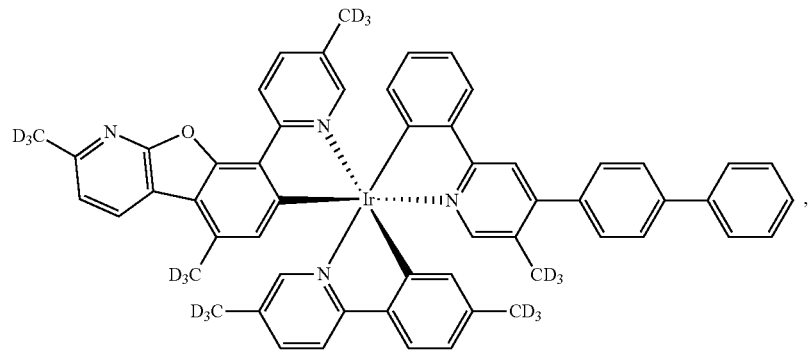
Compound 41
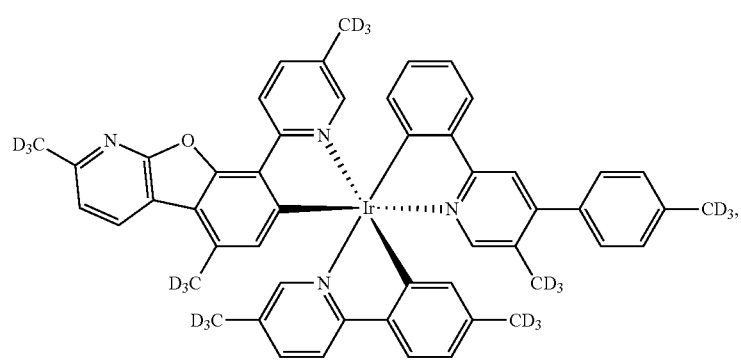
Compound 42
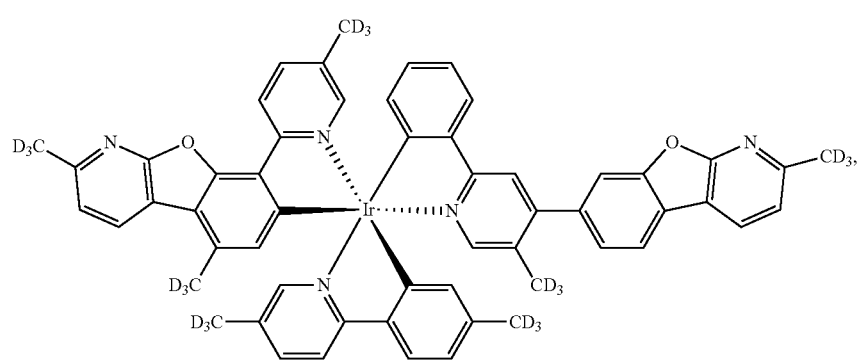
Compound 44
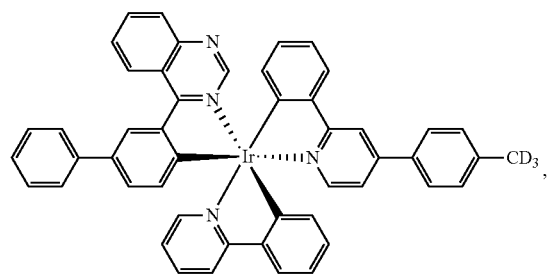

Compound 45
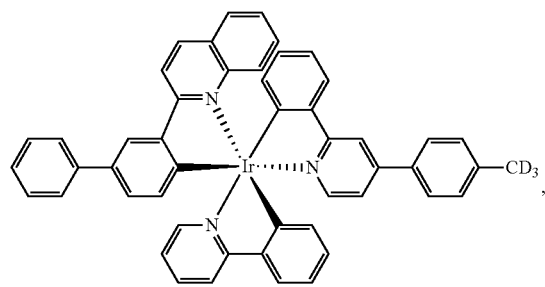
Compound 46
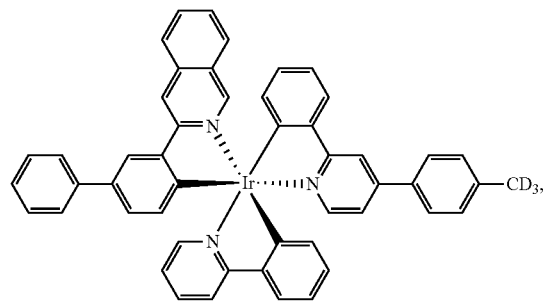
Compound 47
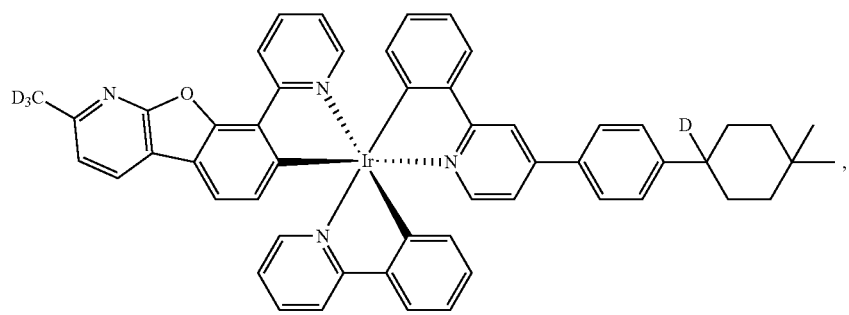
Compound 48
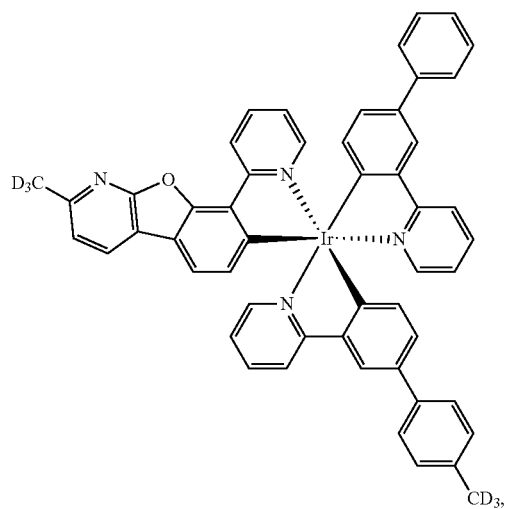
Compound 49
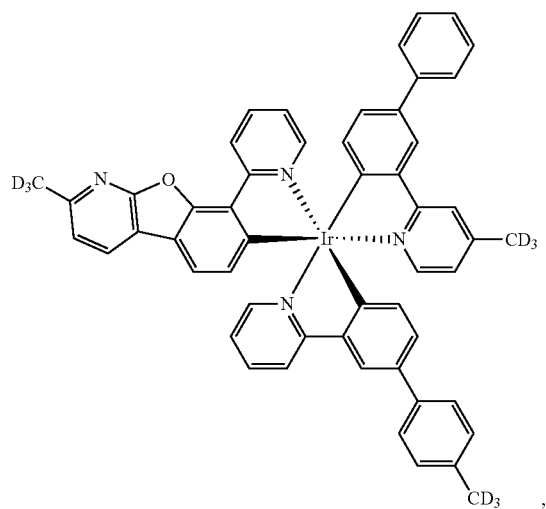

Compound 50
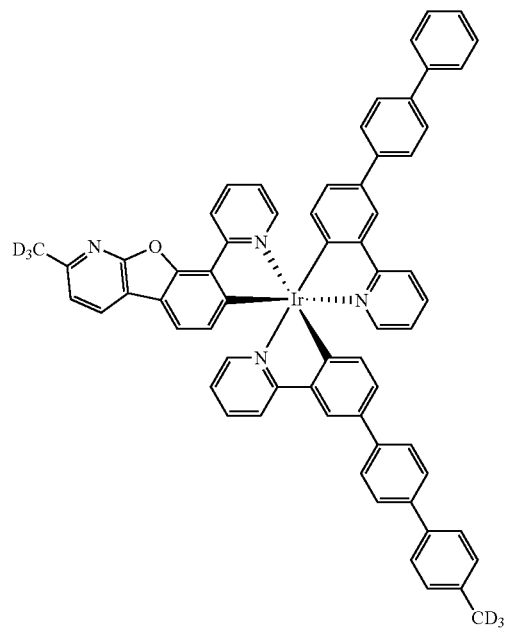
Compound 51
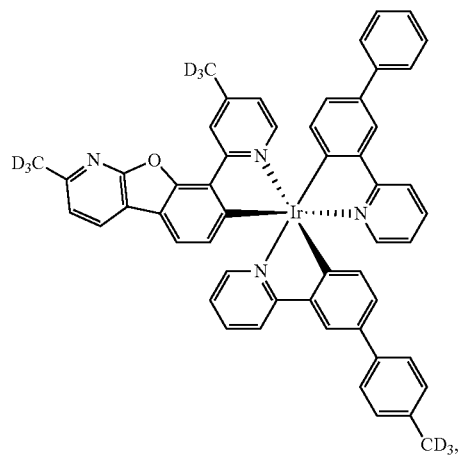
Compound 52
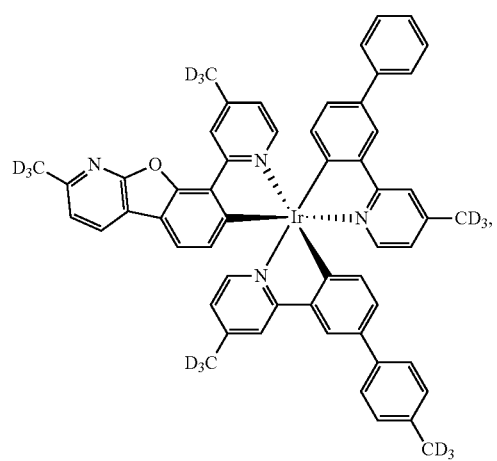
Compound 53
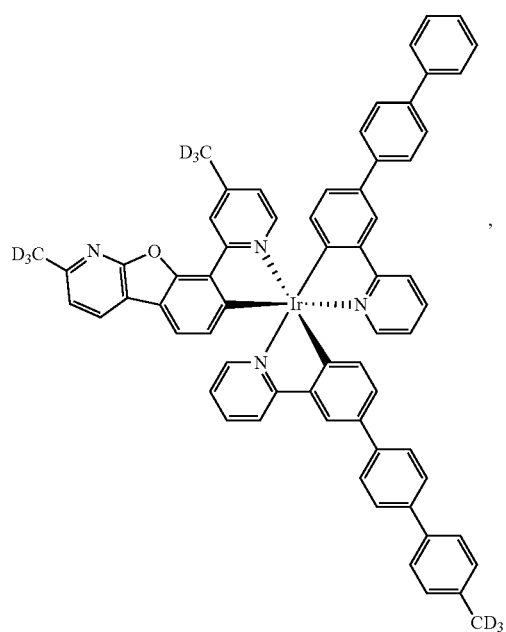

-continued
Compound 54
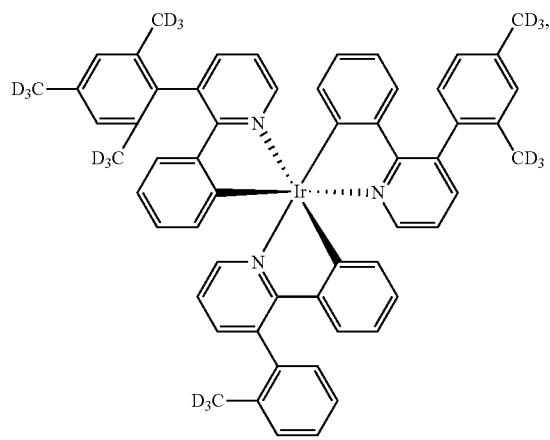
Compound 55
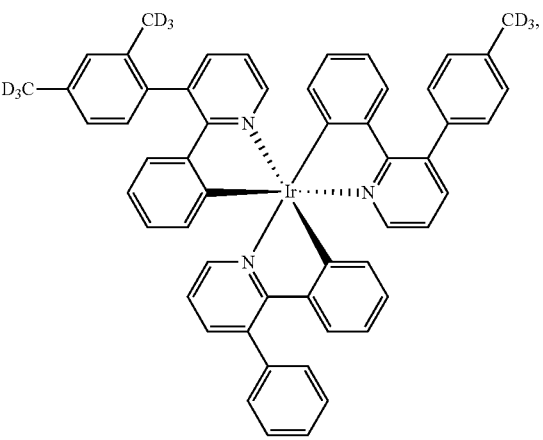
Compound 56
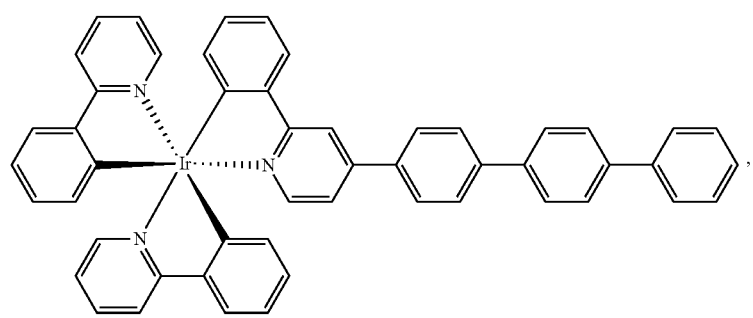
Compound 59
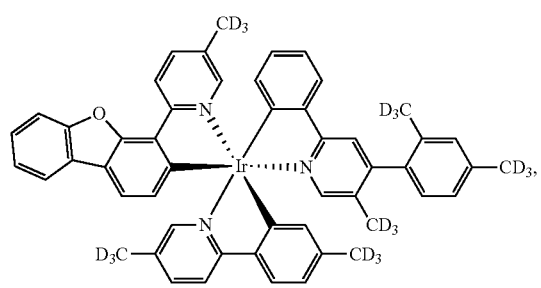
Compound 60
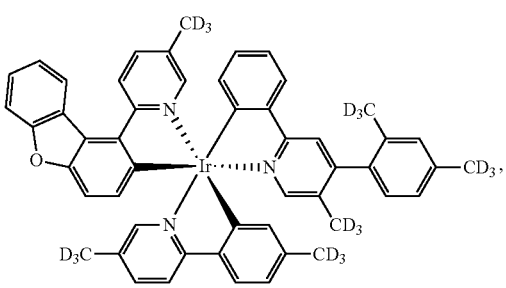
Compound 61
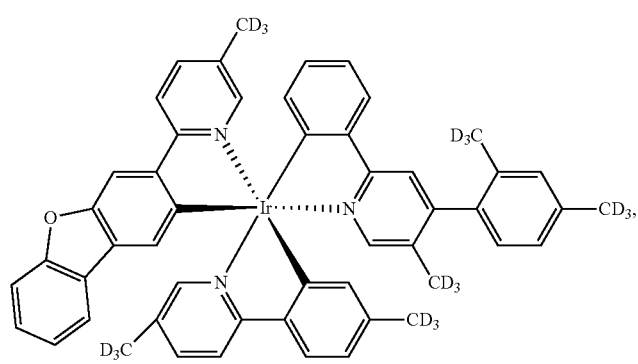

Compound 62
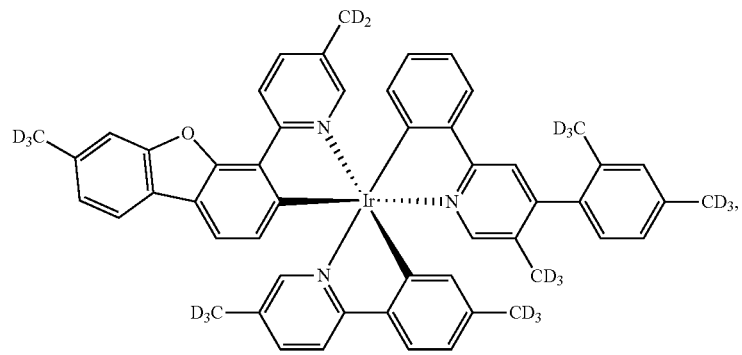
Compound 63
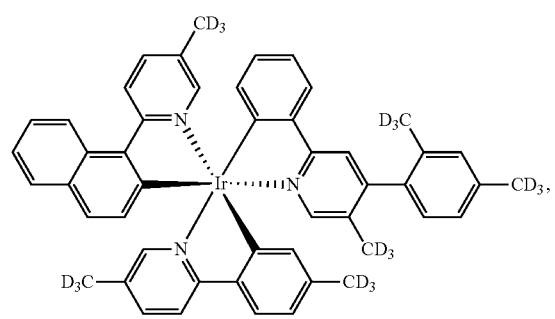
Compound 64
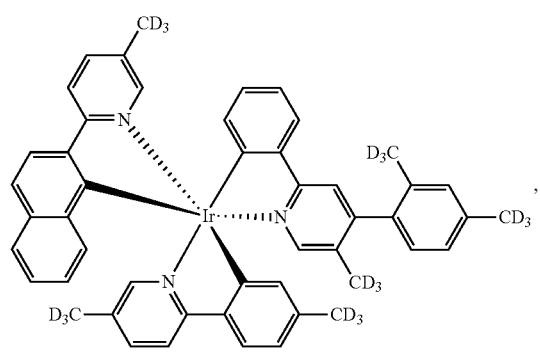
Compound 65
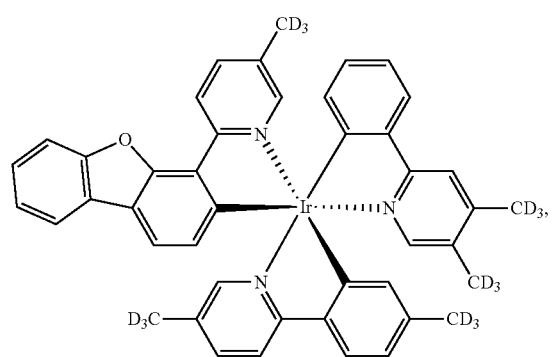
Compound 66
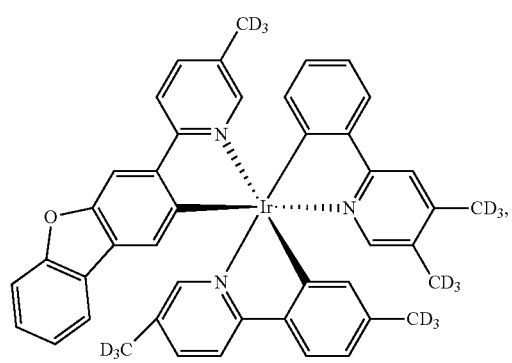
Compound 67
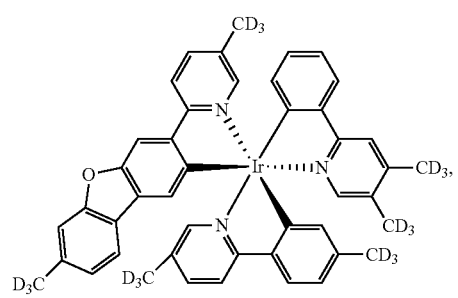

-continued
Compound 69
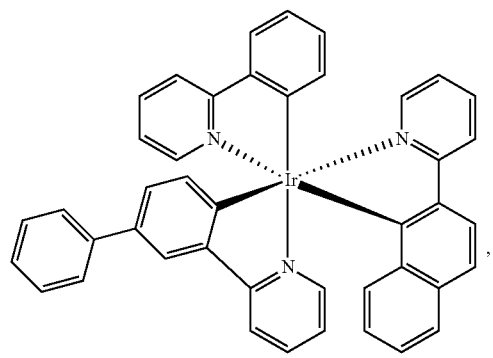
Compound 70
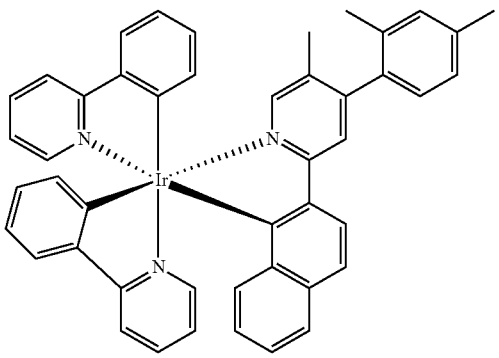
Compound 71
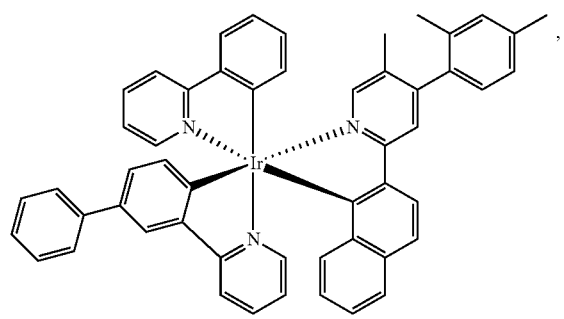
Compound 72
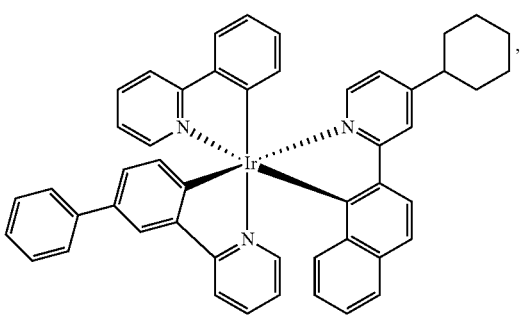
Compound 73
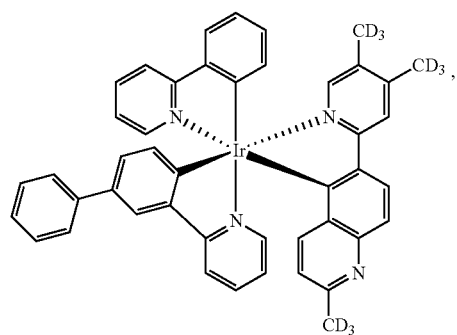
Compound 74
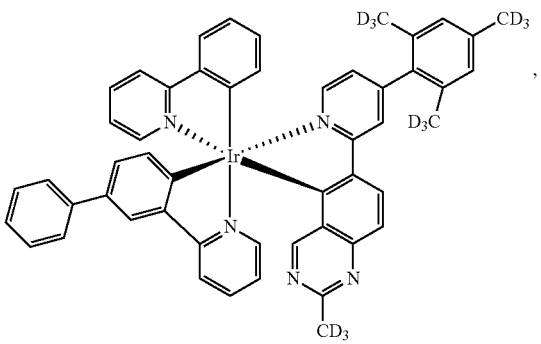
Compound 75
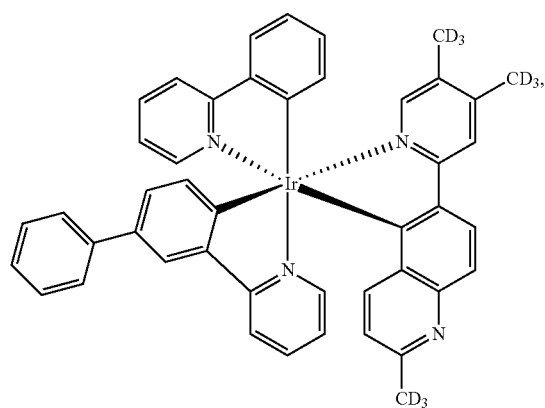
Compound 76
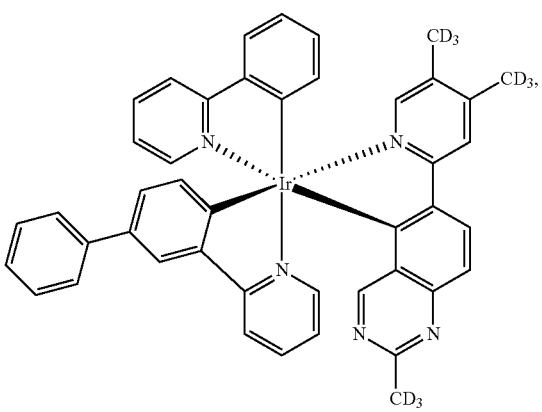

Compound 116
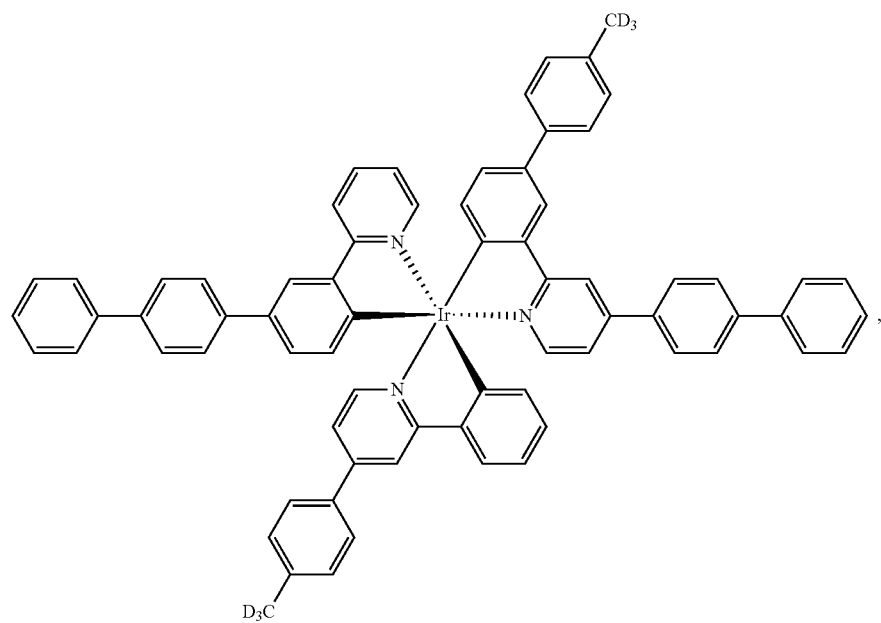
Compound 117
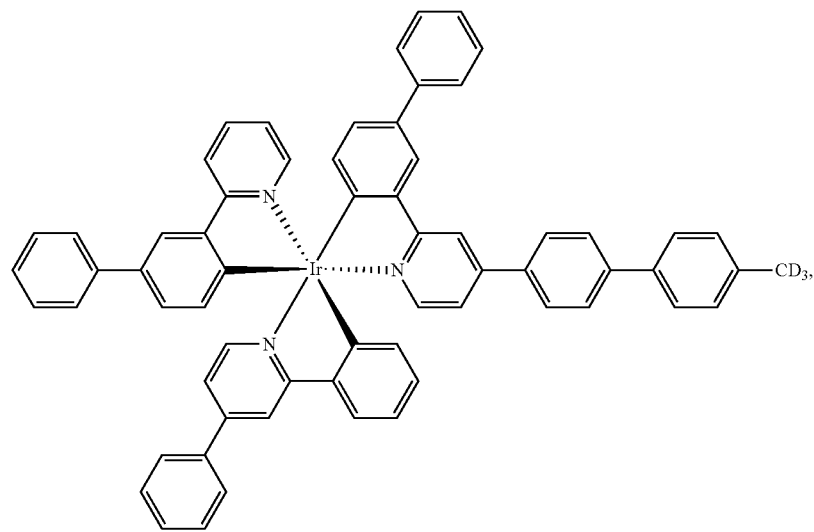

-continued
Compound 118
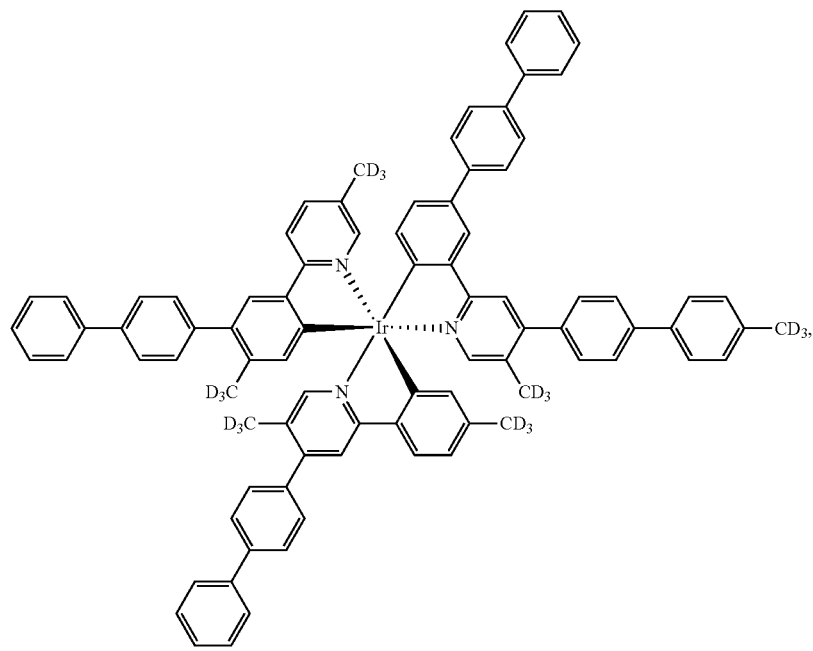
Compound 119
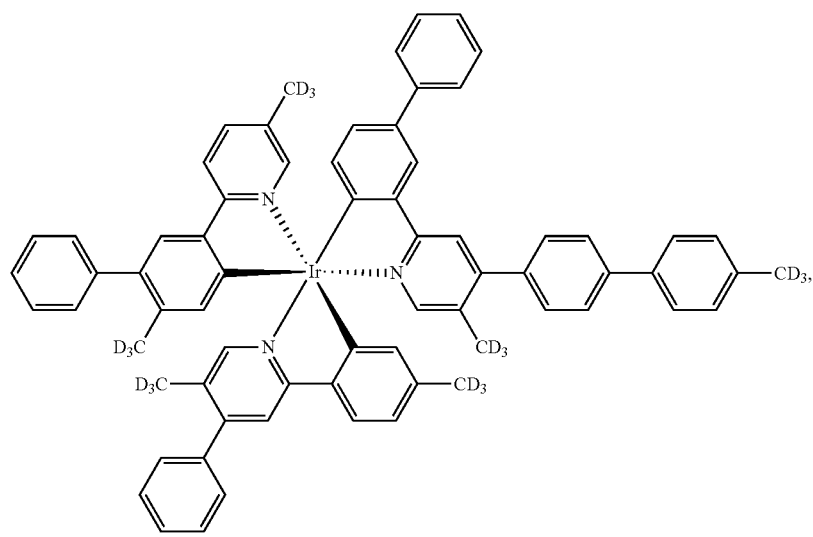
Compound 120
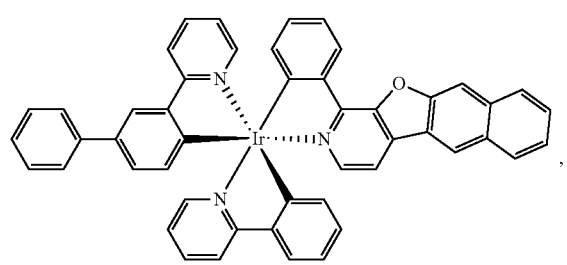
Compound 121
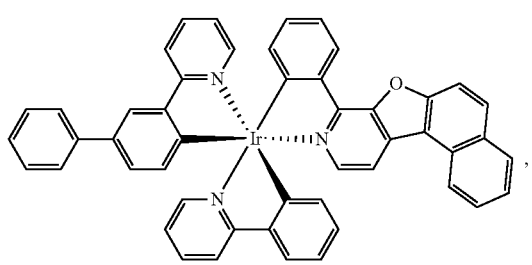

-continued
Compound 122
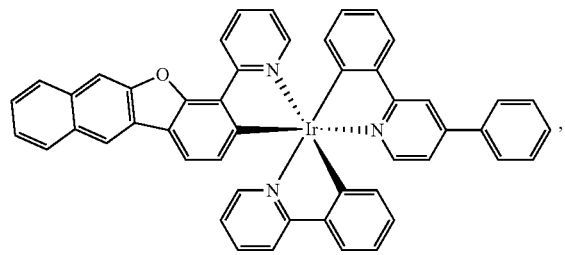
Compound 123
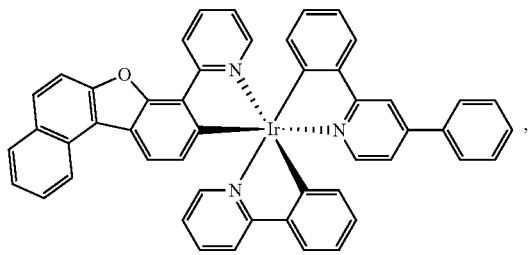
Compound 124
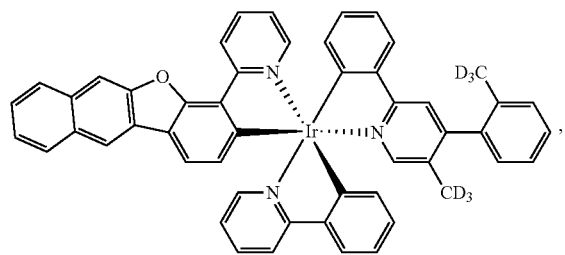
Compound 125
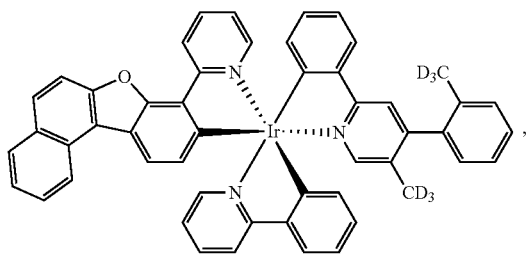
Compound 126
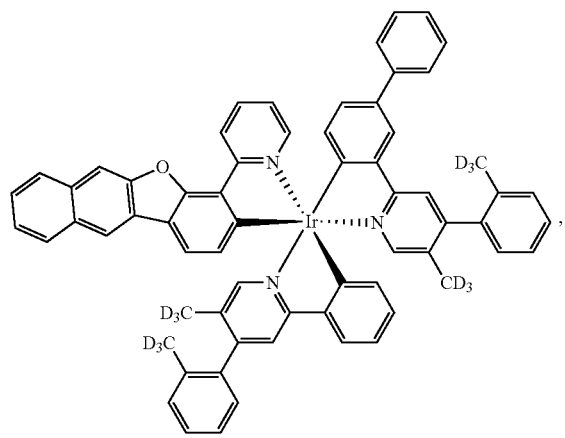
Compound 127
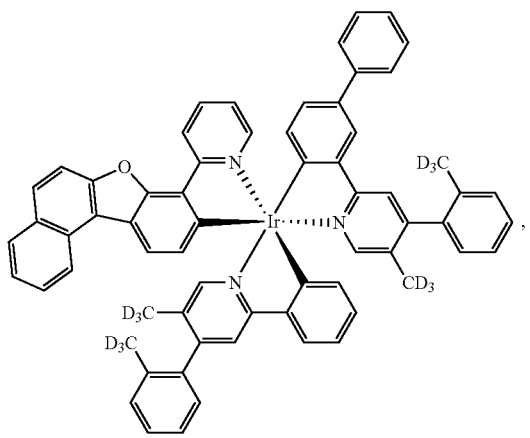
Compound 128
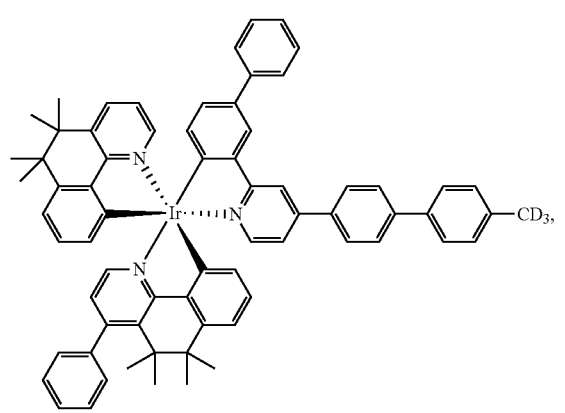
Compound 129
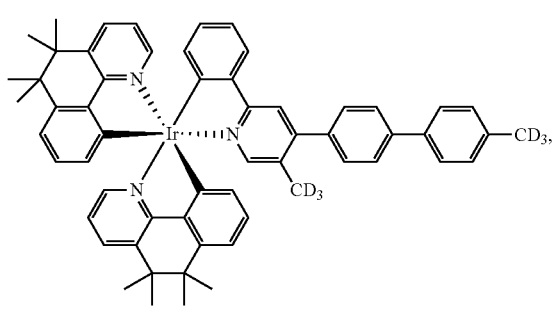

-continued
Compound 130
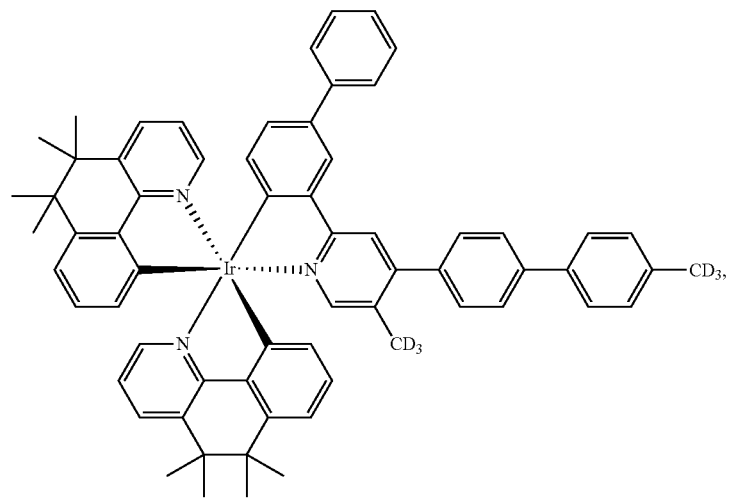
Compound 146
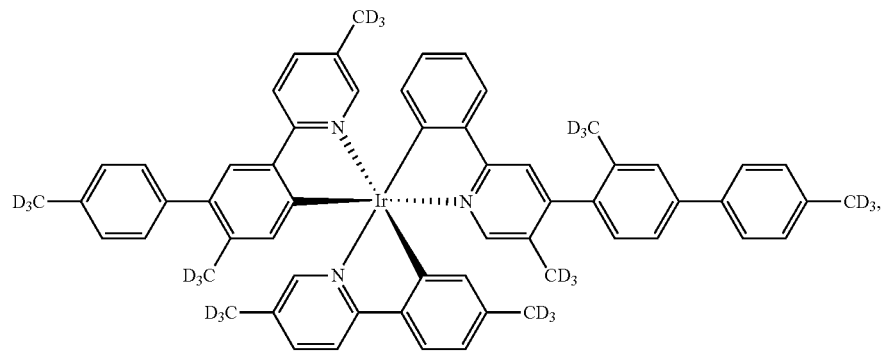
Compound 147
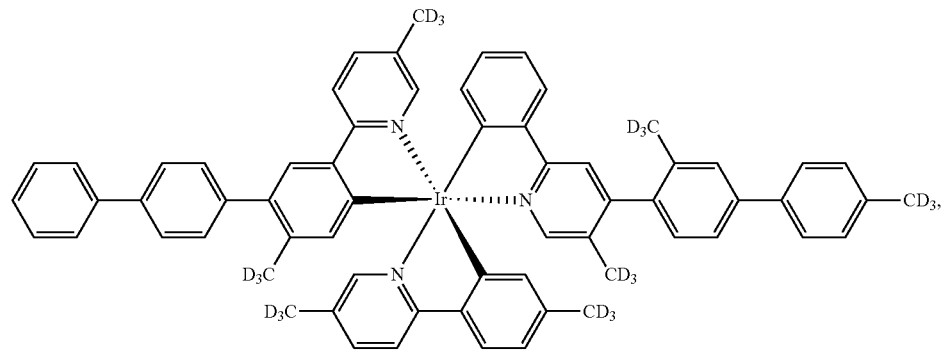
Compound 148
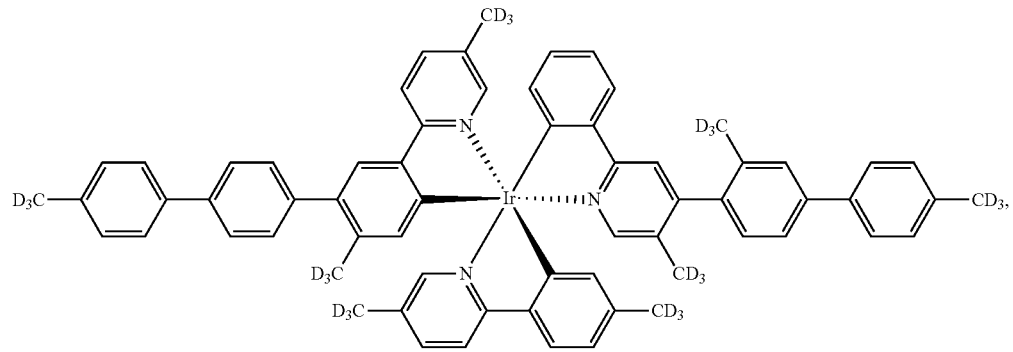

Compound 149
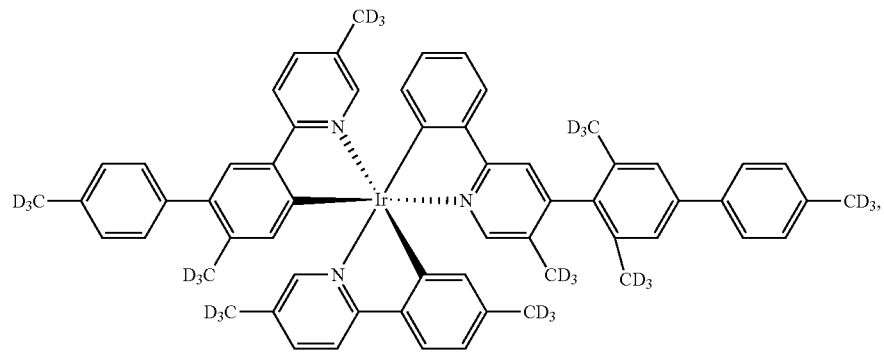
Compound 150
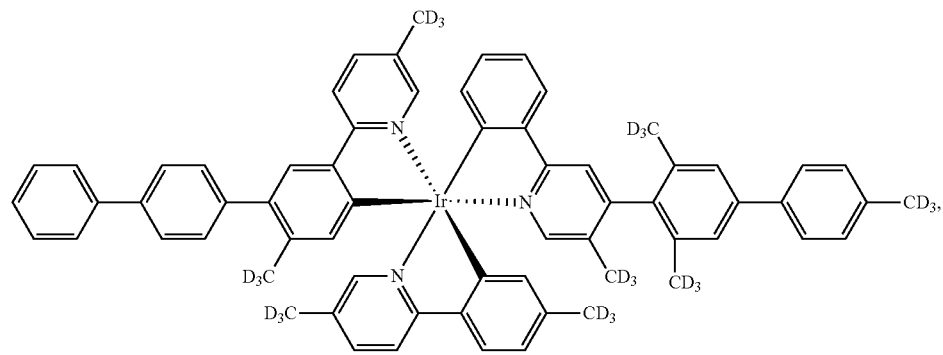
Compound 151
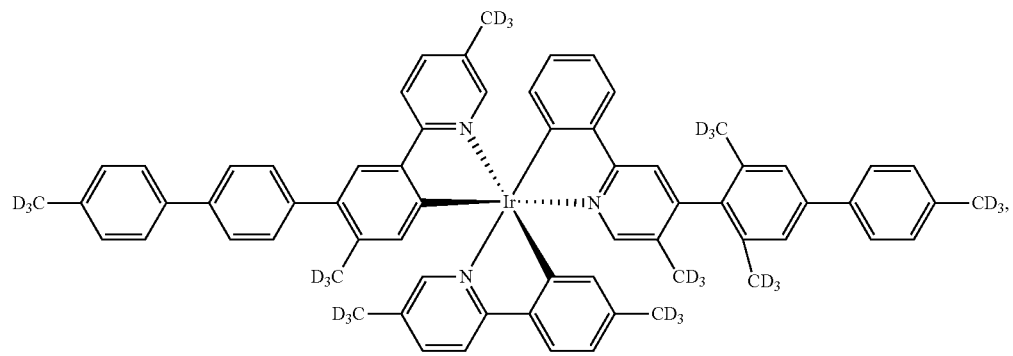
Compound 152
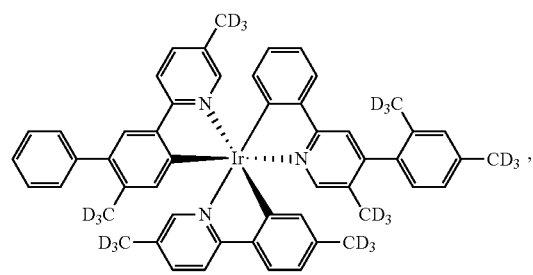
Compound 153
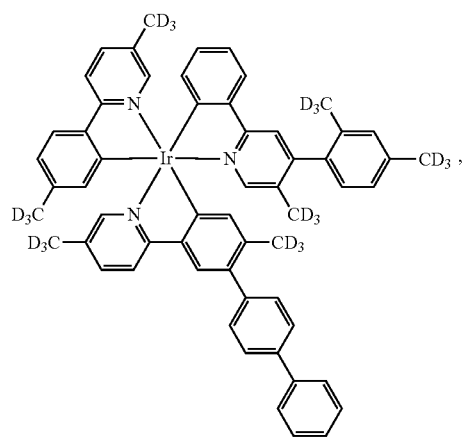

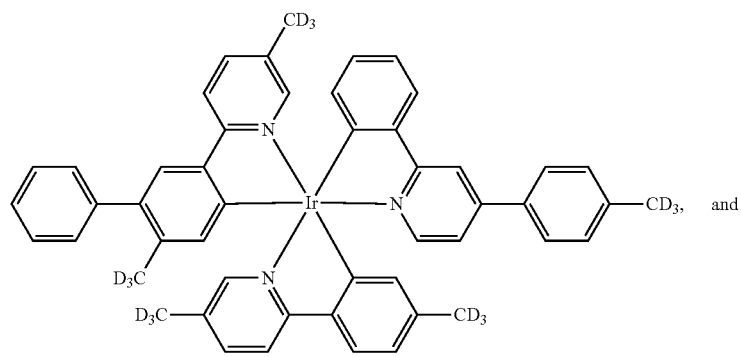

Compound 154

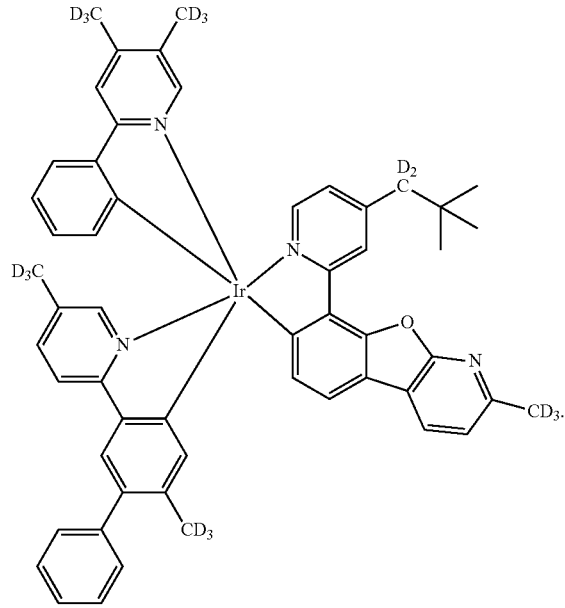

Compound 155

18. The compound of claim 1, wherein the metal is selected from the group consisting of Ir, Rh, Re, Ru, Os, Pt, Pd, Au, Ag, and Cu.

19. An organic light emitting device (OLED) comprising:
an anode;
a cathode; and
an organic layer, disposed between the anode and the cathode, comprising a compound having a metal coordination complex structure;
wherein the compound is capable of functioning as an emitter in an organic light emitting device at room temperature;
wherein the compound has the formula of $M(L^1)(L^2)(L^3)$ and $L^1$, $L^2$, and $L^3$ are different from each other;
wherein each of $L^1$, $L^2$, and $L^3$ is a ligand having at least two six-membered rings bridged together, wherein two adjacent bridged six-membered rings are each coordinated to the metal, and at least one of the two bridged six-membered rings having at least one nitrogen atom,
wherein the compound has a first substituent $R^1$ at one of the ligands' periphery;
wherein a first distance is the distance between the metal and an atom in $R^1$ that is the farthest away from the metal;
wherein the first distance is longer than any distance between the metal and any other atoms in the compound; and
wherein when a sphere having a radius r is defined whose center is the metal and the radius r is the smallest radius that will allow the sphere to enclose all atoms in the compound that are not part of $R^1$, the first distance is longer than the radius r by at least 2.9 Å.

20. The OLED of claim 19, wherein the metal is selected from the group consisting of Ir, Rh, Re, Ru, Os, Pt, Pd, Au, Ag, and Cu.

21. A consumer product comprising an organic light-emitting device (OLED) comprising:
an anode;
a cathode; and
an organic layer, disposed between the anode and the cathode, comprising a compound having a metal coordination complex structure;
wherein the compound is capable of functioning as an emitter in an organic light emitting device at room temperature;
wherein the compound has the formula of $M(L^1)(L^2)(L^3)$ and $L^1$, $L^2$, and $L^3$ are different from each other;
wherein each of $L^1$, $L^2$, and $L^3$ is a ligand having at least two six-membered rings bridged together, wherein two adjacent bridged six-membered rings are each coordinated to the metal, and at least one of the two bridged six-membered rings having at least one nitrogen atom,
wherein the compound has a first substituent $R^1$ at one of the ligands' periphery;

wherein a first distance is the distance between the metal and an atom in $R^1$ that is the farthest away from the metal;

wherein the first distance is longer than any distance between the metal and any other atoms in the compound; and wherein when a sphere having a radius r is defined whose center is the metal and the radius r is the smallest radius that will allow the sphere to enclose all atoms in the compound that are not part of $R^1$, the first distance is longer than the radius r by at least 2.9 Å.

22. The consumer product of claim 21, wherein the metal is selected from the group consisting of Ir, Rh, Re, Ru, Os, Pt, Pd, Au, Ag, and Cu.

23. The consumer product of claim 21, wherein the consumer product is selected from the group consisting of a flat panel display, a computer monitor, a medical monitors television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a microdisplay, a 3-D display, a virtual reality or augmented reality display, a vehicle, a large area wall, a theater or stadium screen, and a sign.

* * * * *